US010164195B2

(12) United States Patent
Kim et al.

(10) Patent No.: US 10,164,195 B2
(45) Date of Patent: Dec. 25, 2018

(54) ORGANIC LIGHT-EMITTING DEVICE

(71) Applicant: Samsung Display Co., Ltd., Yongin-si, Gyeonggi-do (KR)

(72) Inventors: Seulong Kim, Yongin-si (KR); Naoyuki Ito, Yongin-si (KR); Younsun Kim, Yongin-si (KR); Dongwoo Shin, Yongin-si (KR); Jungsub Lee, Yongin-si (KR); Jino Lim, Yongin-si (KR); Hyein Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/284,371

(22) Filed: Oct. 3, 2016

(65) Prior Publication Data

US 2017/0179397 A1 Jun. 22, 2017

(30) Foreign Application Priority Data

Dec. 22, 2015 (KR) ........................ 10-2015-0184077

(51) Int. Cl.
*H01L 51/50* (2006.01)
*H01L 51/00* (2006.01)
(Continued)

(52) U.S. Cl.
CPC ........ *H01L 51/0058* (2013.01); *C09K 11/025* (2013.01); *C09K 11/06* (2013.01);
(Continued)

(58) Field of Classification Search
None
See application file for complete search history.

(56) References Cited

U.S. PATENT DOCUMENTS 6,387,544 B1 * 5/2002 Thompson ............ C07C 211/61 313/504
2005/0089717 A1 * 4/2005 Cosimbescu .......... C09K 11/06 428/690

(Continued)

FOREIGN PATENT DOCUMENTS

KR 10-2010-0040901 A 4/2010
KR 10-2011-0008619 A 1/2011

(Continued)

OTHER PUBLICATIONS

Rodrigo, R., et al., "Cancentrine. IV. Acetolysis Products of Cancentrine Methiodide," Canadian Journal of Chemistry, vol. 50, (1972), pp. 3900-3910, http://www.nrcresearchpress.com/doi/pdf/10.1139/v72-614.

*Primary Examiner* — Gregory D Clark
(74) *Attorney, Agent, or Firm* — Lewis Roca Rothgerber Christie LLP

(57) ABSTRACT

An organic light-emitting device including: a first electrode; a second electrode facing the first electrode; an emission layer between the first electrode and the second electrode; a hole transport region between the first electrode and the emission layer; and an electron transport region between the emission layer and the second electrode, wherein the emission layer includes a first compound represented by Formula 1A or 1B, and at least one selected from the hole transport region and the electron transport region includes a second compound represented by Formula 2A or 2B:

(Continued)

Formula 1A

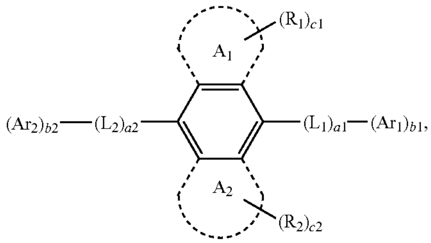

Formula 1B

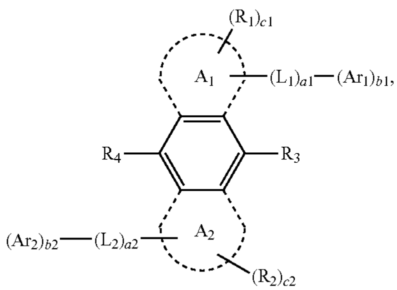

Formula 2A

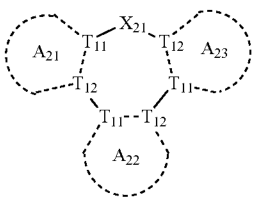

Formula 2B

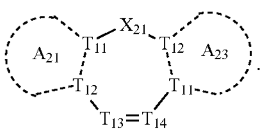

20 Claims, 6 Drawing Sheets

(51) Int. Cl.
*C09K 11/02* (2006.01)
*C09K 11/06* (2006.01)

(52) U.S. Cl.
CPC ........ *H01L 51/006* (2013.01); *H01L 51/0052* (2013.01); *H01L 51/0054* (2013.01); *H01L 51/0055* (2013.01); *H01L 51/0067* (2013.01); *H01L 51/0071* (2013.01); *H01L 51/0072* (2013.01); *H01L 51/0073* (2013.01); *H01L 51/0074* (2013.01); *C09K 2211/1007* (2013.01); *C09K 2211/1011* (2013.01); *C09K 2211/1014* (2013.01); *H01L 51/0085* (2013.01); *H01L 51/0087* (2013.01); *H01L 51/504* (2013.01); *H01L 51/506* (2013.01); *H01L 51/5008* (2013.01); *H01L 51/5012* (2013.01); *H01L 51/5016* (2013.01); *H01L 51/5056* (2013.01); *H01L 51/5072* (2013.01); *H01L 51/5092* (2013.01)

(56) References Cited

U.S. PATENT DOCUMENTS

| | | | |
|---|---|---|---|
| 2007/0054151 | A1 | 3/2007 | Iwakuma et al. |
| 2009/0009065 | A1 | 1/2009 | Nishimura et al. |
| 2009/0096357 | A1 * | 4/2009 | Lee .............................. 313/504 |
| 2012/0091438 | A1 | 4/2012 | Yabunouchi et al. |
| 2012/0153268 | A1 | 6/2012 | Kawamura et al. |
| 2013/0207082 | A1 | 8/2013 | Cho et al. |
| 2014/0183466 | A1 | 7/2014 | Lee et al. |
| 2014/0217393 | A1 | 8/2014 | Kato et al. |
| 2014/0225072 | A1 | 8/2014 | Kim et al. |
| 2015/0053933 | A1 | 2/2015 | Lee et al. |
| 2015/0060808 | A1 | 3/2015 | Kim et al. |
| 2015/0194610 | A1 | 7/2015 | Hwang et al. |
| 2015/0207093 | A1 | 7/2015 | Kim et al. |

FOREIGN PATENT DOCUMENTS

| | | | |
|---|---|---|---|
| KR | 10-2011-0106193 | A | 9/2011 |
| KR | 10-2012-0022861 | A | 3/2012 |
| KR | 10-2012-0092550 | A | 8/2012 |
| KR | 10-2012-0092555 | A | 8/2012 |
| KR | 10-2012-0100709 | A | 9/2012 |
| KR | 10-2013-0093327 | A | 8/2013 |
| KR | 10-2014-0034709 | A | 3/2014 |
| KR | 10-2014-0074286 | A | 6/2014 |
| KR | 10-2014-0085110 | A | 7/2014 |
| KR | 10-2014-0087882 | A | 7/2014 |
| KR | 10-2014-0102089 | A | 8/2014 |
| KR | 10-2014-0119642 | A | 10/2014 |
| KR | 10-2014-0128653 | A | 11/2014 |
| KR | 10-2015-0008678 | A | 1/2015 |
| KR | 10-2015-0021861 | A | 3/2015 |
| KR | 10-2015-0024491 | A | 3/2015 |
| KR | 10-2015-0026114 | A | 3/2015 |
| KR | 10-2015-0034612 | A | 4/2015 |
| KR | 10-2015-0037119 | A | 4/2015 |
| KR | 10-2015-0039136 | A | 4/2015 |
| KR | 10-2015-0041931 | A | 4/2015 |
| KR | 10-2015-0070897 | A | 6/2015 |
| KR | 10-2015-0077284 | A | 7/2015 |
| KR | 10-2015-0081736 | A | 7/2015 |
| KR | 10-2015-0086095 | A | 7/2015 |
| KR | 10-2015-0088066 | A | 7/2015 |
| WO | WO 2007/029403 | A1 | 3/2007 |
| WO | WO 2011/010839 | A1 | 1/2011 |
| WO | WO 2012/070233 | A1 | 5/2012 |
| WO | WO 2013/035329 | A1 | 3/2013 |

* cited by examiner

ORGANIC LIGHT-EMITTING DEVICE

CROSS-REFERENCE TO RELATED APPLICATION

This application claims priority to and the benefit of Korean Patent Application No. 10-2015-0184077, filed on Dec. 22, 2015, in the Korean Intellectual Property Office, the entire content of which is incorporated herein by reference.

BACKGROUND

1. Field

One or more aspects of example embodiments of the present disclosure are related to an organic light-emitting device.

2. Description of the Related Art

Organic light-emitting devices are self-emission devices that have wide viewing angles, high contrast ratios, short response times, and/or excellent brightness, driving voltage, and/or response speed characteristics, and may produce full-color images.

An example organic light-emitting device may include a first electrode on a substrate, and a hole transport region, an emission layer, an electron transport region, and a second electrode sequentially positioned on the first electrode. Holes provided from the first electrode may move toward the emission layer through the hole transport region, and electrons provided from the second electrode may move toward the emission layer through the electron transport region. Carriers (such as holes and electrons) may recombine in the emission layer to produce excitons. These excitons may transition (e.g., radiatively decay) from an excited state to a ground state to thereby generate light.

SUMMARY

One or more aspects of example embodiments of the present disclosure are directed toward an organic light-emitting device having a low driving voltage and high efficiency.

Additional aspects will be set forth in part in the description which follows and, in part, will be apparent from the description, or may be learned by practice of the presented embodiments.

One or more example embodiments of the present disclosure provide an organic light-emitting device including:

a first electrode;

a second electrode facing the first electrode;

an emission layer between the first electrode and the second electrode;

a hole transport region between the first electrode and the emission layer; and an electron transport region between the emission layer and the second electrode, wherein the emission layer includes a first compound, at least one selected from the hole transport region and the electron transport region includes a second compound, the first compound is represented by Formula 1A or 1B, and the second compound is represented by Formula 2A or 2B:

Formula 1A

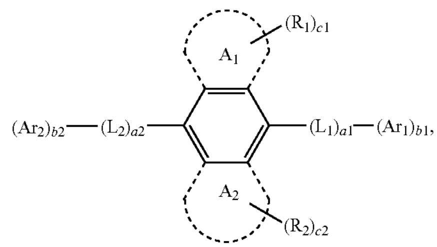

Formula 1B

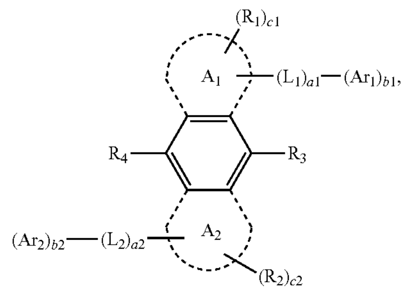

Formula 2A

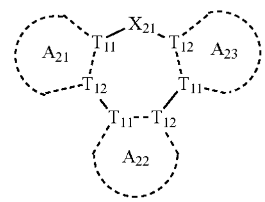

Formula 2B

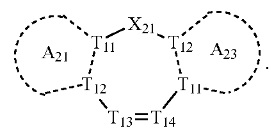

In Formulae 1A, 1B, 2A, and 2B, rings $A_1$ and $A_2$ may each independently be a $C_5$-$C_{60}$ carbocyclic group, rings $A_{21}$, $A_{22}$, and $A_{23}$ may each independently be a $C_5$-$C_{30}$ carbocyclic group or a $C_1$-$C_{30}$ heterocyclic group, each substituted with at least one *-$[(L_{22})_{a22}$-$(R_{22})_{b22}]$, each $T_{11}$ and each $T_{12}$ may independently be carbon (C) or nitrogen (N), any two or more of the three $T_{11}$(s) in Formula 2A may be identical to or different from each other, $T_{13}$ may be N or $C(R_{27})$, $T_{14}$ may be N or $C(R_{28})$, any two or more of the three $T_{12}$(s) in Formula 2A may be identical to or different from each other, the two $T_{11}$(s) in Formula 2B may be identical to or different from each other, the two $T_{12}$(s) in Formula 2B may be identical to or different from each other, and each bond between $T_{11}$ and $T_{12}$ may be a single bond or a double bond; wherein the three $T_{11}$(s) and the three $T_{12}$(s) in Formula 2A are not all nitrogen, and the two $T_{11}$(s), the two $T_{12}$(s), $T_{13}$, and $T_{14}$ in Formula 2B are not all nitrogen, rings $A_{21}$, $A_{22}$, and $A_{23}$ may each be condensed to (e.g., fused with) a central 7-membered ring in Formulae 2A and 2B, such that they each share a $T_{11}$ and a $T_{12}$ with the central 7-membered ring, $X_{21}$ may be selected from O, S, Se, $C(R_{23})(R_{24})$, $Si(R_{23})(R_{24})$, and N-$[(L_{21})_{a21}$-$(R_{21})_{b21}]$, $L_1$, $L_2$, $L_{21}$, and $L_{22}$ may each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1, a2, a21, and a22 may each independently be an integer selected from 0 to 5, $Ar_1$ and $Ar_2$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, b1 and b2 may each independently be an integer selected from 1 to 5, $R_1$ to $R_4$, $R_{21}$ to $R_{24}$, $R_{27}$, and $R_{28}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, and c1, c2, b21, and b22 may each independently be an integer selected from 0 to 4, wherein a compound represented by Formula 1A in which i) rings $A_1$ and $A_2$ are each a benzene group, ii) a1, a2, c1, and c2 are 0, iii) b1 and b2 are 1, and iv) $Ar_1$ and $Ar_2$ are each a naphthyl group, is excluded from being the first compound represented by Formula 1A or 1B, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, and $—P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, and $—P(=O)(Q_{21})(Q_{22})$; and $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

BRIEF DESCRIPTION OF THE DRAWINGS

These and/or other aspects will become apparent and more readily appreciated from the following description of example embodiments, taken in conjunction with the accompanying drawings, in which.

DETAILED DESCRIPTION

Figure 1:
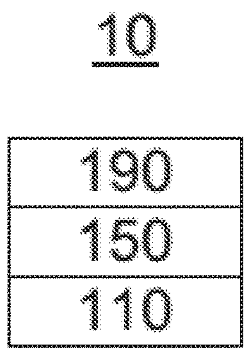
FIGS. 1 to 6 are schematic views of an organic light-emitting device according to one or more embodiments of the present disclosure.

Reference will now be made in more detail to example embodiments, examples of which are illustrated in the accompanying drawings, wherein like reference numerals refer to like elements throughout and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Expressions such as "at least one of", "one of", and "selected from", when preceding a list of elements, modify the entire list of elements and do not modify the individual elements of the list.

The thicknesses of layers, films, panels, regions, etc., may be exaggerated in the drawings for clarity. It will be understood that when an element such as a layer, film, region, or substrate is referred to as being "on" another element, it can be directly on the other element or intervening element(s) may also be present. In contrast, when an element is referred to as being "directly on" another element, no intervening elements are present.

An organic light-emitting device according to an embodiment of the present disclosure may include a first electrode, a second electrode facing the first electrode, an emission layer between the first electrode and the second electrode, a hole transport region between the first electrode and the emission layer, and an electron transport region between the emission layer and the second electrode, wherein the emission layer may include a first compound, and at least one selected from the hole transport region and the electron transport region may include a second compound.

The first compound may be represented by Formula 1A or 1B, and the second compound may be represented by Formula 2A or 2B:

Formula 1A

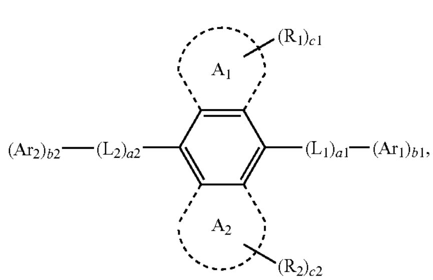

-continued

Formula 1B

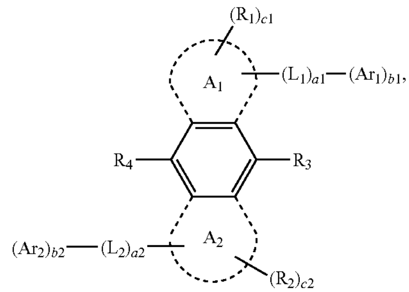

Formula 2A

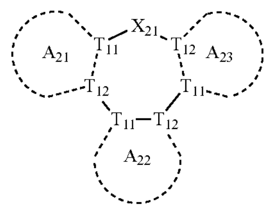

Formula 2B

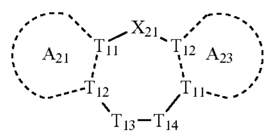

In Formulae 1A and 1B, rings $A_1$ and $A_2$ may each independently be a $C_5$-$C_{60}$ group.

In some embodiments, in Formulae 1A and 1B, rings $A_1$ and $A_2$ may each independently be selected from a benzene group, a naphthalene group, an anthracene group, a phenanthrene group, an indene group, a fluorene group, and a benzofluorene group.

In one or more embodiments, in Formula 1A, ring $A_1$ may be a benzene group, a naphthalene group, or a fluorene group, and ring $A_2$ may be a benzene group, but embodiments of the present disclosure are not limited thereto.

In one or more embodiments, in Formula 1B, rings $A_1$ and $A_2$ may each be a benzene group, but embodiments of the present disclosure are not limited thereto.

In Formulae 1A and 1B, a group represented by *-$(L_1)_{a1}$-$(Ar_1)_{b1}$ and a group represented by *-$(L_2)_{a2}$-$(Ar_2)_{b2}$ may be different from each other. $L_1$, $L_2$, a1, a2, $Ar_1$, $Ar_2$, b1, and b2 may each independently be the same as described above. The first compound represented by Formula 1A or 1B may have an asymmetrical structure. Accordingly, the first compound represented by Formula 1A or 1B may have low crystallinity. Thus, an organic light-emitting device including the first compound represented by Formula 1A or 1B may have a low driving voltage, high efficiency, and/or long lifespan.

In Formulae 2A and 2B, rings $A_{21}$, $A_{22}$, and $A_{23}$ may each independently be a $C_5$-$C_{60}$ carbocyclic group or a $C_1$-$C_{60}$ heterocyclic group, each substituted with at least one *-[$(L_{22})_{a22}$-$(R_{22})_{b22}$]. $L_{22}$, a22, $R_{22}$, and b22 may each independently be the same as described above.

In Formulae 2A and 2B, each $T_{11}$ and each $T_{12}$ may independently be carbon or nitrogen, any two or more of the three $T_{11}$(s) in Formula 2A may be identical to or different from each other, $T_{13}$ may be N or C($R_{27}$), $T_{14}$ may be N or C($R_{28}$), any two or more of the three $T_{12}$(s) in Formula 2A may be identical to or different from each other, the two $T_{11}$(s) in Formula 2B may be identical to or different from each other, the two $T_{12}$(s) in Formula 2B may be identical to or different from each other, and each bond between $T_{11}$ and $T_{12}$ may be a single bond or a double bond; wherein the three $T_{11}$(s) and the three $T_{12}$(s) in Formula 2A are not all nitrogen, and the two $T_{11}$(s), the two $T_{12}$(s), $T_{13}$, and $T_{14}$ in Formula 2B are not all nitrogen. Rings $A_{21}$, $A_{22}$, and $A_{23}$ may each be condensed to a central 7-membered ring in Formulae 2A and 2B, such that they each share a $T_{11}$ and a $T_{12}$ with the central 7-membered ring.

*-[$(L_{22})_{a22}$-$(R_{22})_{b22}$] substituted in ring $A_{21}$, *-[$(L_{22})_{a22}$-$(R_{22})_{b22}$] substituted in ring $A_{22}$, and *-[$(L_{22})_{a22}$-$(R_{22})_{b22}$] substituted in ring $A_{23}$ may be identical to or different from each other.

In some embodiments, when *-[$(L_{22})_{a22}$-$(R_{22})_{b22}$] substituted in ring $A_{21}$ is 2 or greater, a plurality of *-[$(L_{22})_{a22}$-$(R_{22})_{b22}$](s) may be identical to or different from each other; when *-[$(L_{22})_{a22}$-$(R_{22})_{b22}$] substituted in ring $A_{22}$ is 2 or greater, a plurality of *-[$(L_{22})_{a22}$-$(R_{22})_{b22}$](s) may be identical to or different from each other; and when *-[$(L_{22})_{a22}$-$(R_{22})_{b22}$] substituted in ring $A_{23}$ is 2 or greater, a plurality of *-[$(L_{22})_{a22}$-$(R_{22})_{b22}$](s) may be identical to or different from each other.

In one embodiment, in Formulae 2A and 2B, rings $A_{21}$, $A_{22}$, and $A_{23}$ may each independently be selected from a benzene group, a naphthalene group, an anthracene group, an indene group, a fluorene group, a pyridine group, a pyrimidine group, a pyrazine group, a pyridazine group, a quinoline group, an isoquinoline group, a pyrrole group, a pyrazole group, an imidazole group, an oxazole group, a thiazole group, a cyclopentadiene group, a silole group, a selenophene group, a furan group, a thiophene group, an indole group, a benzimidazole group, a benzoxazole group, a benzothiazole group, an indene group, a benzosilole group, a benzoselenophene group, a benzofuran group, a benzothiophene group, a carbazole group, a fluorene group, a dibenzosilole group, a dibenzoselenophene group, a dibenzofuran group, a dibenzothiophene group, a pyrrolopyridine group, a cyclopentapyridine group, a silolopyridine group, a selenophenopyridine group, a furopyridine group, a thienopyridine group, a pyrrolopyrimidine group, a cyclopentapyrimidine group, a silolopyrimidine group, a selenophenopyrimidine group, a furopyrimidine group, a thienopyrimidine group, a pyrrolopyrazine group, a cyclopentapyrazine group, a silolopyrazine group, a selenophenopyrazine group, a furopyrazine group, a thienopyrazine group, a naphthopyrrole group, a cyclopentanaphthalene group, a naphthosilole group, a naphthoselenothiophene group, a naphthofuran group, a naphthothiophene group, a pyrroloquinoline group, a cyclopentaquinoline group, a siloloquinoline group, a selenophenoquinoline group, a furoquinoline group, a thienoquinoline group, an pyrroloisoquinoline group, an cyclopentaisoquinoline group, an siloloisoquinoline group, an selenophenoisoquinoline group, an furoisoquinoline group, an thienoisoquinoline group, an azacarbazole group, an azafluorene group, an azadibenzosilole group, an azadibenzoselenophene group, an azadibenzofuran group, an azadibenzothiophene group, an indenoquinoline group, an indenoisoquinoline group, an indenoquinoxaline group, a phenanthroline group, and a naphthoindole group, each substituted with at least one *-[$(L_{22})_{a22}$-$(R_{22})_{b22}$].

In one or more embodiments, in the second compound represented by Formula 2A or 2B, the case that rings $A_{21}$, $A_{22}$, and $A_{23}$ are all (e.g., simultaneously) a benzene group substituted with at least one *-[$(L_{22})_{a22}$-$(R_{22})_{b22}$] may be excluded.

In one or more embodiments, in Formulae 2A and 2B, rings $A_{21}$, $A_{22}$, and $A_{23}$ may each independently be selected from groups represented by Formulae 2-1 to 2-36, each substituted with at least one *-[$(L_{22})_{a22}$-$(R_{22})_{b22}$]:

Formula 2-1

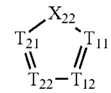

Formula 2-2

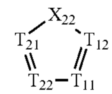

Formula 2-3

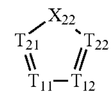

Formula 2-4

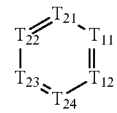

Formula 2-5

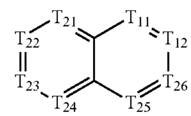

Formula 2-6

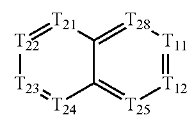

Formula 2-7

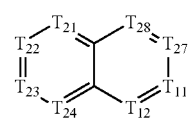

Formula 2-8

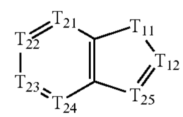

Formula 2-9

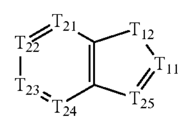

Formula 2-10

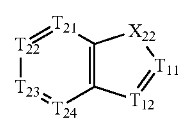

Formula 2-11

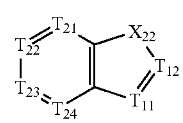

Formula 2-12

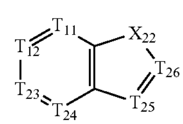

-continued
Formula 2-13
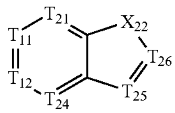
Formula 2-14
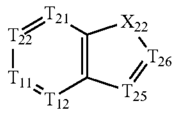
Formula 2-15
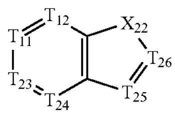
Formula 2-16
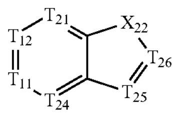
Formula 2-17
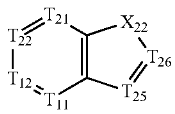
Formula 2-18
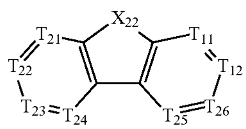
Formula 2-19
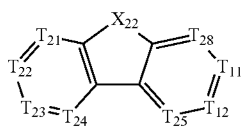
Formula 2-20
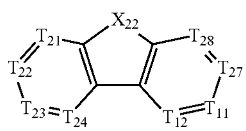
Formula 2-21
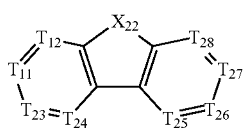
Formula 2-22
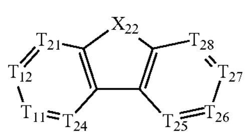
Formula 2-23
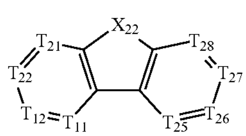
Formula 2-24
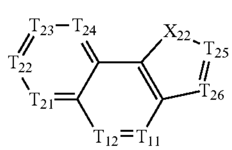
-continued
Formula 2-25
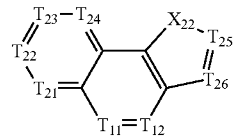
Formula 2-26
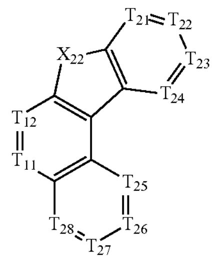
Formula 2-27
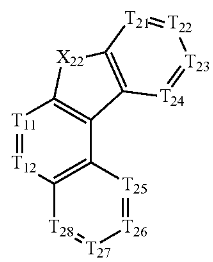
Formula 2-28
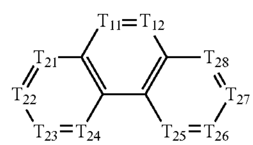
Formula 2-29
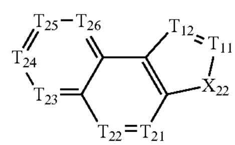
Formula 2-30
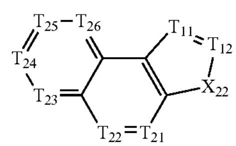
Formula 2-31
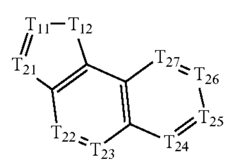
Formula 2-32
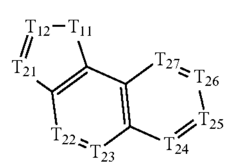
Formula 2-33
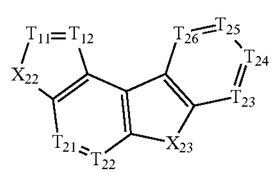

-continued

Formula 2-34

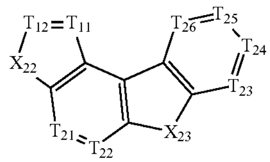

Formula 2-35

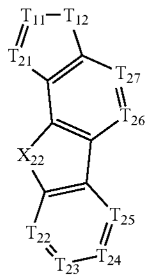

Formula 2-36

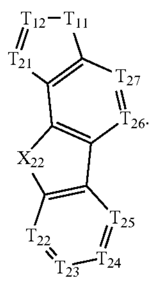

In Formulae 2-1 to 2-36, $T_{11}$ and $T_{12}$ may each independently be the same as described herein, $X_{22}$ and $X_{23}$ may each independently be O, S, Se, or a moiety including C, N, and/or Si, and $T_{21}$ to $T_{28}$ may each independently be N or a moiety including C.

In some embodiments, in Formulae 2-1 to 2-36, $X_{22}$ and $X_{23}$ may each independently be selected from O, S, Se, $C(R_{25})(R_{26})$, $N\text{-}[(L_{22})_{a22}\text{-}(R_{22})_{b22}]$, and $Si(R_{25})(R_{26})$, and $T_{21}$ to $T_{28}$ may each independently be N or $C\text{-}[(L_{22})_{a22}\text{-}(R_{22})_{b22}]$. $R_{25}$, $R_{26}$, and $R_{30}$ may each independently be selected from groups represented by $*\text{—}[(L_{22})_{a22}\text{-}(R_{22})_{b22})]$.

In one or more embodiments, in Formulae 2A and 2B, rings $A_{21}$, $A_{22}$, and $A_{23}$ may each independently be selected from groups represented by Formulae 2-101 to 2-229:

Formula 2-101

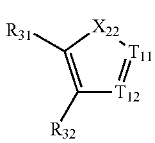

Formula 2-102

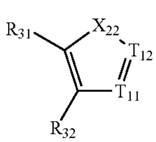

Formula 2-103

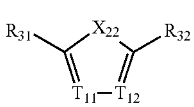

-continued

Formula 2-104

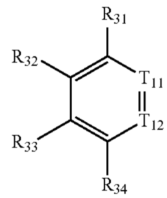

Formula 2-105

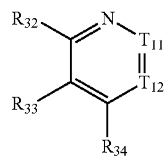

Formula 2-106

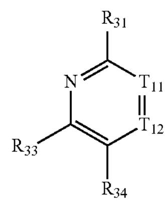

Formula 2-107

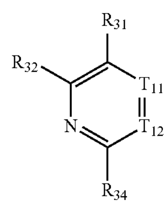

Formula 2-108

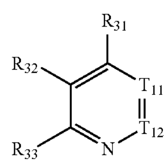

Formula 2-109

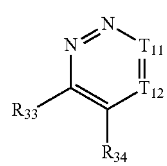

Formula 2-110

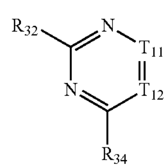

Formula 2-111

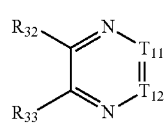

Formula 2-112

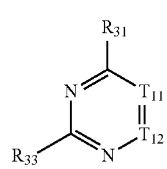

-continued
Formula 2-113
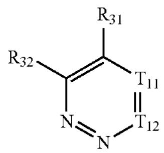
Formula 2-114
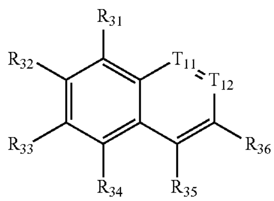
Formula 2-115
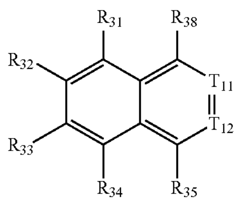
Formula 2-116
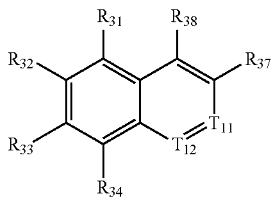
Formula 2-117
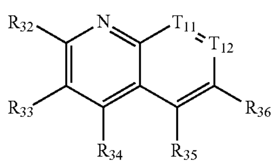
Formula 2-118
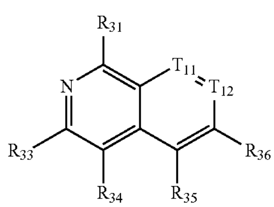
Formula 2-119
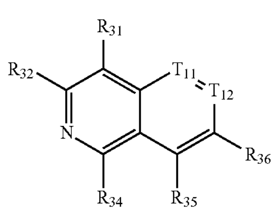
Formula 2-120
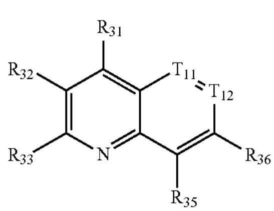
-continued
Formula 2-121
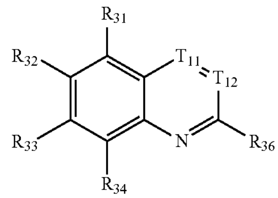
Formula 2-122
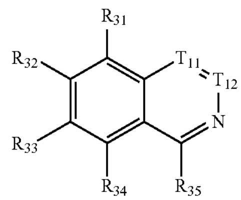
Formula 2-123
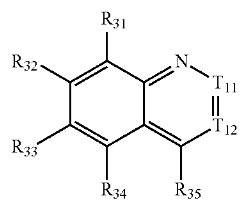
Formula 2-124
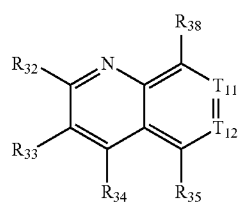
Formula 2-125
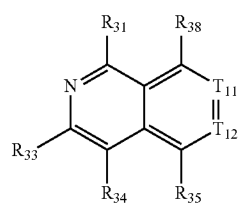
Formula 2-126
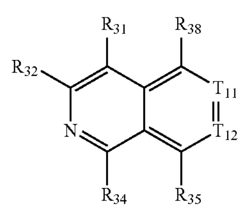
Formula 2-127
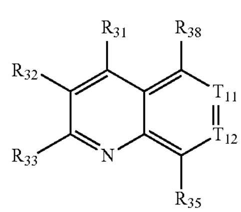

-continued
Formula 2-128
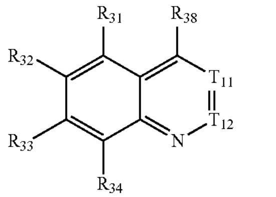
Formula 2-129
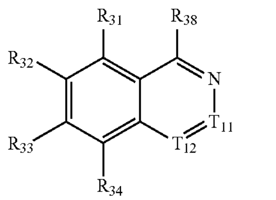
Formula 2-130
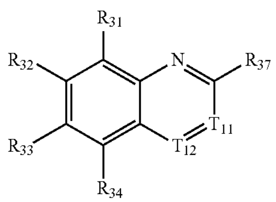
Formula 2-131
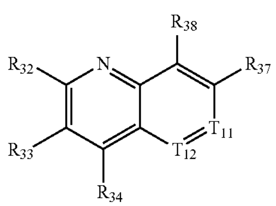
Formula 2-132
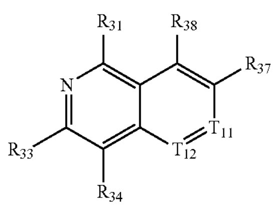
Formula 2-133
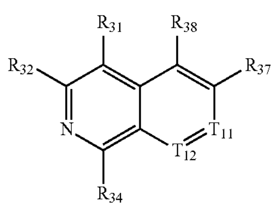
Formula 2-134
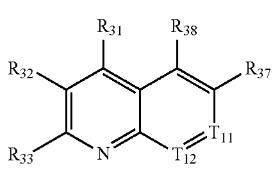
Formula 2-135
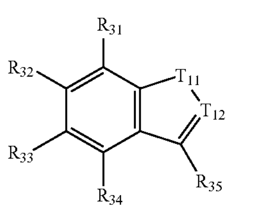
-continued
Formula 2-136
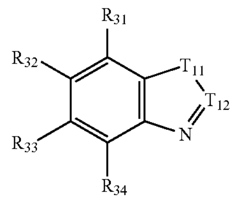
Formula 2-137
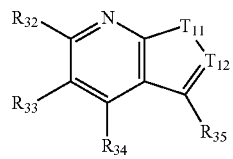
Formula 2-138
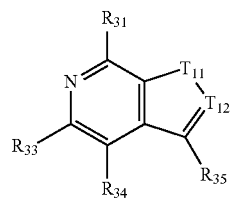
Formula 2-139
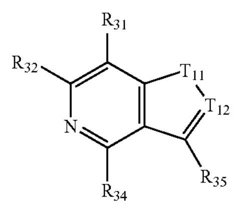
Formula 2-140
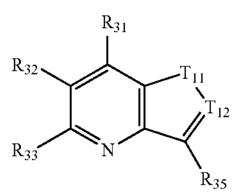
Formula 2-141
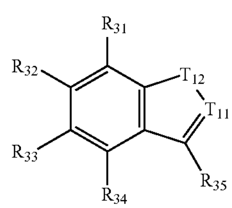
Formula 2-142
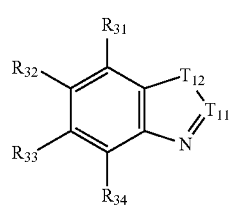
Formula 2-143
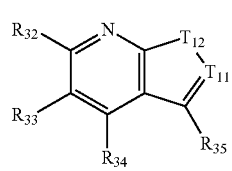

-continued
Formula 2-144
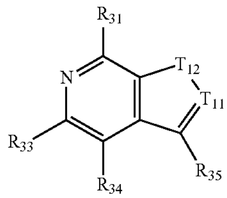
Formula 2-145
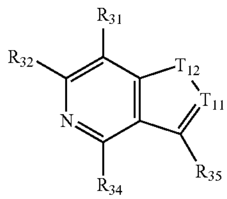
Formula 2-146
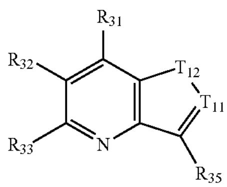
Formula 2-147
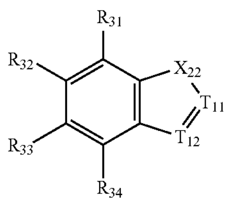
Formula 2-148
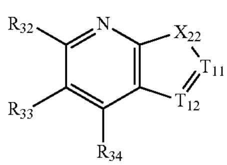
Formula 2-149
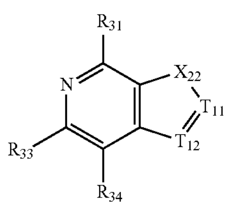
Formula 2-150
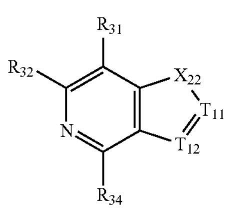
Formula 2-151
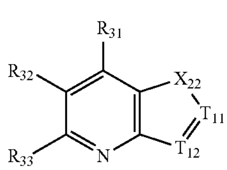
-continued
Formula 2-152
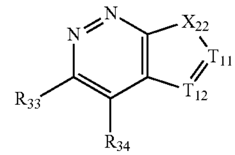
Formula 2-153
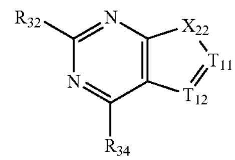
Formula 2-154
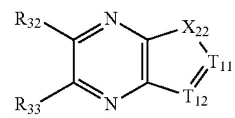
Formula 2-155
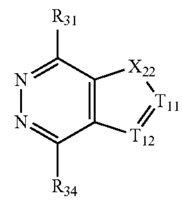
Formula 2-156
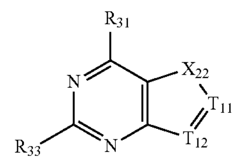
Formula 2-157
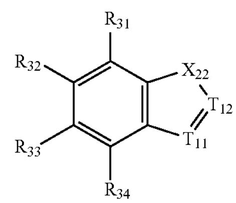
Formula 2-158
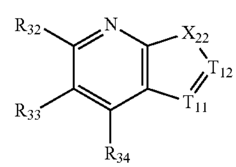
Formula 2-159
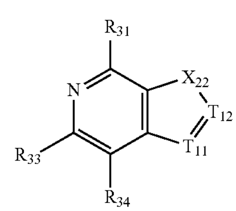
Formula 2-160
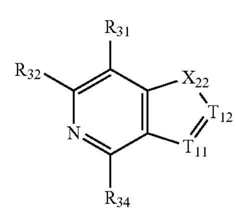

-continued
Formula 2-161
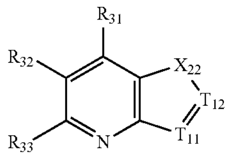
Formula 2-162
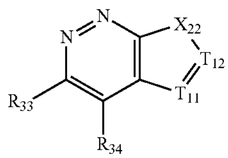
Formula 2-163
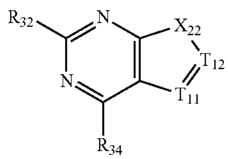
Formula 2-164
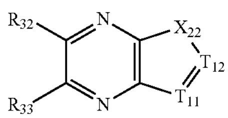
Formula 2-165
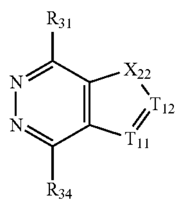
Formula 2-166
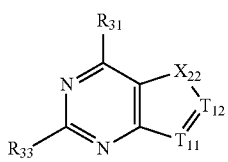
Formula 2-167
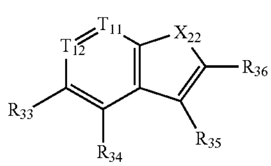
Formula 2-168
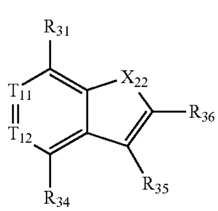
Formula 2-169
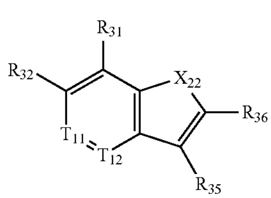
-continued
Formula 2-170
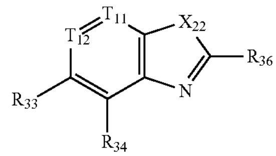
Formula 2-171
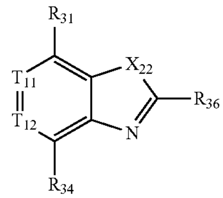
Formula 2-172
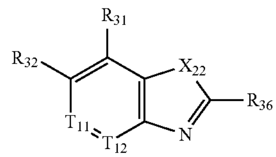
Formula 2-173
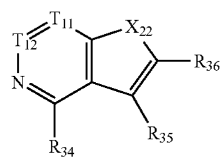
Formula 2-174
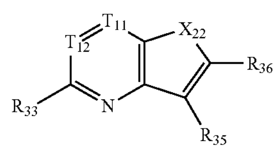
Formula 2-175
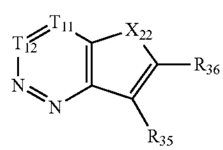
Formula 2-176
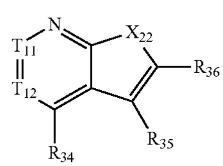
Formula 2-177
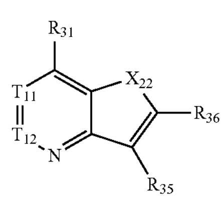
Formula 2-178
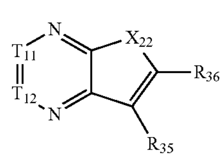

-continued
Formula 2-179
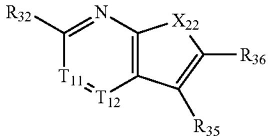
Formula 2-180
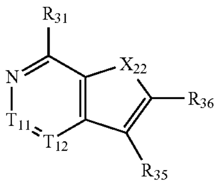
Formula 2-181
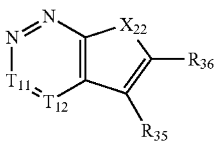
Formula 2-182
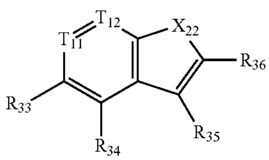
Formula 2-183
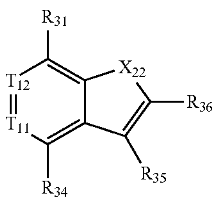
Formula 2-184
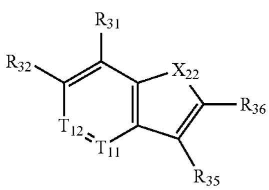
Formula 2-185
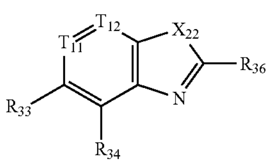
Formula 2-186
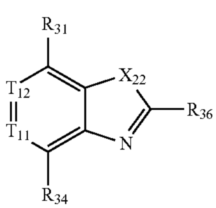
Formula 2-187
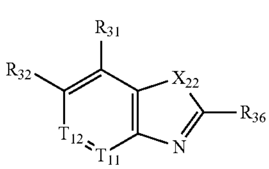
-continued
Formula 2-188
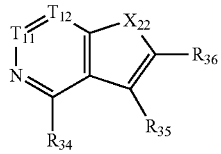
Formula 2-189
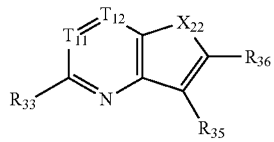
Formula 2-190
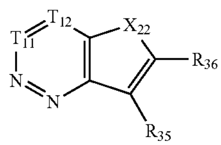
Formula 2-191
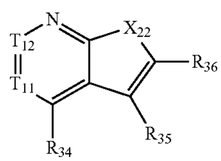
Formula 2-192
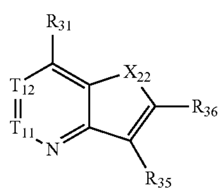
Formula 2-193
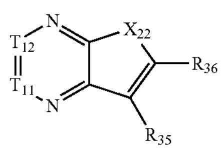
Formula 2-194
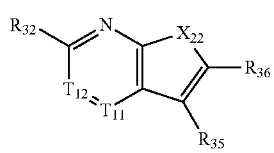
Formula 2-195
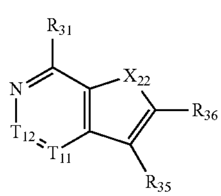
Fomrula 2-196
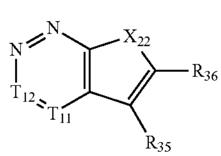

-continued
Formula 2-197
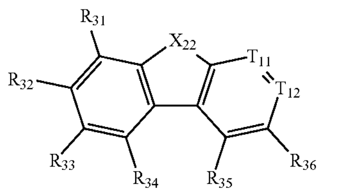
Formula 2-198
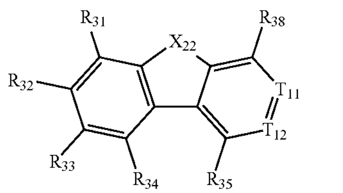
Formula 2-199
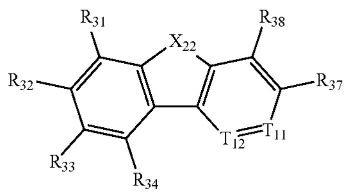
Formula 2-200
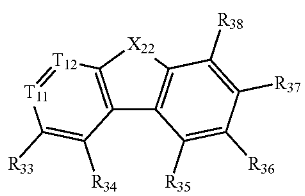
Formula 2-201
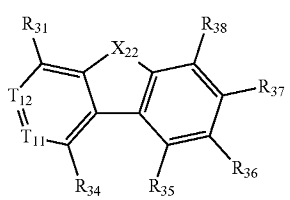
Formula 2-202
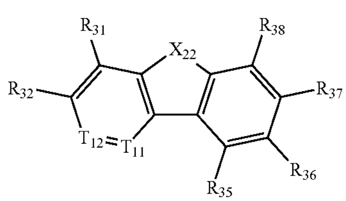
Formula 2-203
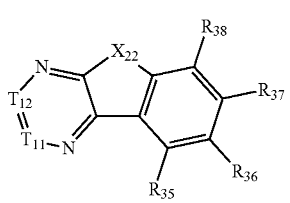
Formula 2-204
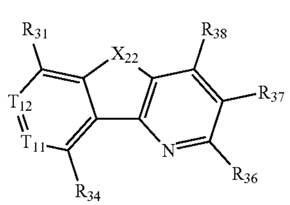
-continued
Formula 2-205
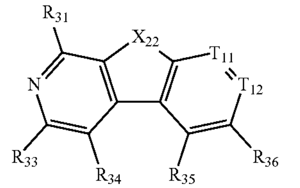
Formula 2-206
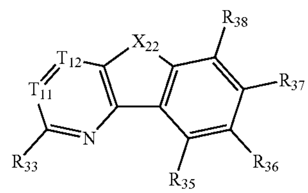
Formula 2-207
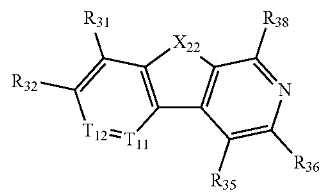
Formula 2-208
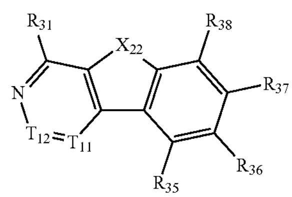
Formula 2-209
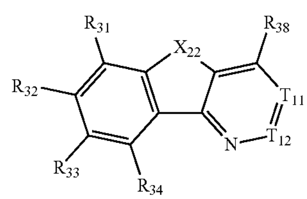
Formula 2-210
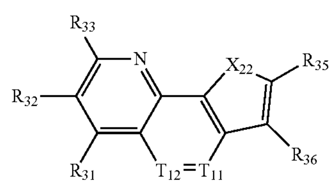
Formula 2-211
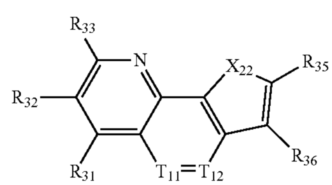
Formula 2-212
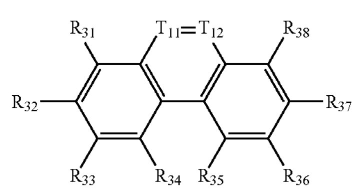

-continued
Formula 2-213
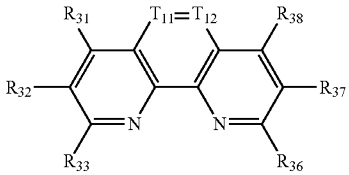
Formula 2-214
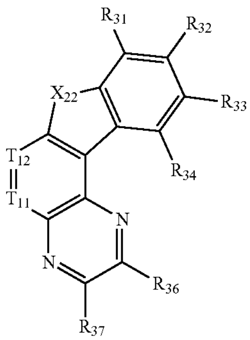
Formula 2-215
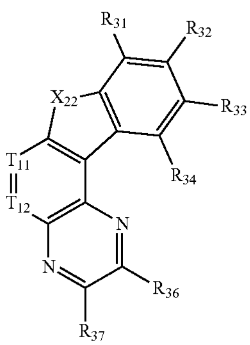
Formula 2-216
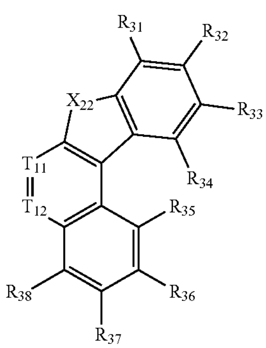
Formula 2-217
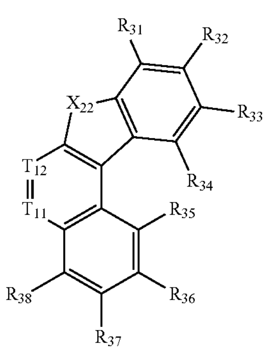
-continued
Formula 2-218
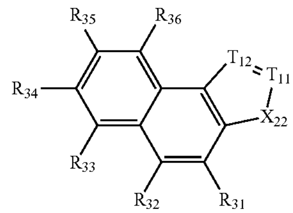
Formula 2-219
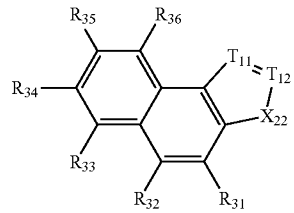
Formula 2-220
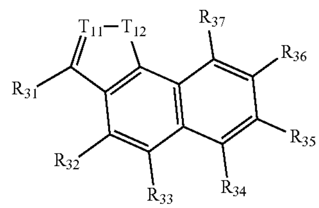
Formula 2-221
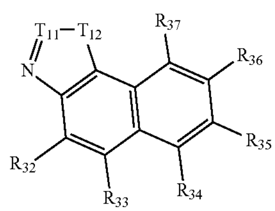
Formula 2-222
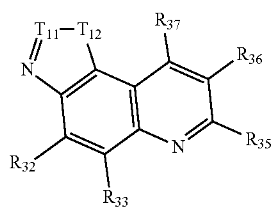
Formula 2-223
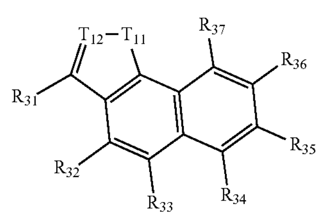
Formula 2-224
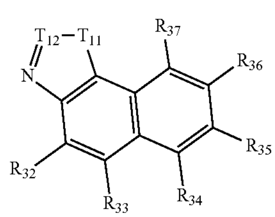

-continued

Formula 2-225

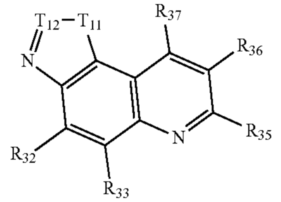

Formula 2-226

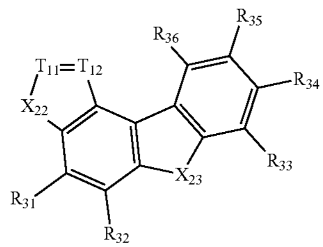

Formula 2-227

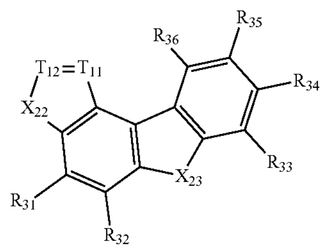

Formula 2-228

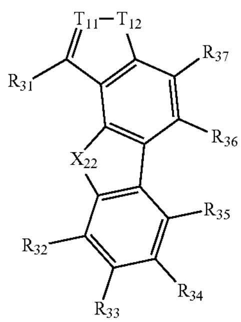

Formula 2-229

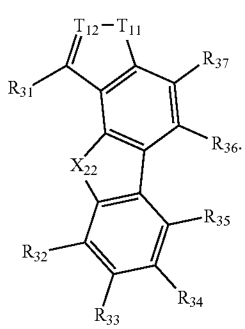

In Formulae 2-101 to 2-229, $T_{11}$ and $T_{12}$ may each independently be the same as described herein, $X_{22}$ and $X_{23}$ may each independently be O, S, Se, or a moiety including C, N, and/or Si, and $R_{31}$ to $R_{38}$ may each independently be selected from substituents represented by $*\text{—}[(L_{22})_{a22}\text{-}(R_{22})_{b22}]$.

In one or more embodiments, the second compound represented by Formula 2A or 2B may be represented by one selected from Formulae 2-201A to 2-269A (denoting a formula based on Formula 2A), wherein rings $A_{21}$, $A_{22}$, and $A_{23}$ in Formulae 2-201A to 2-269A are each selected from the formulae shown in Table 1A:

TABLE 1A

| Formula No. | Formula No. of Ring $A_{21}$ | Formula No. of Ring $A_{22}$ | Formula No. of Ring $A_{23}$ |
|---|---|---|---|
| 2-201A | 2-2 | 2-4 | 2-4 |
| 2-202A | 2-4 | 2-4 | 2-1 |
| 2-203A | 2-4 | 2-4 | 2-2 |
| 2-204A | 2-4 | 2-4 | 2-3 |
| 2-205A | 2-4 | 2-1 | 2-4 |
| 2-206A | 2-4 | 2-2 | 2-4 |
| 2-207A | 2-4 | 2-4 | 2-10 |
| 2-208A | 2-11 | 2-4 | 2-4 |
| 2-209A | 2-4 | 2-4 | 2-11 |
| 2-210A | 2-4 | 2-10 | 2-4 |
| 2-211A | 2-4 | 2-4 | 2-8 |
| 2-212A | 2-4 | 2-9 | 2-4 |
| 2-213A | 2-4 | 2-4 | 2-14 |
| 2-214A | 2-17 | 2-4 | 2-4 |
| 2-215A | 2-4 | 2-4 | 2-15 |
| 2-216A | 2-13 | 2-4 | 2-4 |
| 2-217A | 2-4 | 2-4 | 2-16 |
| 2-218A | 2-4 | 2-4 | 2-13 |
| 2-219A | 2-16 | 2-4 | 2-4 |
| 2-220A | 2-4 | 2-4 | 2-12 |
| 2-221A | 2-4 | 2-4 | 2-17 |
| 2-222A | 2-4 | 2-16 | 2-4 |
| 2-223A | 2-4 | 2-15 | 2-4 |
| 2-224A | 2-4 | 2-14 | 2-4 |
| 2-225A | 2-4 | 2-17 | 2-4 |
| 2-226A | 2-19 | 2-4 | 2-4 |
| 2-227A | 2-22 | 2-4 | 2-4 |
| 2-228A | 2-18 | 2-4 | 2-4 |
| 2-229A | 2-23 | 2-4 | 2-4 |
| 2-230A | 2-21 | 2-4 | 2-4 |
| 2-231A | 2-20 | 2-4 | 2-4 |
| 2-232A | 2-4 | 2-23 | 2-4 |
| 2-233A | 2-4 | 2-18 | 2-4 |
| 2-234A | 2-4 | 2-21 | 2-4 |
| 2-235A | 2-4 | 2-19 | 2-4 |
| 2-236A | 2-5 | 2-2 | 2-4 |
| 2-237A | 2-5 | 2-1 | 2-4 |
| 2-238A | 2-2 | 2-2 | 2-4 |
| 2-239A | 2-4 | 2-23 | 2-1 |
| 2-240A | 2-6 | 2-10 | 2-4 |
| 2-241A | 2-4 | 2-4 | 2-29 |
| 2-242A | 2-7 | 2-4 | 2-10 |
| 2-243A | 2-11 | 2-4 | 2-10 |
| 2-244A | 2-4 | 2-10 | 2-6 |
| 2-245A | 2-11 | 2-11 | 2-4 |
| 2-246A | 2-11 | 2-11 | 2-5 |
| 2-247A | 2-11 | 2-11 | 2-10 |
| 2-248A | 2-7 | 2-9 | 2-4 |
| 2-249A | 2-4 | 2-4 | 2-25 |
| 2-250A | 2-11 | 2-15 | 2-4 |
| 2-251A | 2-18 | 2-28 | 2-4 |
| 2-252A | 2-23 | 2-10 | 2-4 |
| 2-253A | 2-4 | 2-27 | 2-4 |
| 2-254A | 2-6 | 2-18 | 2-4 |
| 2-255A | 2-4 | 2-23 | 2-5 |
| 2-256A | 2-23 | 2-4 | 2-14 |
| 2-257A | 2-17 | 2-4 | 2-14 |
| 2-258A | 2-14 | 2-4 | 2-12 |
| 2-259A | 2-17 | 2-4 | 2-12 |
| 2-260A | 2-14 | 2-16 | 2-2 |
| 2-261A | 2-17 | 2-5 | 2-14 |
| 2-262A | 2-17 | 2-13 | 2-17 |
| 2-263A | 2-17 | 2-14 | 2-12 |
| 2-264A | 2-17 | 2-12 | 2-12 |
| 2-265A | 2-5 | 2-1 | 2-18 |
| 2-266A | 2-4 | 2-29 | 2-4 |
| 2-267A | 2-4 | 2-31 | 2-4 |
| 2-268A | 2-4 | 2-33 | 2-4 |
| 2-269A | 2-4 | 2-35 | 2-4 |

In one or more embodiments, the second compound represented by Formula 2A or 2B may be represented by one selected from Formulae 2-201B to 2-215B (denoting a formula based on Formulae 2B), wherein rings $A_{21}$ and $A_{23}$ in Formulae 2-201B to 2-215B are each selected from the formulae shown in Table 1B:

TABLE 1B

| Formula No. | Formula No. of Ring $A_{21}$ | Formula No. of Ring $A_{22}$ | Formula No. of Ring $A_{23}$ |
|---|---|---|---|
| 2-201B | 2-4 | — | 2-19 |
| 2-202B | 2-4 | — | 2-22 |
| 2-203B | 2-4 | — | 2-18 |
| 2-204B | 2-4 | — | 2-23 |
| 2-205B | 2-4 | — | 2-21 |
| 2-206B | 2-4 | — | 2-20 |
| 2-207B | 2-5 | — | 2-23 |
| 2-208B | 2-7 | — | 2-23 |
| 2-209B | 2-4 | — | 2-26 |
| 2-210B | 2-7 | — | 2-22 |
| 2-211B | 2-13 | — | 2-16 |
| 2-212B | 2-5 | — | 2-19 |
| 2-213B | 2-7 | — | 2-20 |
| 2-214B | 2-19 | — | 2-18 |
| 2-215B | 2-18 | — | 2-18 |

In one or more embodiments, the second compound represented by Formula 2A or 2B may be represented by one selected from Formulae 2-301A to 2-419A and 2-421A to 2-431A (denoting a formula based on Formula 2A), wherein rings $A_{21}$, $A_{22}$, and $A_{23}$ in Formulae 2-301A to 2-419A and 2-421A to 2-431A are each selected from the formulae shown in Table 2A:

TABLE 2A

| Formula No. | Formula No. of Ring $A_{21}$ | Formula No. of Ring $A_{22}$ | Formula No. of Ring $A_{23}$ |
|---|---|---|---|
| 2-301A | 2-104 | 2-147 | 2-104 |
| 2-302A | 2-102 | 2-104 | 2-104 |
| 2-303A | 2-104 | 2-104 | 2-101 |
| 2-304A | 2-104 | 2-104 | 2-102 |
| 2-305A | 2-104 | 2-104 | 2-103 |
| 2-306A | 2-104 | 2-101 | 2-104 |
| 2-307A | 2-104 | 2-102 | 2-104 |
| 2-308A | 2-104 | 2-104 | 2-147 |
| 2-309A | 2-157 | 2-104 | 2-104 |
| 2-310A | 2-104 | 2-104 | 2-157 |
| 2-311A | 2-104 | 2-147 | 2-107 |
| 2-312A | 2-104 | 2-149 | 2-104 |
| 2-313A | 2-104 | 2-156 | 2-104 |
| 2-314A | 2-107 | 2-147 | 2-106 |
| 2-315A | 2-104 | 2-151 | 2-104 |
| 2-316A | 2-104 | 2-147 | 2-106 |
| 2-317A | 2-104 | 2-148 | 2-104 |
| 2-318A | 2-104 | 2-150 | 2-104 |
| 2-319A | 2-106 | 2-147 | 2-104 |
| 2-320A | 2-104 | 2-106 | 2-147 |
| 2-321A | 2-157 | 2-107 | 2-104 |
| 2-322A | 2-106 | 2-104 | 2-147 |
| 2-323A | 2-104 | 2-107 | 2-147 |
| 2-324A | 2-107 | 2-104 | 2-147 |
| 2-325A | 2-104 | 2-104 | 2-160 |
| 2-326A | 2-104 | 2-111 | 2-157 |
| 2-327A | 2-108 | 2-104 | 2-158 |
| 2-328A | 2-111 | 2-104 | 2-157 |
| 2-329A | 2-107 | 2-147 | 2-104 |
| 2-330A | 2-104 | 2-104 | 2-135 |
| 2-331A | 2-104 | 2-141 | 2-104 |
| 2-332A | 2-104 | 2-142 | 2-104 |
| 2-333A | 2-107 | 2-104 | 2-135 |
| 2-334A | 2-104 | 2-111 | 2-135 |
| 2-335A | 2-104 | 2-143 | 2-104 |
| 2-336A | 2-106 | 2-142 | 2-104 |
| 2-337A | 2-107 | 2-142 | 2-106 |
| 2-338A | 2-104 | 2-104 | 2-169 |
| 2-339A | 2-184 | 2-104 | 2-104 |
| 2-340A | 2-104 | 2-104 | 2-182 |

TABLE 2A-continued

| Formula No. | Formula No. of Ring $A_{21}$ | Formula No. of Ring $A_{22}$ | Formula No. of Ring $A_{23}$ |
|---|---|---|---|
| 2-341A | 2-168 | 2-104 | 2-104 |
| 2-342A | 2-104 | 2-104 | 2-183 |
| 2-343A | 2-104 | 2-104 | 2-168 |
| 2-344A | 2-183 | 2-104 | 2-104 |
| 2-345A | 2-104 | 2-104 | 2-167 |
| 2-346A | 2-104 | 2-104 | 2-184 |
| 2-347A | 2-104 | 2-183 | 2-104 |
| 2-348A | 2-104 | 2-182 | 2-104 |
| 2-349A | 2-104 | 2-169 | 2-104 |
| 2-350A | 2-104 | 2-184 | 2-104 |
| 2-351A | 2-107 | 2-104 | 2-179 |
| 2-352A | 2-111 | 2-104 | 2-169 |
| 2-353A | 2-104 | 2-111 | 2-182 |
| 2-354A | 2-106 | 2-104 | 2-185 |
| 2-355A | 2-171 | 2-104 | 2-104 |
| 2-356A | 2-104 | 2-104 | 2-115 |
| 2-357A | 2-104 | 2-104 | 2-178 |
| 2-358A | 2-104 | 2-106 | 2-167 |
| 2-359A | 2-108 | 2-105 | 2-167 |
| 2-360A | 2-105 | 2-104 | 2-167 |
| 2-361A | 2-112 | 2-104 | 2-184 |
| 2-362A | 2-104 | 2-192 | 2-104 |
| 2-363A | 2-107 | 2-182 | 2-106 |
| 2-364A | 2-104 | 2-169 | 2-105 |
| 2-365A | 2-105 | 2-184 | 2-104 |
| 2-366A | 2-105 | 2-169 | 2-105 |
| 2-367A | 2-198 | 2-104 | 2-104 |
| 2-368A | 2-201 | 2-104 | 2-104 |
| 2-369A | 2-197 | 2-104 | 2-104 |
| 2-370A | 2-202 | 2-104 | 2-104 |
| 2-371A | 2-200 | 2-104 | 2-104 |
| 2-372A | 2-199 | 2-104 | 2-104 |
| 2-373A | 2-104 | 2-202 | 2-104 |
| 2-374A | 2-104 | 2-197 | 2-104 |
| 2-375A | 2-104 | 2-200 | 2-104 |
| 2-376A | 2-104 | 2-198 | 2-104 |
| 2-377A | 2-209 | 2-104 | 2-104 |
| 2-378A | 2-207 | 2-104 | 2-104 |
| 2-379A | 2-200 | 2-106 | 2-104 |
| 2-380A | 2-104 | 2-208 | 2-104 |
| 2-381A | 2-105 | 2-198 | 2-108 |
| 2-382A | 2-202 | 2-102 | 2-104 |
| 2-383A | 2-202 | 2-101 | 2-106 |
| 2-384A | 2-102 | 2-102 | 2-107 |
| 2-385A | 2-104 | 2-202 | 2-101 |
| 2-386A | 2-123 | 2-147 | 2-104 |
| 2-387A | 2-104 | 2-104 | 2-218 |
| 2-388A | 2-116 | 2-104 | 2-147 |
| 2-389A | 2-157 | 2-104 | 2-147 |
| 2-390A | 2-107 | 2-147 | 2-115 |
| 2-391A | 2-157 | 2-157 | 2-104 |
| 2-392A | 2-157 | 2-157 | 2-114 |
| 2-393A | 2-157 | 2-157 | 2-147 |
| 2-394A | 2-116 | 2-147 | 2-104 |
| 2-395A | 2-104 | 2-104 | 2-210 |
| 2-396A | 2-157 | 2-182 | 2-104 |
| 2-397A | 2-197 | 2-213 | 2-104 |
| 2-398A | 2-202 | 2-167 | 2-104 |
| 2-399A | 2-104 | 2-216 | 2-104 |
| 2-400A | 2-124 | 2-197 | 2-104 |
| 2-401A | 2-104 | 2-202 | 2-114 |
| 2-402A | 2-168 | 2-104 | 2-169 |
| 2-403A | 2-184 | 2-104 | 2-169 |
| 2-404A | 2-169 | 2-104 | 2-167 |
| 2-405A | 2-184 | 2-106 | 2-167 |
| 2-406A | 2-169 | 2-183 | 2-102 |
| 2-407A | 2-184 | 2-114 | 2-169 |
| 2-408A | 2-184 | 2-168 | 2-184 |
| 2-409A | 2-184 | 2-104 | 2-167 |
| 2-410A | 2-184 | 2-167 | 2-167 |
| 2-411A | 2-114 | 2-101 | 2-197 |
| 2-412A | 2-104 | 2-149 | 2-104 |
| 2-413A | 2-106 | 2-104 | 2-147 |
| 2-414A | 2-104 | 2-104 | 2-168 |
| 2-415A | 2-200 | 2-106 | 2-104 |
| 2-416A | 2-104 | 2-104 | 2-183 |
| 2-417A | 2-104 | 2-104 | 2-101 |

TABLE 2A-continued

| Formula No. | Formula No. of Ring $A_{21}$ | Formula No. of Ring $A_{22}$ | Formula No. of Ring $A_{23}$ |
|---|---|---|---|
| 2-418A | 2-105 | 2-169 | 2-105 |
| 2-419A | 2-104 | 2-147 | 2-107 |
| 2-421A | 2-104 | 2-218 | 2-104 |
| 2-422A | 2-104 | 2-226 | 2-104 |
| 2-423A | 2-104 | 2-222 | 2-104 |
| 2-424A | 2-104 | 2-228 | 2-104 |
| 2-425A | 2-104 | 2-151 | 2-104 |
| 2-426A | 2-106 | 2-147 | 2-107 |
| 2-427A | 2-104 | 2-147 | 2-106 |
| 2-428A | 2-107 | 2-150 | 2-104 |
| 2-429A | 2-104 | 2-143 | 2-104 |
| 2-430A | 2-107 | 2-142 | 2-106 |
| 2-431A | 2-104 | 2-142 | 2-104 |

In one or more embodiments, the second compound represented by Formula 2A or 2B may be represented by one of Formulae 2-301B to 2-320B (denoting a formula based on Formula 2B), wherein rings $A_{21}$ and $A_{23}$ in Formulae 2-301B to 2-320B are each selected from the formulae shown in Table 2B:

TABLE 2B

| Formula No. | Formula No. of Ring $A_{21}$ | Formula No. of Ring $A_{22}$ | Formula No. of Ring $A_{23}$ |
|---|---|---|---|
| 2-301B | 2-104 | — | 2-198 |
| 2-302B | 2-104 | — | 2-201 |
| 2-303B | 2-104 | — | 2-197 |
| 2-304B | 2-104 | — | 2-202 |
| 2-305B | 2-104 | — | 2-200 |
| 2-306B | 2-104 | — | 2-199 |
| 2-307B | 2-104 | — | 2-203 |
| 2-308B | 2-104 | — | 2-204 |
| 2-309B | 2-106 | — | 2-205 |
| 2-310B | 2-104 | — | 2-206 |
| 2-311B | 2-112 | — | 2-199 |
| 2-312B | 2-114 | — | 2-202 |
| 2-313B | 2-116 | — | 2-202 |
| 2-314B | 2-104 | — | 2-214 |
| 2-315B | 2-130 | — | 2-201 |
| 2-316B | 2-168 | — | 2-183 |
| 2-317B | 2-114 | — | 2-198 |
| 2-318B | 2-116 | — | 2-199 |
| 2-319B | 2-198 | — | 2-197 |
| 2-320B | 2-197 | — | 2-197 |

In Formulae 2A and 2B, $X_{21}$ may be selected from O, S, Se, $C(R_{23})(R_{24})$, $Si(R_{23})(R_{24})$, and $N\text{-}[(L_{21})_{a21}\text{-}(R_{21})_{b21}]$.

In one embodiment, in Formulae 2A and 2B, $X_{21}$ may be $N[(L_{21})_{a21}\text{-}(R_{21})_{b21}]$.

In one or more embodiments, in Formulae 2A and 2B, $X_{21}$ may be O, S, Se, $C(R_{23})(R_{24})$, or $Si(R_{23})(R_{24})$, and at least one selected from rings $A_{21}$, $A_{22}$, and $A_{23}$ in Formula 2A and at least one selected from rings $A_{21}$ and $A_{23}$ in Formula 2B may each independently be selected from groups represented by Formulae 2-1 to 2-3, 2-10 to 2-27, and 2-33 to 2-36, and $X_{22}$ or $X_{23}$ in Formulae 2-1 to 2-3, 2-10 to 2-27, and 2-33 to 2-36 may be $N\text{-}[(L_{22})_{a22}\text{-}(R_{22})_{b22}]$.

In one or more embodiments, in Formulae 2A and 2B, $X_{21}$ may be O, S, Se, $C(R_{23})(R_{24})$, or $Si(R_{23})(R_{24})$, and at least one selected from rings $A_{21}$, $A_{22}$, and $A_{23}$ in Formula 2A and at least one selected from rings $A_{21}$ and $A_{23}$ in Formula 2B may each independently be selected from groups represented by Formulae 2-101 to 2-103, 2-147 to 2-211, 2-214 to 2-219, and 2-226 to 2-229, and $X_{22}$ or $X_{23}$ in Formulae 2-101 to 2-103, 2-147 to 2-211, 2-214 to 2-219, and 2-226 to 2-229 may be $N\text{-}[(L_{22})_{a22}\text{-}(R_{22})_{b22}]$, but embodiments of the present disclosure are not limited thereto.

In Formulae 2A and 2B, $X_{21}$ may be O, S, Se, $C(R_{23})(R_{24})$, $Si(R_{23})(R_{24})$, or $N\text{-}[(L_{21})_{a21}\text{-}(R_{21})_{b21}]$, and $X_{22}$ and $X_{23}$ may each independently be O, S, Se, $C(R_{25})(R_{26})$, $Si(R_{25})(R_{26})$, or $N\text{-}[(L_{22})_{a22}\text{-}(R_{22})_{b22}]$. $L_{21}$, $L_{22}$, a21, a22, $R_{21}$ to $R_{26}$, b21, and b22 may each independently be the same as described herein.

In Formulae 1A, 1B, 2A, and 2B, $L_1$, $L_2$, $L_{21}$, and $L_{22}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In some embodiments, in Formulae 1A, 1B, 2A, and 2B, $L_1$, $L_2$, $L_{21}$, and $L_{22}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkyl group, a $C_6$-$C_{20}$ aryl group, a $C_3$-$C_{20}$ heteroaryl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $L_1$ and $L_2$ are each not a substituted or unsubstituted carbazolylene group, a substituted or unsubstituted dibenzofuranylene group, or a substituted or unsubstituted dibenzothiophenylene group, and $Q_1$ to $Q_3$ and $Q_{31}$ to $Q_{33}$ may each independently be selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group, but embodiments of the present disclosure are not limited thereto.

In one embodiment, in Formulae 1A and 1B, $L_1$ and $L_2$ may each independently be selected from groups represented by Formulae 3-1 to 3-14 and 3-17 to 3-22, in Formulae 2A and 2B, $L_{21}$ and $L_{22}$ may each independently be selected from groups represented by Formulae 3-1 to 3-100, and when $L_1$ and $L_2$ are each independently selected from groups represented by Formulae 3-17 to 3-20, $Y_1$ in Formulae 3-17 to 3-20 may be C($Z_3$)($Z_4$):

Formula 3-1

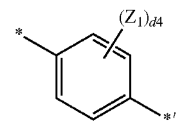

Formula 3-2

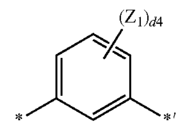

Formula 3-3

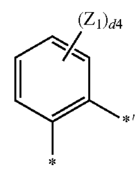

Formula 3-4

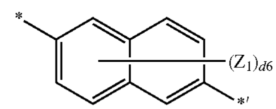

Formula 3-5

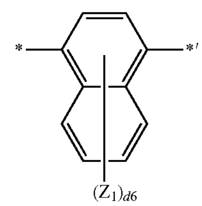

Formula 3-6

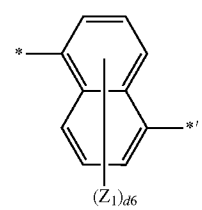

Formula 3-7

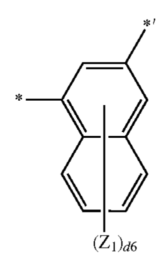

Formula 3-8

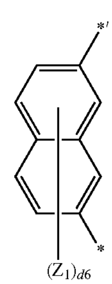

Formula 3-9
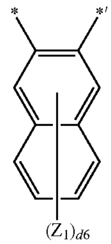
Formula 3-10
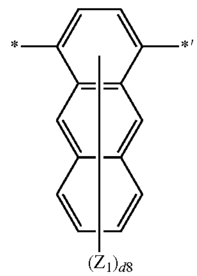
Formula 3-11
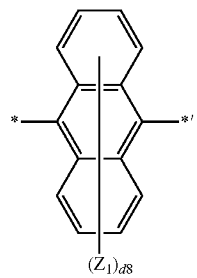
Formula 3-12
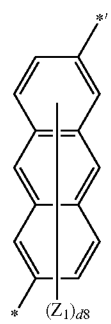
Formula 3-13
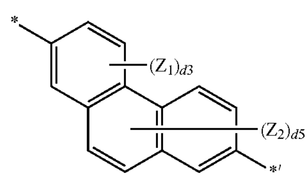
Formula 3-14
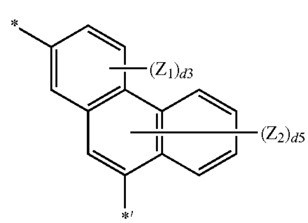
Formula 3-15
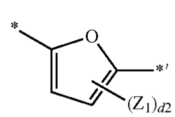
Formula 3-16
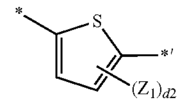
Formula 3-17
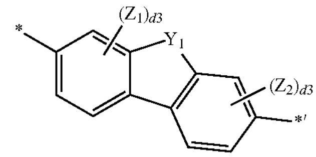
Formula 3-18
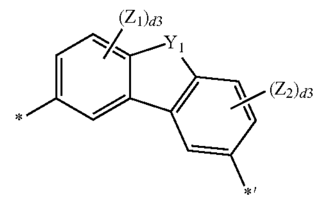
Formula 3-19
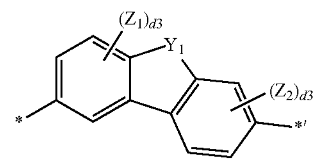
Formula 3-20
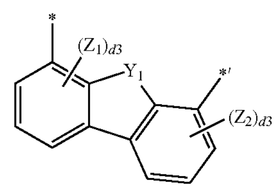
Formula 3-21
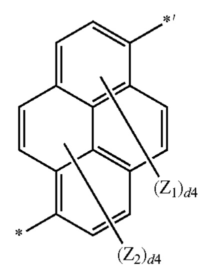
Formula 3-22
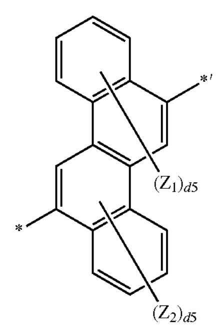
Formula 3-23
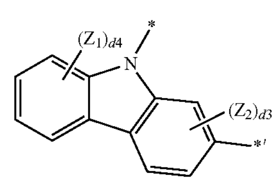

-continued
Formula 3-24
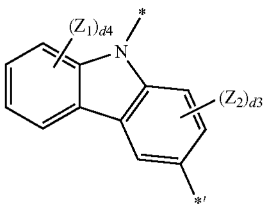
Formula 3-25
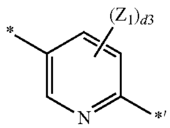
Formula 3-26
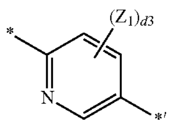
Formula 3-27
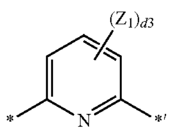
Formula 3-28
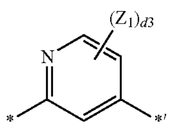
Formula 3-29
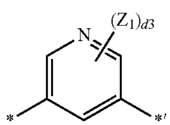
Formula 3-30
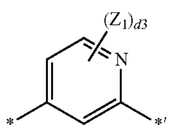
Formula 3-31
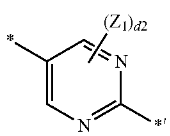
Formula 3-32
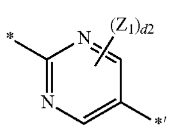
Formula 3-33
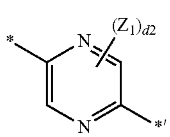
Formula 3-34
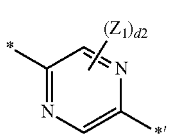
-continued
Formula 3-35
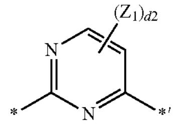
Formula 3-36
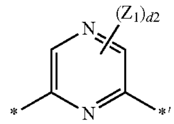
Formula 3-37
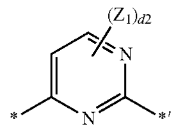
Formula 3-38
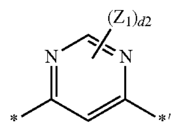
Formula 3-39
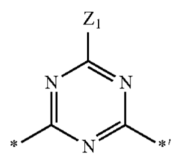
Formula 3-40
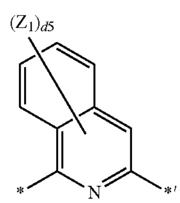
Formula 3-41
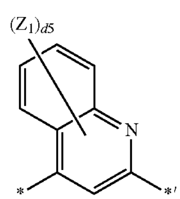
Formula 3-42
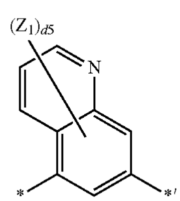
Formula 3-43
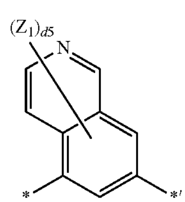

-continued
Formula 3-44
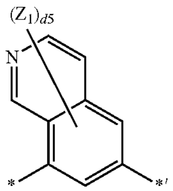
Formula 3-45
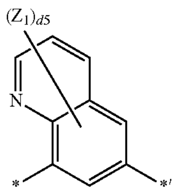
Formula 3-46
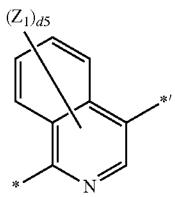
Formula 3-47
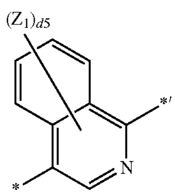
Formula 3-48
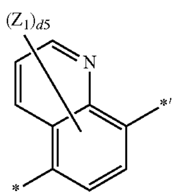
Formula 3-49
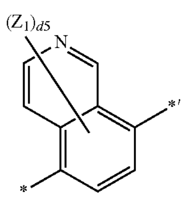
Formula 3-50
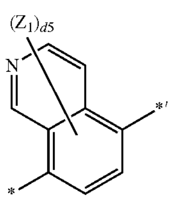
Formula 3-51
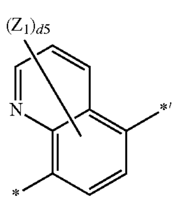
-continued
Formula 3-52
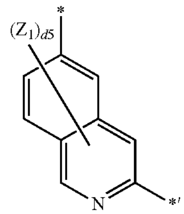
Formula 3-53
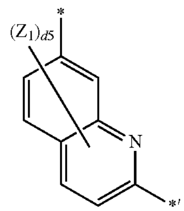
Formula 3-54
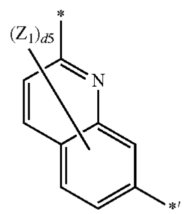
Formula 3-55
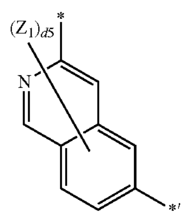
Formula 3-56
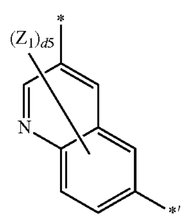
Formula 3-57
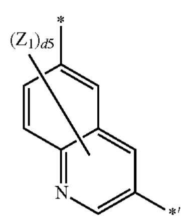
Formula 3-58
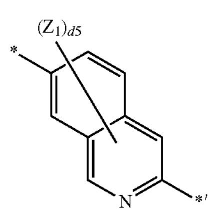

-continued
Formula 3-59
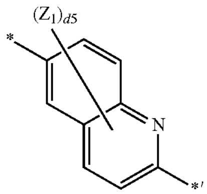
Formula 3-61
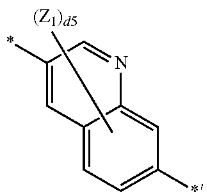
Formula 3-62
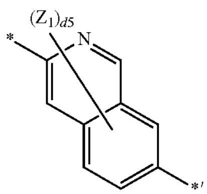
Formula 3-63
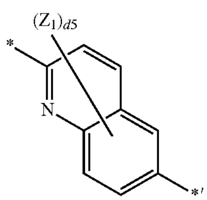
Formula 3-64
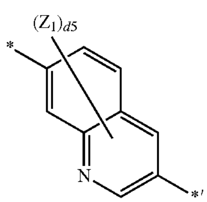
Formula 3-65
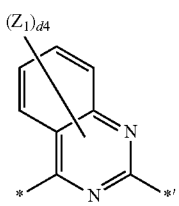
Formula 3-66
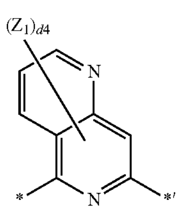
Formula 3-67
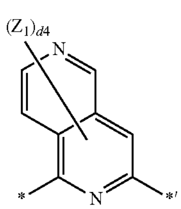
-continued
Formula 3-68
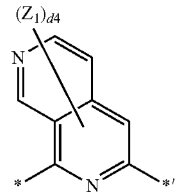
Formula 3-69
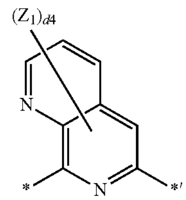
Formula 3-70
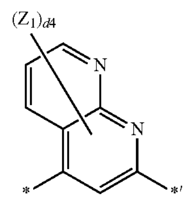
Formula 3-71
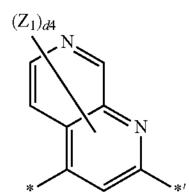
Formula 3-72
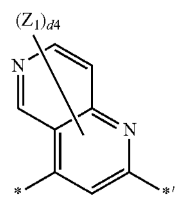
Formula 3-73
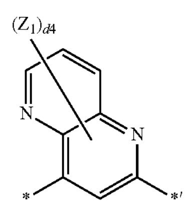
Formula 3-74
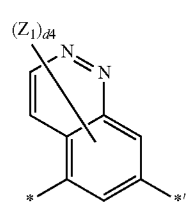
Formula 3-75
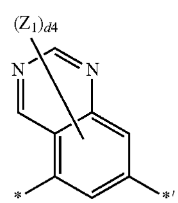

-continued
Formula 3-76
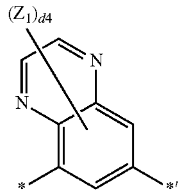
Formula 3-77
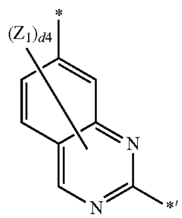
Formula 3-78
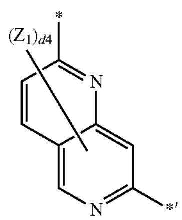
Formula 3-79
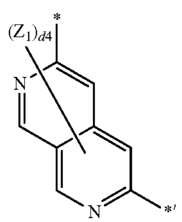
Formula 3-80
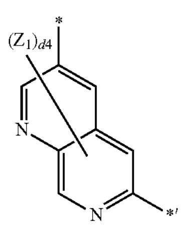
Formula 3-81
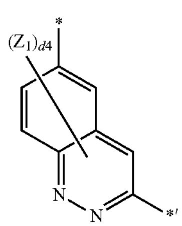
Formula 3-82
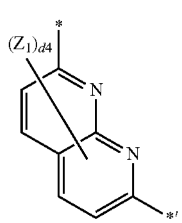
-continued
Formula 3-83
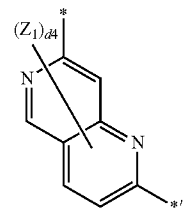
Formula 3-84
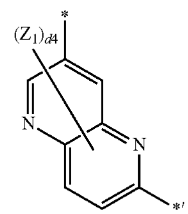
Formula 3-85
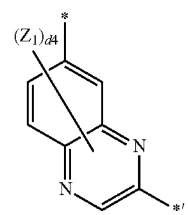
Formula 3-86
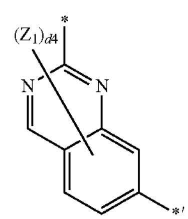
Formula 3-87
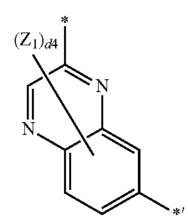
Formula 3-88
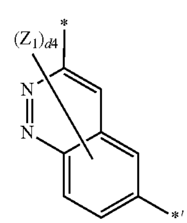
Formula 3-89
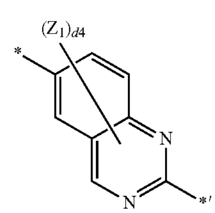

-continued

Formula 3-90

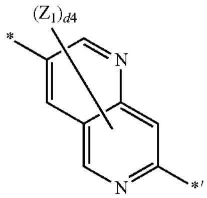

Formula 3-91

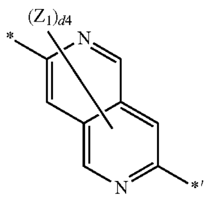

Formula 3-92

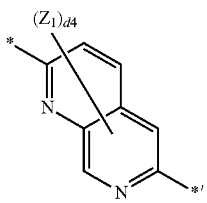

Formula 3-93

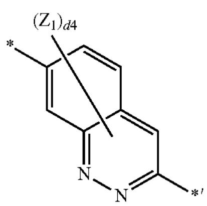

Formula 3-94

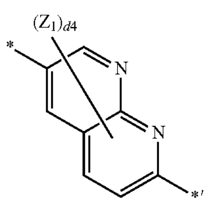

Formula 3-95

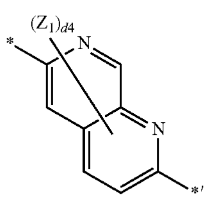

Formula 3-96

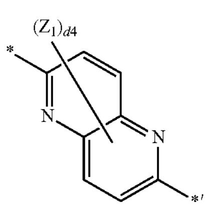

Formula 3-97

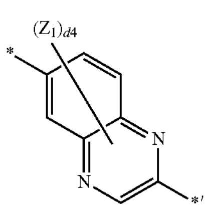

-continued

Formula 3-98

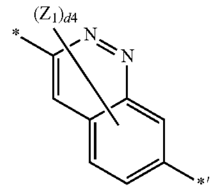

Formula 3-99

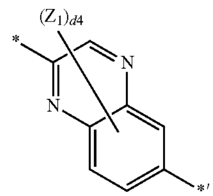

Formula 3-100

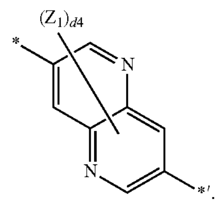

In Formulae 3-1 to 3-100, $Y_1$ may be O, S, $C(Z_3)(Z_4)$, $N(Z_5)$, or $Si(Z_6)(Z_7)$, $Z_1$ to $Z_7$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{31}$ to $Q_{33}$ may each independently be the same as described herein, d2 may be an integer selected from 0 to 2, d3 may be an integer selected from 0 to 3, d4 may be an integer selected from 0 to 4, d5 may be an integer selected from 0 to 5, d6 may be an integer selected from 0 to 6, d8 may be an integer selected from 0 to 8, and

* and *' may each independently indicate a binding site to an adjacent atom.

In Formulae 1A, 1B, 2A, and 2B, a1 indicates the number of $L_1$(s), and a1 may be an integer selected from 0 to 5. When a1 is 0, *-$(L_1)_{a1}$-*' may be a single bond, and when a1 is 2 or greater, a plurality of $L_1$(s) may be identical to or different from each other. a2, a21, and a22 may each independently be the same as described herein in connection with a1 and Formulae 1A, 1B, 2A, and 2B.

In some embodiments, a1, a2, a21, and a22 may each independently be 0, 1, or 2.

In Formulae 1A and 1B, $Ar_1$ and $Ar_2$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In Formulae 1A and 1B, b1 indicates the number of $Ar_1$(s), and b1 may be an integer selected from 1 to 5. When b1 is 2 or greater, a plurality of $Ar_1$(s) may be identical to or different from each other. b2 may be the same as described herein in connection with b1 and Formulae 1A and 1B.

In Formulae 1A and 1B, b1 and b2 may each independently be an integer selected from 1 to 5. In some embodiments, b1 and b2 may each independently be 1 or 2, but embodiments of the present disclosure are not limited thereto.

$R_1$ to $R_4$, $R_{21}$ to $R_{24}$, $R_{27}$, and $R_{28}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$.

In some embodiments, in Formulae 1A and 1B, $R_1$ to $R_4$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a phenanthrenyl group, an anthracenyl group, a fluorenyl group, a dimethyl-fluorenyl group, a diphenyl-fluorenyl group, and —$Si(Q_1)(Q_2)(Q_3)$, wherein $Q_1$ to $Q_3$ may each independently be the same as described herein.

In one embodiment, $Ar_1$, $Ar_2$, $R_{21}$, and $R_{22}$ may each independently be selected from the group consisting of:

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkyl group, a $C_6$-$C_{20}$ aryl group, a $C_3$-$C_{20}$ heteroaryl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), or $R_{22}$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, —Si($Q_1$)($Q_2$)($Q_3$), —S(=O)$_2$($Q_1$), and —P(=O)($Q_1$)($Q_2$), wherein $Ar_1$ and $Ar_2$ are each not a substituted or unsubstituted carbazolyl group, a substituted or unsubstituted dibenzofuranyl group, or a substituted or unsubstituted dibenzothiophenyl group, wherein $Q_1$ to $Q_3$ and $Q_{31}$ to $Q_{33}$ may each independently be the same as described herein.

In some embodiments, in Formulae 1A and 1B, $Ar_1$ and $Ar_2$ may each independently be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a spiro-benzofluorene-fluorenyl group, an indenofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a tetraphenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a triazinyl group, an imidazopyridinyl group, an imidazopyrimidinyl group, a benzofuranyl group, and a benzothiophenyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a spiro-benzofluorene-fluorenyl group, an indenofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a tetraphenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a triazinyl group, an imidazopyridinyl group, an imidazopyrimidinyl group, a benzofuranyl group, and a benzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkyl group, a $C_6$-$C_{20}$ aryl group, a $C_3$-$C_{20}$ heteroaryl group (e.g., a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a spiro-benzofluorene-fluorenyl group, an indenofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a tetraphenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a triazinyl group, an imidazopyridinyl group, an imidazopyrimidinyl group, a benzofuranyl group, and/or a benzothiophenyl group, etc.), —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be the same as described herein.

In one or more embodiments, in Formulae 1A and 1B, $Ar_1$ and $Ar_2$ may each independently be selected from groups represented by Formulae 5-1 to 5-44, in Formulae 1A and 1B, when $Ar_1$ and $Ar_2$ are each independently selected from groups represented by Formulae 5-13 to 5-36 and 5-43, $Y_{31}$ and $Y_{32}$ in Formulae 5-13 to 5-36 and 5-43 may each independently be $C(Z_{33})(Z_{34})$, in Formulae 2A and 2B, $R_{21}$ may be selected from groups represented by Formulae 5-1 to 5-45 and 6-1 to 6-124, and in Formulae 2A and 2B, $R_{22}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a group represented by any of Formulae 5-1 to 5-45 and 6-1 to 6-124, —$Si(Q_1)(Q_2)(Q_3)$, —$S(=O)_2(Q_1)$, and —$P(=O)(Q_1)(Q_2)$, but embodiments of the present disclosure are not limited thereto:

Formula 5-1

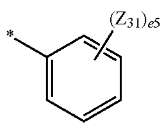

Formula 5-2

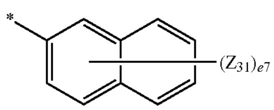

Formula 5-3

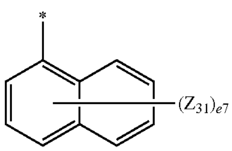

Formula 5-4

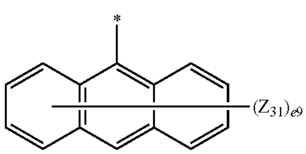

Formula 5-5

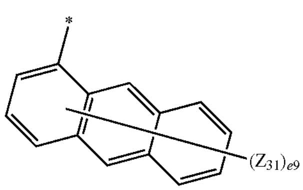

Formula 5-6

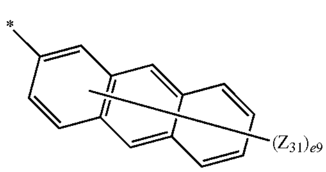

Formula 5-7

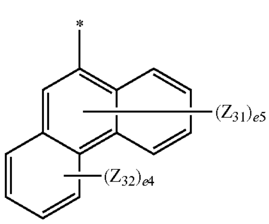

-continued

Formula 5-8

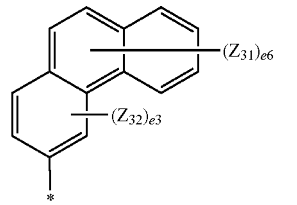

Formula 5-9

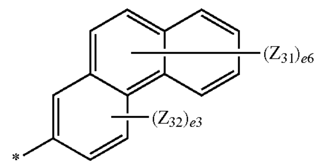

Formula 5-10

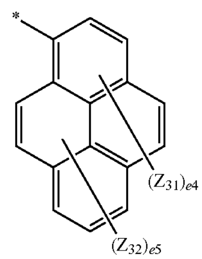

Formula 5-11

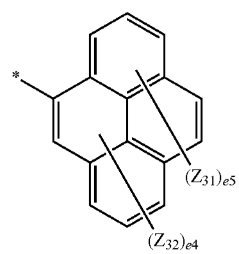

Formula 5-12

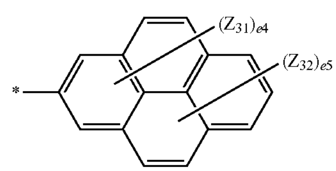

Formula 5-13

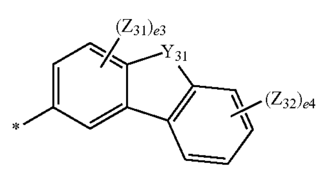

Formula 5-14

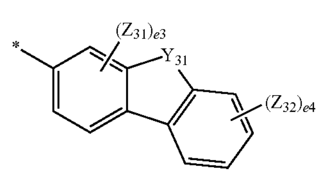

Formula 5-15

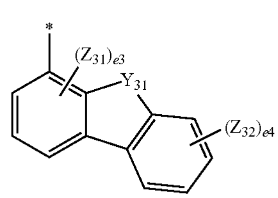

-continued
Formula 5-16
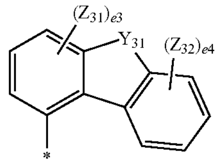
Formula 5-17
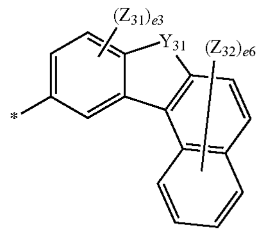
Formula 5-18
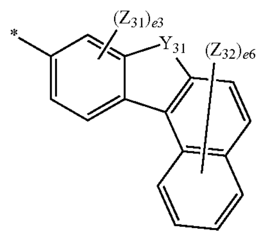
Formula 5-19
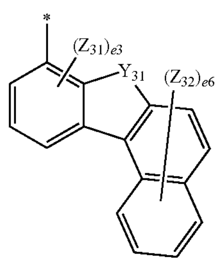
Formula 5-20
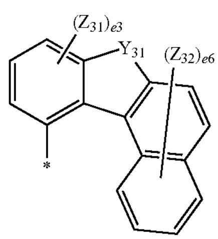
Formula 5-21
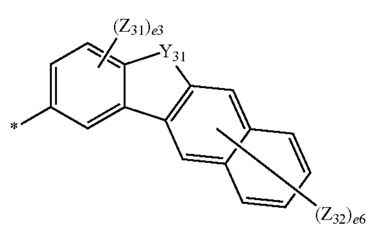
Formula 5-22
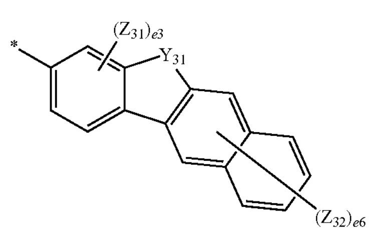
-continued
Formula 5-23
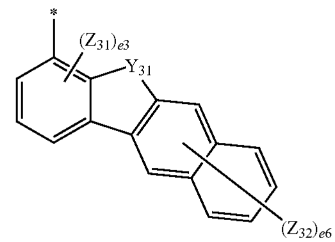
Formula 5-24
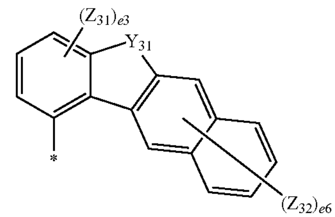
Formula 5-25
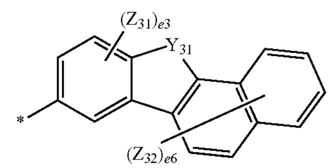
Formula 5-26
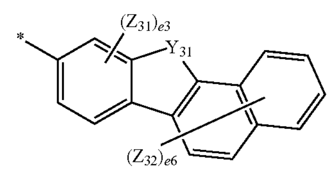
Formula 5-27
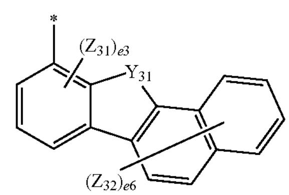
Formula 5-28
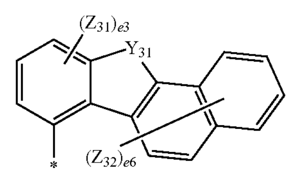
Formula 5-29
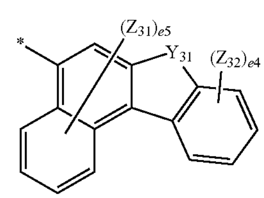
Formula 5-30
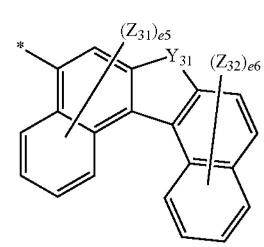

Formula 5-31
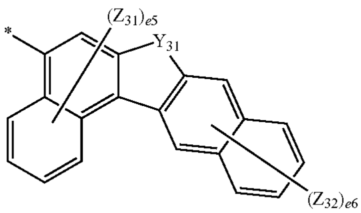
Formula 5-32
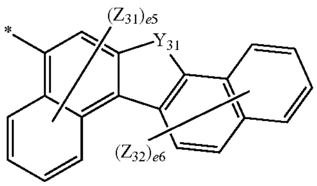
Formula 5-33
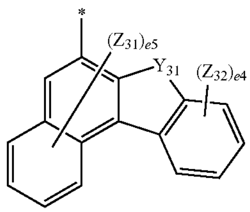
Formula 5-34
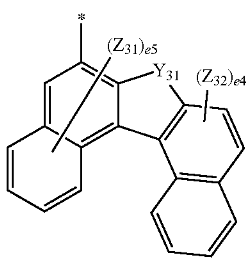
Formula 5-35
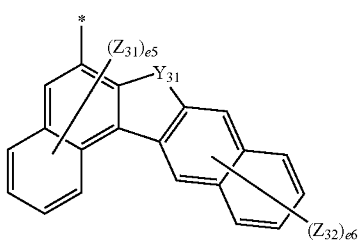
Formula 5-36
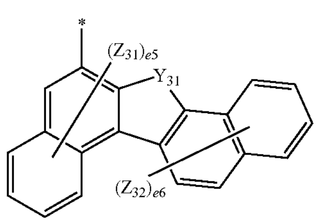
Formula 5-37
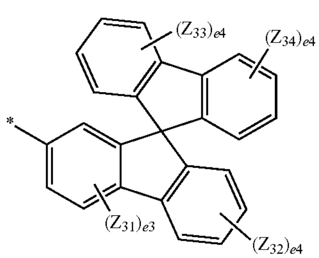
Formula 5-38
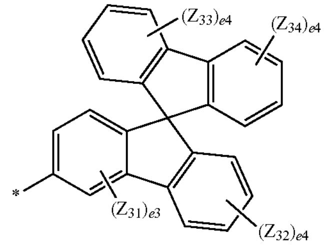
Formula 5-39
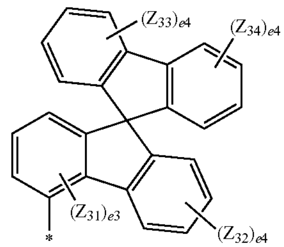
Formula 5-40
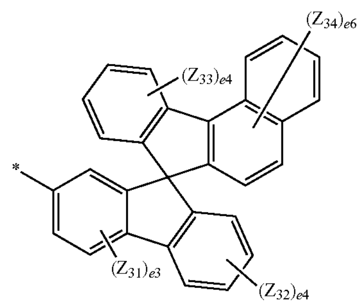
Formula 5-41
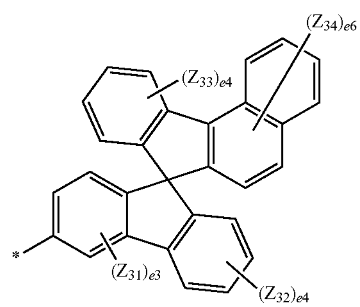
Formula 5-42
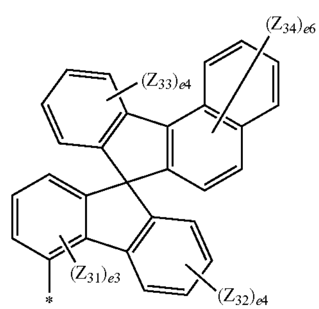
Formula 5-43
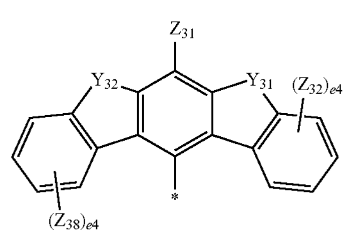

-continued
Formula 5-44
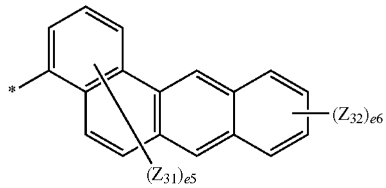
Formula 5-45
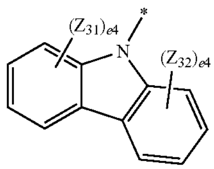
Formula 6-1
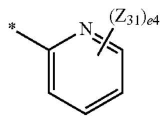
Formula 6-2
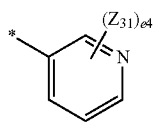
Formula 6-3
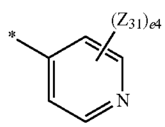
Formula 6-4
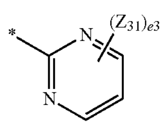
Formula 6-5
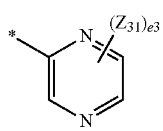
Formula 6-6
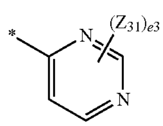
Formula 6-7
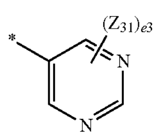
Formula 6-8
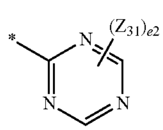
Formula 6-9
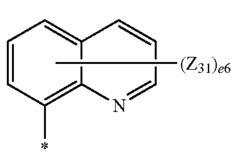
-continued
Formula 6-10
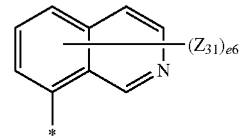
Formula 6-11
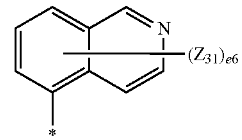
Formula 6-12
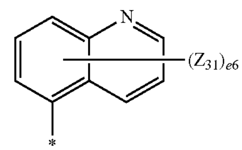
Formula 6-13
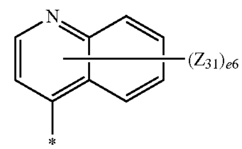
Formula 6-14
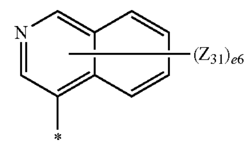
Formula 6-15
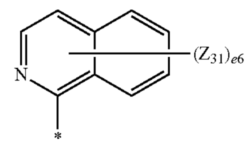
Formula 6-16
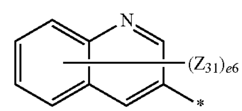
Formula 6-17
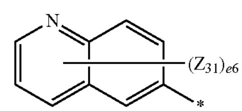
Formula 6-18
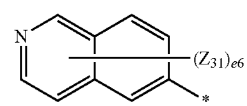
Formula 6-19
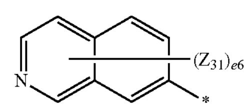
Formula 6-20
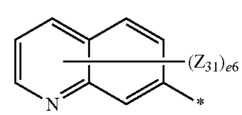
Formula 6-21
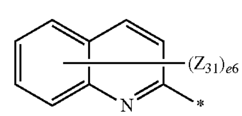

-continued
Formula 6-22
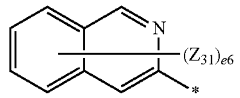
Formula 6-23
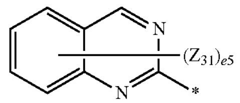
Formula 6-24
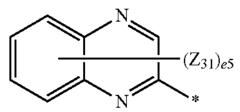
Formula 6-25
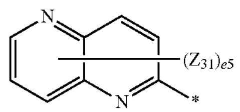
Formula 6-26
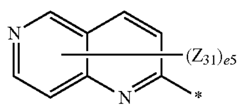
Formula 6-27
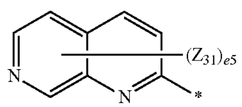
Formula 6-28
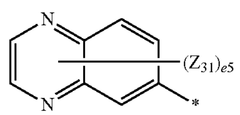
Formula 6-29
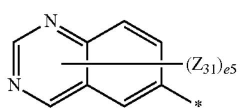
Formula 6-30
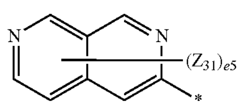
Formula 6-31
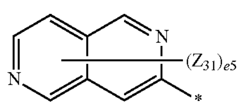
Formula 6-32
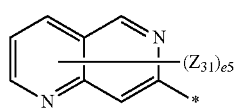
Formula 6-33
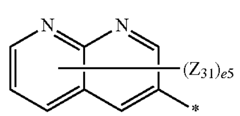
Formula 6-34
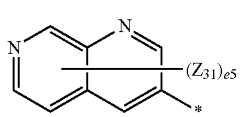
Formula 6-35
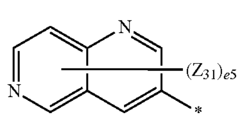
-continued
Formula 6-36
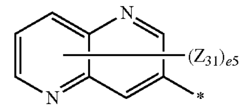
Formula 6-37
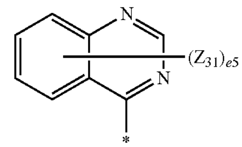
Formula 6-38
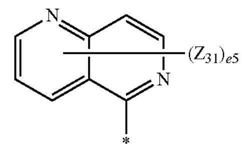
Formula 6-39
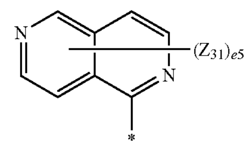
Formula 6-40
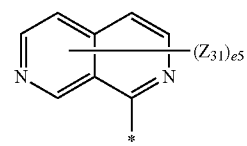
Formula 6-41
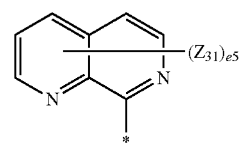
Formula 6-42
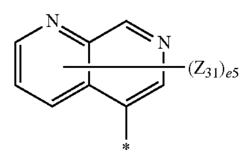
Formula 6-43
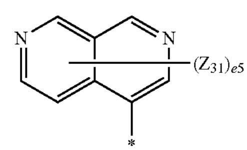
Formula 6-44
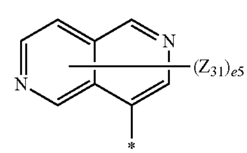
Formula 6-45
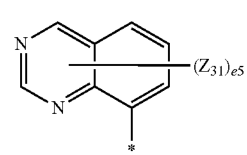

-continued
Formula 6-46
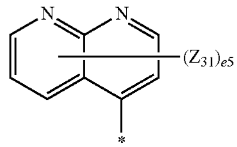
Formula 6-47
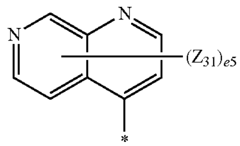
Formula 6-48
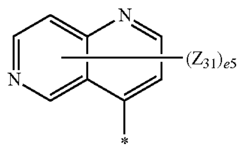
Formula 6-49
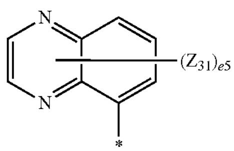
Formula 6-50
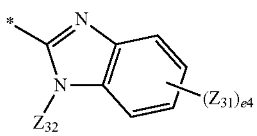
Formula 6-51
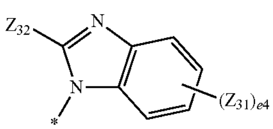
Formula 6-52
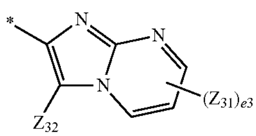
Formua 6-53
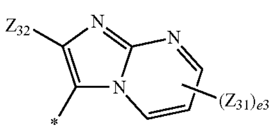
Formula 6-54
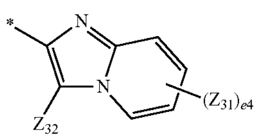
Formula 6-55
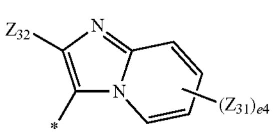
Formula 6-56
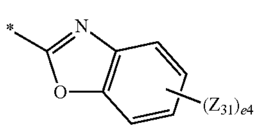
-continued
Formula 6-57
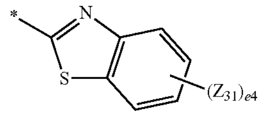
Formula 6-58
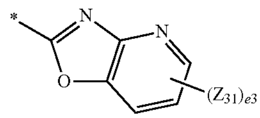
Formula 6-59
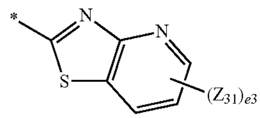
Formula 6-60
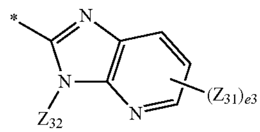
Formula 6-61
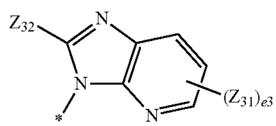
Formula 6-62
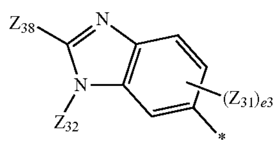
Formula 6-63
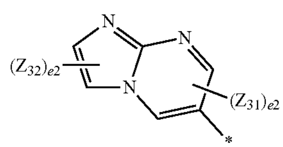
Formula 6-64
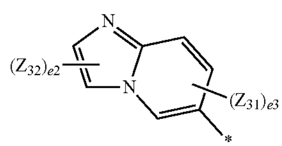
Formula 6-65
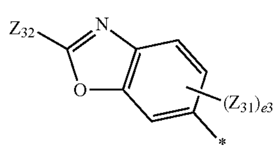
Formula 6-66
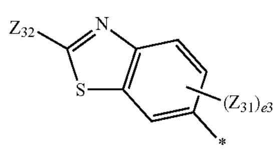
Formula 6-67
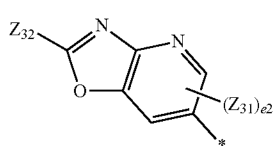

-continued
Formula 6-68
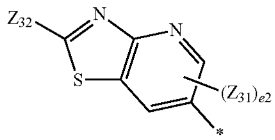
Formula 6-69
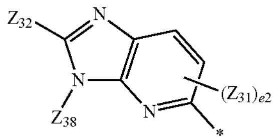
Formula 6-70
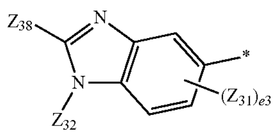
Formula 6-71
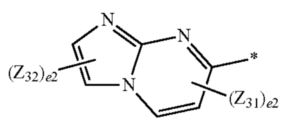
Formula 6-72
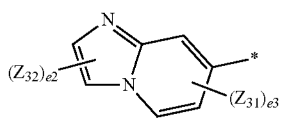
Formula 6-73
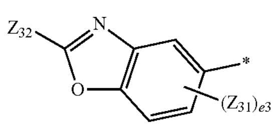
Formula 6-74
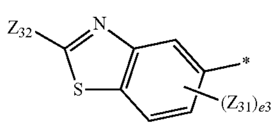
Formula 6-75
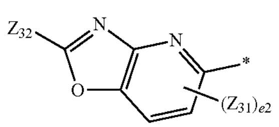
Formula 6-76
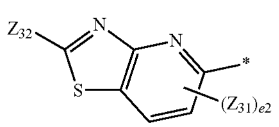
Formula 6-77
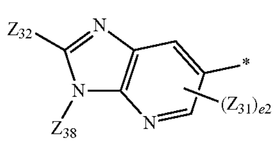
Formula 6-78
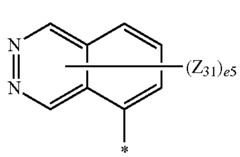
-continued
Formula 6-79
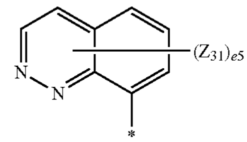
Formula 6-80
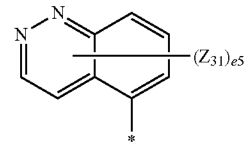
Formula 6-81
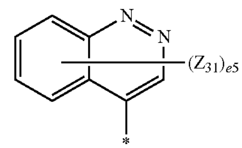
Formula 6-82
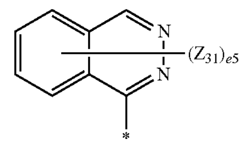
Formula 6-83
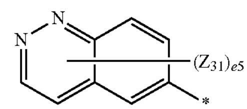
Formula 6-84
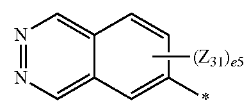
Formula 6-85
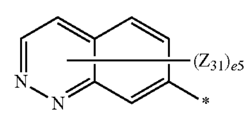
Formula 6-86
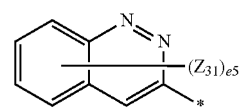
Formula 6-87
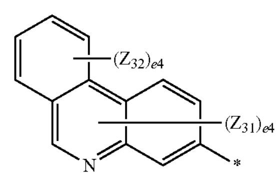
Formula 6-88
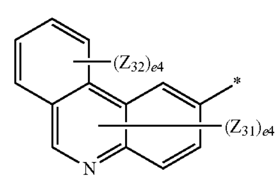
Formula 6-89
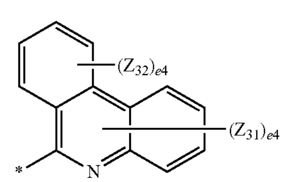

-continued
Formula 6-90
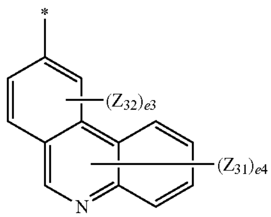
Formula 6-91
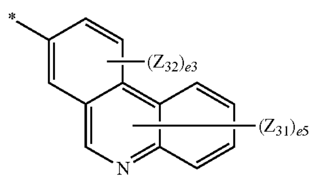
Formula 6-92
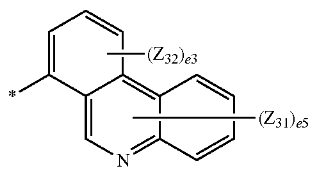
Formula 6-93
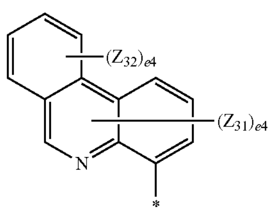
Formula 6-94
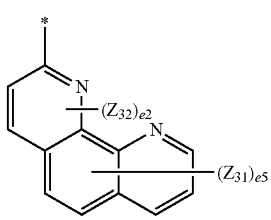
Formula 6-95
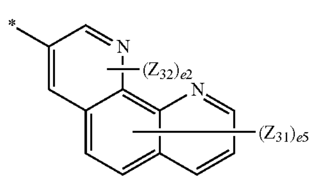
Formula 6-96
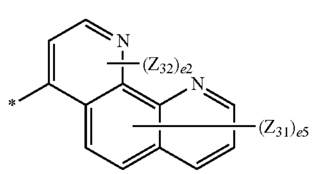
Formula 6-97
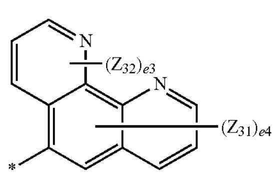
-continued
Formula 6-98
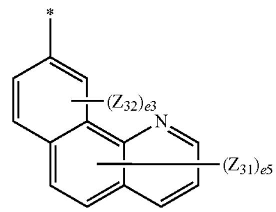
Formula 6-99
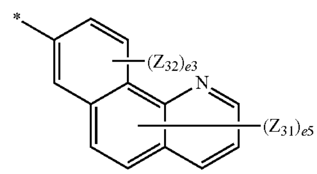
Formula 6-100
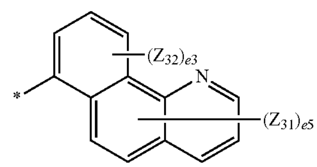
Formula 6-101
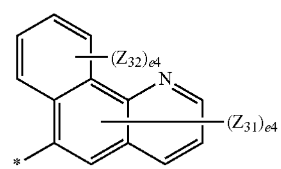
Formula 6-102
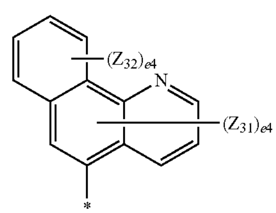
Formula 6-103
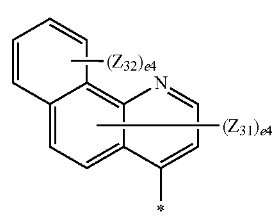
Formula 6-104
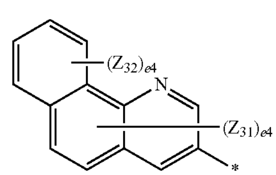
Formula 6-105
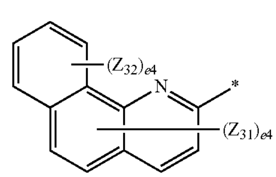

-continued
Formula 6-106
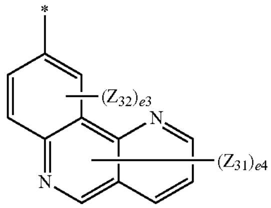
Formula 6-107
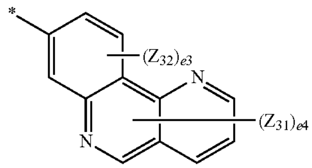
Formula 6-108
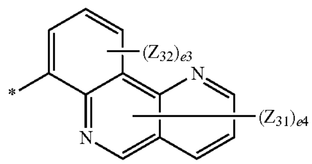
Formula 6-109
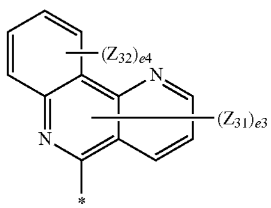
Formula 6-110
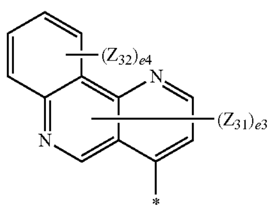
Formula 6-111
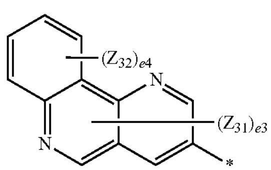
Formula 6-112
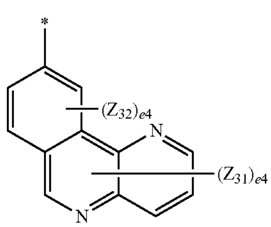
Formula 6-113
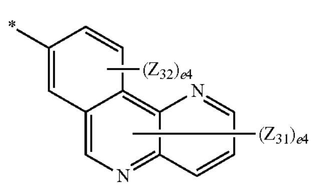
-continued
Formula 6-114
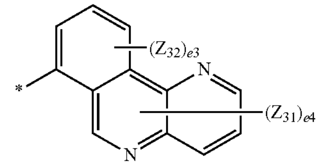
Formula 6-115
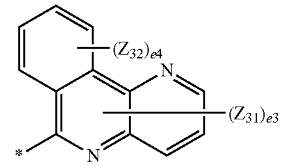
Formula 6-116
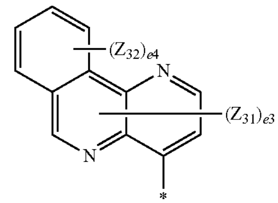
Formula 6-117
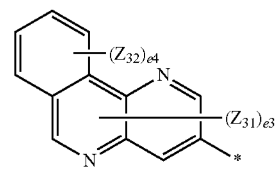
Formula 6-118
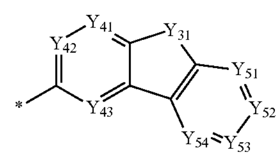
Formula 6-119
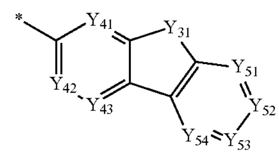
Formula 6-120
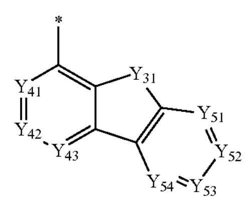
Formula 6-121
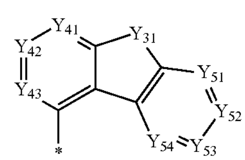
Formula 6-122
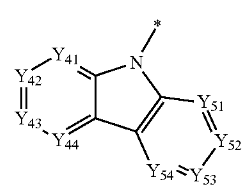

-continued

Formula 6-123

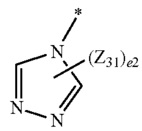

Formula 6-124

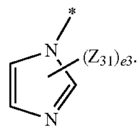

In Formulae 5-1 to 5-45 and 6-1 to 6-124, $Y_{31}$ and $Y_{32}$ may each independently be selected from O, S, $C(Z_{33})(Z_{34})$, $N(Z_{35})$, and $Si(Z_{36})(Z_{37})$, $Y_{41}$ may be N or $C(Z_{41})$, Y42 may be N or $C(Z_{42})$, $Y_{43}$ may be N or $C(Z_{43})$, $Y_{44}$ may be N or $C(Z_{44})$, $Y_{51}$ may be N or $C(Z_{51})$, $Y_{52}$ may be N or $C(Z_{52})$, $Y_{53}$ may be N or $C(Z_{53})$, $Y_{54}$ may be N or $C(Z_{54})$, at least one selected from $Y_{41}$ to $Y_{43}$ and $Y_{51}$ to $Y_{54}$ in Formulae 5-118 to 5-121 may be N, and at least one selected from $Y_{41}$ to $Y_{44}$ and $Y_{51}$ to $Y_{54}$ in Formula 5-122 may be N, $Z_{31}$ to $Z_{37}$, $Z_{41}$ to $Z_{44}$, and $Z_{51}$ to $Z_{54}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, and $—Si(Q_{31})(Q_{32})(Q_{33})$, wherein $Q_{31}$ to $Q_{33}$ may each independently be the same as described herein and $Q_1$ to $Q_3$ may each independently be the same as described herein in connection with $Q_{31}$, e2 may be an integer selected from 0 to 2, e3 may be an integer selected from 0 to 3, e4 may be an integer selected from 0 to 4, e5 may be an integer selected from 0 to 5, e6 may be an integer selected from 0 to 6, e7 may be an integer selected from 0 to 7, e9 may be an integer selected from 0 to 9, and

* may indicate a binding site to an adjacent atom.

In one or more embodiments, in Formulae 1A and 1B, $Ar_1$ and $Ar_2$ may each independently be selected from groups represented by Formulae 9-1 to 9-28 and 9-53 to 9-88, in Formulae 2A and 2B, $R_{21}$ may be selected from groups represented by Formulae 9-1 to 9-100 and 10-1 to 10-121, and in Formulae 2A and 2B, $R_{22}$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a group represented by any of Formulae 9-1 to 9-100 and 10-1 to 10-121, $—Si(Q_1)(Q_2)(Q_3)$, $—S(=O)_2(Q_1)$, and $—P(=O)(Q_1)(Q_2)$, wherein $Q_1$ to $Q_3$ may each independently be the same as described above, but embodiments of the present disclosure are not limited thereto:

Formula 9-1

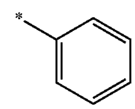

Formula 9-2

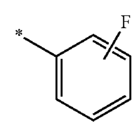

Formula 9-3

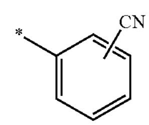

Formula 9-4

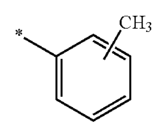

Formula 9-5

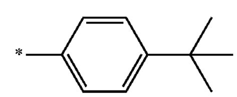

Formula 9-6

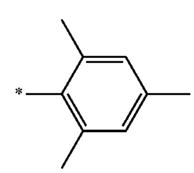

Formula 9-7

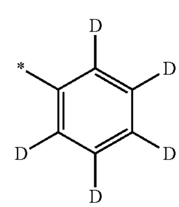

-continued
Formula 9-8
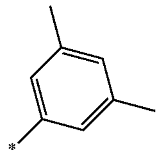
Formula 9-9
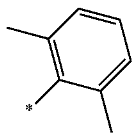
Formula 9-10
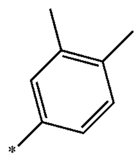
Formula 9-11
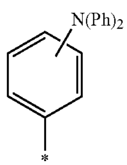
Formula 9-12
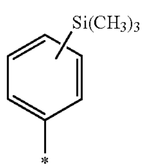
Formula 9-13
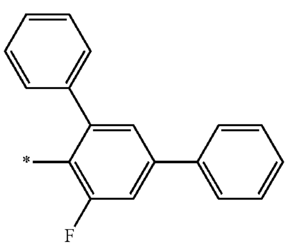
Formula 9-14
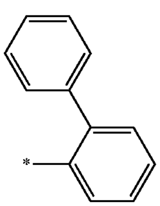
Formula 9-15
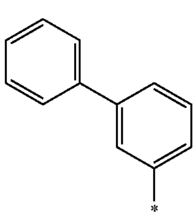
-continued
Formula 9-16
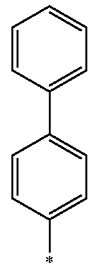
Formula 9-17
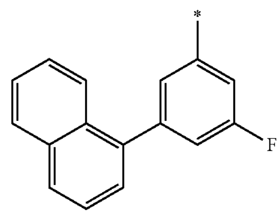
Formula 9-18
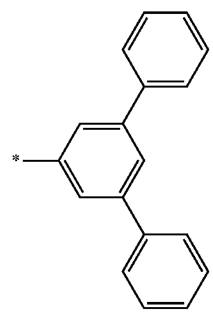
Formula 9-19
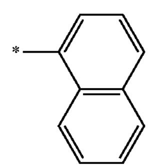
Formula 9-20
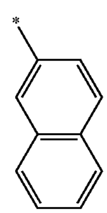
Formula 9-21
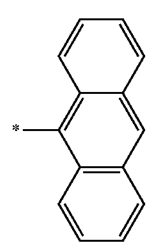

-continued
Formula 9-22
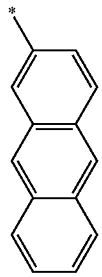
Formula 9-23
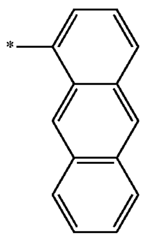
Formula 9-24
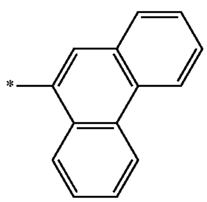
Formula 9-25
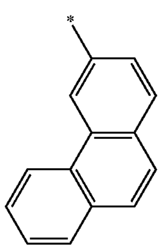
Formula 9-26
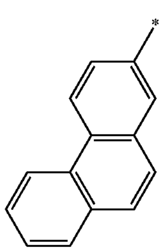
Formula 9-27
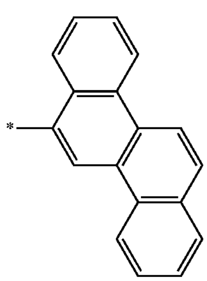
-continued
Formula 9-28
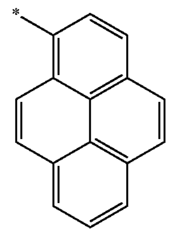
Formula 9-29
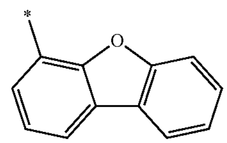
Formula 9-30
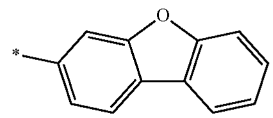
Formula 9-31
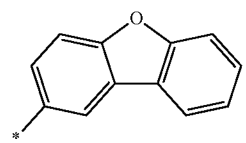
Formula 9-32
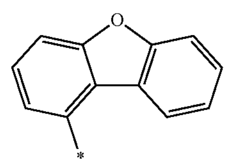
Formula 9-33
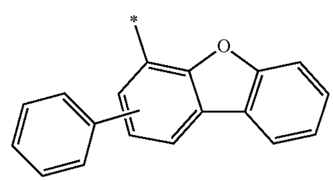
Formula 9-34
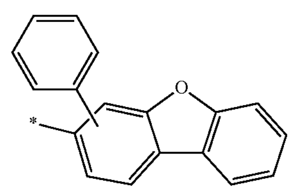
Formula 9-35
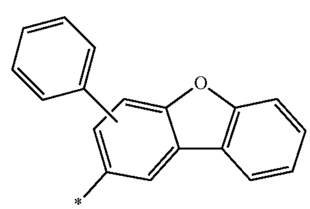
Formula 9-36
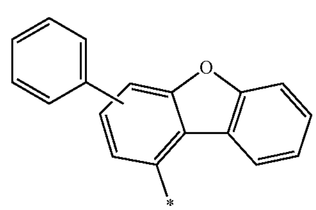

-continued
Formula 9-37
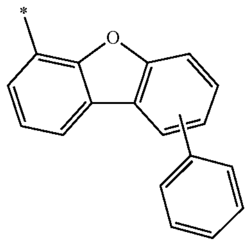
Formula 9-38
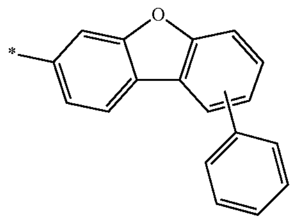
Formula 9-39
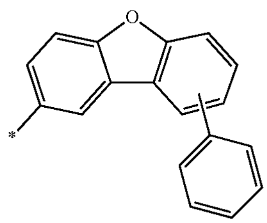
Formula 9-40
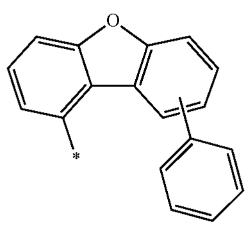
Formula 9-41
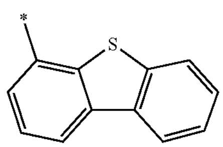
Formula 9-42
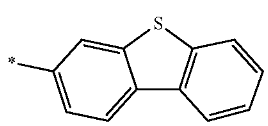
Formula 9-43
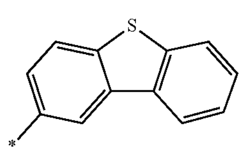
Formula 9-44
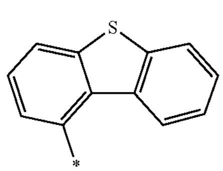
-continued
Formula 9-45
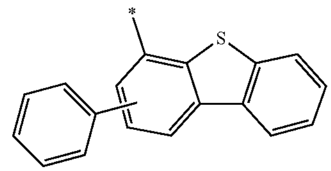
Formula 9-46
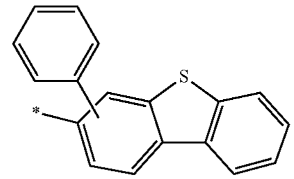
Formula 9-47
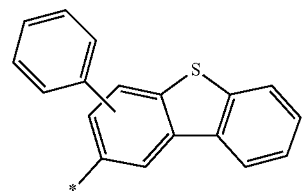
Formula 9-48
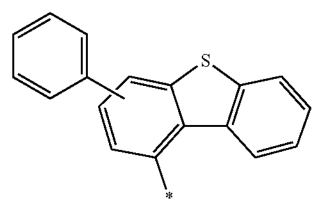
Formula 9-49
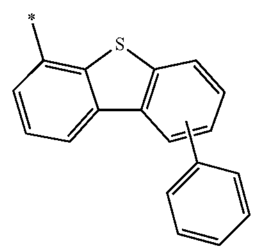
Formula 9-50
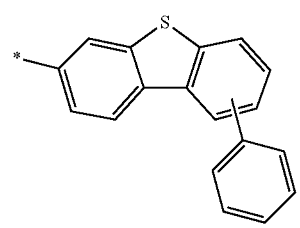
Formula 9-51
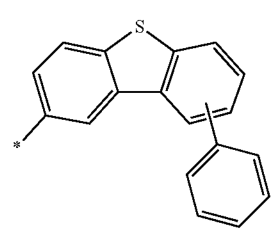

-continued
Formula 9-52
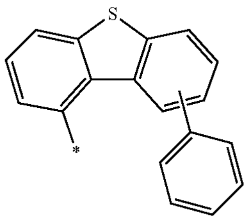
Formula 9-53
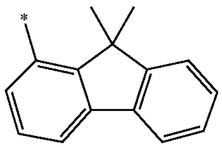
Formula 9-54
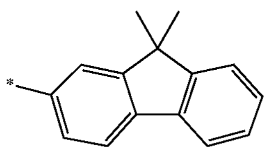
Formula 9-55
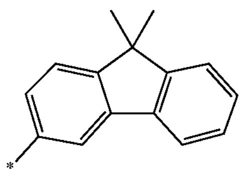
Formula 9-56
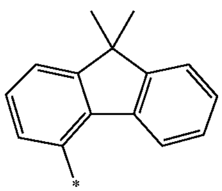
Formula 9-57
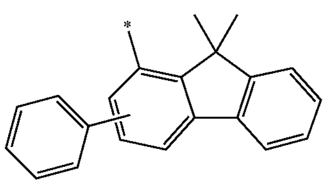
Formula 9-58
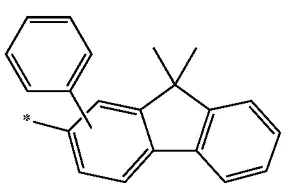
Formula 9-59
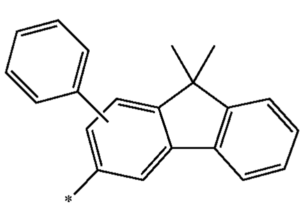
-continued
Formula 9-60
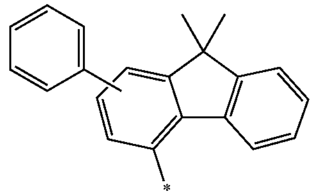
Formula 9-61
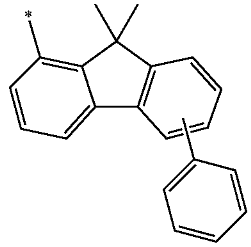
Formula 9-62
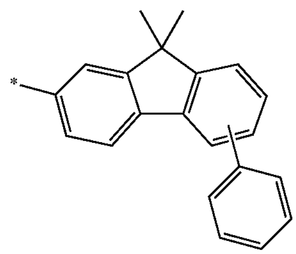
Formula 9-63
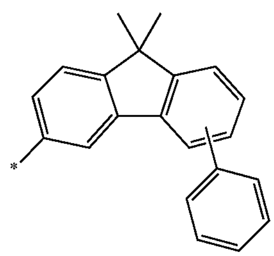
Formula 9-64
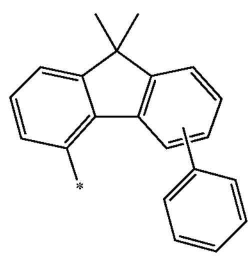
Formula 9-65
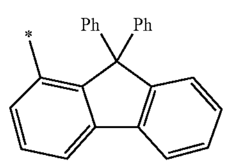
Formula 9-66
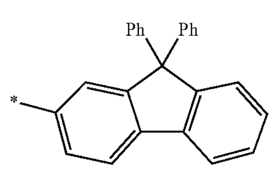

-continued
Formula 9-67
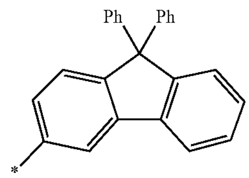
Formula 9-68
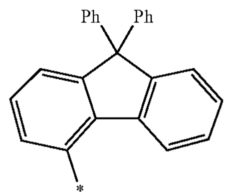
Formula 9-69
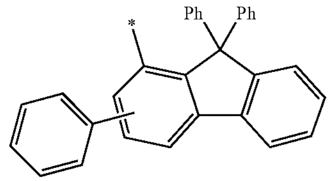
Formula 9-70
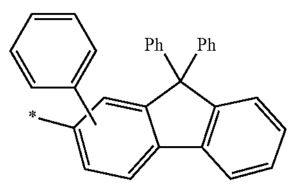
Formula 9-71
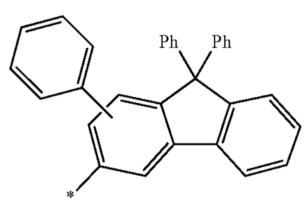
Formula 9-72
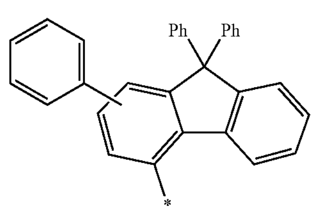
Formula 9-73
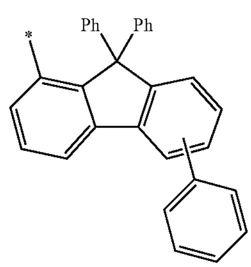
-continued
Formula 9-74
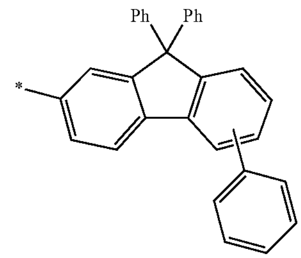
Formula 9-75
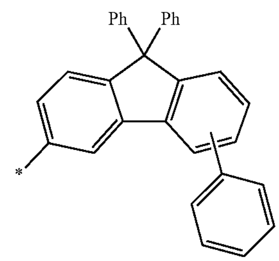
Formula 9-76
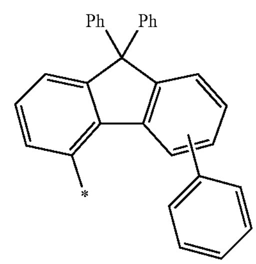
Formula 9-77
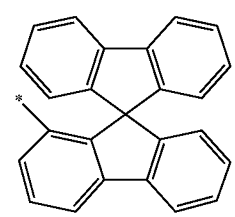
Formula 9-78
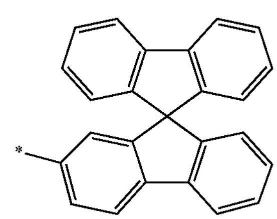
Formula 9-79
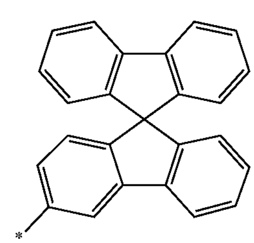

-continued
Formula 9-80
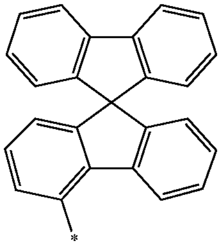
Formula 9-81
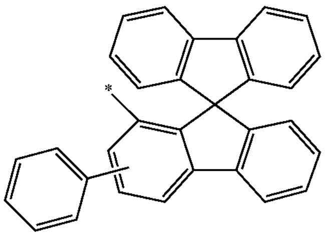
Formula 9-82
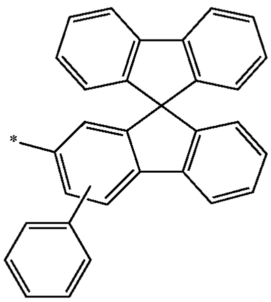
Formula 9-83
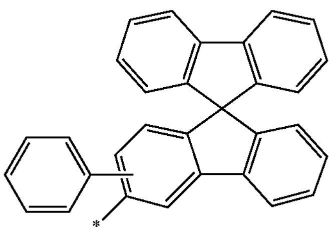
Formula 9-84
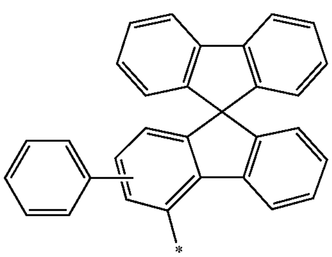
Formula 9-85
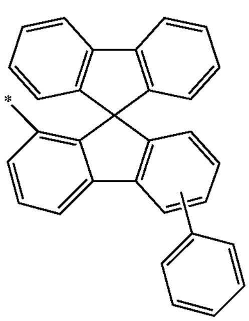
-continued
Formula 9-86
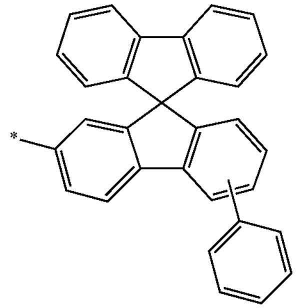
Formula 9-87
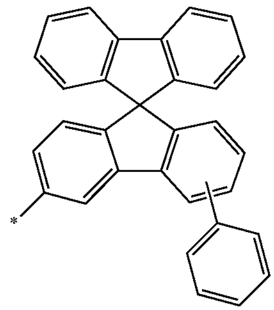
Formula 9-88
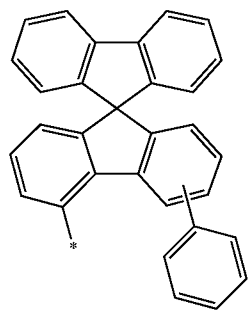
Formula 9-89
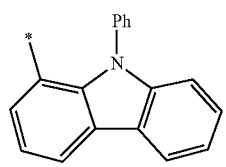
Formula 9-90
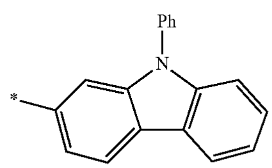
Formula 9-91
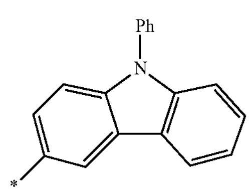

-continued
Formula 9-92
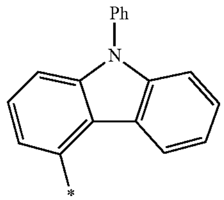
Formula 9-93
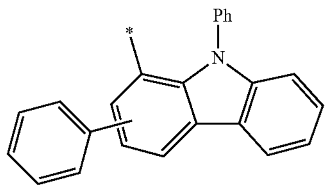
Formula 9-94
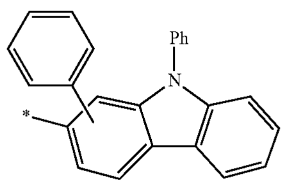
Formula 9-95
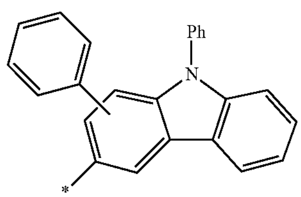
Formula 9-96
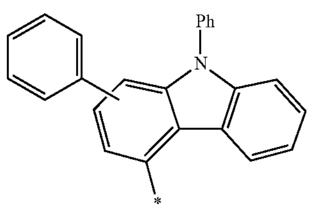
Formula 9-97
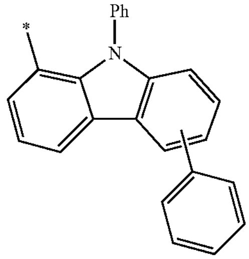
Formula 9-98
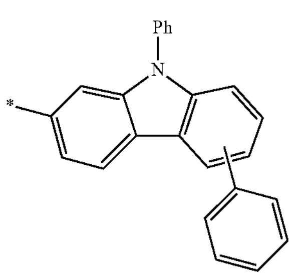
-continued
Formula 9-99
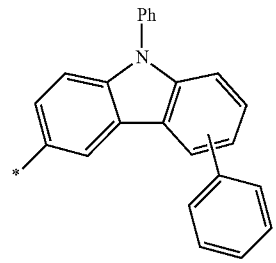
Formula 9-100
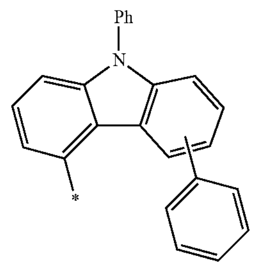
Formula 10-1
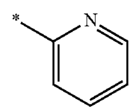
Formula 10-2
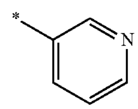
Formula 10-3
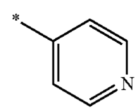
Formula 10-4
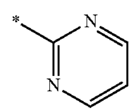
Formula 10-5
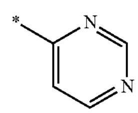
Formula 10-6
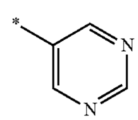
Formula 10-7
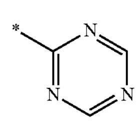
Formula 10-8
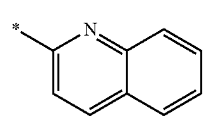
Formula 10-9
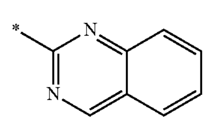

-continued
Formula 10-10
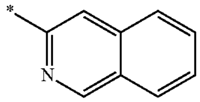
Formula 10-11
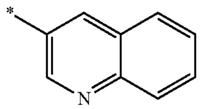
Formula 10-12
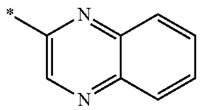
Formula 10-13
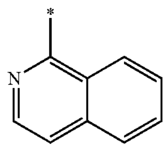
Formula 10-14
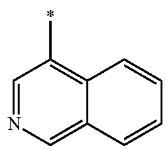
Formula 10-15
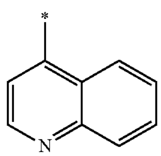
Formula 10-16
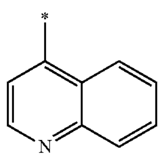
Formula 10-17
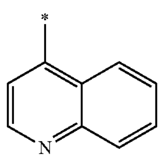
Formula 10-18
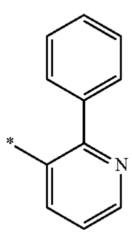
Formula 10-19
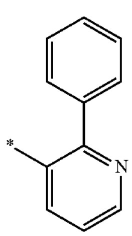
-continued
Formula 10-20
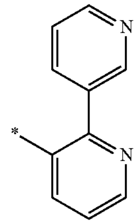
Formula 10-21
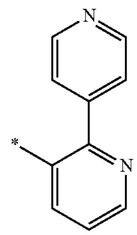
Formula 10-22
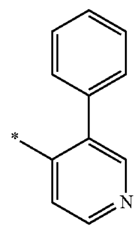
Formula 10-23
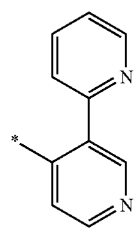
Formula 10-24
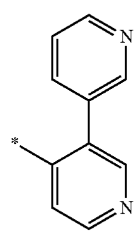
Formula 10-25
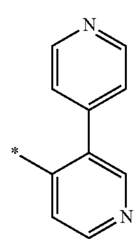

-continued
Formula 10-26
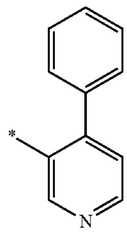
Formula 10-27
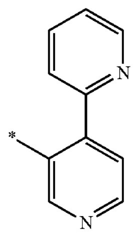
Formula 10-28
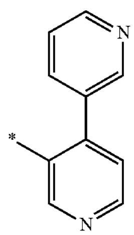
Formula 10-29
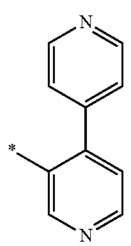
Formula 10-30
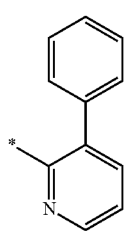
Formula 10-31
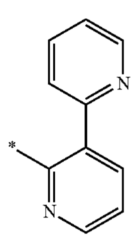
-continued
Formula 10-32
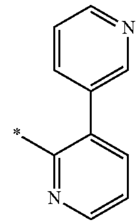
Formula 10-33
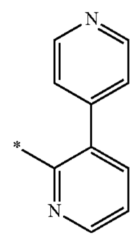
Formula 10-34
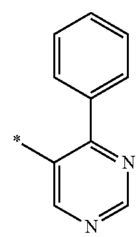
Formula 10-35
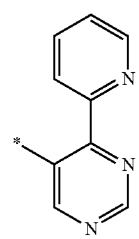
Formula 10-36
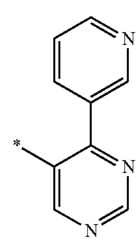
Formula 10-37
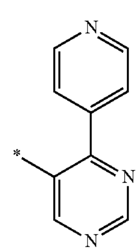

-continued
Formula 10-38
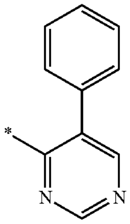
Formula 10-39
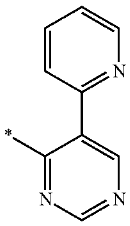
Formula 10-40
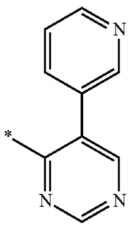
Formula 10-41
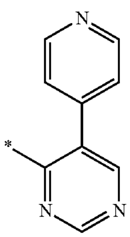
Formula 10-42
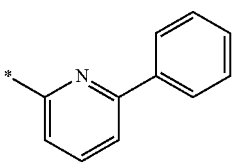
Formula 10-43
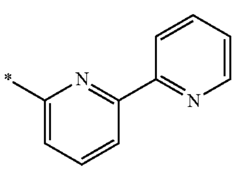
Formula 10-44
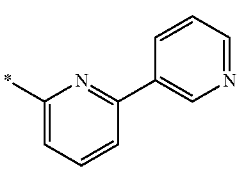
Formula 10-45
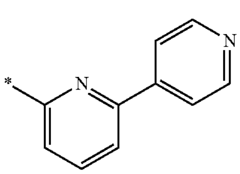
-continued
Formula 10-46
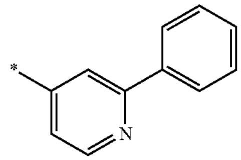
Formula 10-47
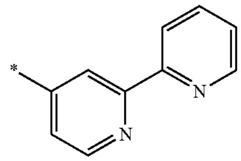
Formula 10-48
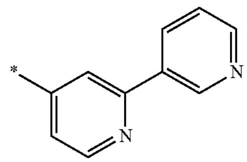
Formula 10-49
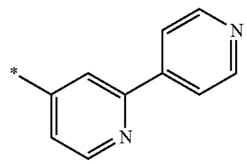
Formula 10-50
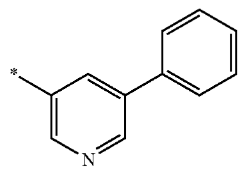
Formula 10-51
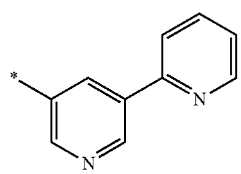
Formula 10-52
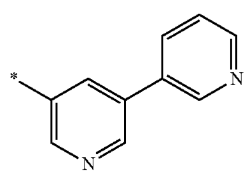
Formula 10-53
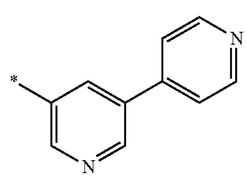
Formula 10-54
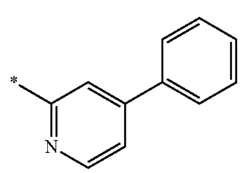

-continued
Formula 10-55
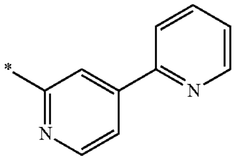
Formula 10-56
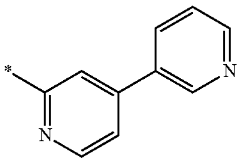
Formula 10-57
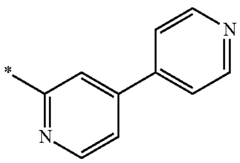
Formula 10-58
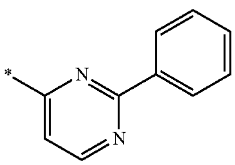
Formula 10-59
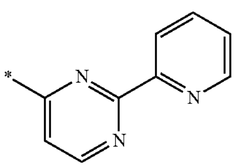
Formula 10-60
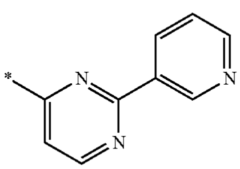
Formula 10-61
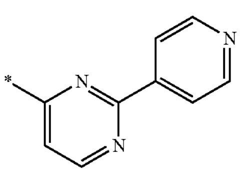
Formula 10-62
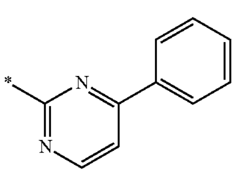
Formula 10-63
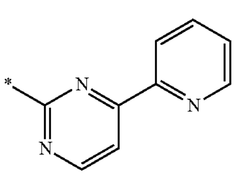
-continued
Formula 10-64
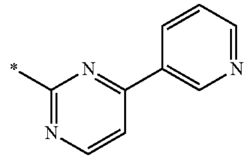
Formula 10-65
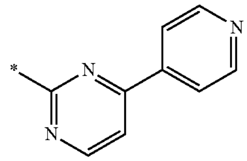
Formula 10-66
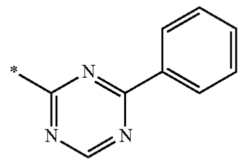
Formula 10-67
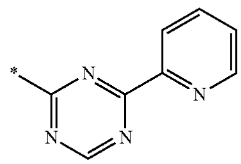
Formula 10-68
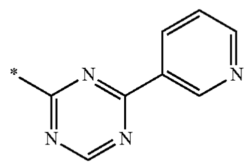
Formula 10-69
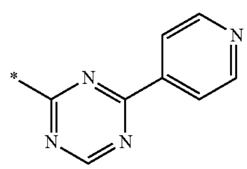
Formula 10-70
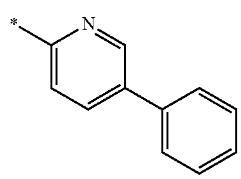
Formula 10-71
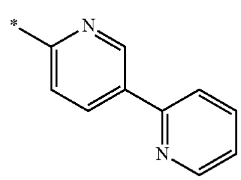
Formula 10-72
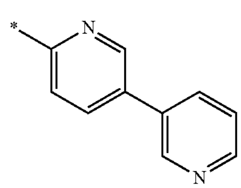

-continued
Formula 10-73
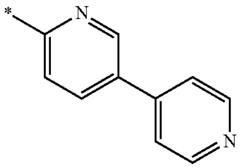
Formula 10-74
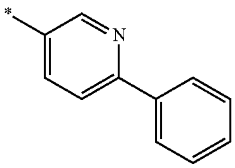
Formula 10-75
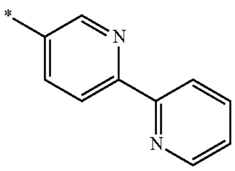
Formula 10-76
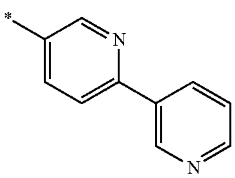
Formula 10-77
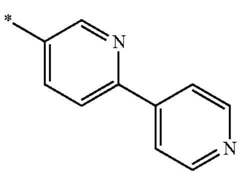
Formula 10-78
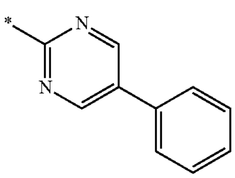
Formula 10-79
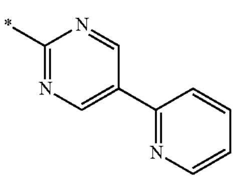
Formula 10-80
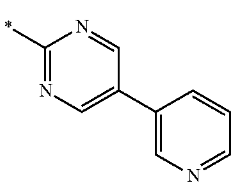
Formula 10-81
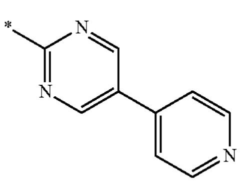
-continued
Formula 10-82
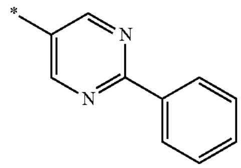
Formula 10-83
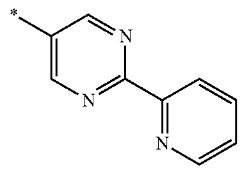
Formula 10-84
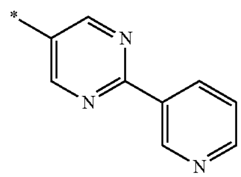
Formula 10-85
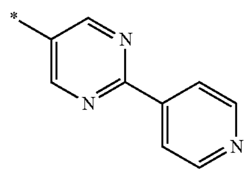
Formula 10-86
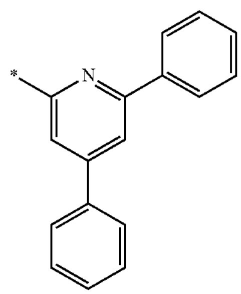
Formula 10-87
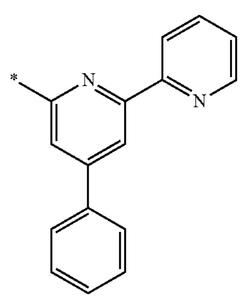
Formula 10-88
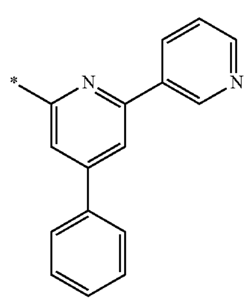

-continued
Formula 10-89
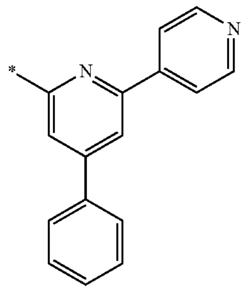
Formula 10-90
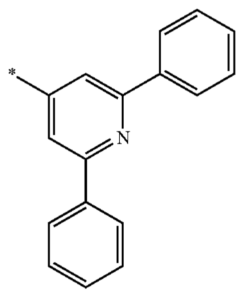
Formula 10-91
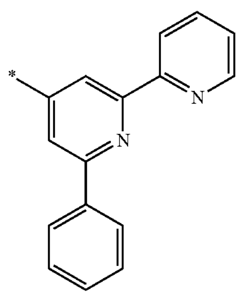
Formula 10-92
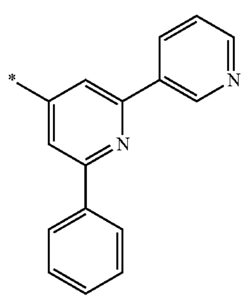
Formula 10-93
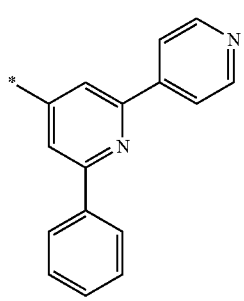
-continued
Formula 10-94
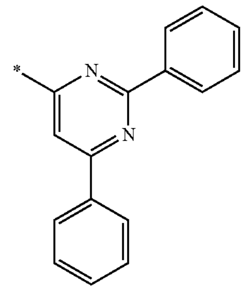
Formula 10-95
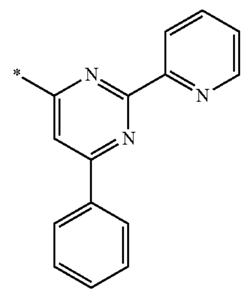
Formula 10-96
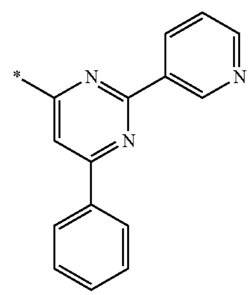
Formula 10-97
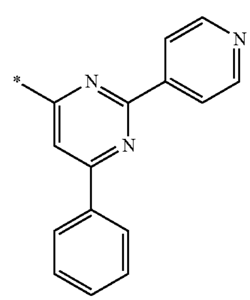
Formula 10-98
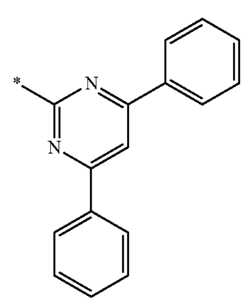

-continued
Formula 10-99
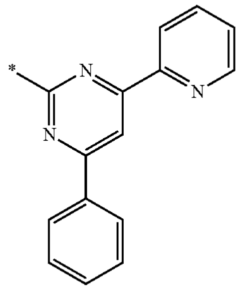
Formula 10-100
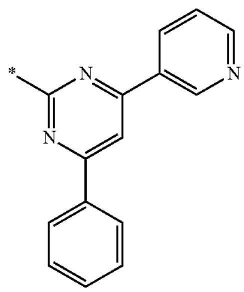
Formula 10-101
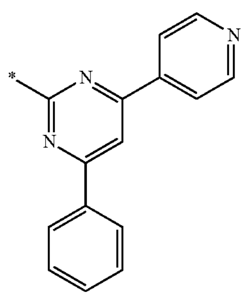
Formula 10-102
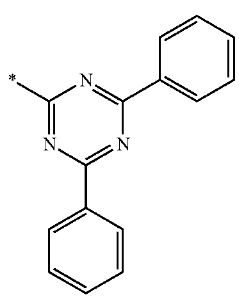
Formula 10-103
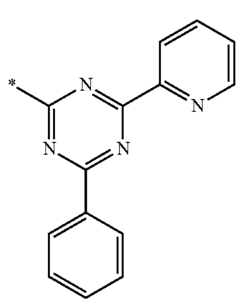
-continued
Formula 10-104
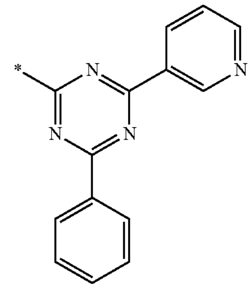
Formula 10-105
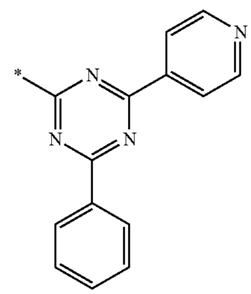
Formula 10-106
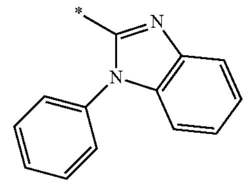
Formula 10-107
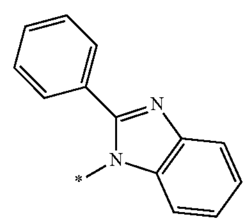
Formula 10-108
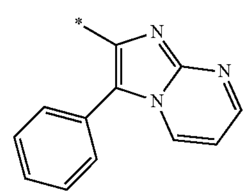
Formula 10-109
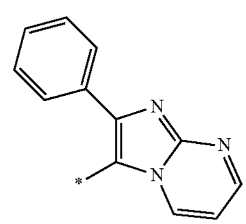
Formula 10-110
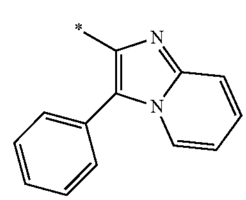

-continued

Formula 10-111

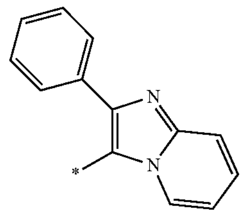

Formula 10-112

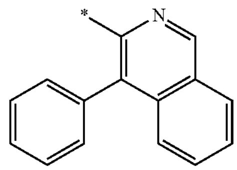

Formula 10-113

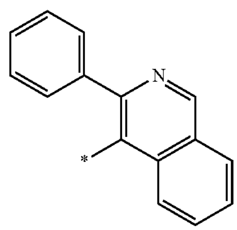

Formula 10-114

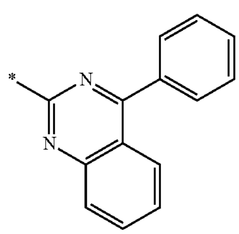

Formula 10-115

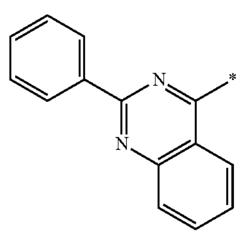

Formula 10-116

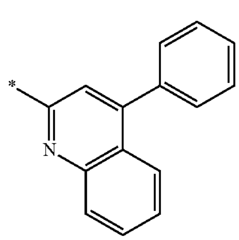

Formula 10-117

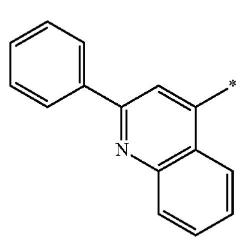

-continued

Formula 10-118

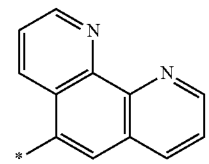

Formula 10-119

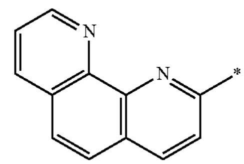

Formula 10-120

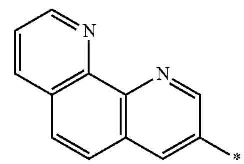

Formula 10-121

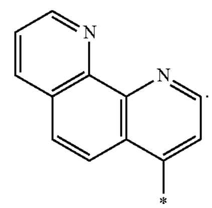

In Formulae 9-1 to 9-100 and 10-1 to 10-121, “Ph” represents a phenyl group, and * indicates a binding site to an adjacent atom.

In Formulae 1A and 1B, c1 indicates the number of $R_1$(s). When c1 is 2 or greater, a plurality of $R_1$(s) may be identical to or different from each other. c2 may be the same as described herein in connection with c1 and the structure of Formulae 1A and 1B.

In Formulae 1A and 1B, c1 and c2 may each independently be an integer selected from 0 to 4. In some embodiments, c1 and c2 may each independently be 0 or 1, but embodiments of the present disclosure are not limited thereto.

In Formulae 2A and 2B, b21 indicates the number of $R_{21}$(s). When b21 is 2 or greater, a plurality of $R_{21}$(s) may be identical to or different from each other. b22 may be the same as described herein in connection with b21 and the structure of Formulae 2A and 2B.

In Formulae 2A and 2B, b21 and b22 may each independently be an integer selected from 0 to 4. In some embodiments, b21 and b22 may each independently be 1 or 2, but embodiments of the present disclosure are not limited thereto.

In the first compound represented by Formula 1A, a compound in which i) rings $A_1$ and $A_2$ are a benzene group, ii) a1, a2, c1, and c2 are 0, iii) b1 and b2 are 1, and iv) $Ar_1$ and $Ar_2$ are a naphthyl group, is excluded from being the first compound.

In one embodiment, the first compound represented by Formula 1A or 1B may be represented by one selected from Formulae 1(1) to 1(7):

Formula 1(1)

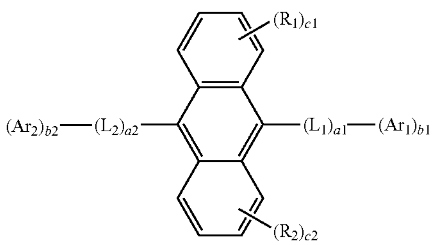

Formula 1(2)

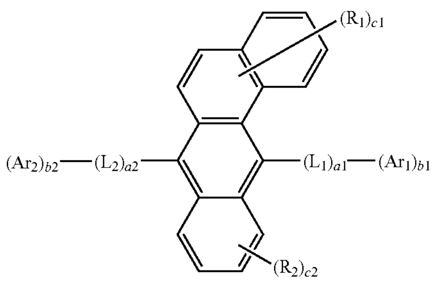

Formula 1(3)

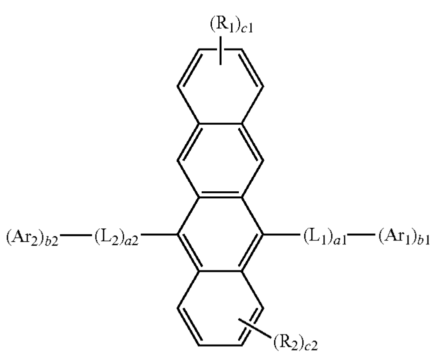

Formula 1(4)

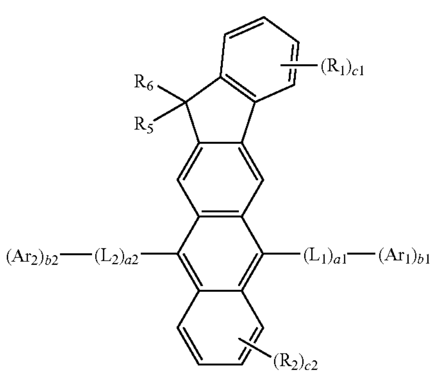

-continued

Formula 1(5)

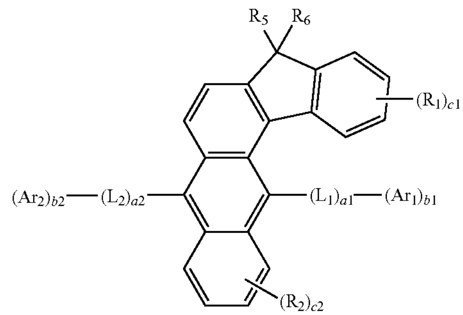

Formula 1(6)

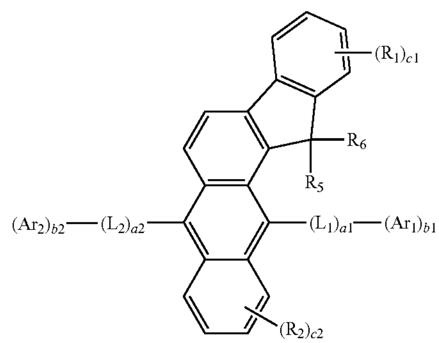

Formula 1(7)

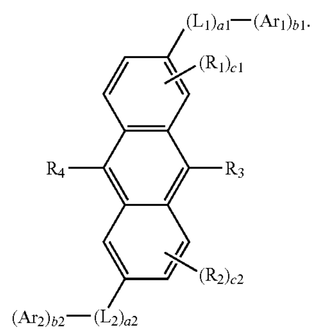

In Formulae 1(1) to 1(7), $L_1$, $L_2$, a1, a2, $Ar_1$, $Ar_2$, b1, b2, $R_1$ to $R_4$, c1 and c2 may each independently be the same as described herein, and $R_5$ and $R_6$ may each independently be the same as described herein in connection with $R_1$.

In one embodiment, in Formulae 1(1) to 1(7), the groups represented by *—$(L_1)_{a1}$-$(Ar_1)_{b1}$ may differ from the groups represented by *—$(L_2)_{a2}$-$(Ar_2)_{b2}$. Thus, Formulae 1(1) to 1(7) may have asymmetrical structures.

In one embodiment, the first compound represented by Formula 1A or 1B may be selected from Compounds 1-1 to 1-139:

1-1

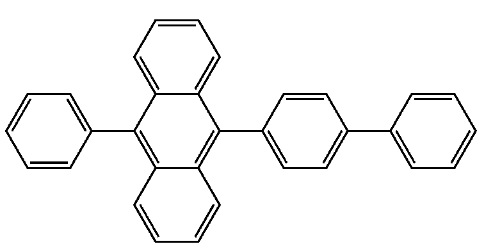

1-2

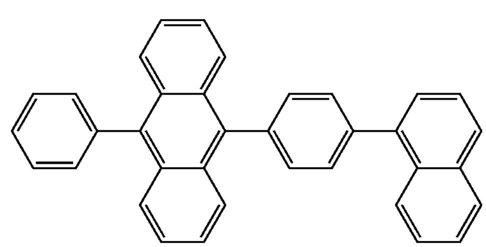

-continued
1-3
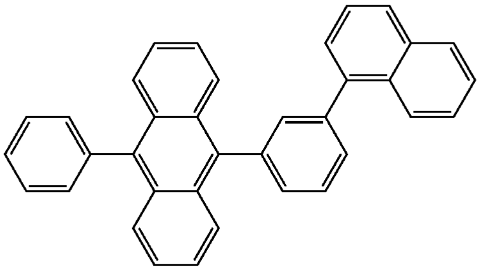
1-4
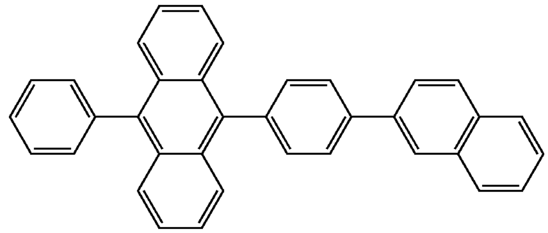
1-5
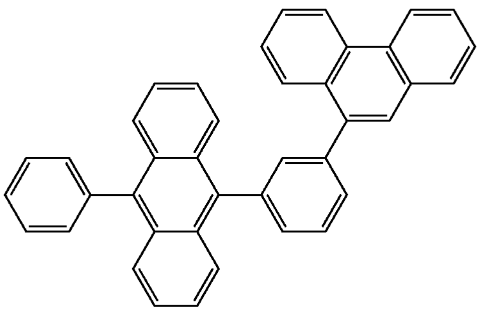
1-6
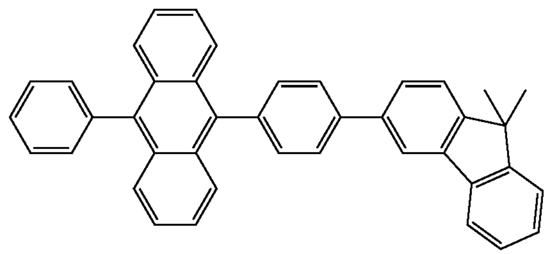
1-7
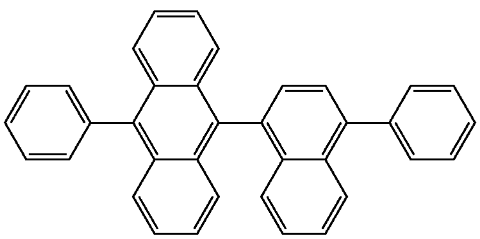
1-8
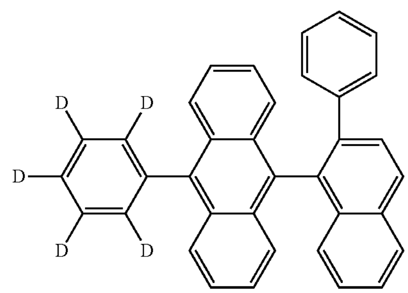
1-9
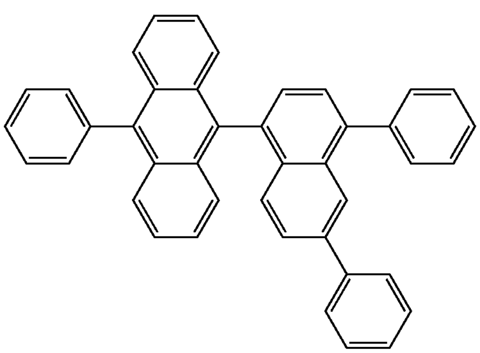
1-10
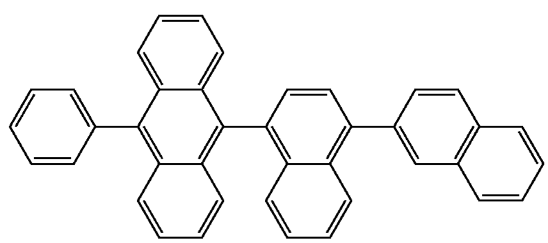
1-11
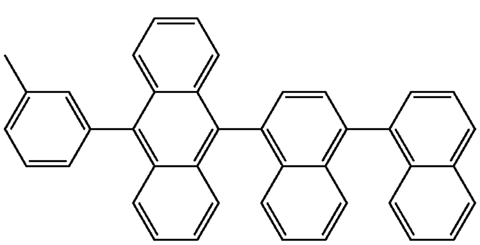
1-12
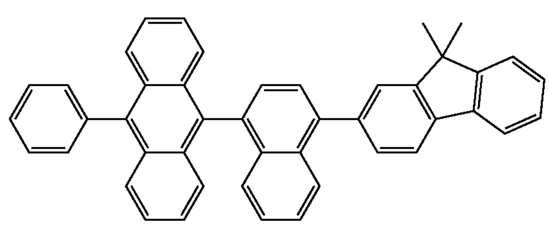

-continued
1-13
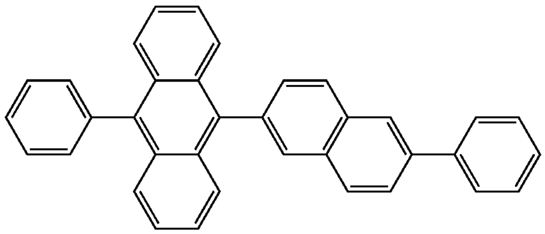
1-14
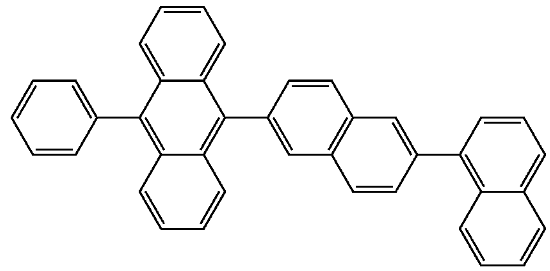
1-15
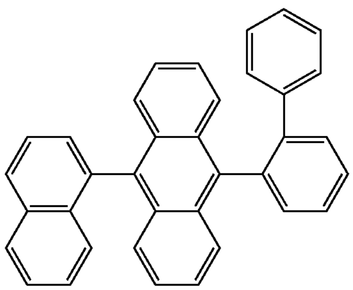
1-16
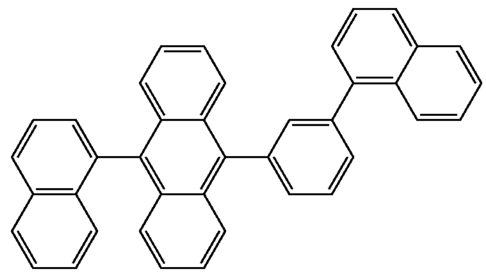
1-17
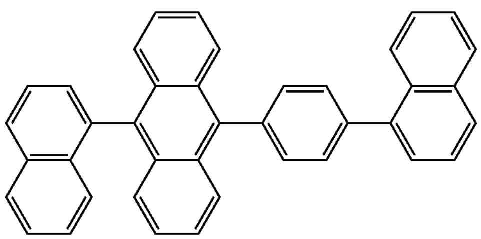
1-18
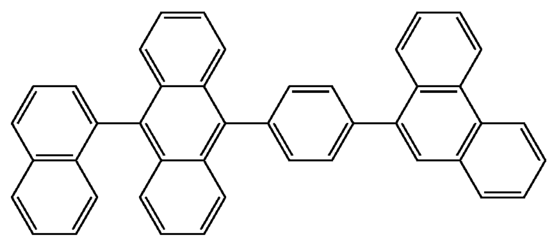
1-19
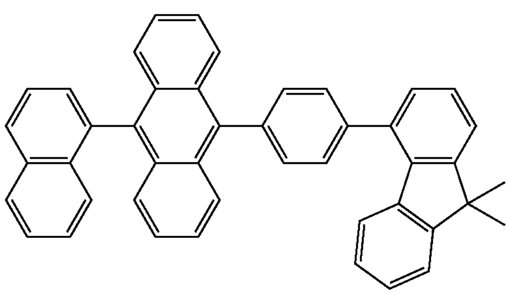
1-20
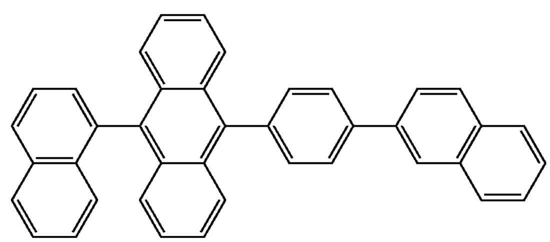
1-21
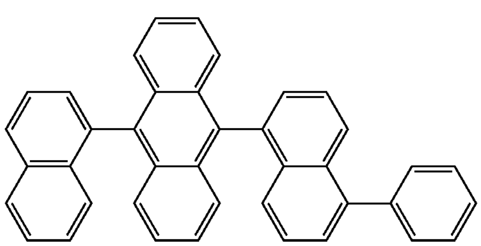
1-22
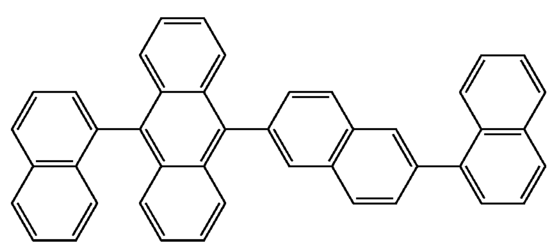

-continued
1-23
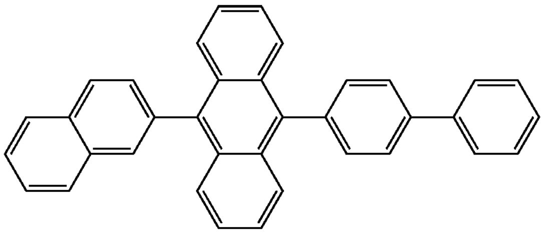
1-24
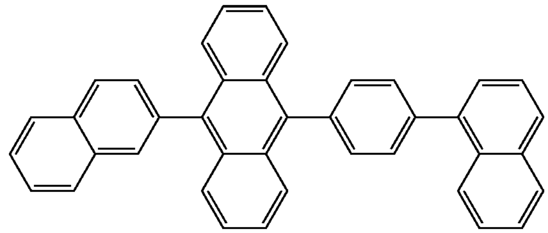
1-25
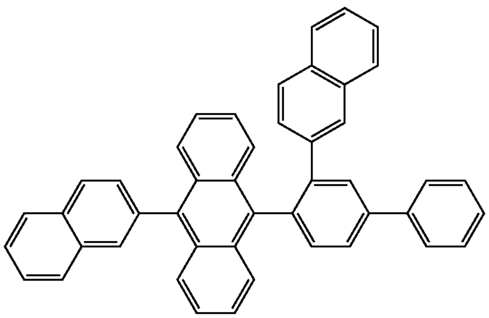
1-26
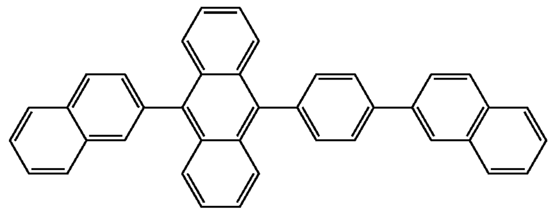
1-27
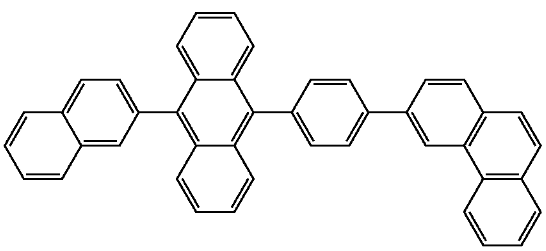
1-28
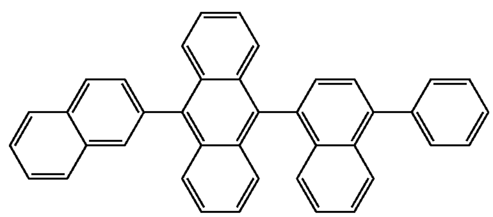
1-29
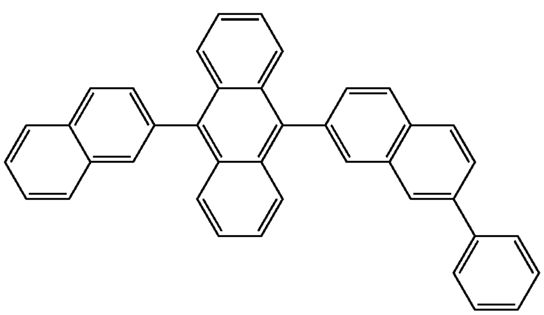
1-30
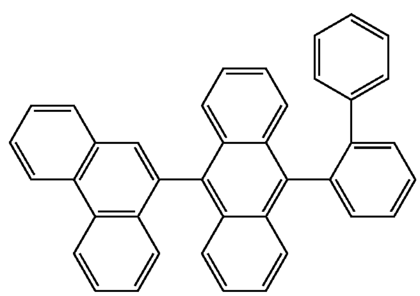
1-31
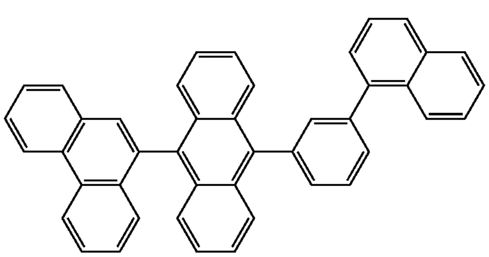
1-32
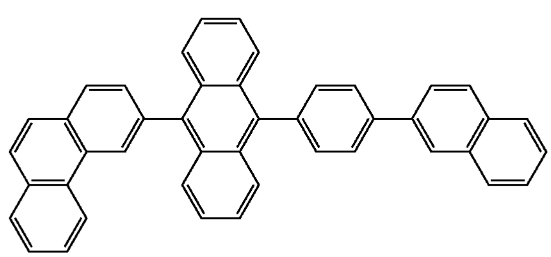

-continued
1-33
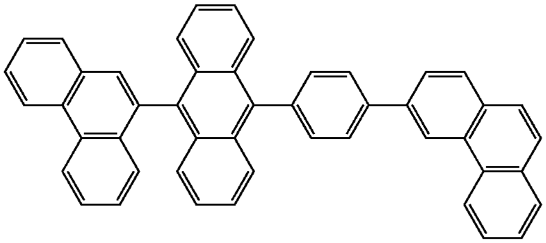
1-34
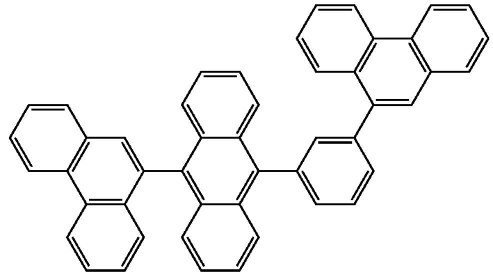
1-35
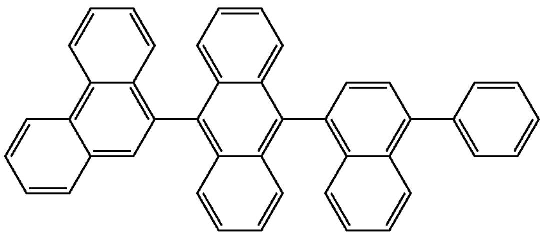
1-36
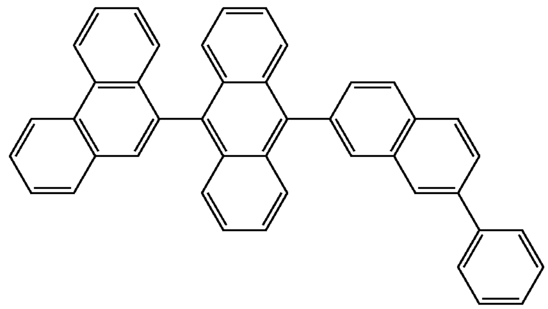
1-37
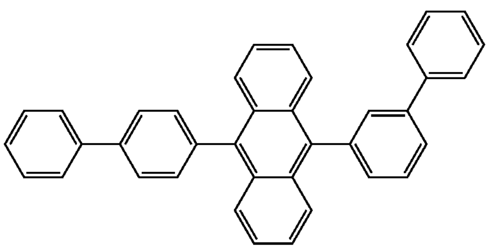
1-38
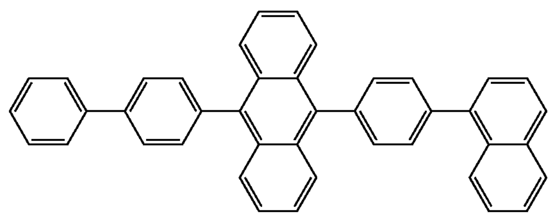
1-39
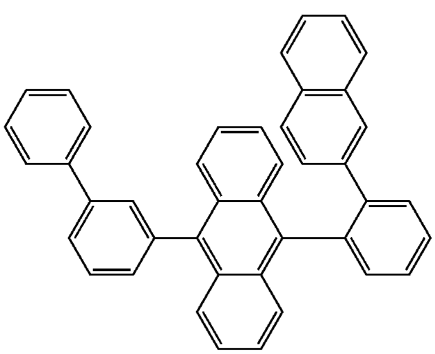
1-40
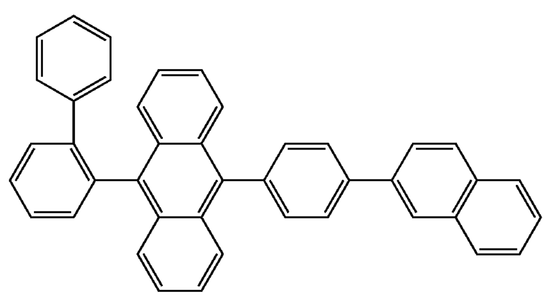
1-41
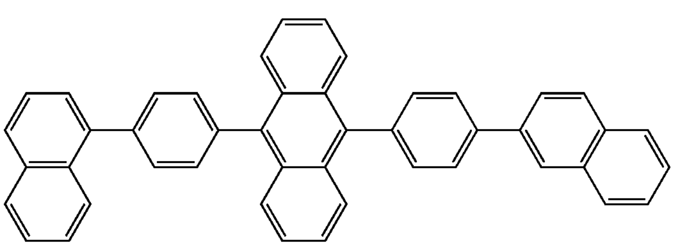

-continued
1-42
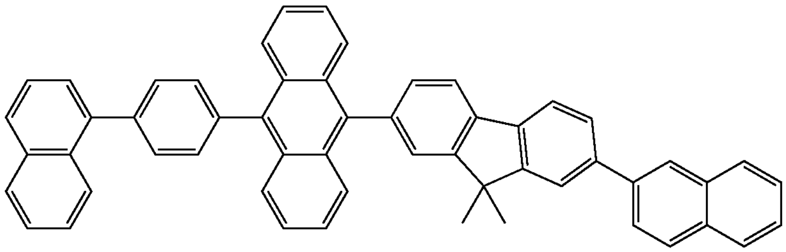
1-43
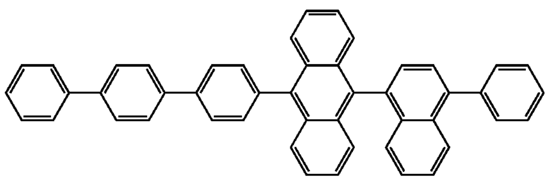
1-44
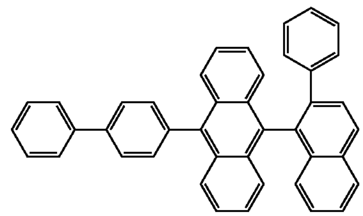
1-45
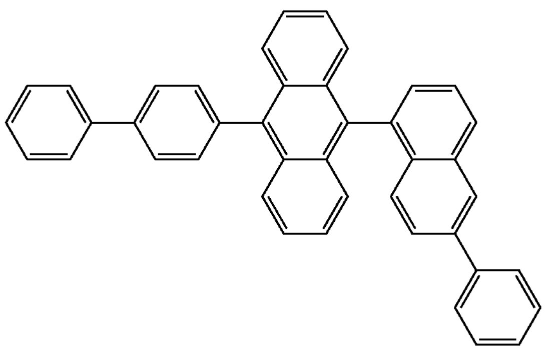
1-46
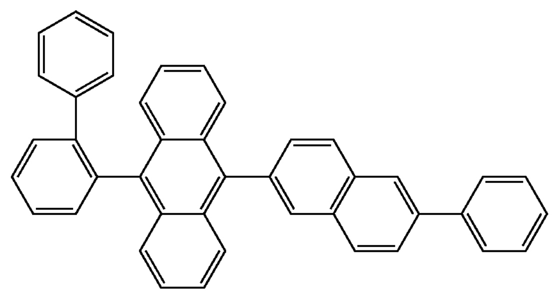
1-47
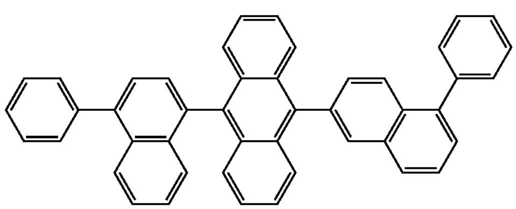
1-48
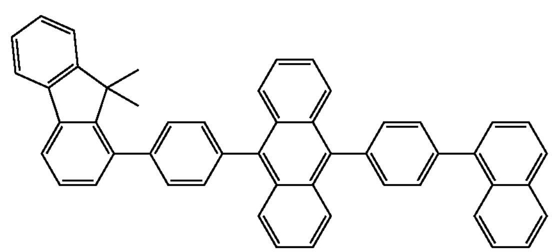
1-49
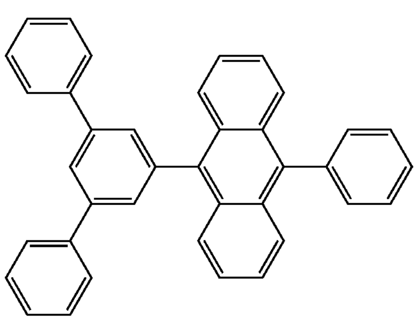
1-50
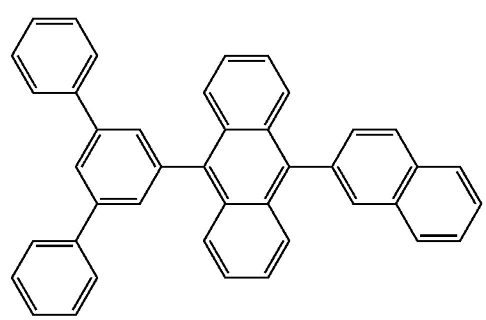

-continued
1-51
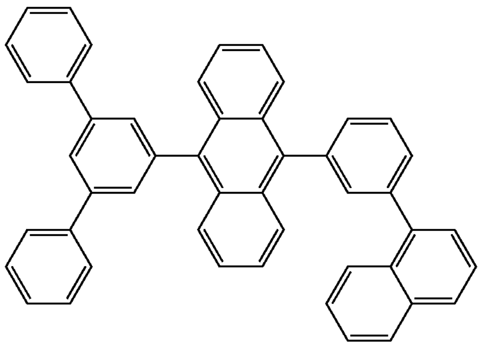
1-52
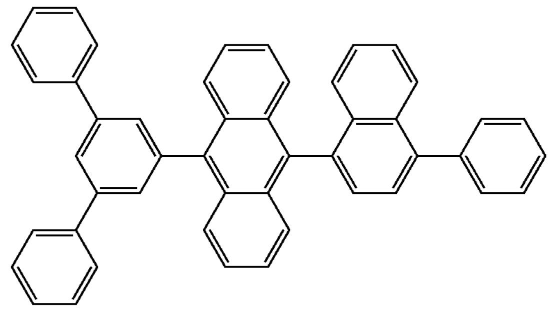
1-53
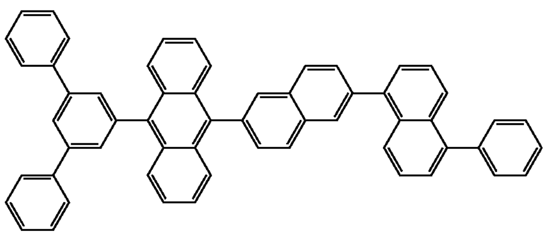
1-54
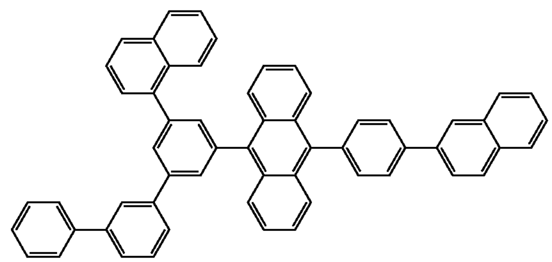
1-55
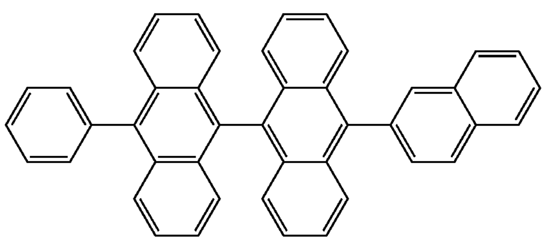
1-56
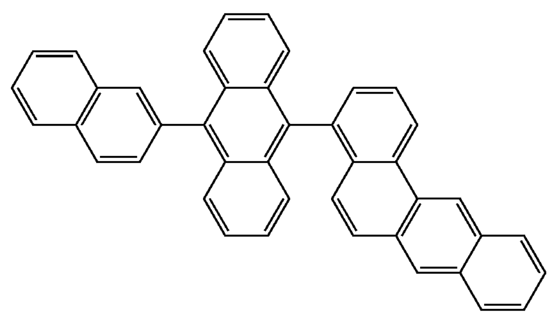
1-57
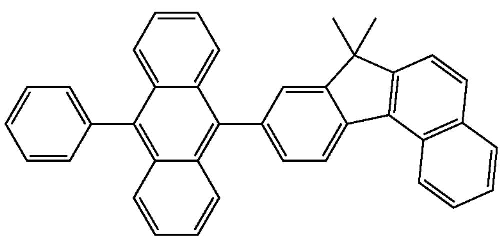
1-58
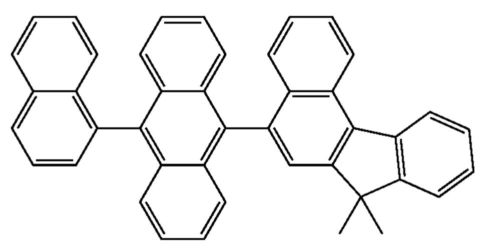
1-59
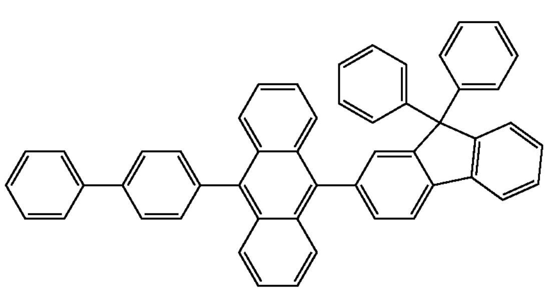
1-60
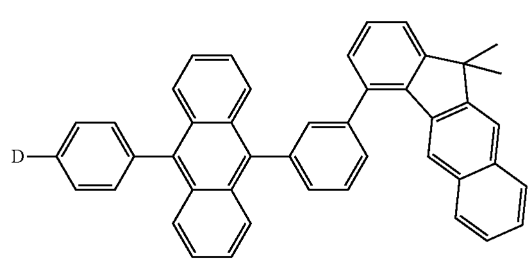

-continued
1-61
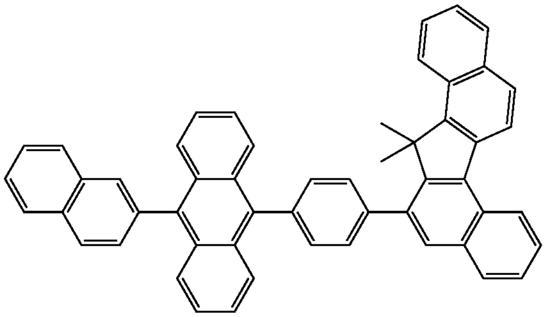
1-62
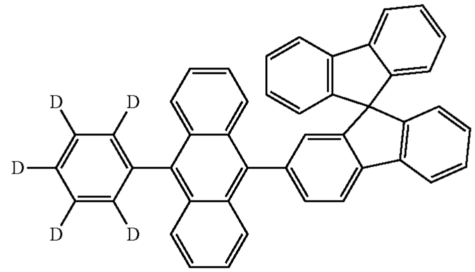
1-63
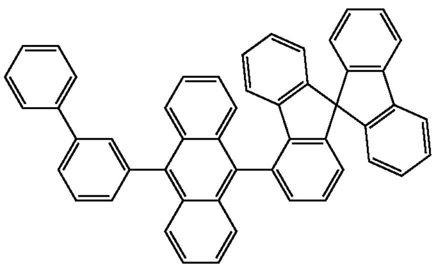
1-64
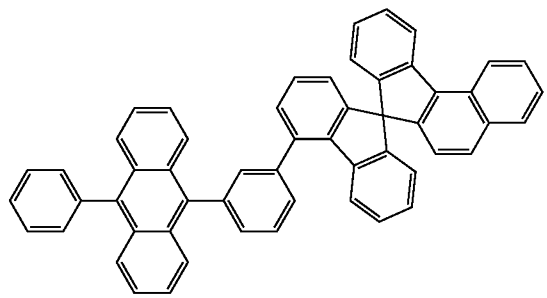
1-65
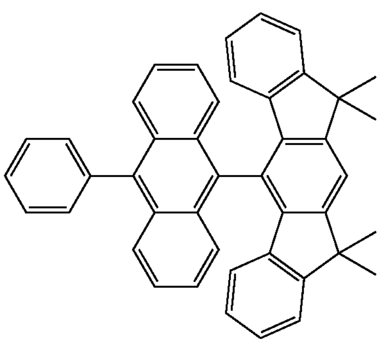
1-66
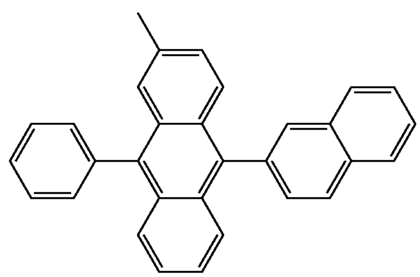
1-67
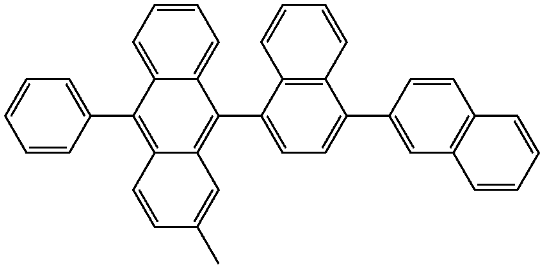
1-68
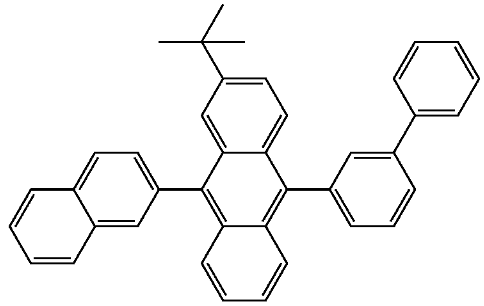

-continued
1-69
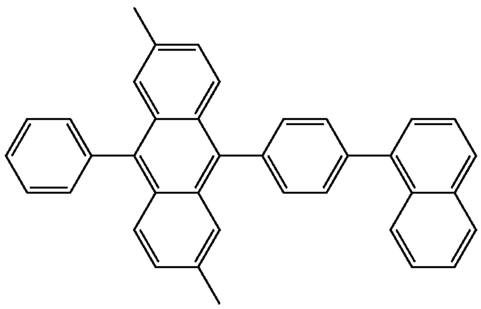
1-70
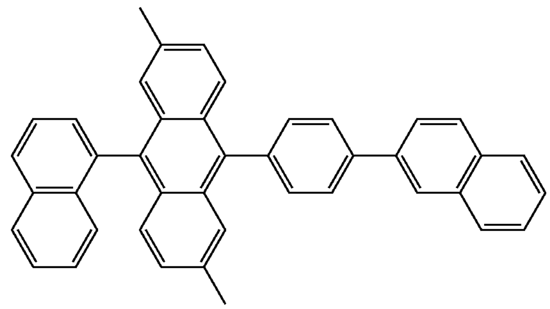
1-71
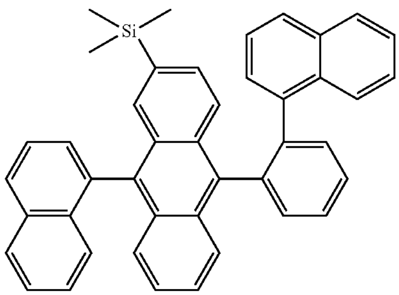
1-72
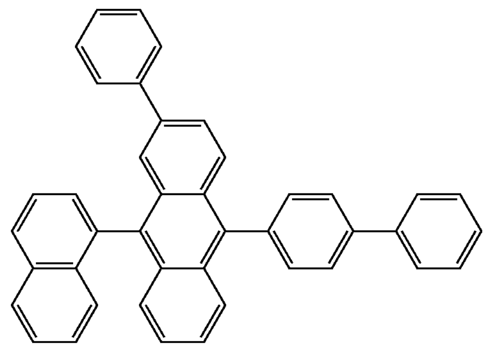
1-73
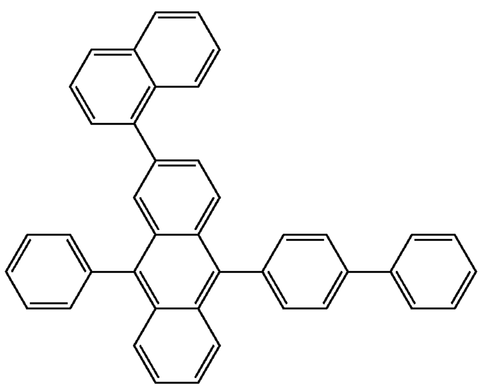
1-74
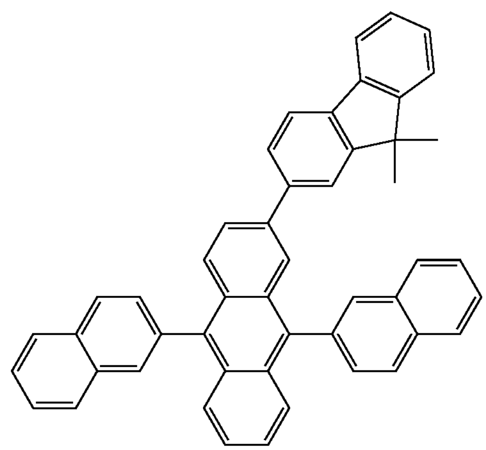
1-75
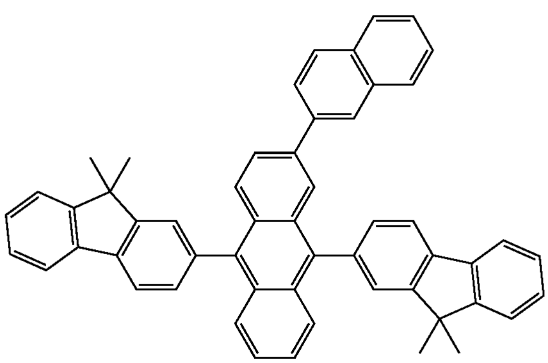
1-76
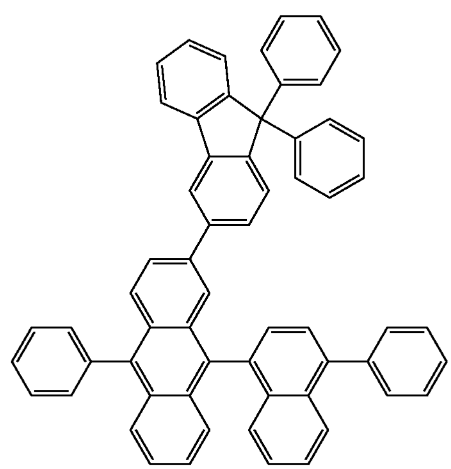

-continued
1-77
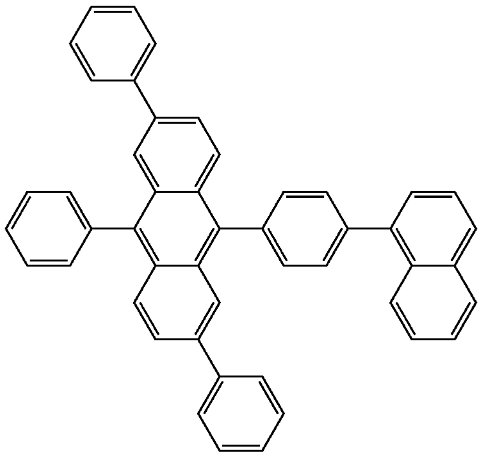
1-78
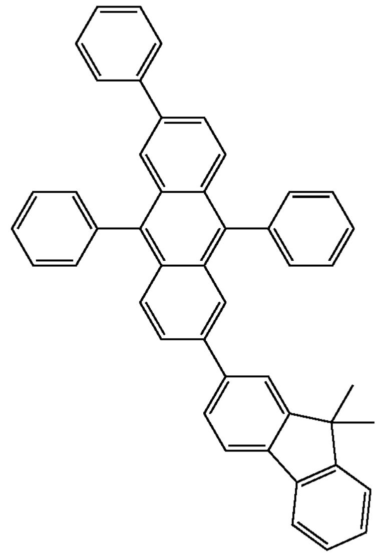
1-79
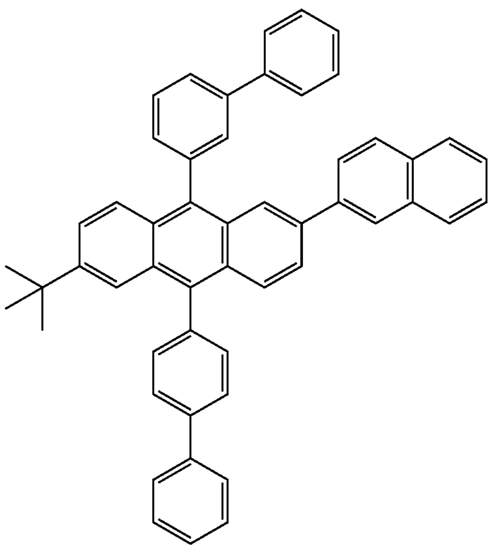
1-80
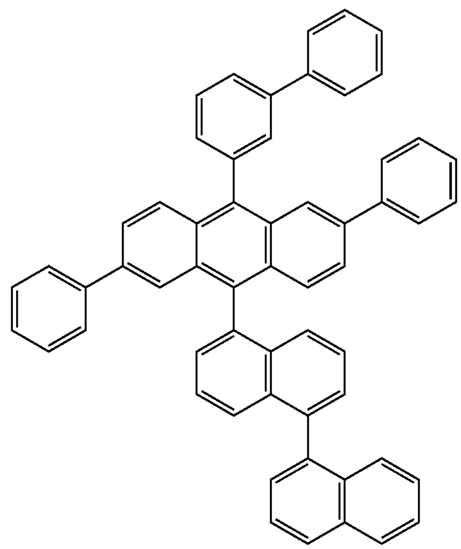
1-81
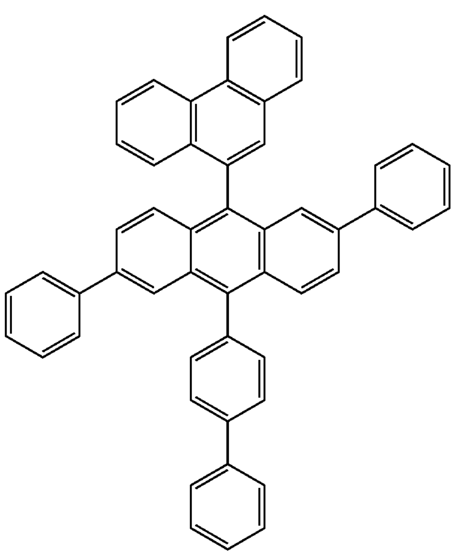
1-82
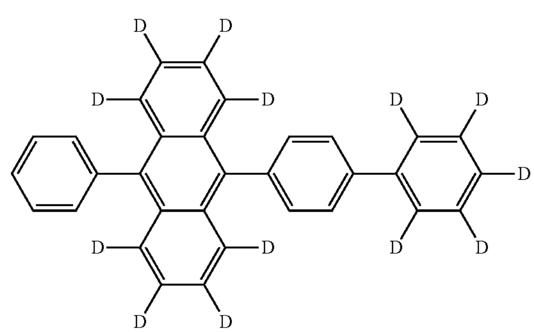

-continued
1-83
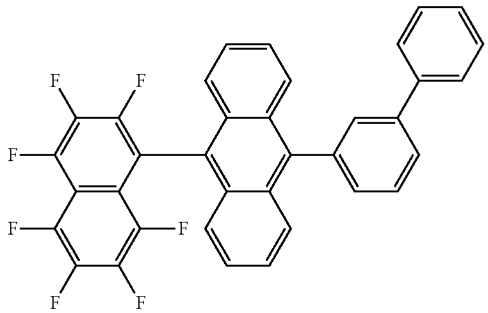
1-84
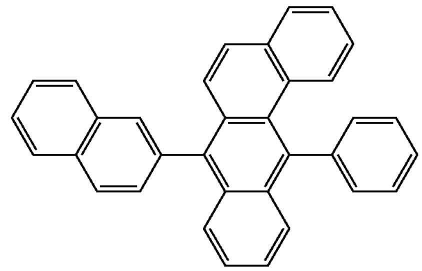
1-85
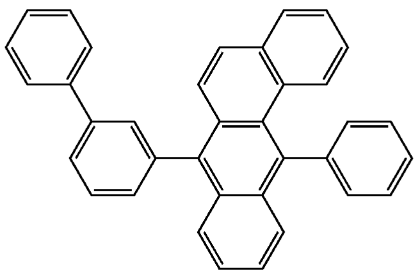
1-86
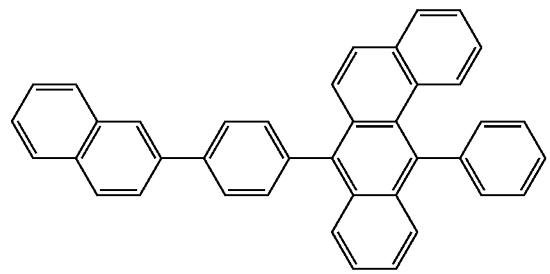
1-87
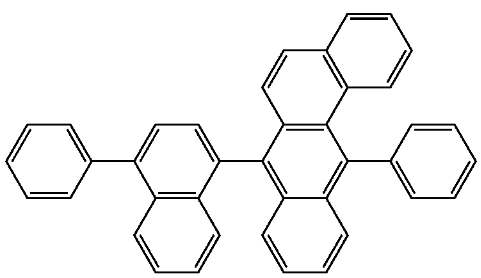
1-88
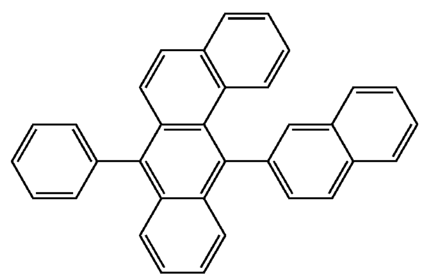
1-89
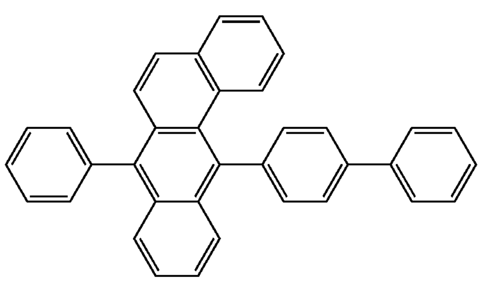
1-90
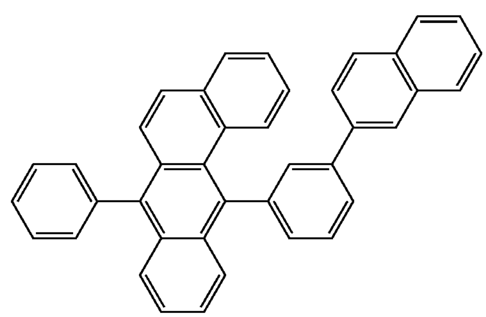
1-91
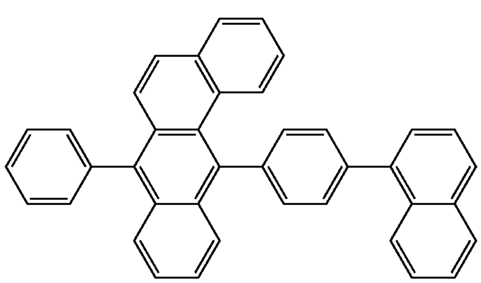
1-92
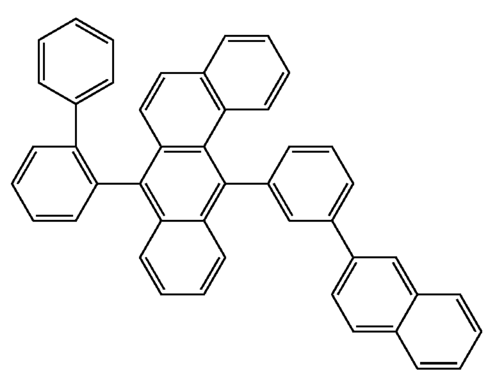

-continued
1-93
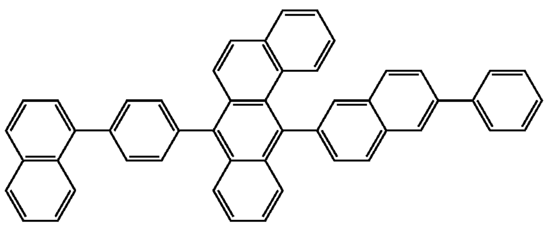
1-94
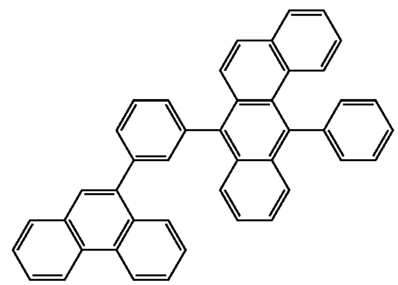
1-95
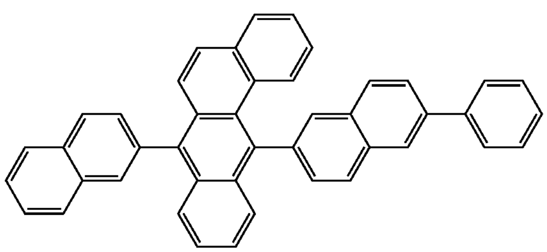
1-96
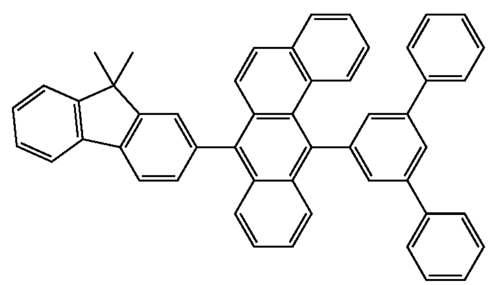
1-97
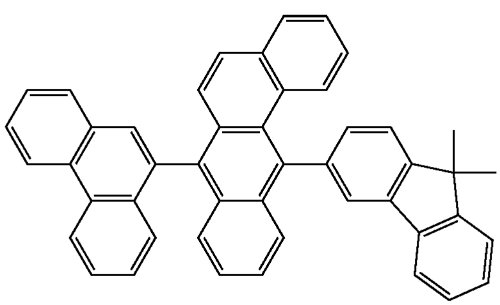
1-98
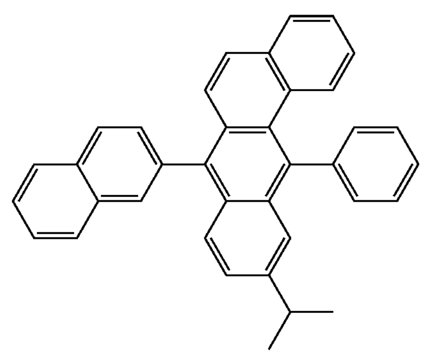
1-99
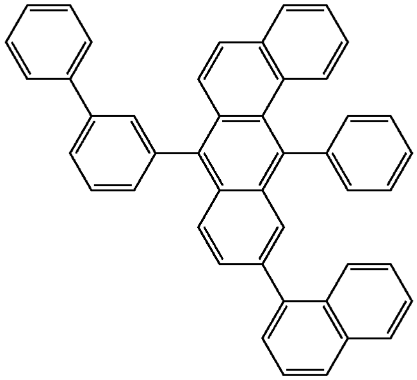
1-100
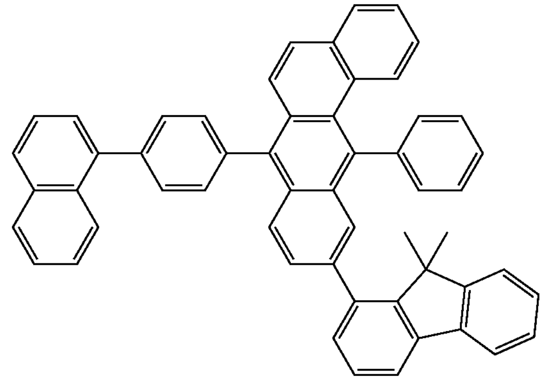

-continued
1-101
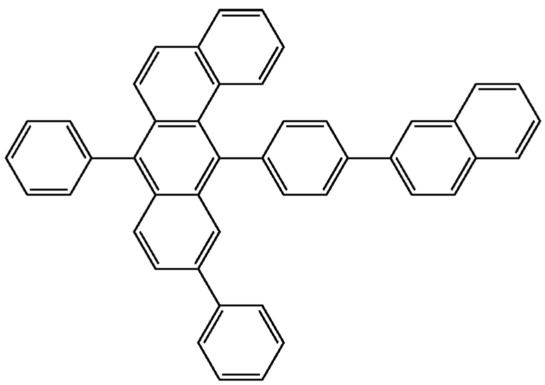
1-102
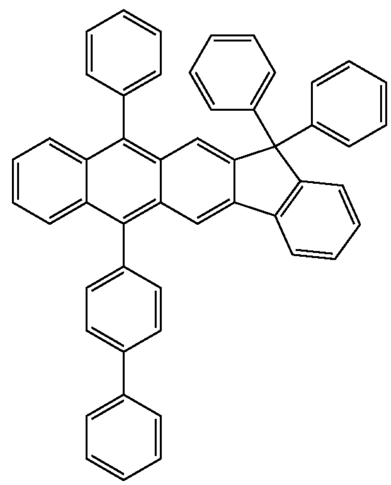
1-103
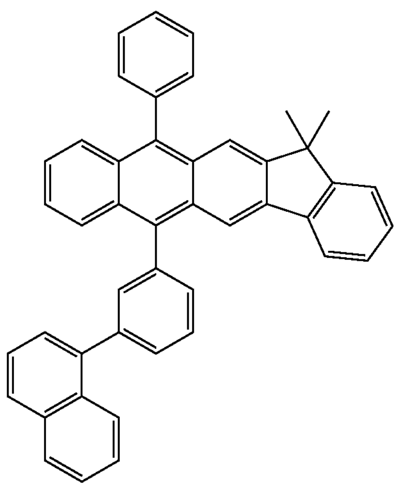
1-104
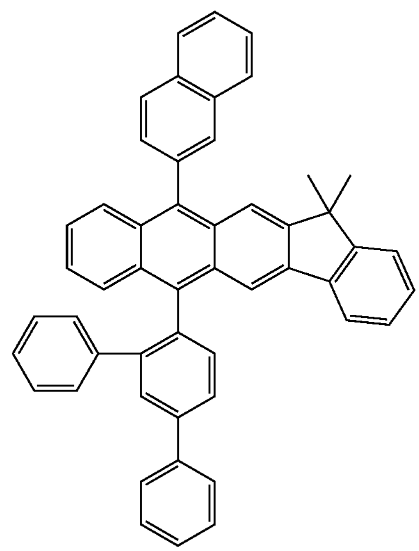
1-105
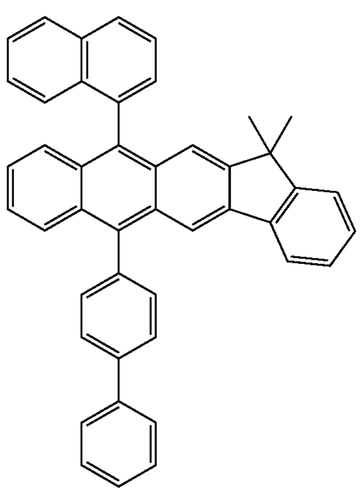
1-106
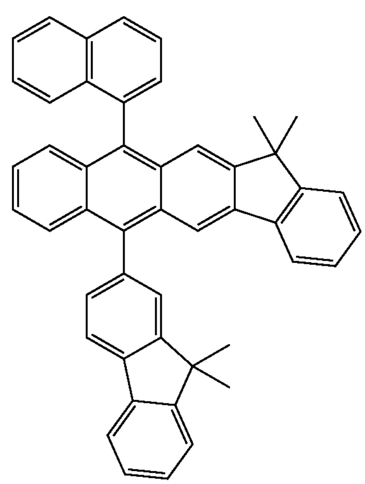

-continued
1-107
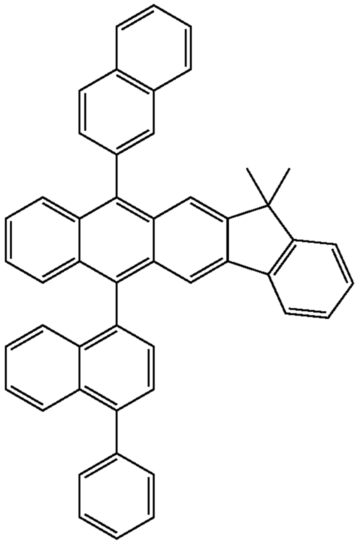
1-108
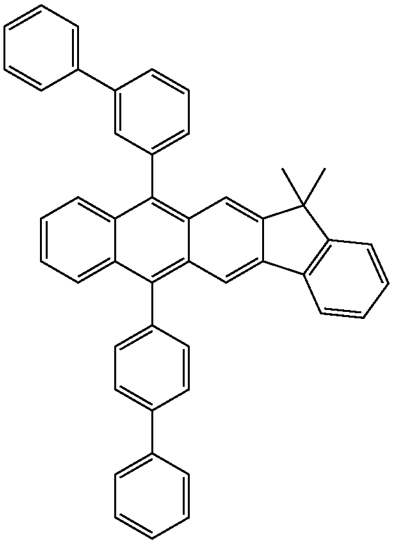
1-109
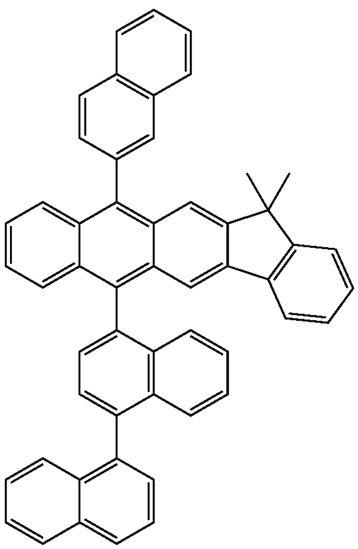
1-110
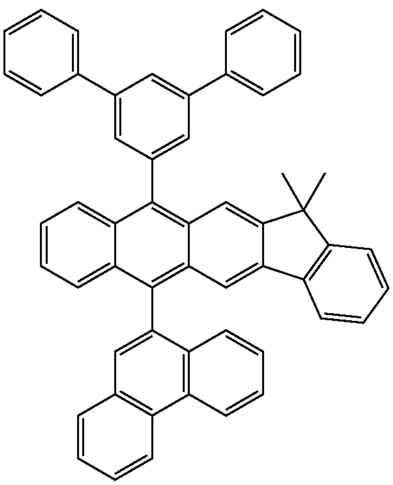
1-111
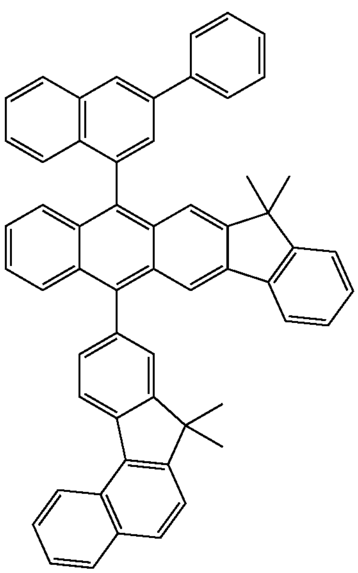
1-112
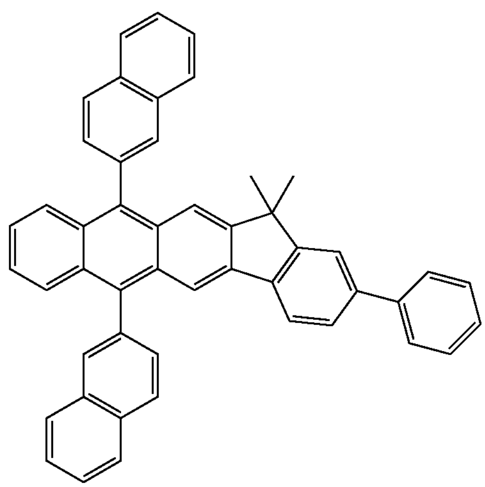

-continued
1-113
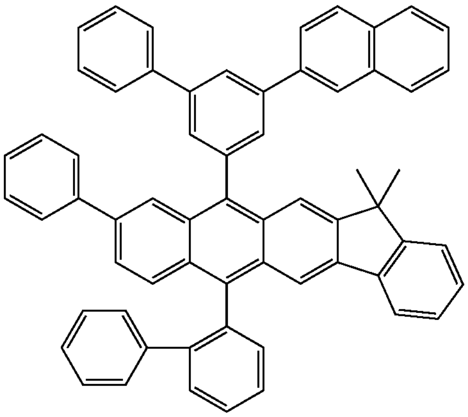
1-114
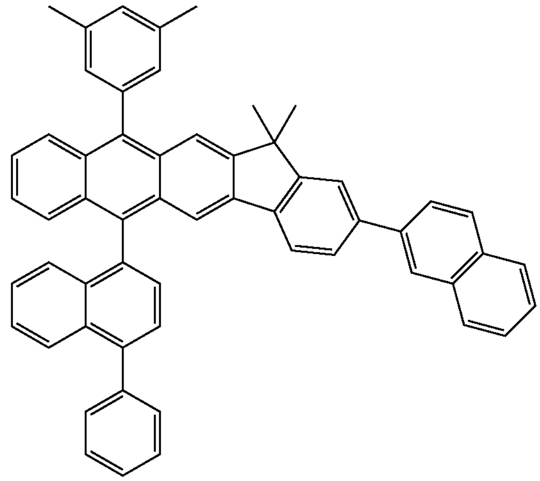
1-115
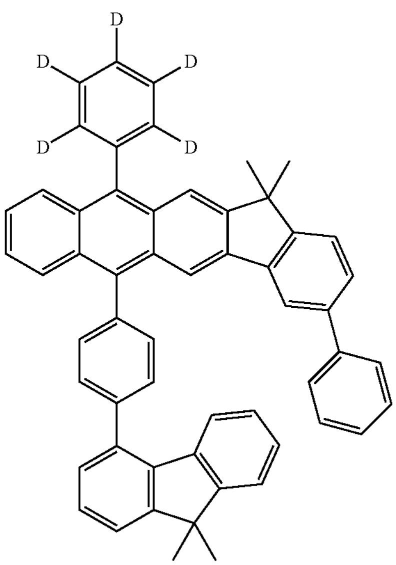
1-116
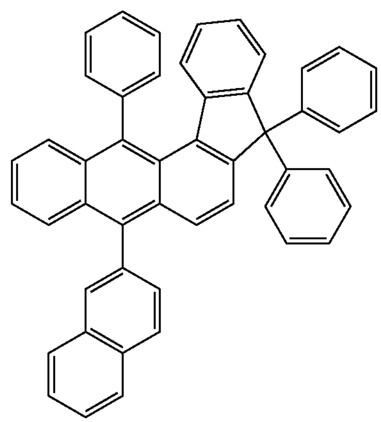
1-117
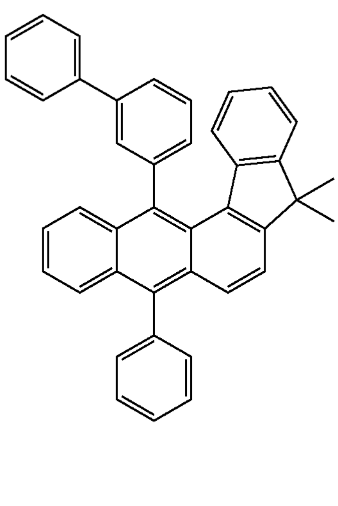
1-118
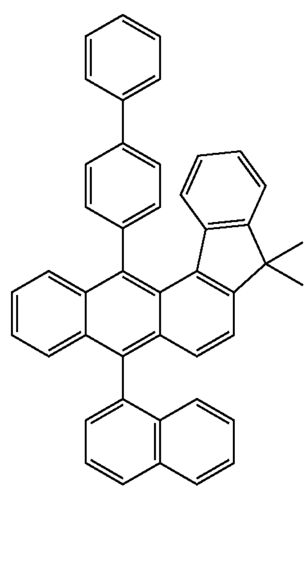

-continued
1-119
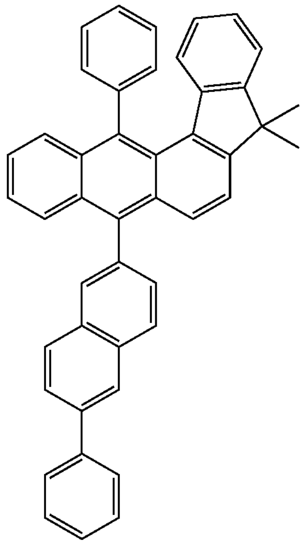
1-120
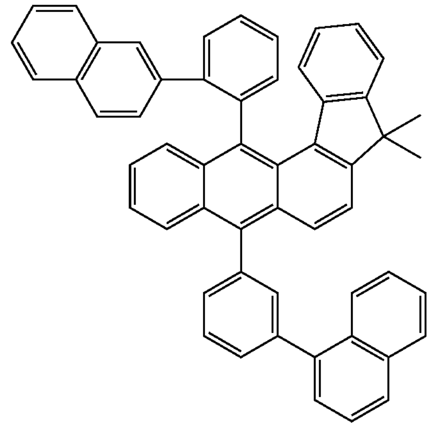
1-121
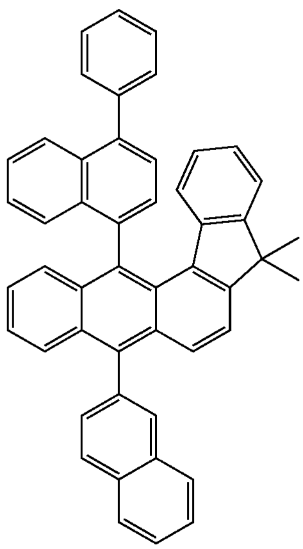
1-122
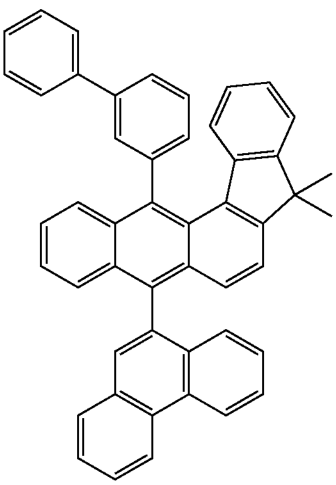
1-123
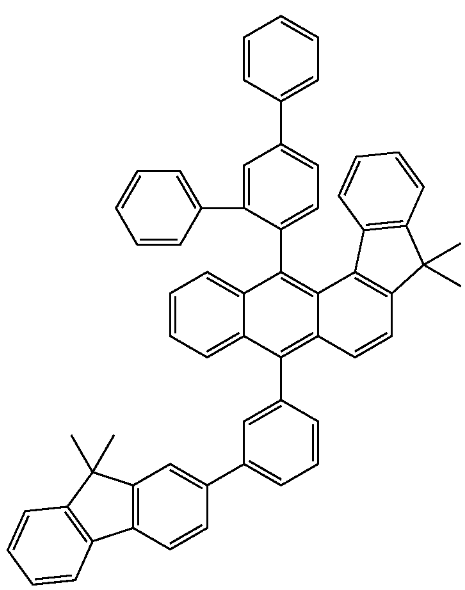
1-124
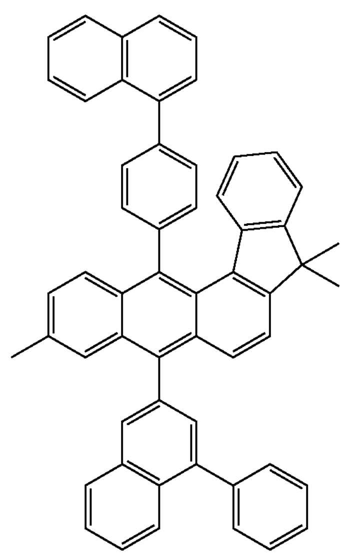

-continued
1-125
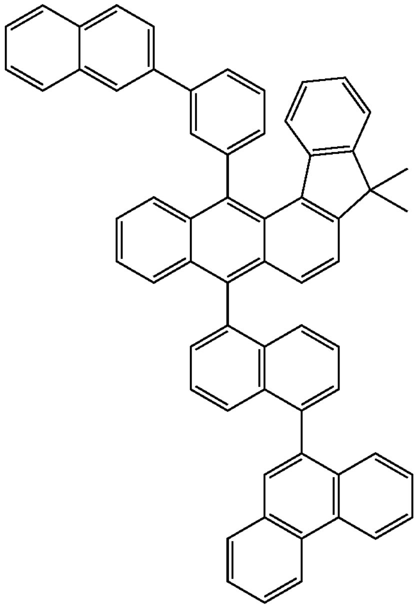
1-126
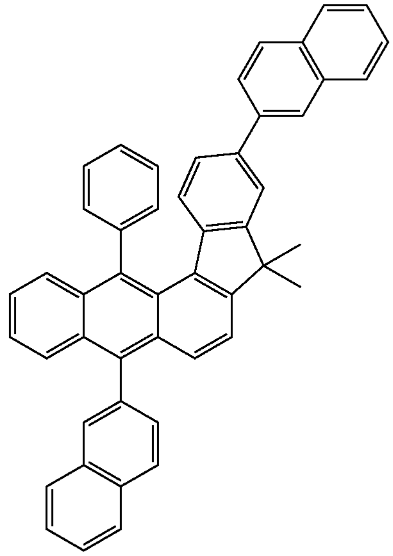
1-127
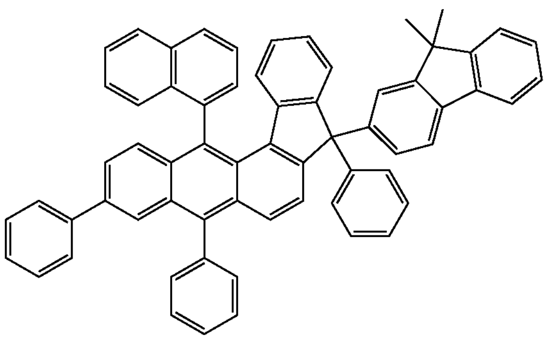
1-128
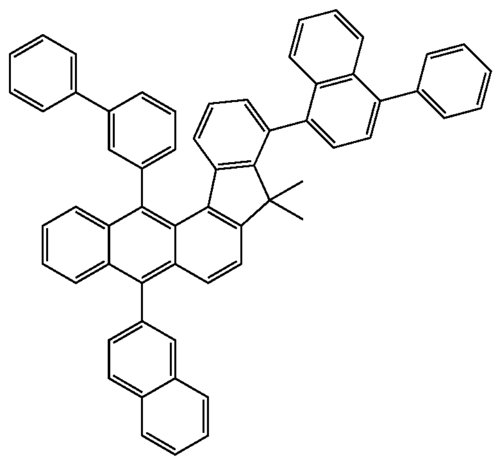
1-129
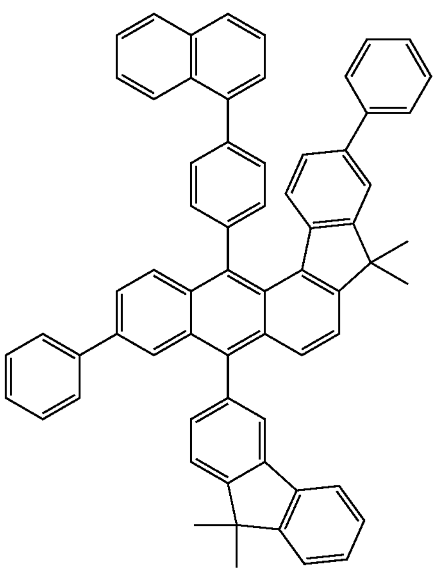
1-130
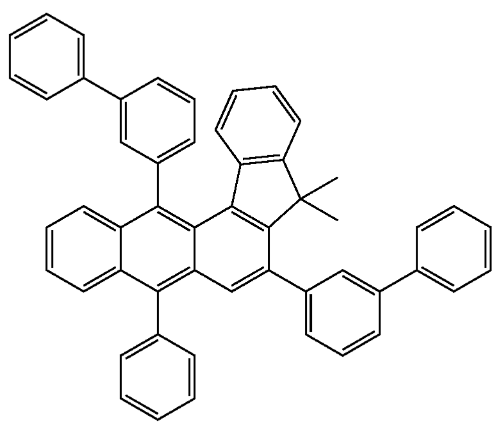

-continued
1-131
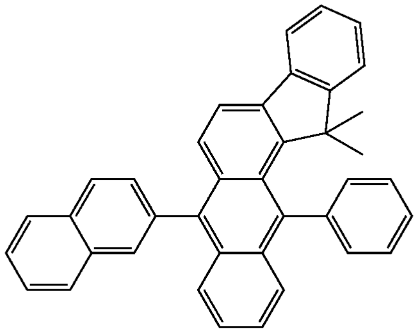
1-132
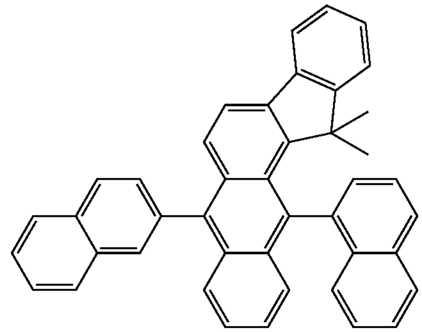
1-133
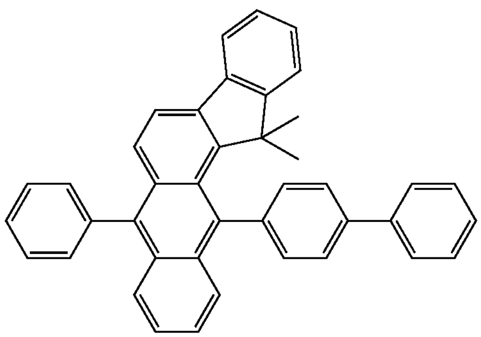
1-134
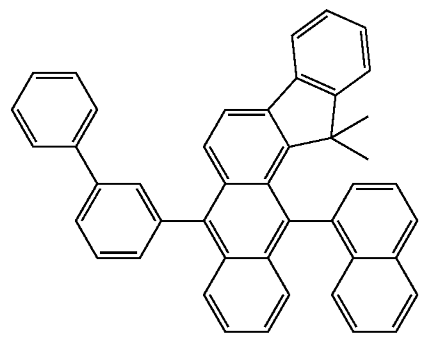
1-135
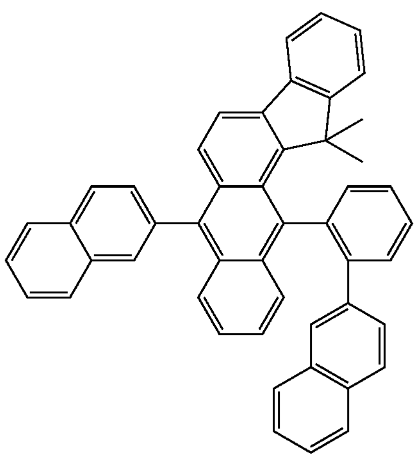
1-136
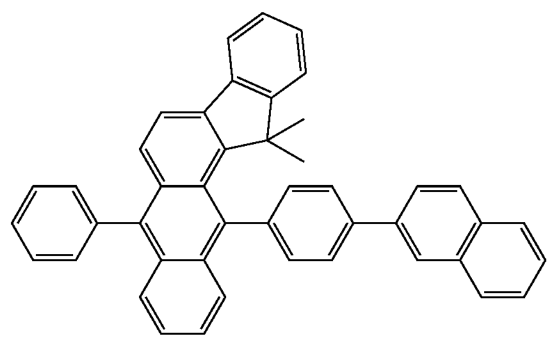
1-137
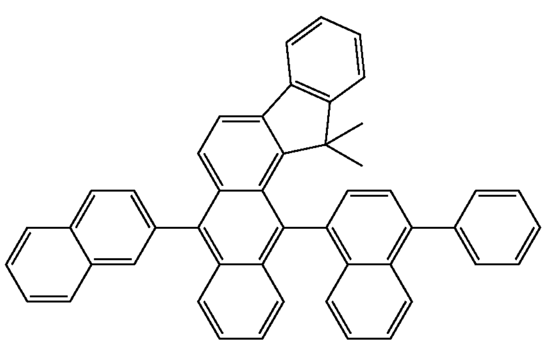
1-138
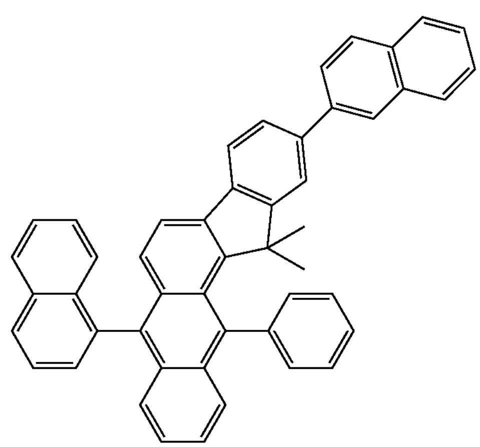

-continued
1-139
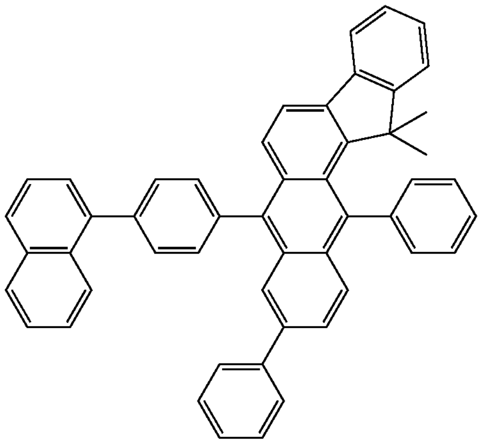
In one or more embodiments, the second compound represented by Formula 2A or 2B may be selected from Compounds 2-1a to 2-172a and 2-1 to 2-262, but embodiments of the present disclosure are not limited thereto:
2-1a
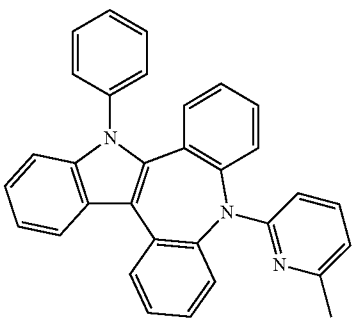
2-2a
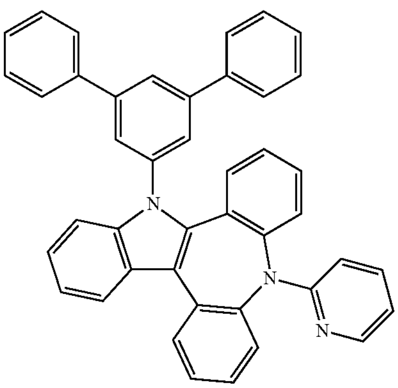
2-3a
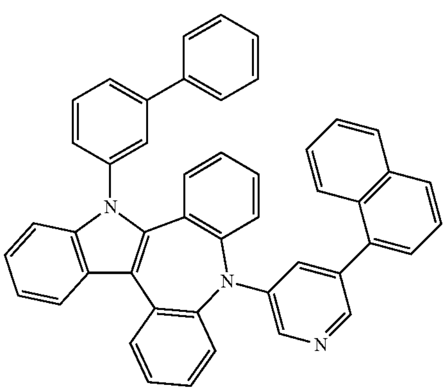
-continued
2-4a
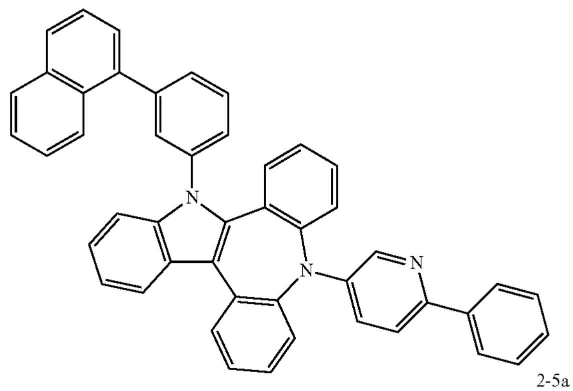
2-5a
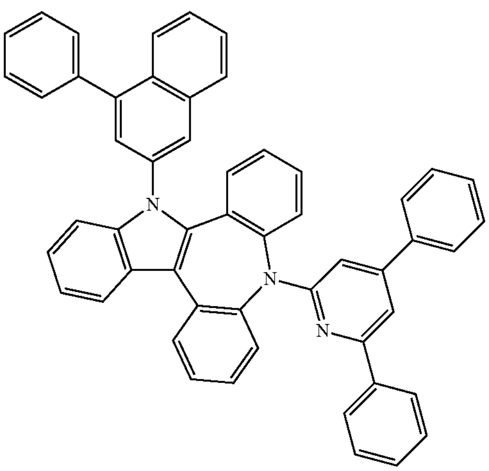
2-6a
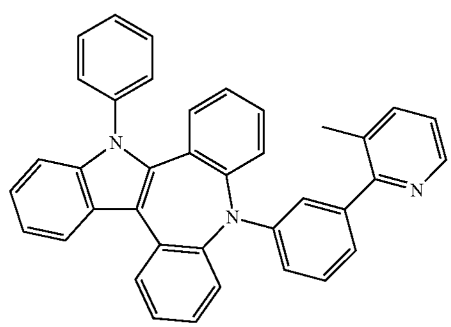

2-7a
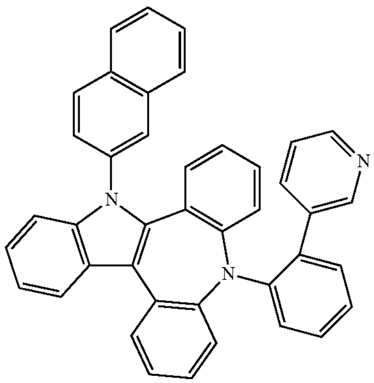
2-8a
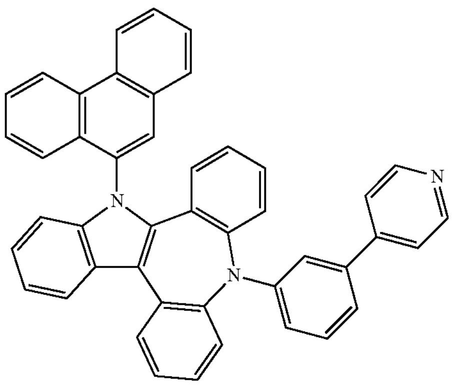
2-9a
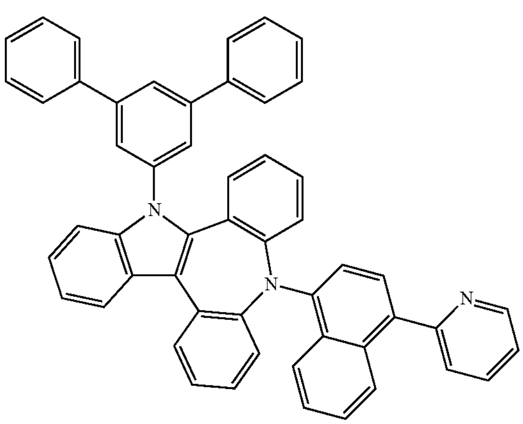
2-10a
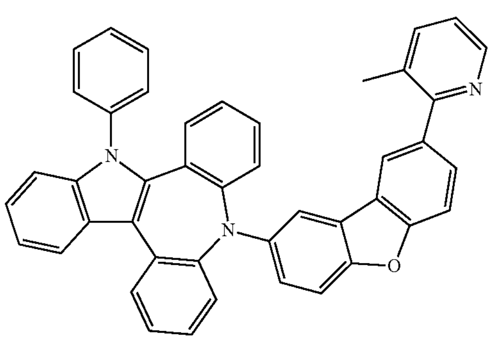
2-11a
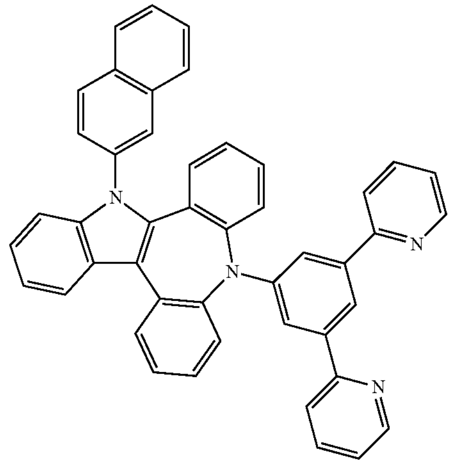
2-12a
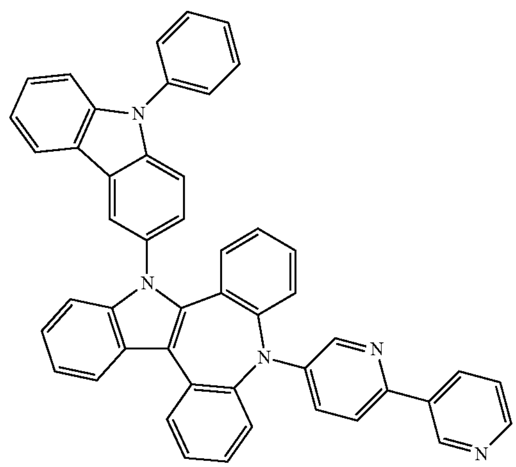
2-13a
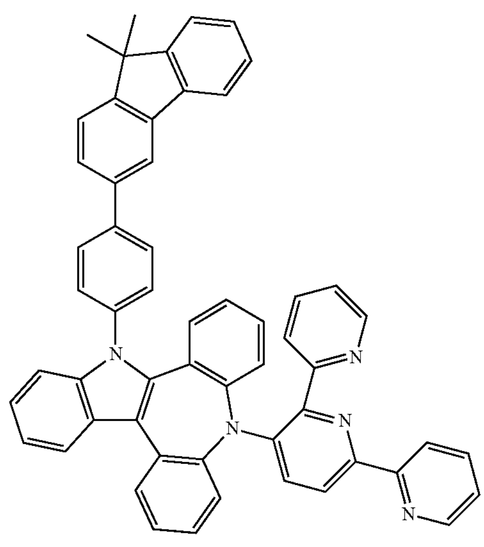

-continued
2-14a
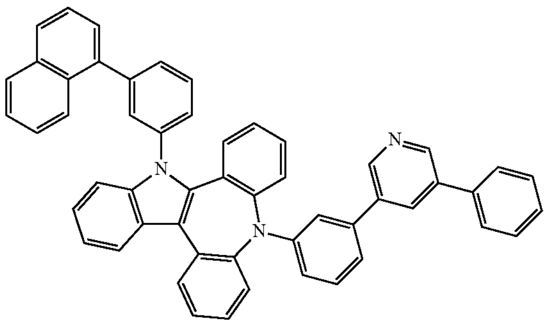
2-15a
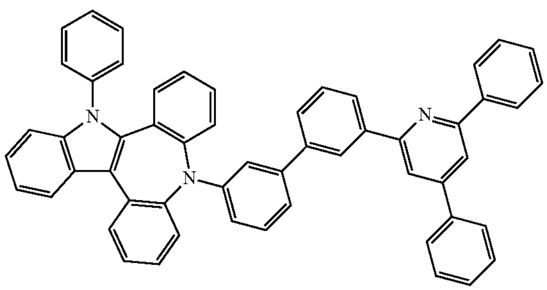
2-16a
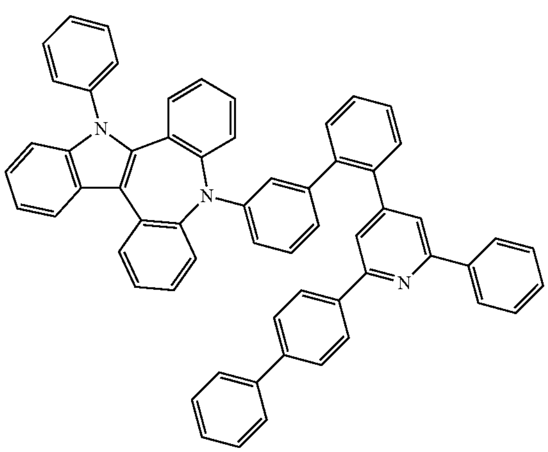
2-17a
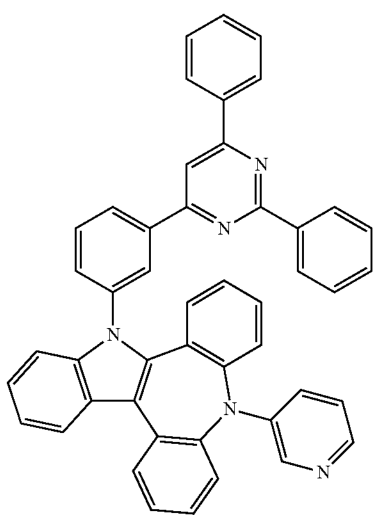
-continued
2-18a
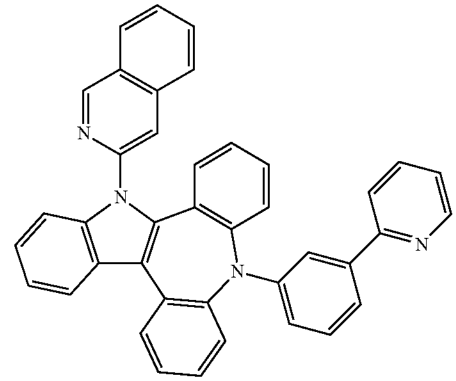
2-19a
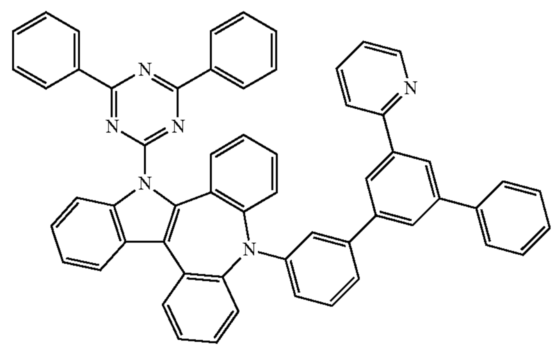
2-20a
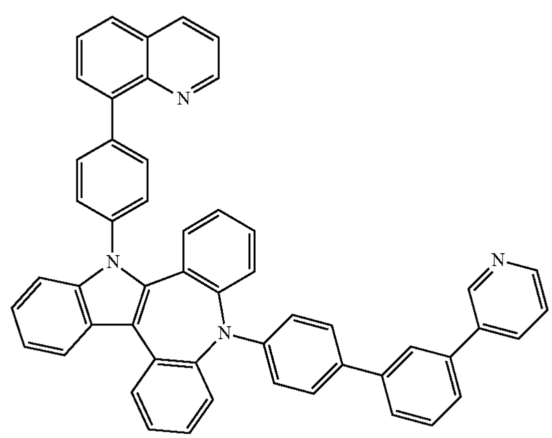

-continued
2-21a
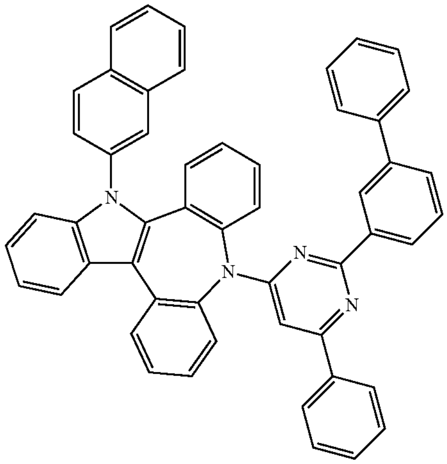
2-22a
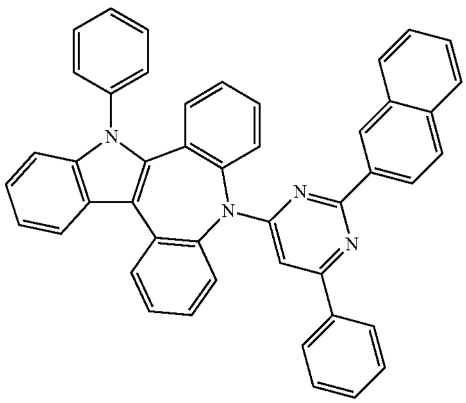
2-23a
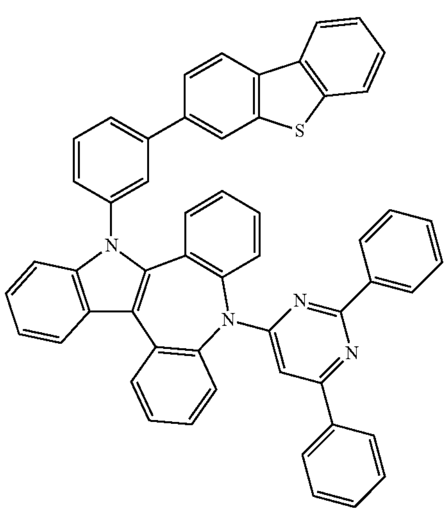
-continued
2-24a
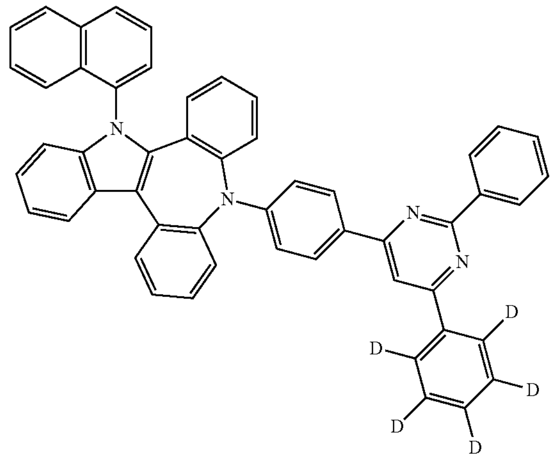
2-25a
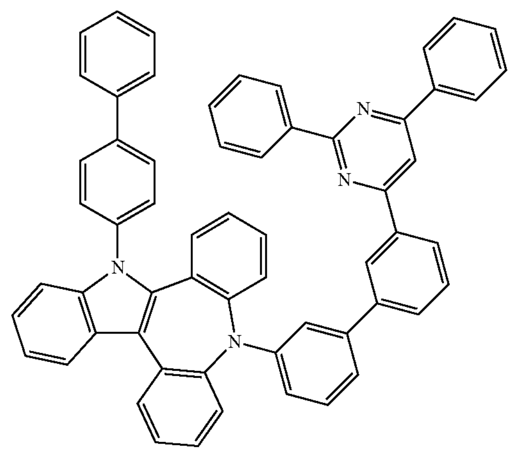
2-26a
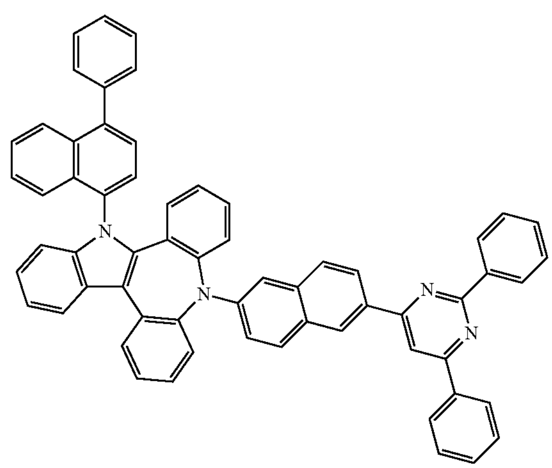

2-27a
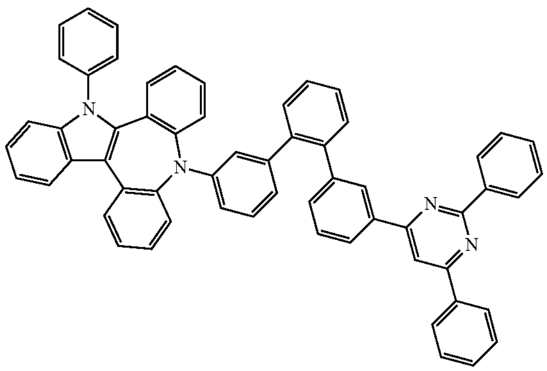
2-28a
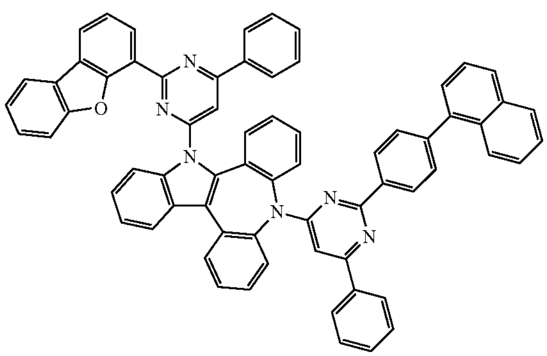
2-29a
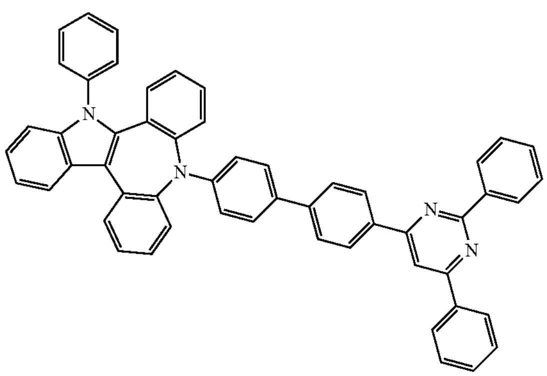
2-30a
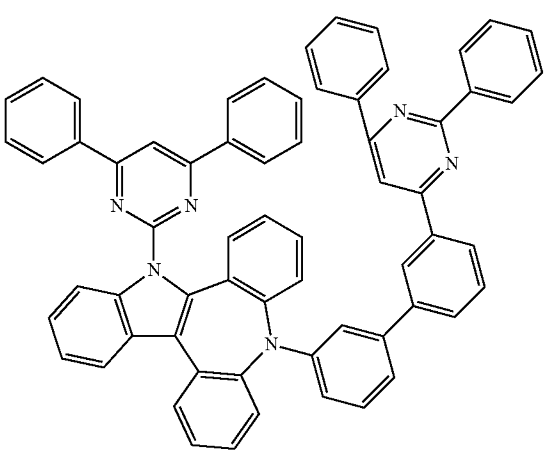
2-31a
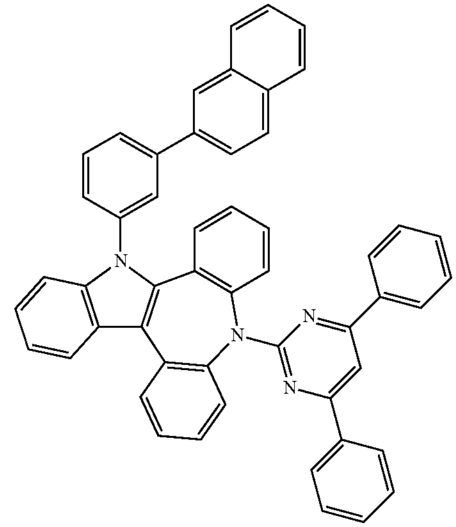
2-32a
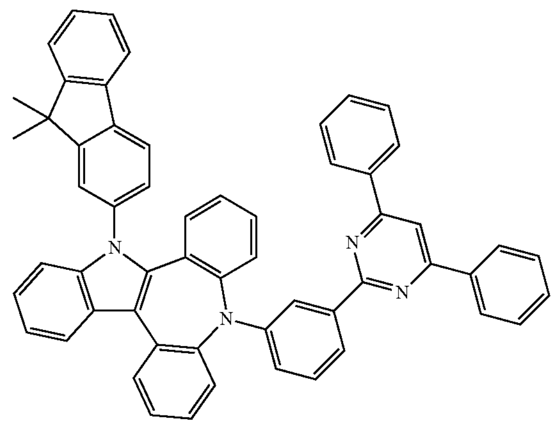
2-33a
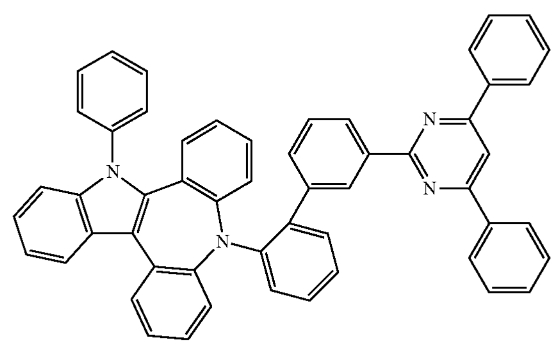
2-34a
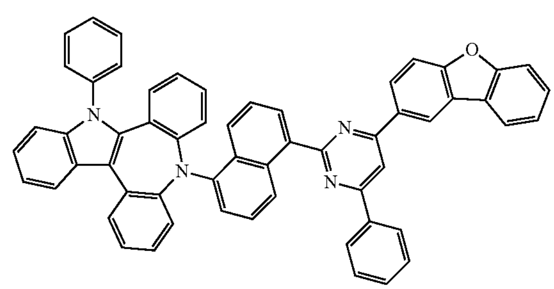

-continued
2-35a
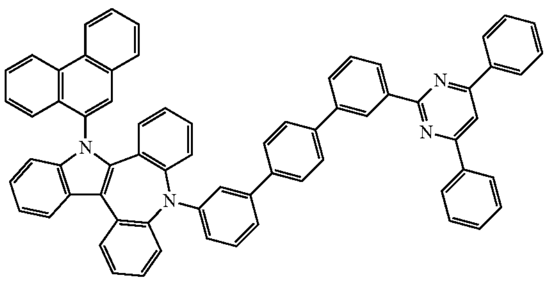
2-36a
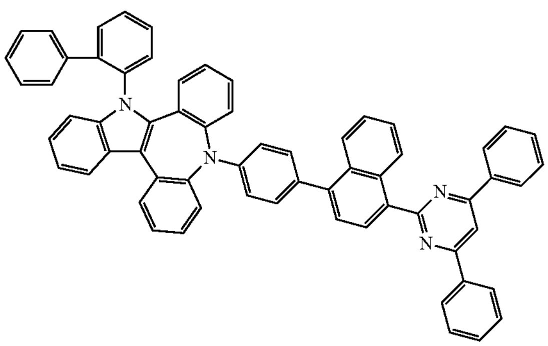
2-37a
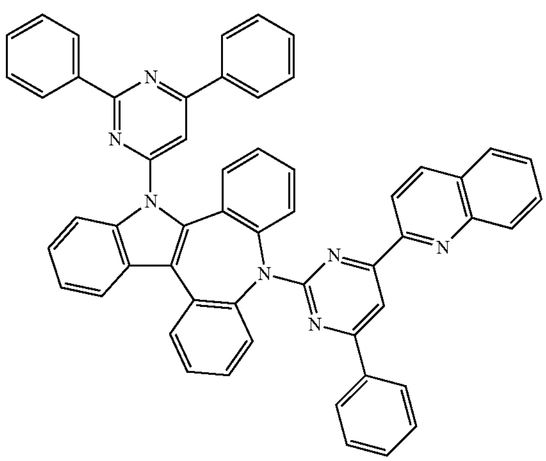
2-38a
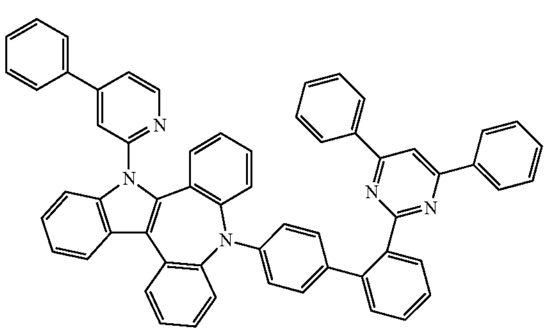
-continued
2-39a
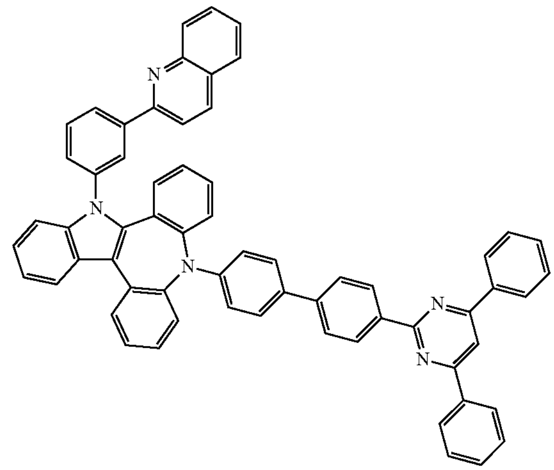
2-40a
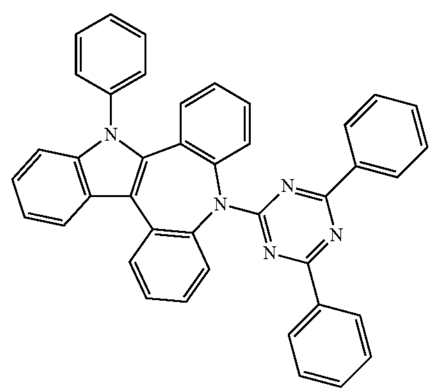
2-41a
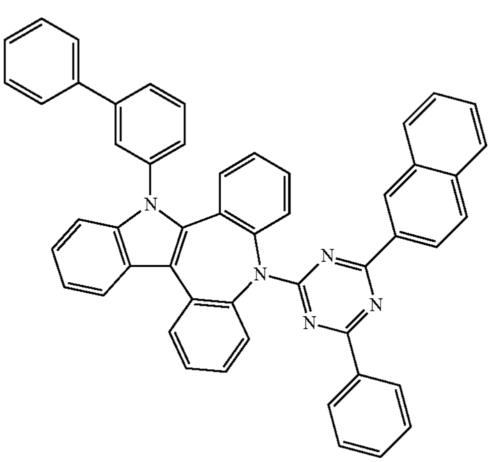

-continued
2-42a
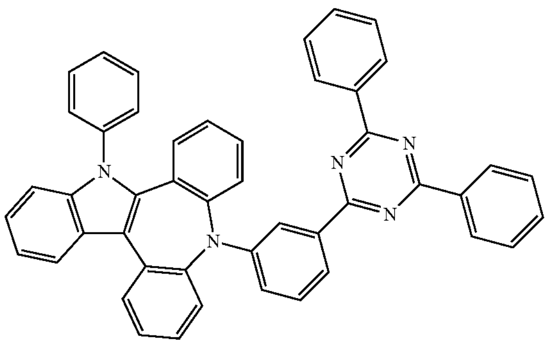
2-43a
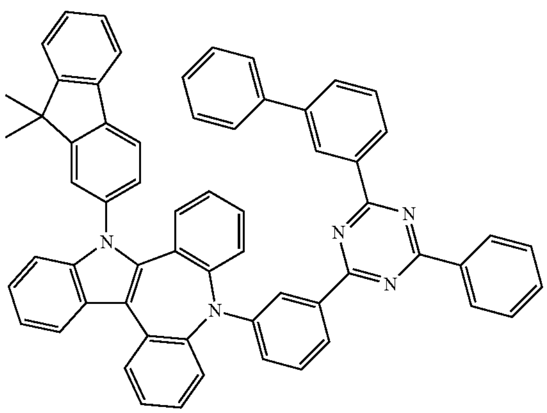
2-44a
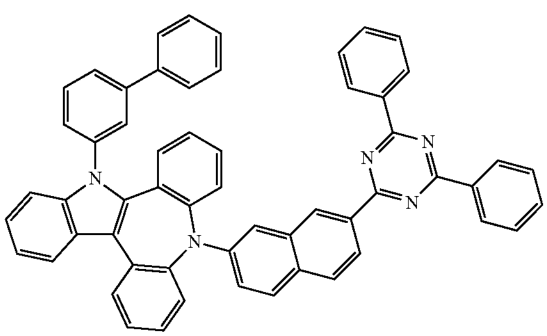
2-45a
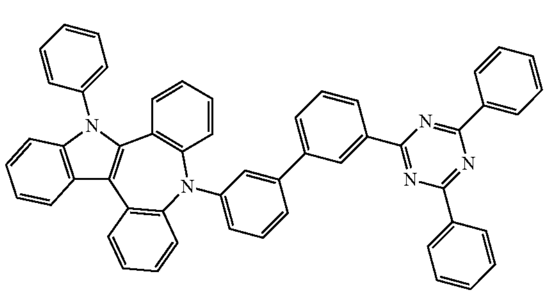
-continued
2-46a
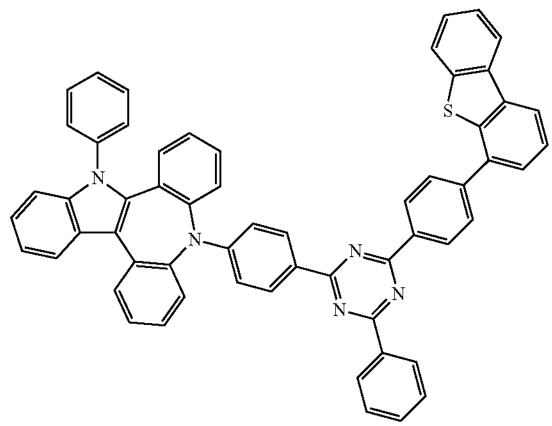
2-47a
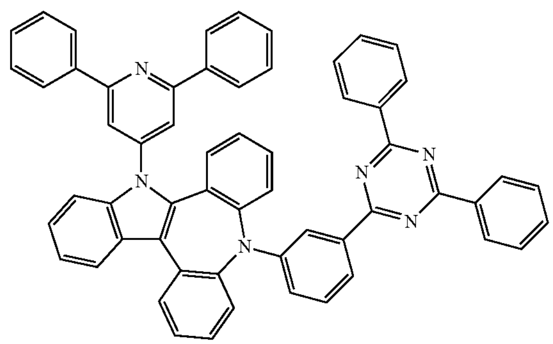
2-48a
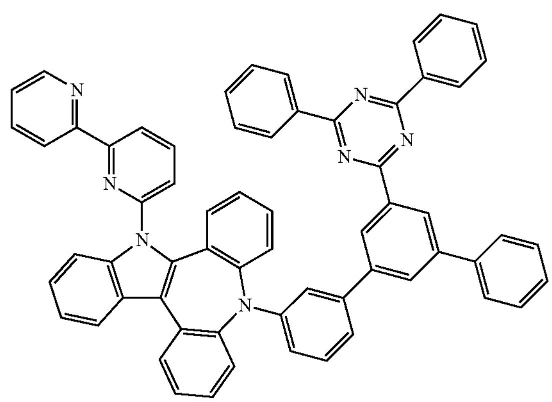
2-49a
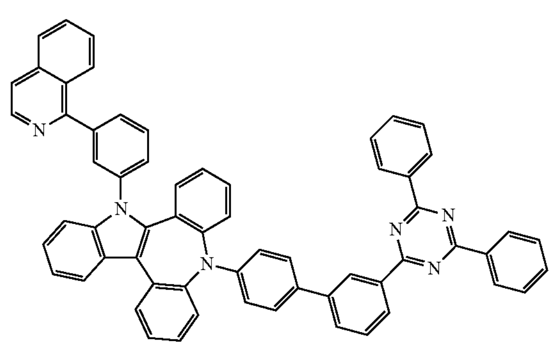

-continued
2-50a
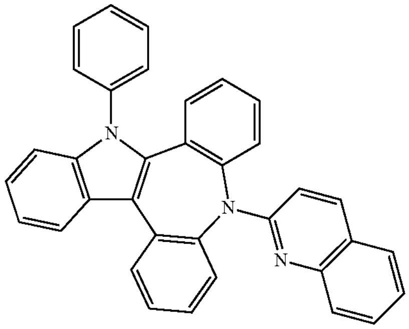
2-51a
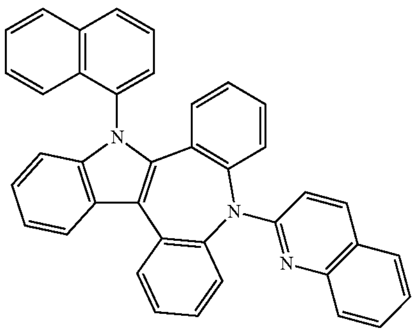
2-52a
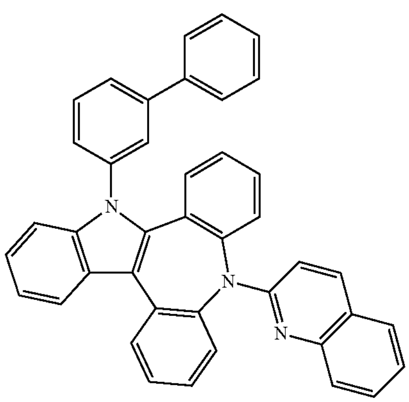
2-53a
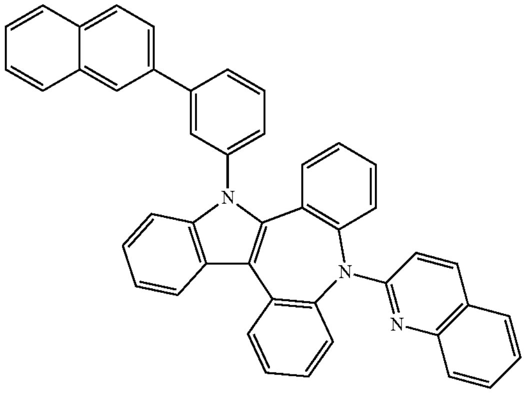
-continued
2-54a
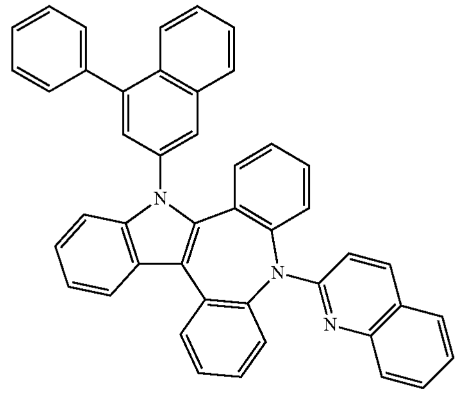
2-55a
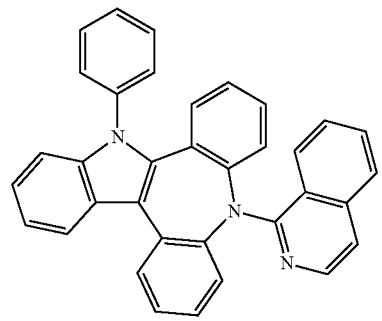
2-56a
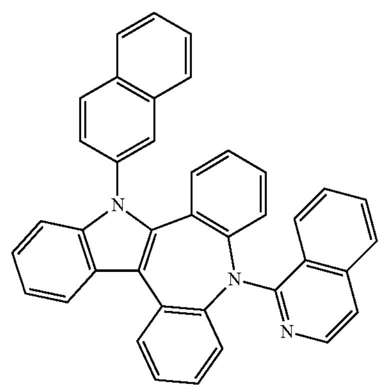
2-57a
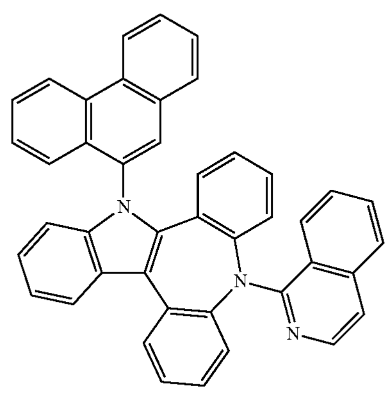

2-58a
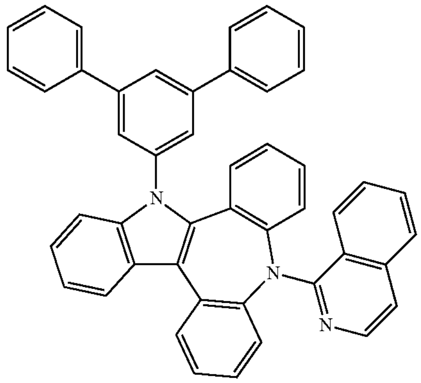
2-59a
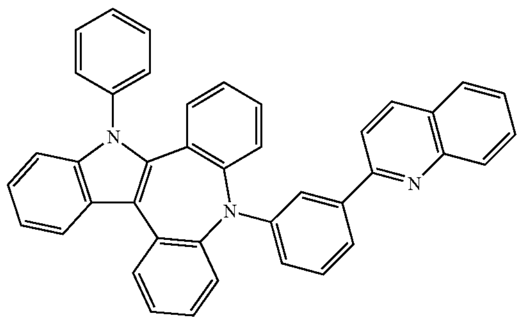
2-60a
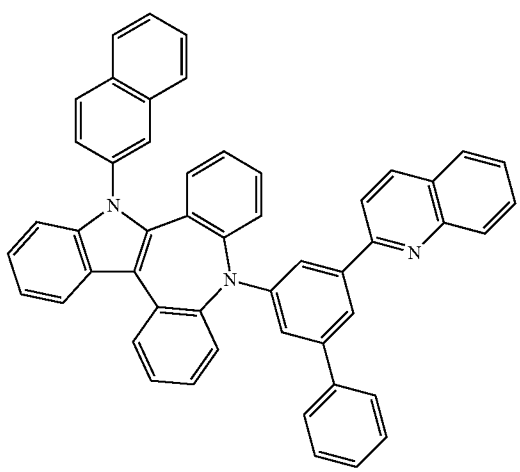
2-61a
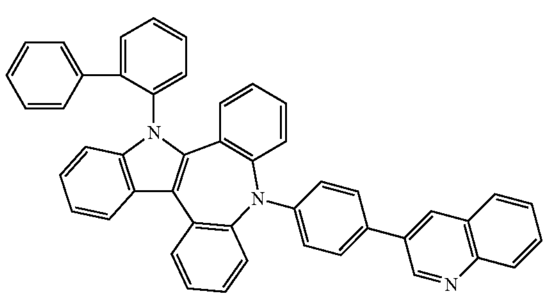
2-62a
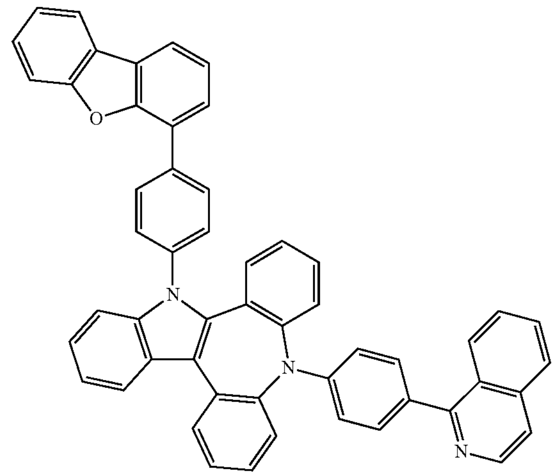
2-63a
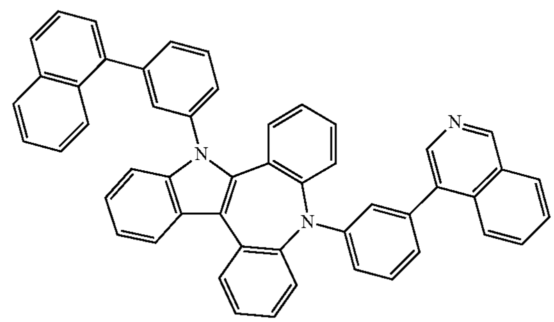
2-64a
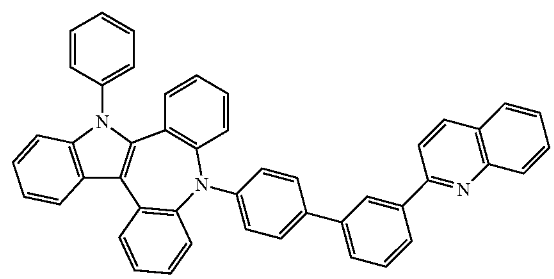
2-65a
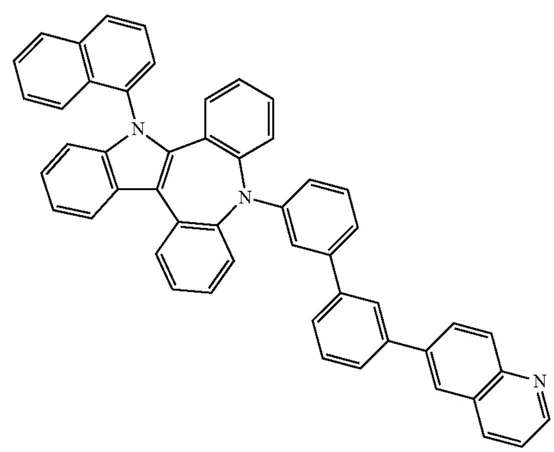

-continued
2-66a
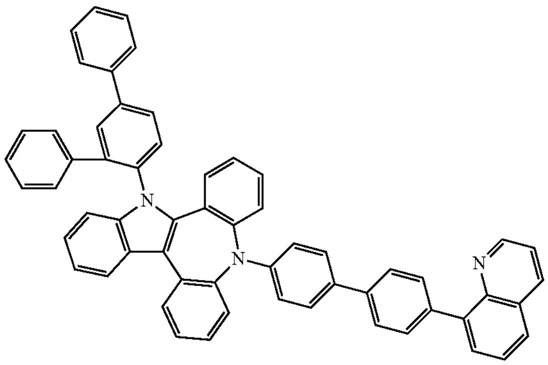
2-67a
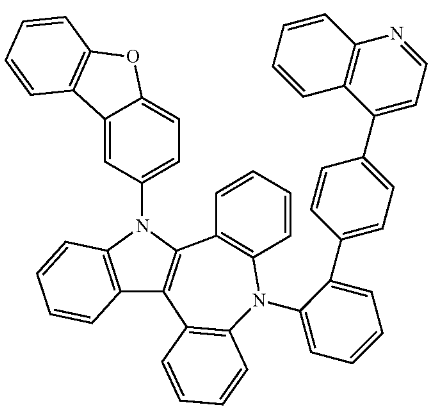
2-68a
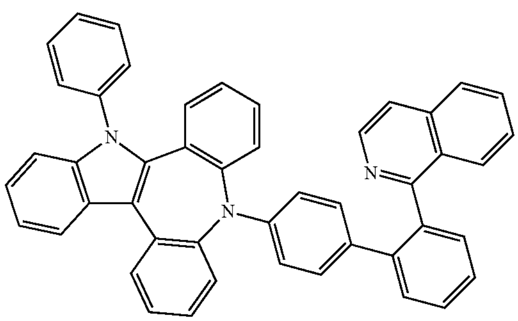
2-69a
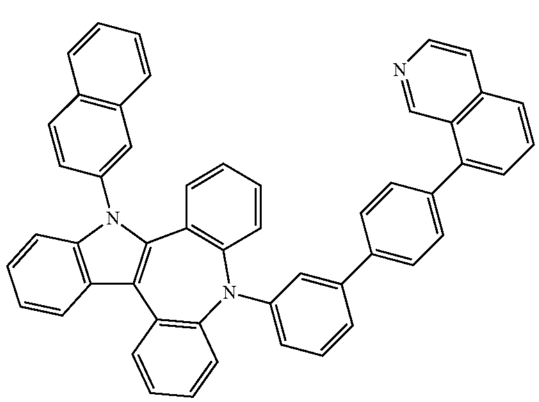
-continued
2-70a
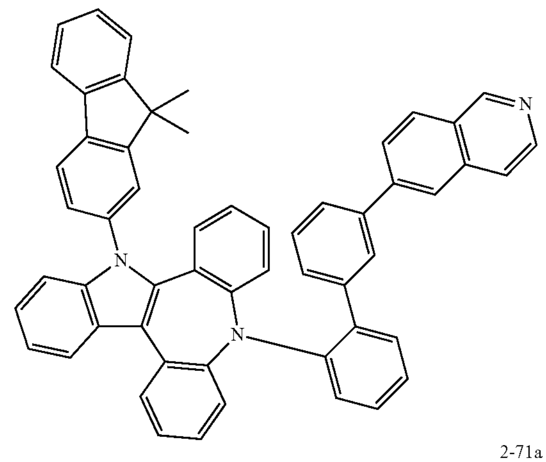
2-71a
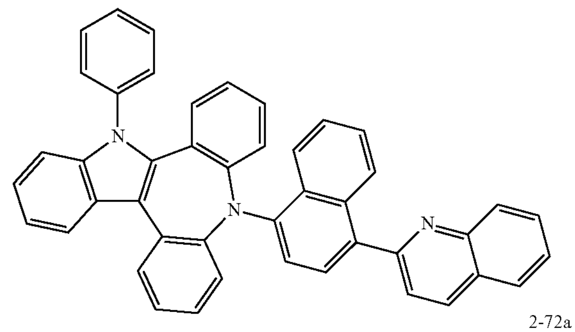
2-72a
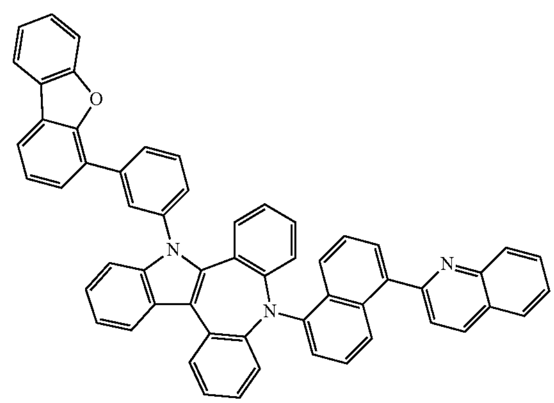
2-73a
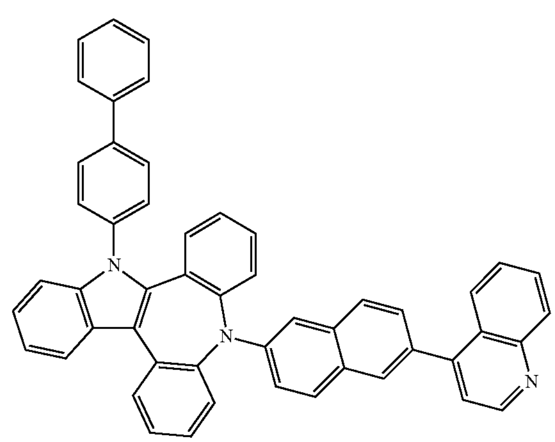

-continued
2-74a
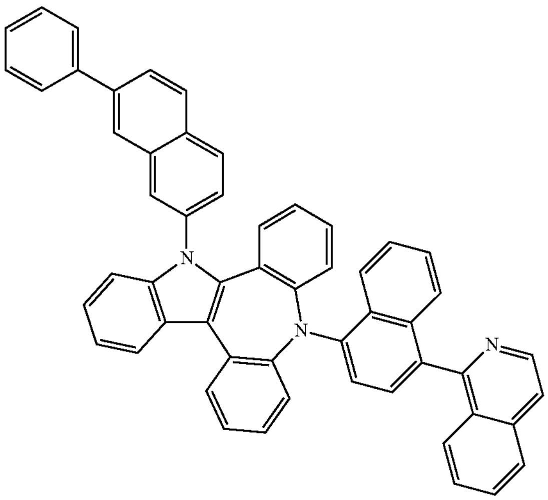
2-75a
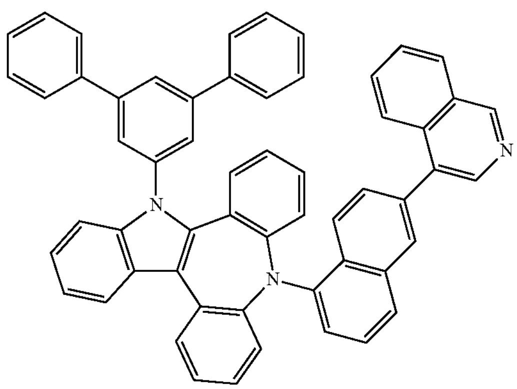
2-76a
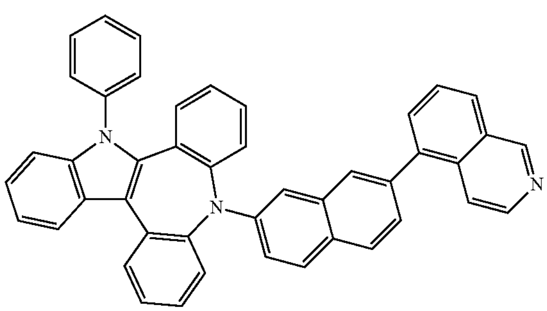
-continued
2-77a
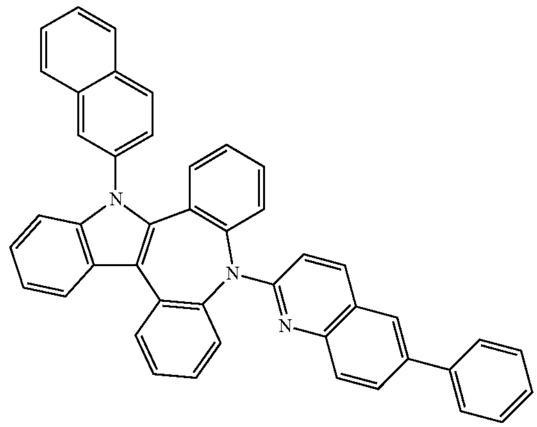
2-78a
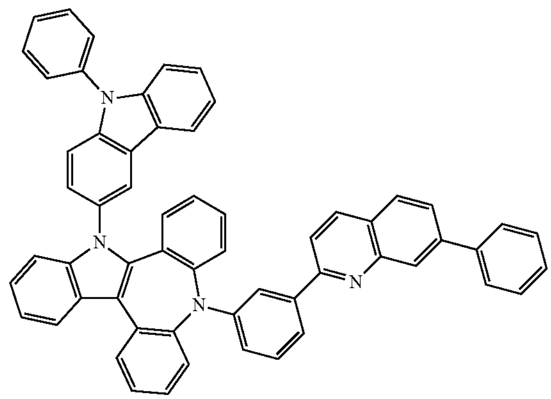
2-79a
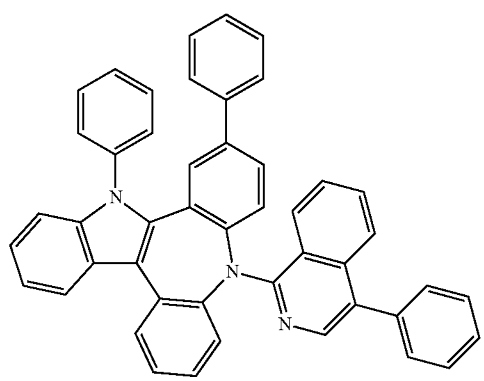

-continued
2-80a
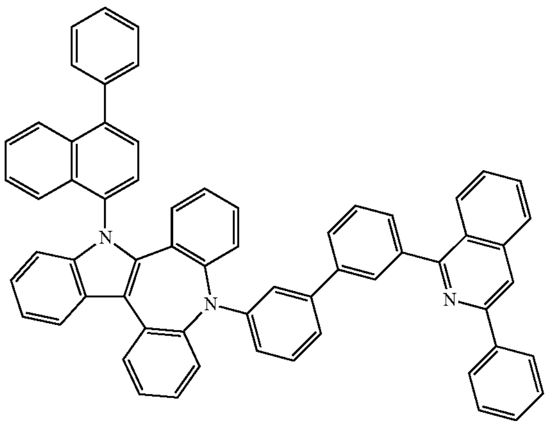
2-81a
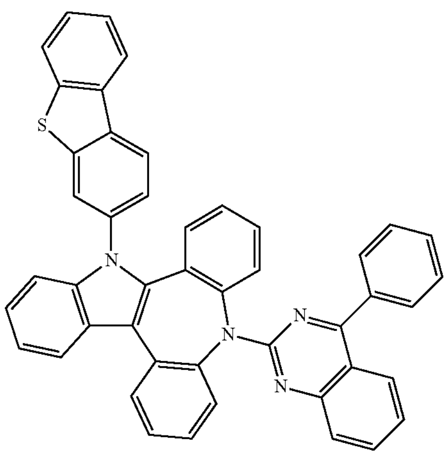
2-82a
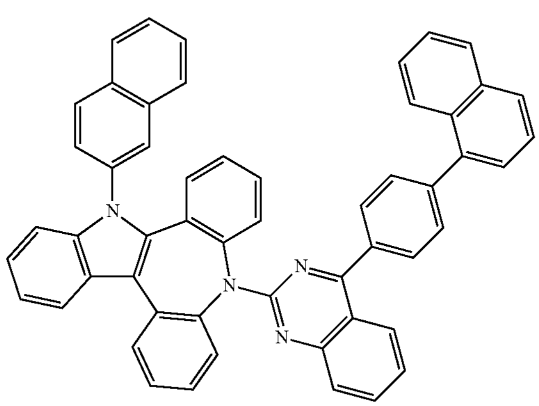
-continued
2-83a
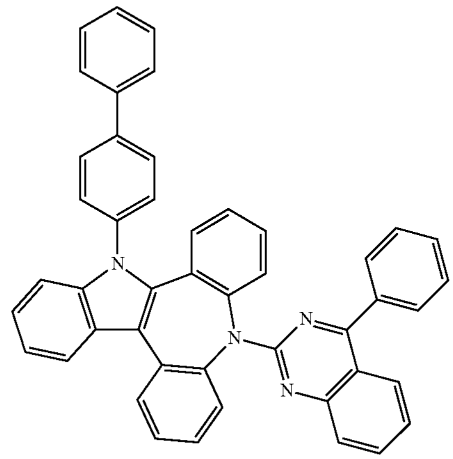
2-84a
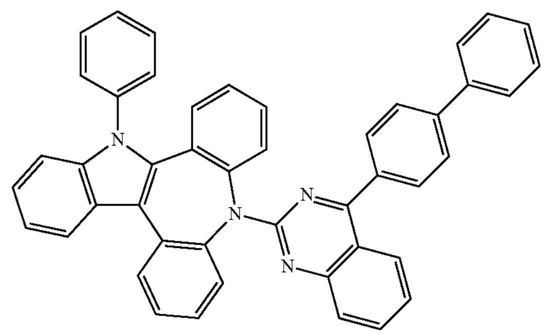
2-85a
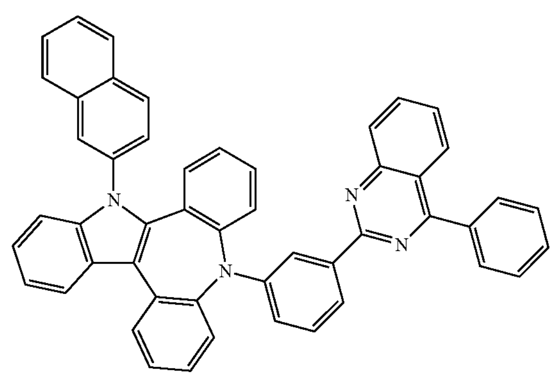
2-86a
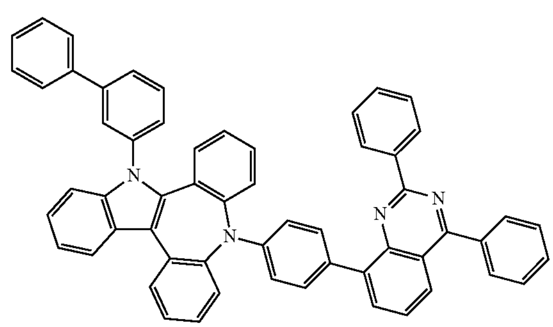

2-87a
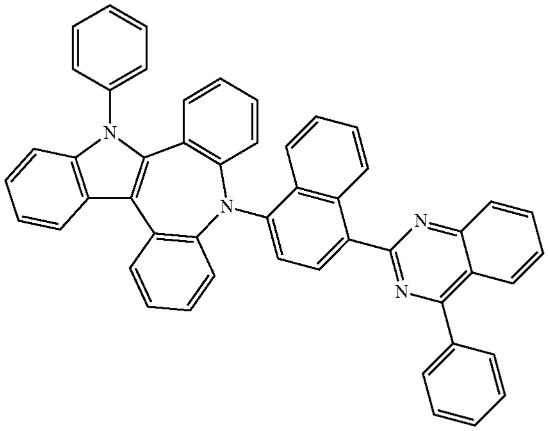
2-88a
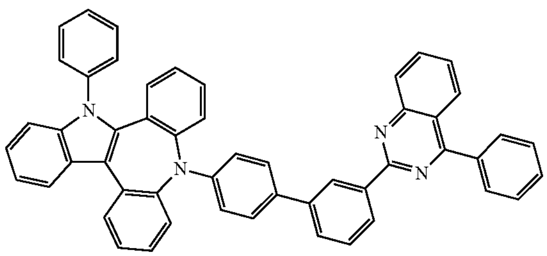
2-89a
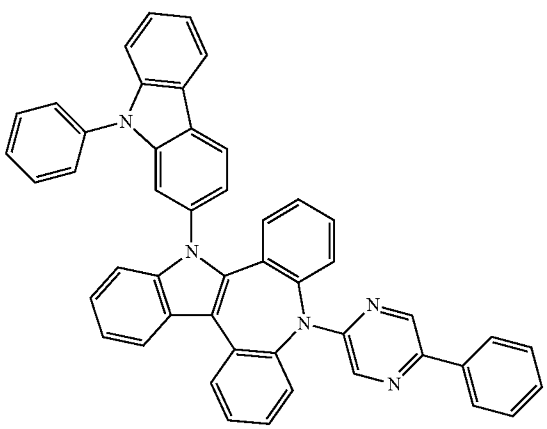
2-90a
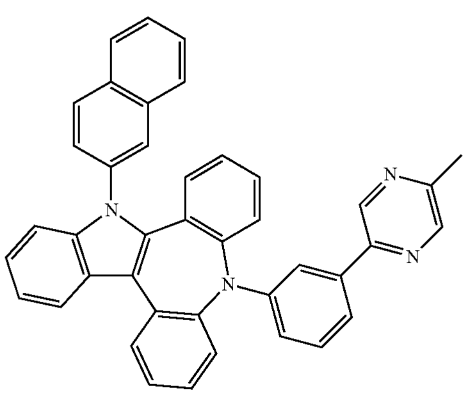
2-91a
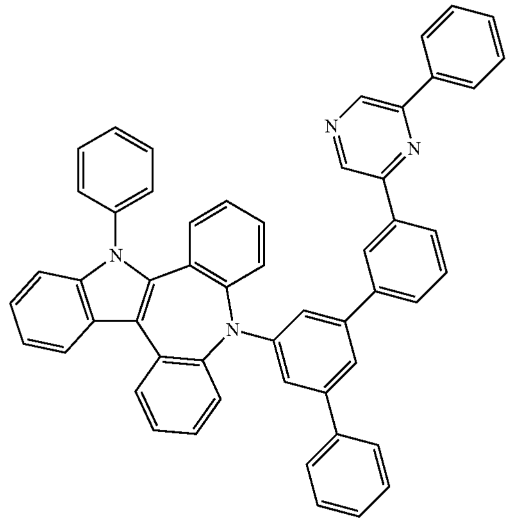
2-92a
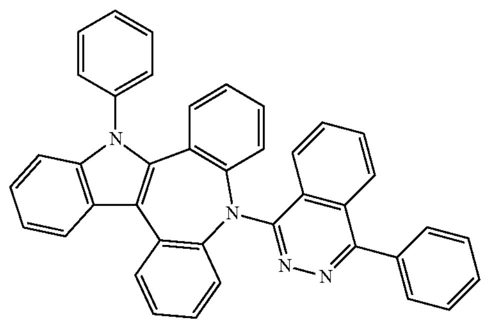
2-93a
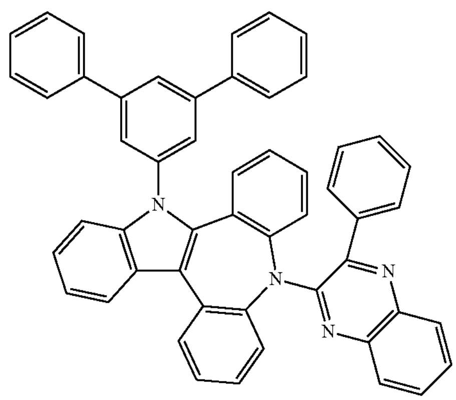
2-94a
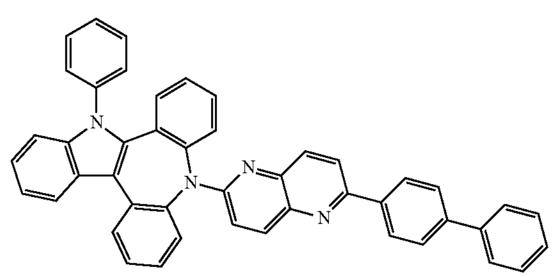

-continued
2-95a
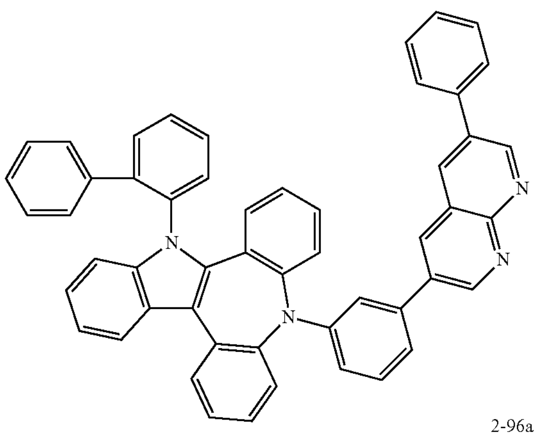
2-96a
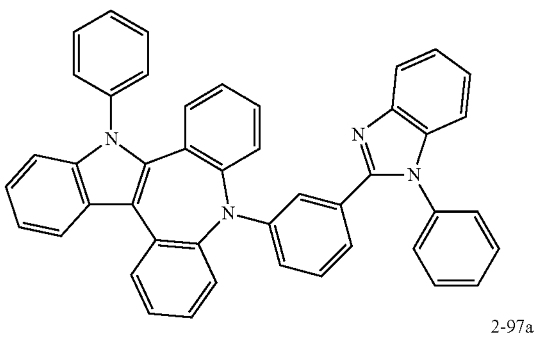
2-97a
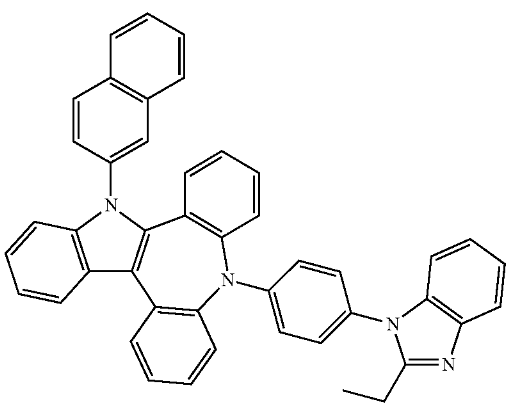
2-98a
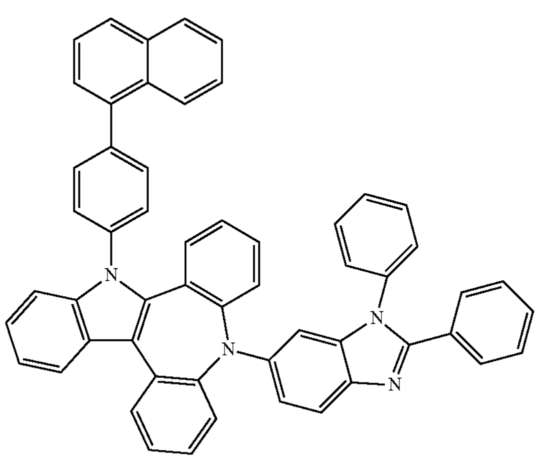
-continued
2-99a
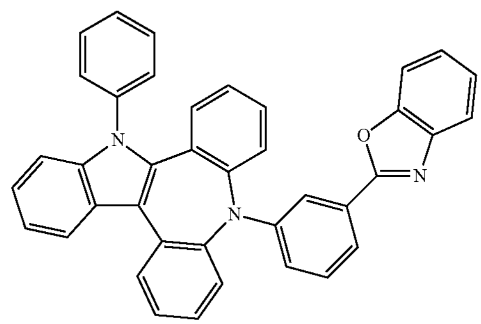
2-100a
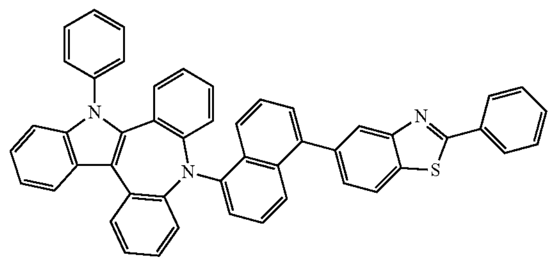
2-101a
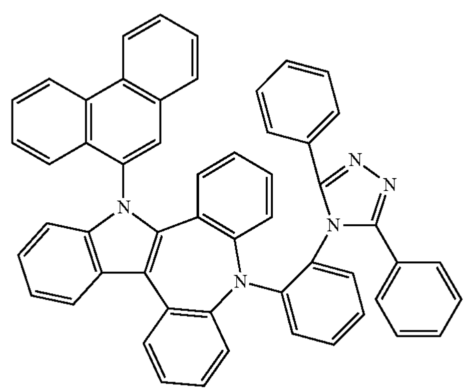
2-102a
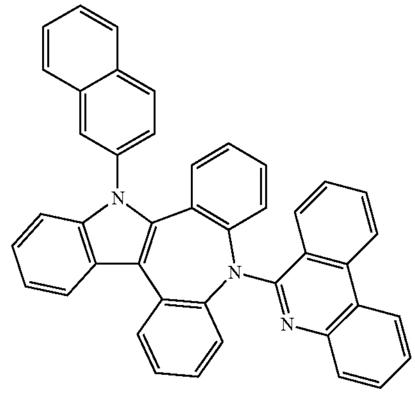

-continued
2-103a
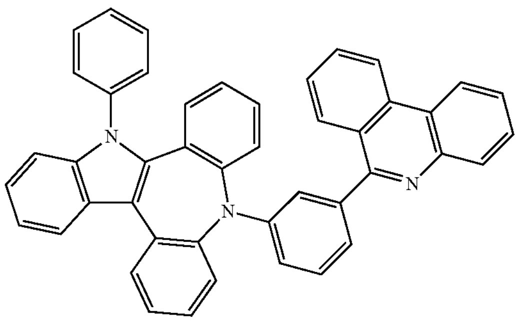
2-104a
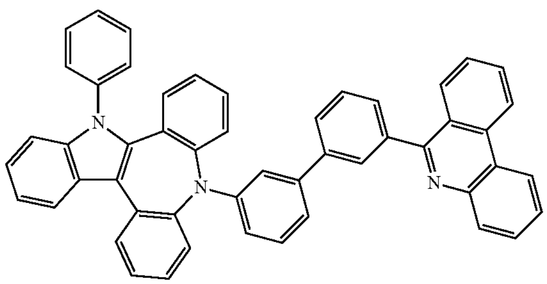
2-105a
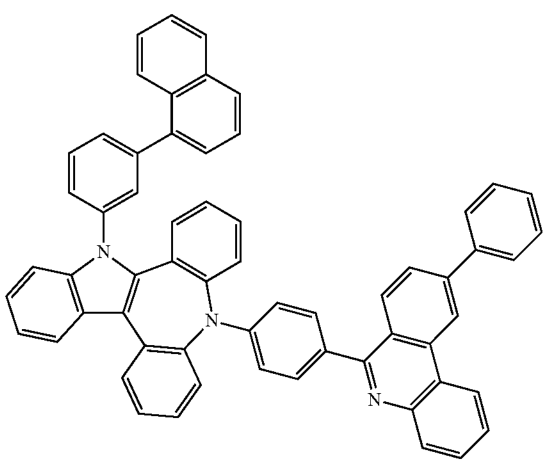
2-106a
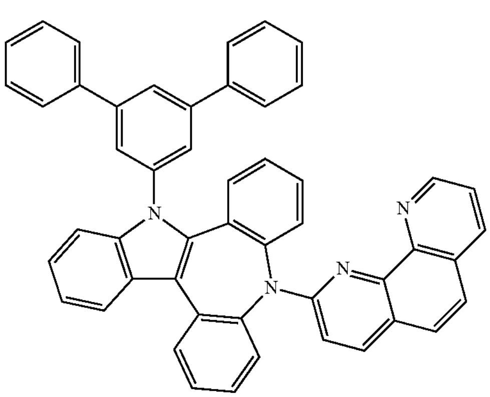
-continued
2-107a
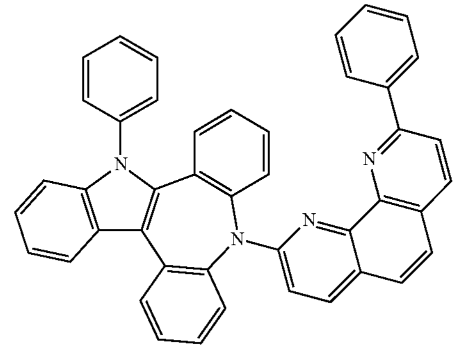
2-108a
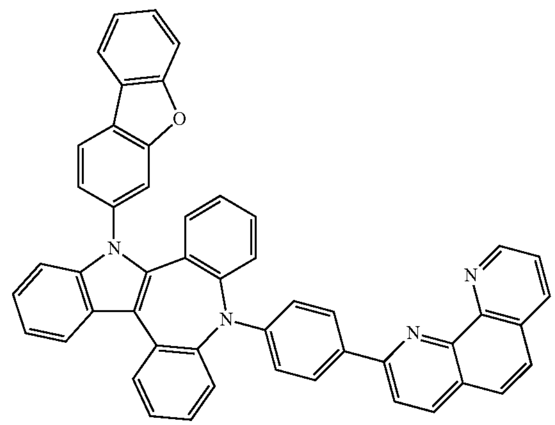
2-109a
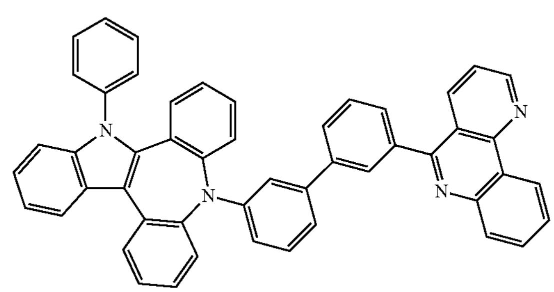
2-110a
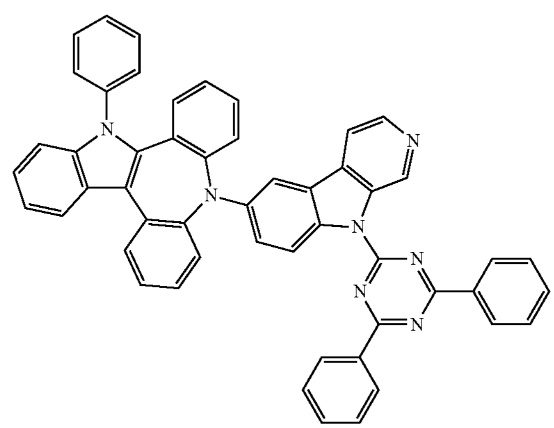

-continued
2-111a
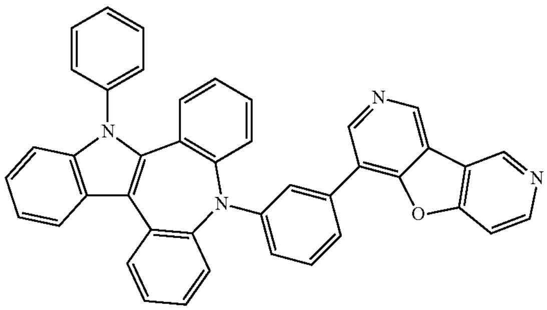
2-112a
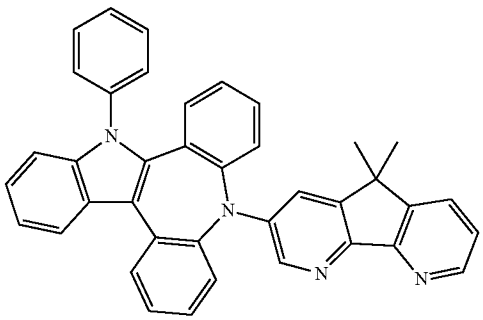
2-113a
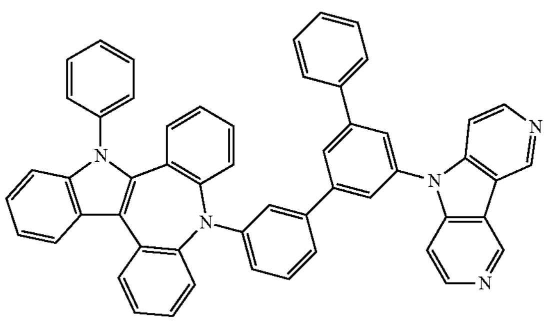
2-114a
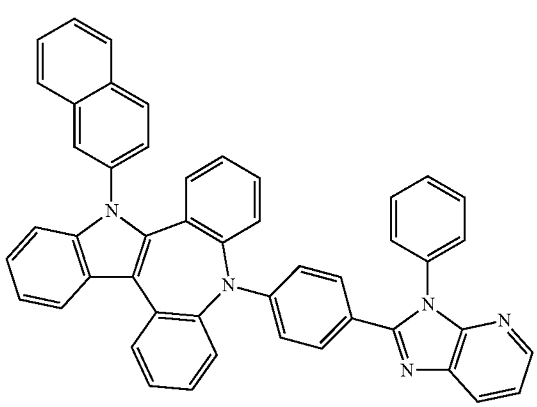
-continued
2-115a
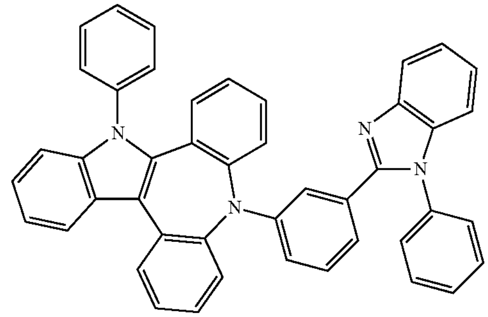
2-116a
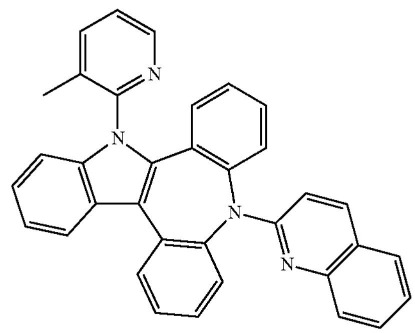
2-117a
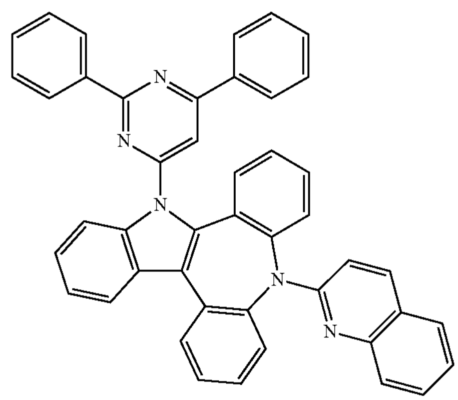
2-118a
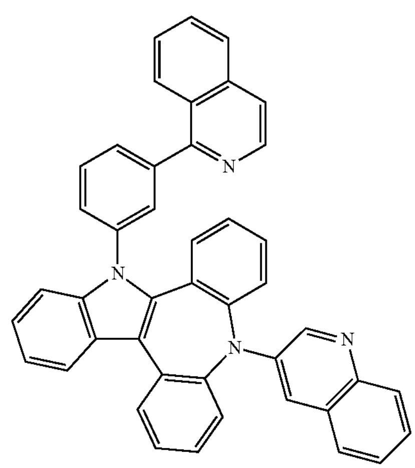

-continued
2-119a
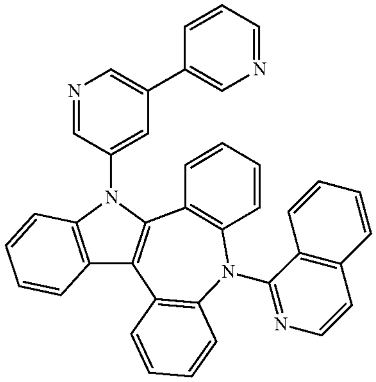
2-120a
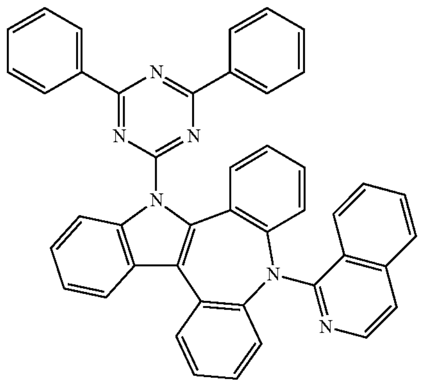
2-121a
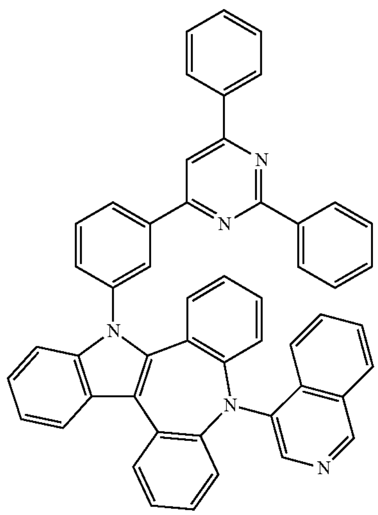
2-122a
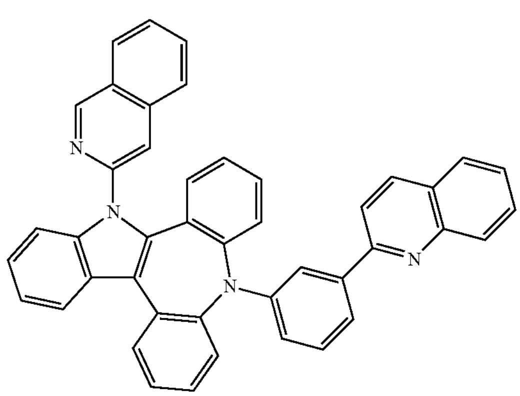
-continued
2-123a
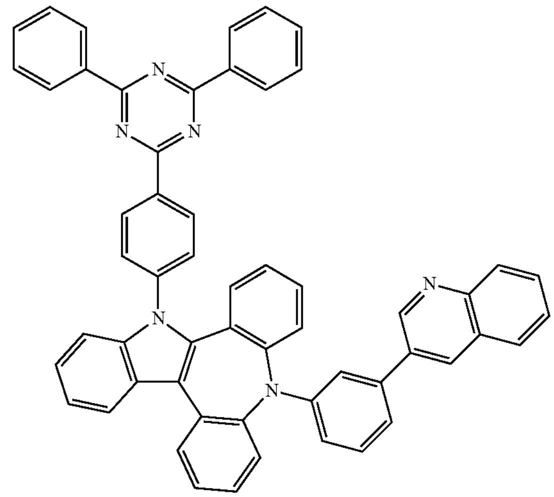
2-124a
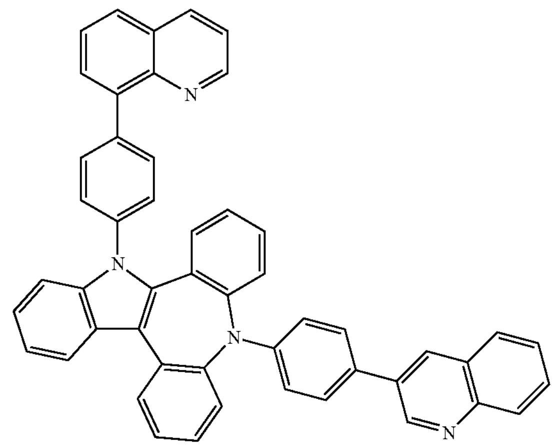
2-125a
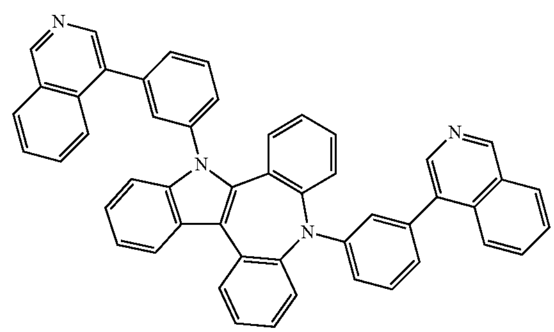
2-126a
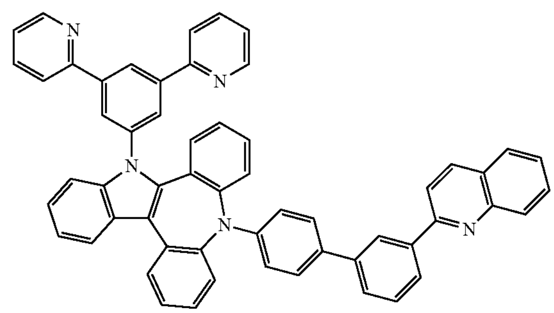

-continued
2-127a
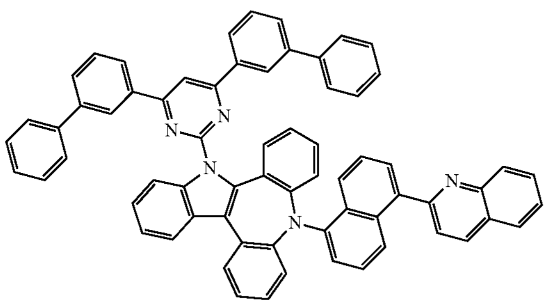
2-128a
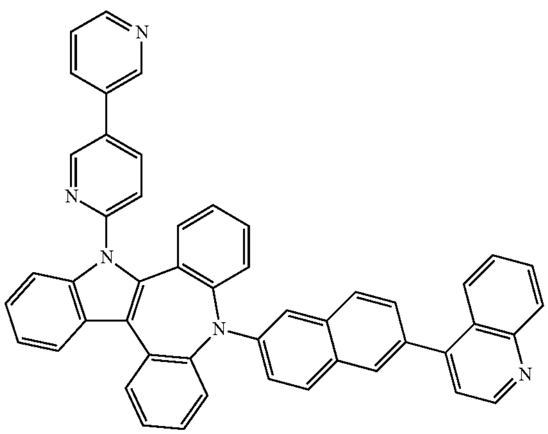
2-129a
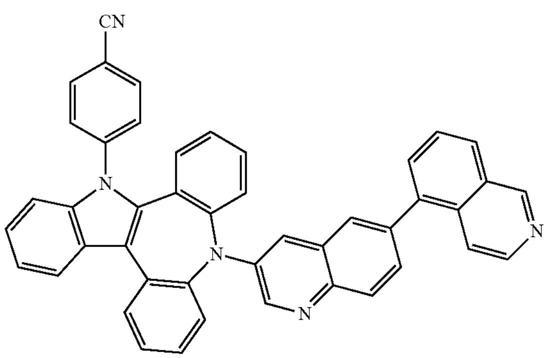
2-130a
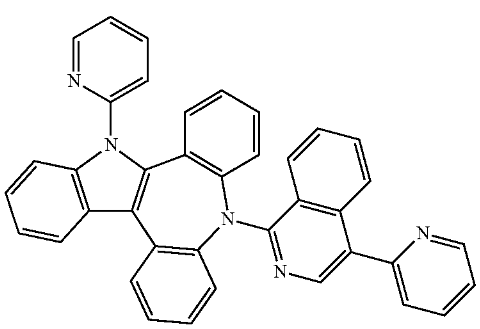
-continued
2-131a
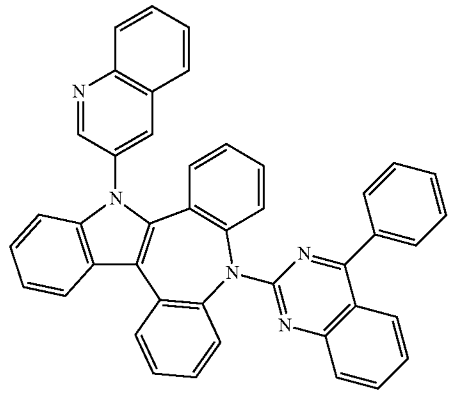
2-132a
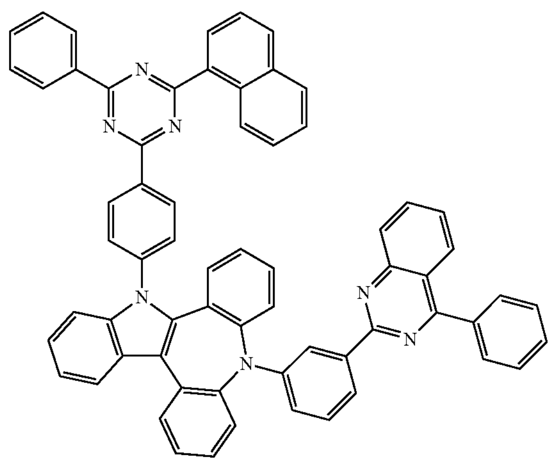
2-133a
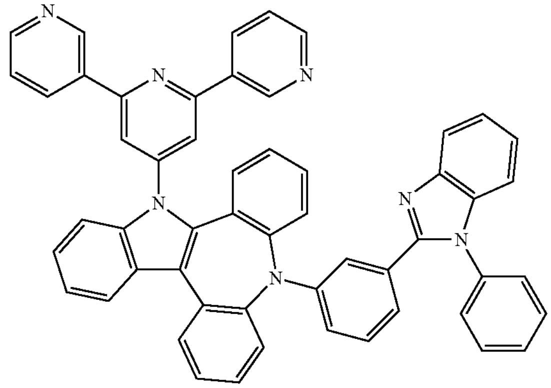

-continued
2-134a
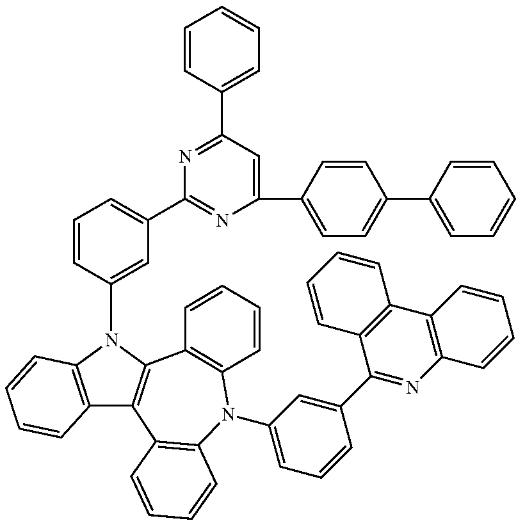
2-135a
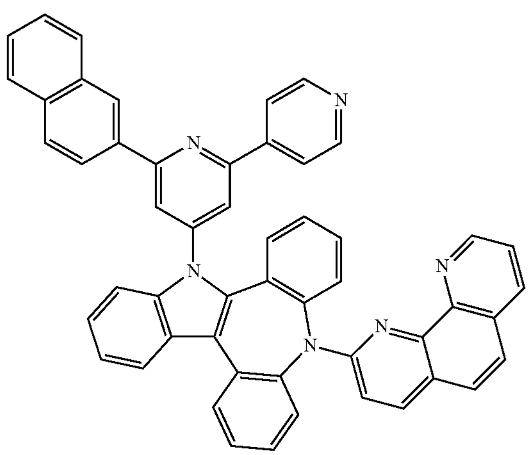
2-136a
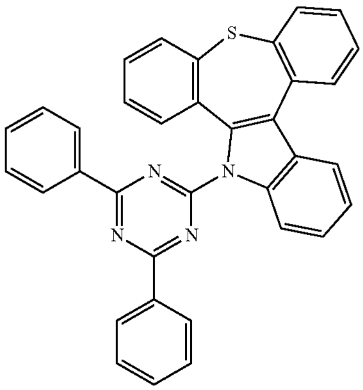
-continued
2-137a
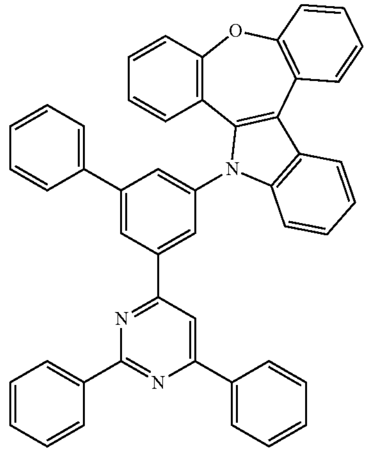
2-138a
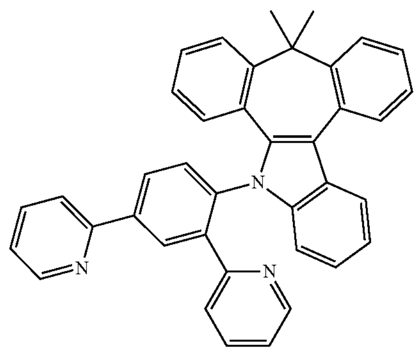
2-139a
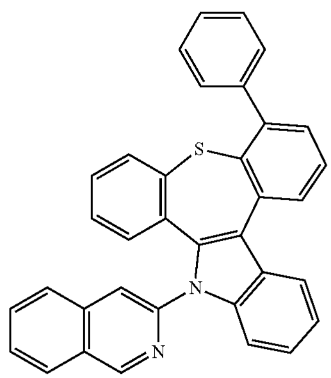
2-140a
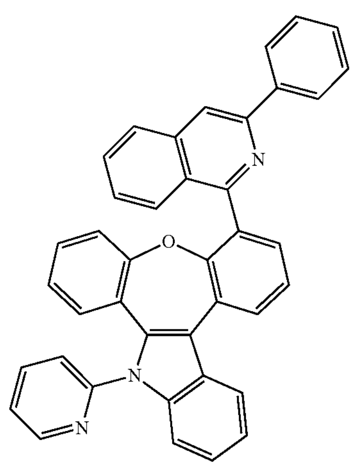

-continued
2-141a
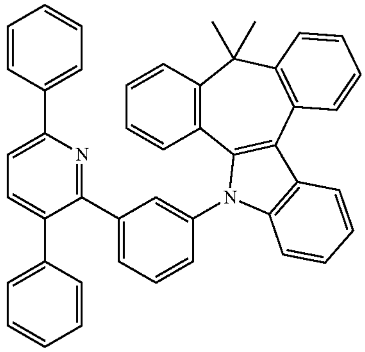
2-142a
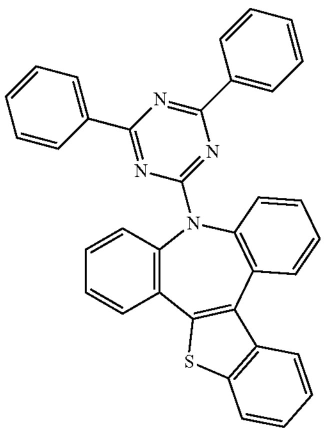
2-143a
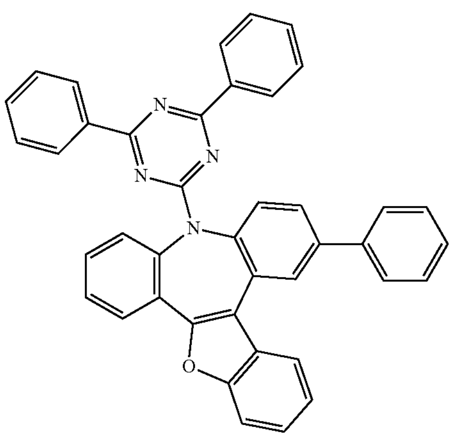
2-144a
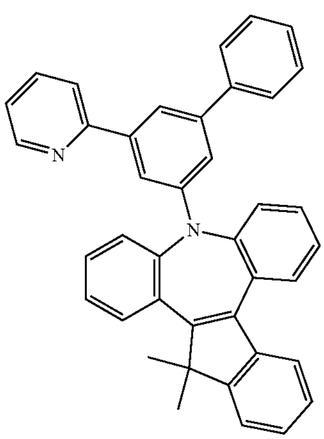
-continued
2-145a
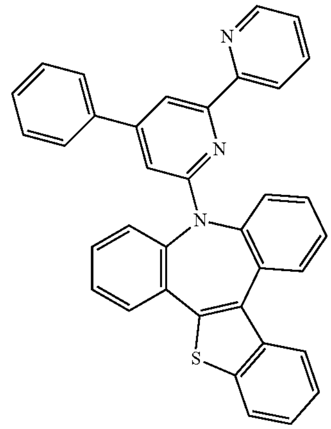
2-146a
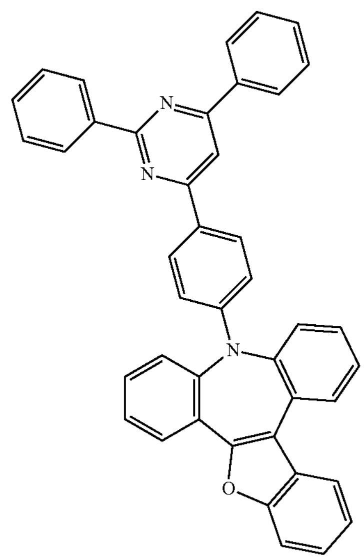
2-147a
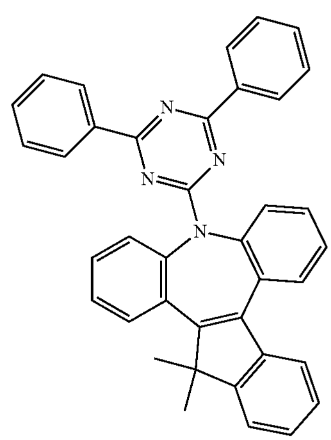

-continued
2-148a
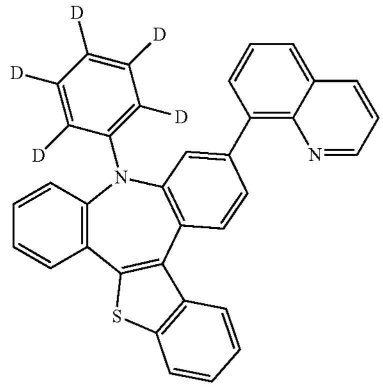
2-149a
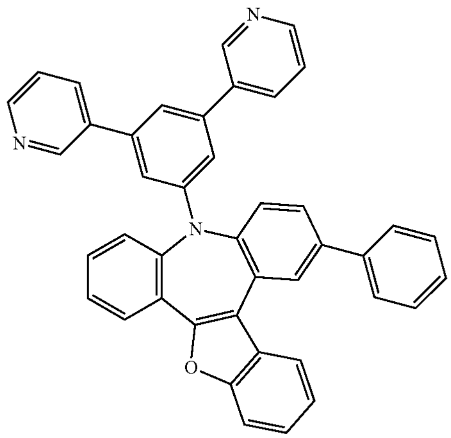
2-150a
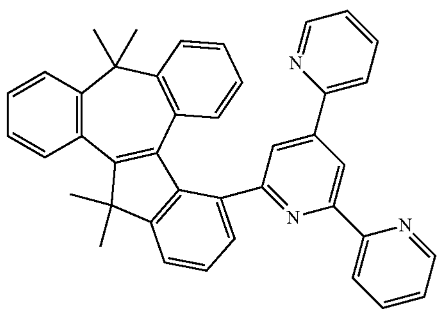
2-151a
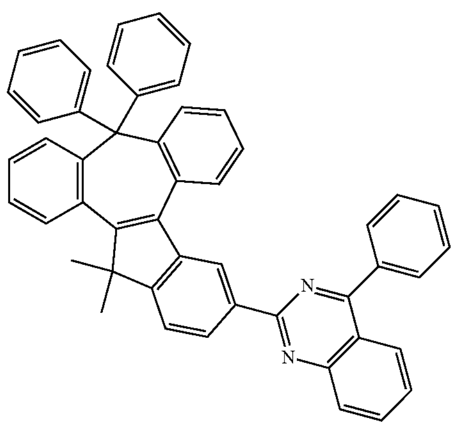
-continued
2-152a
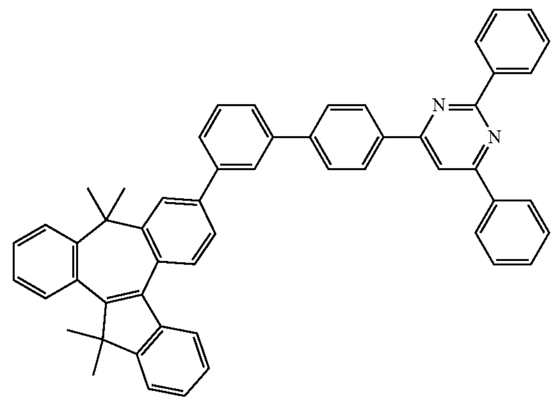
2-153a
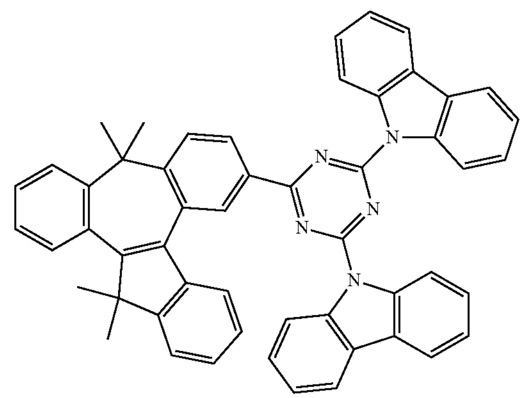
2-154a
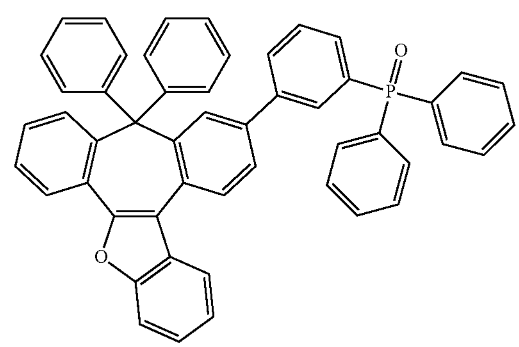
2-155a
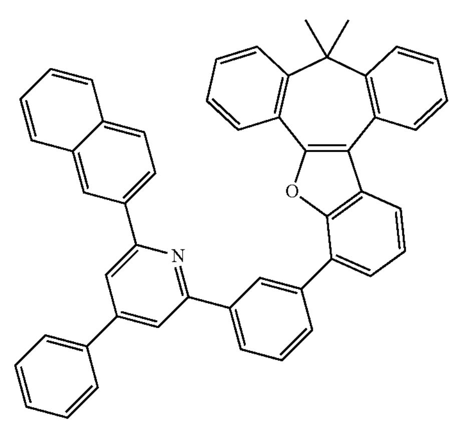

-continued
2-156a
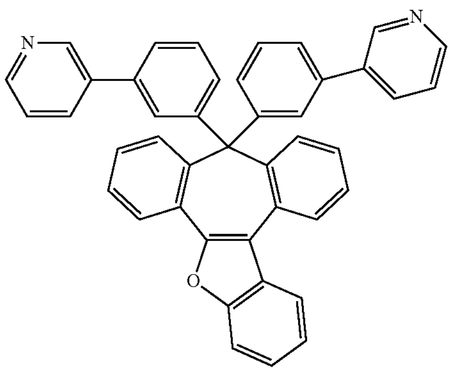
2-157a
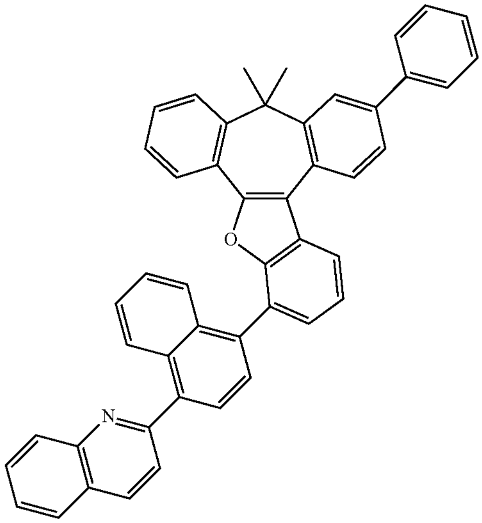
2-158a
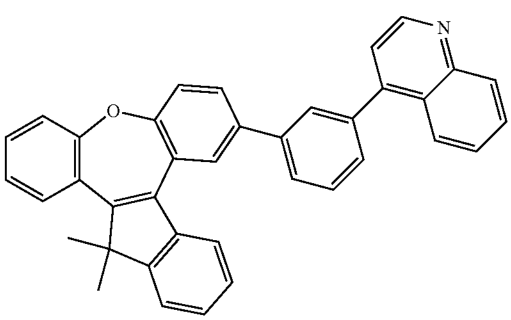
2-159a
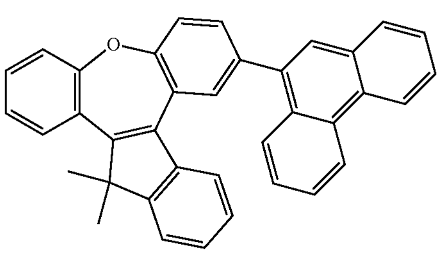
-continued
2-160a
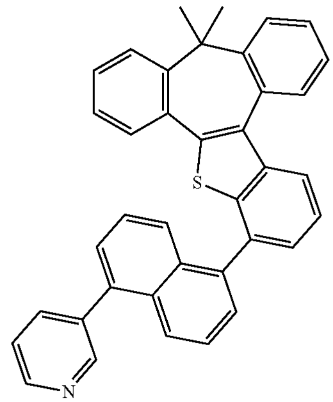
2-161a
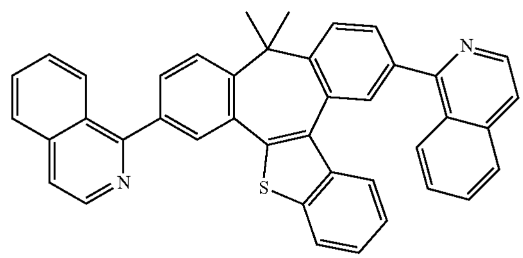
2-162a
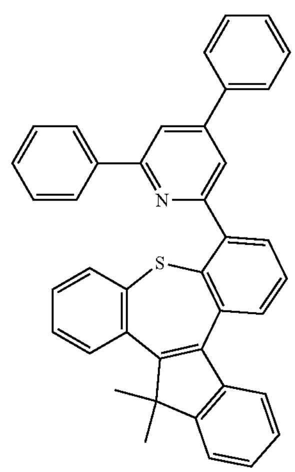
2-163a
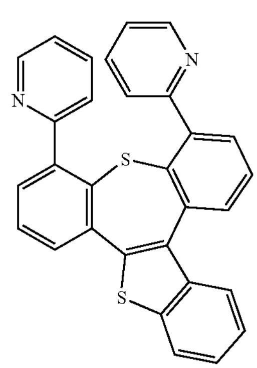

-continued
2-164a
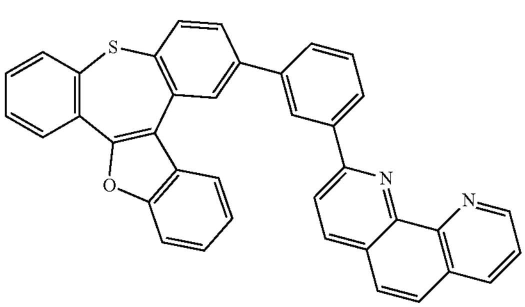
2-165a
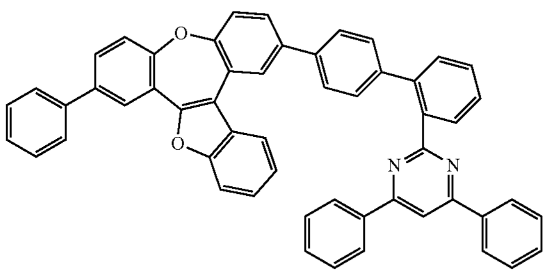
2-166a
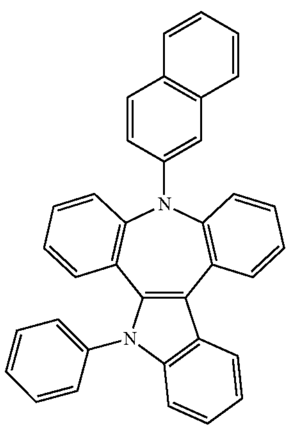
2-167a
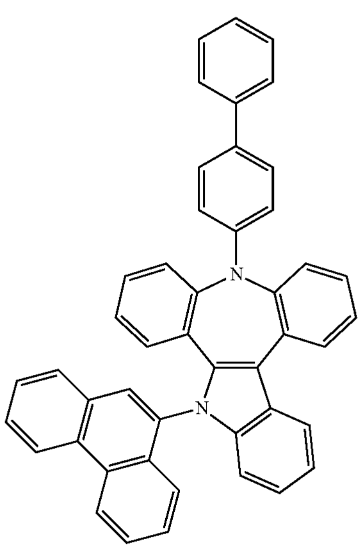
-continued
2-168a
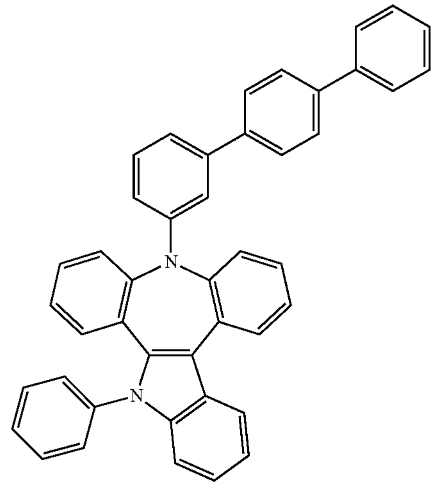
2-169a
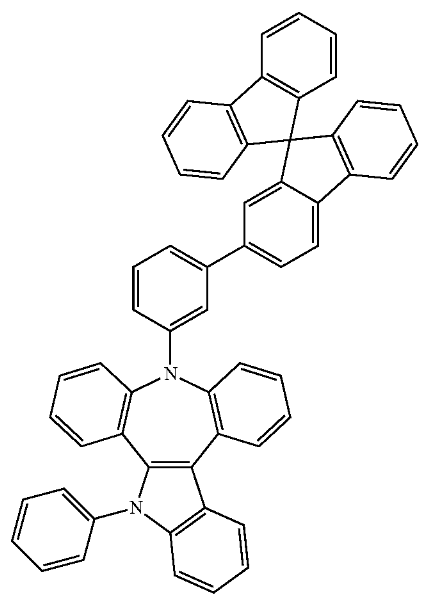
2-170a
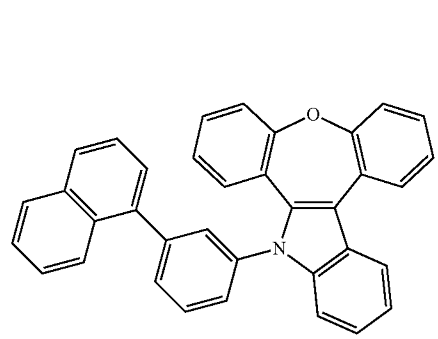

2-171a
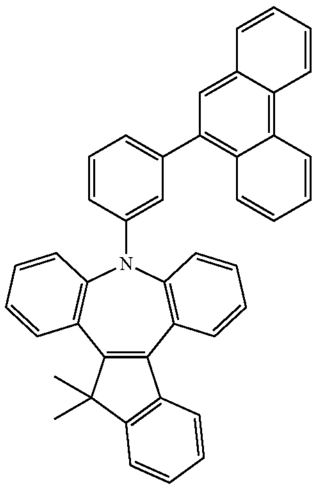
2-172a
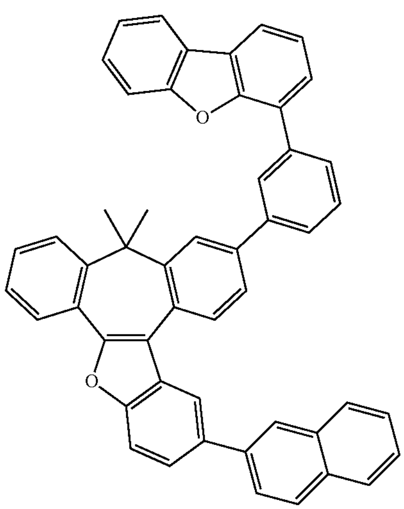
2-1
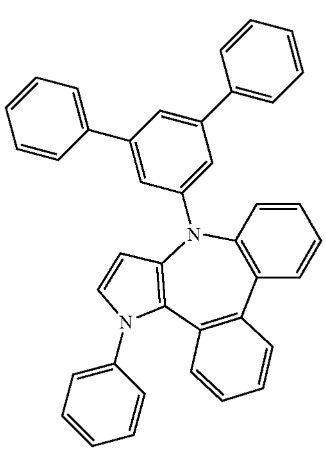
2-2
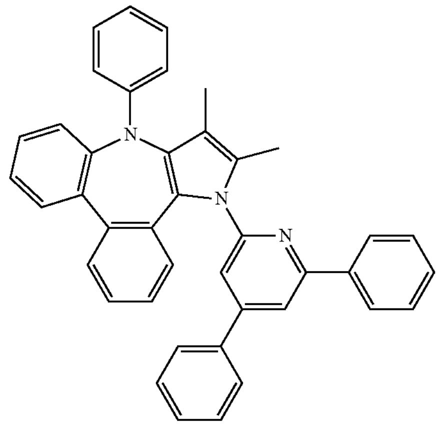
2-3
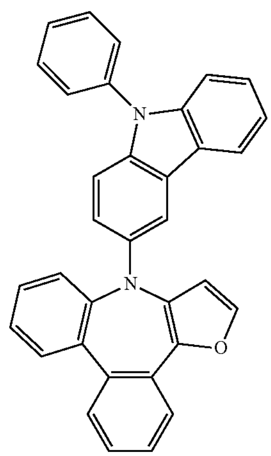
2-4
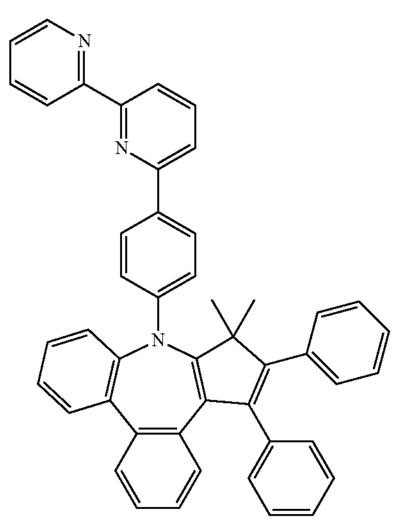

-continued
2-5
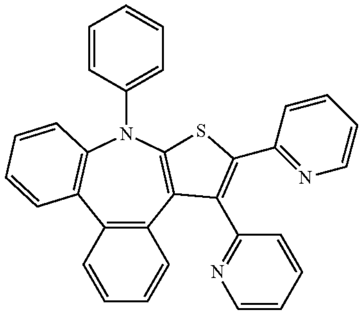
2-6
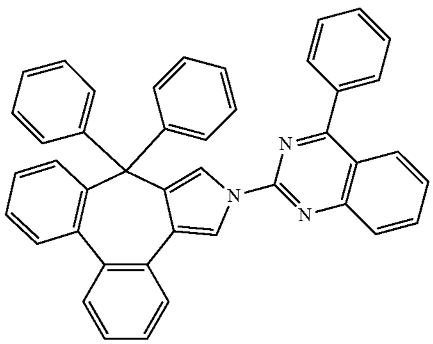
2-7
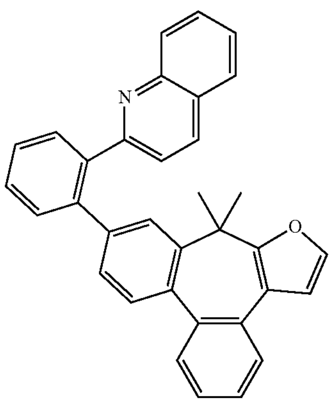
2-8
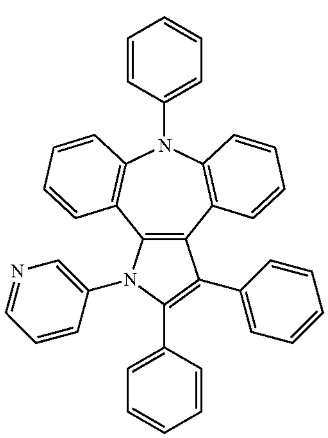
-continued
2-9
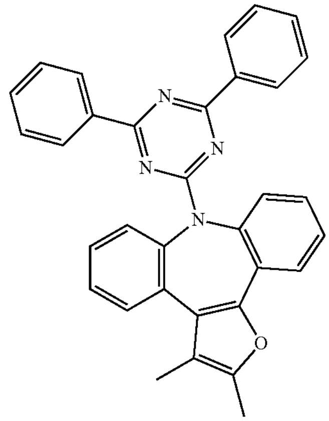
2-10
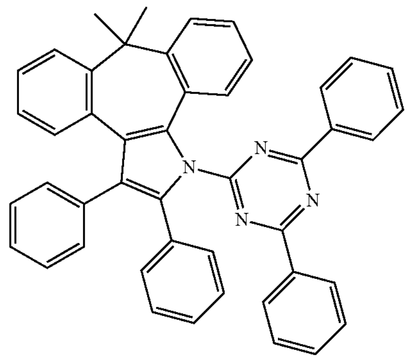
2-11
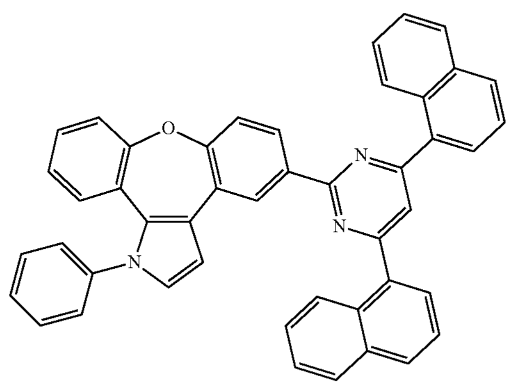
2-12
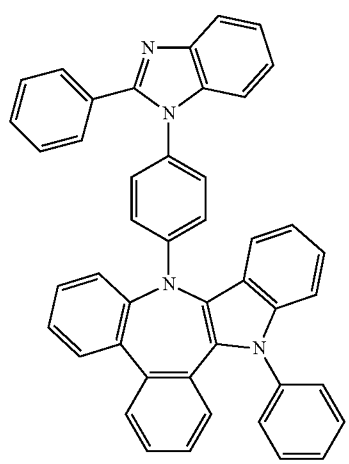

-continued
2-13
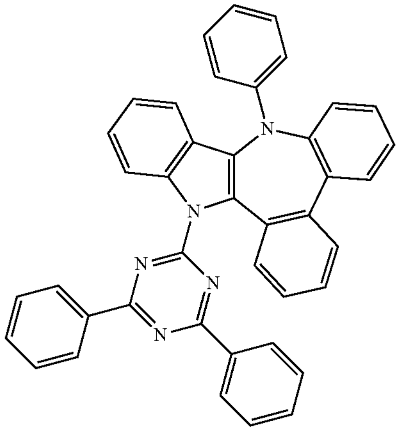
2-14
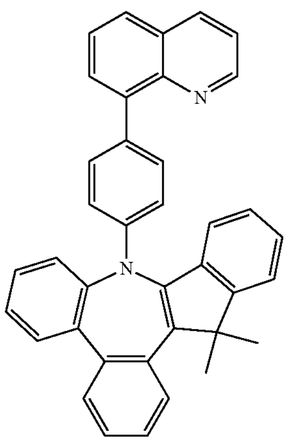
2-15
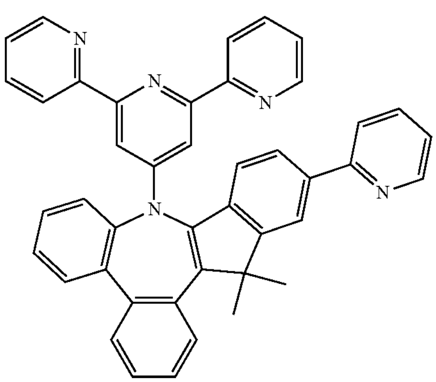
-continued
2-16
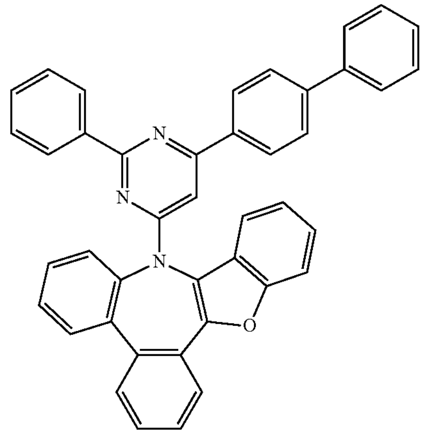
2-17
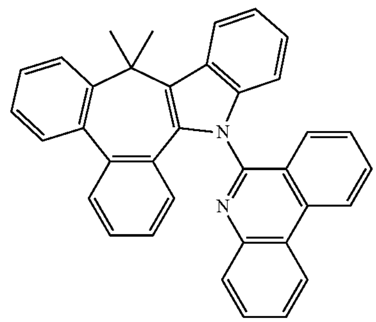
2-18
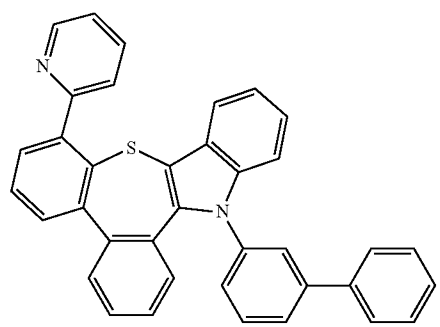
2-19
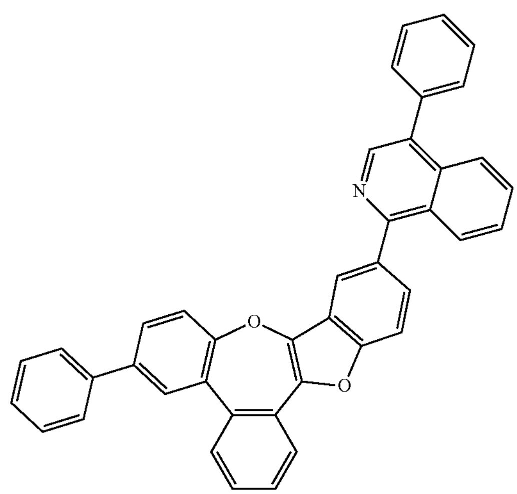

-continued
2-20
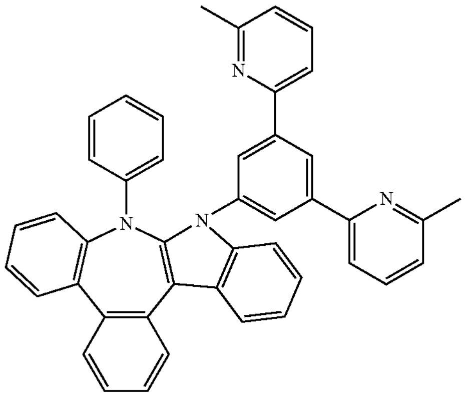
2-21
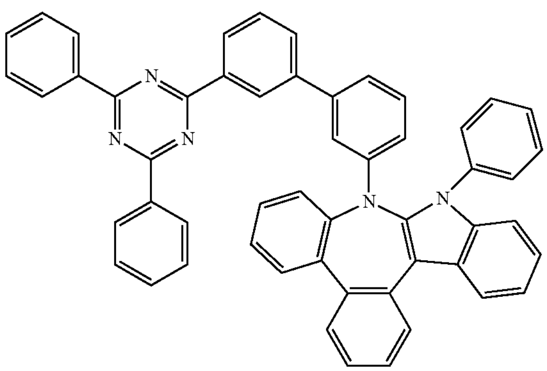
2-22
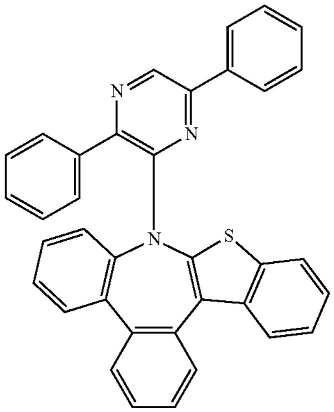
-continued
2-23
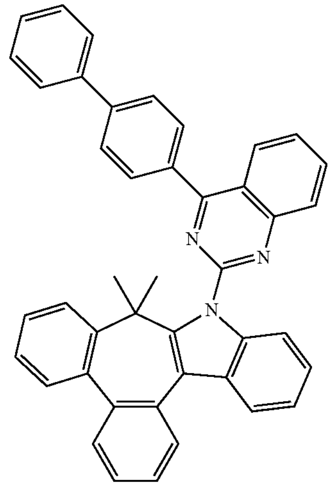
2-24
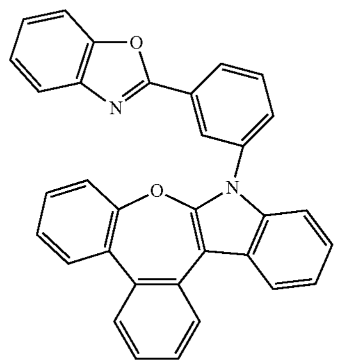
2-25
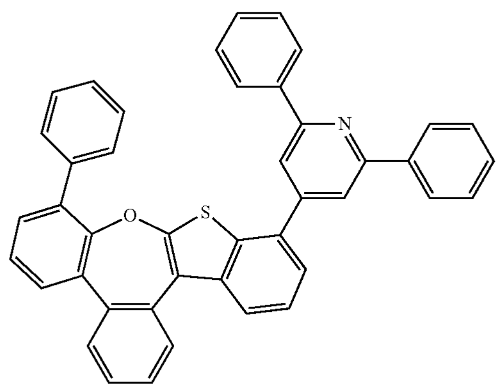
2-26
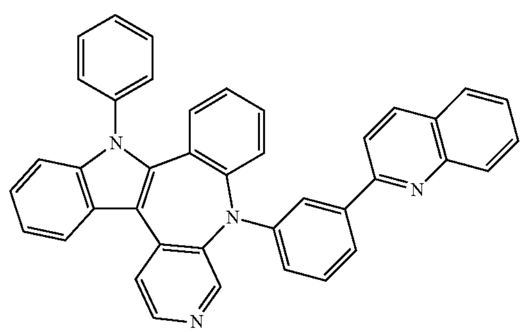

-continued
2-27
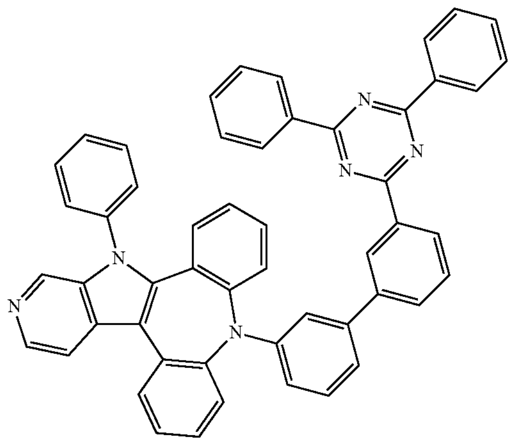
2-28
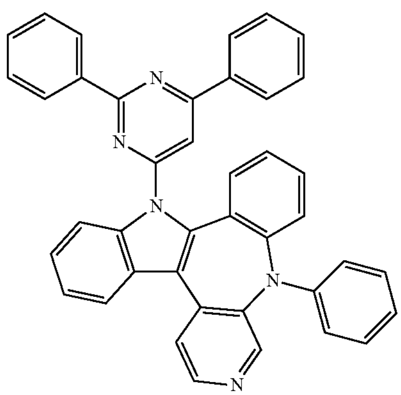
2-29
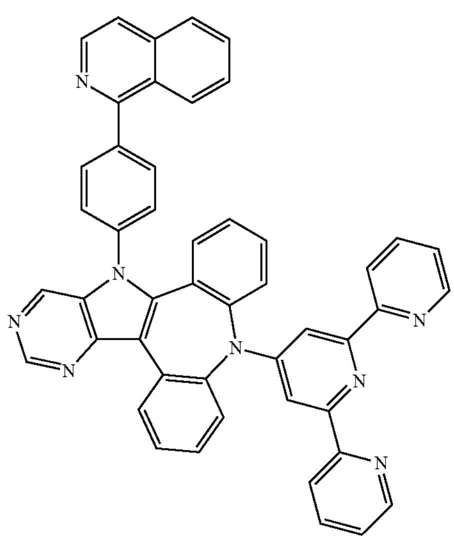
-continued
2-30
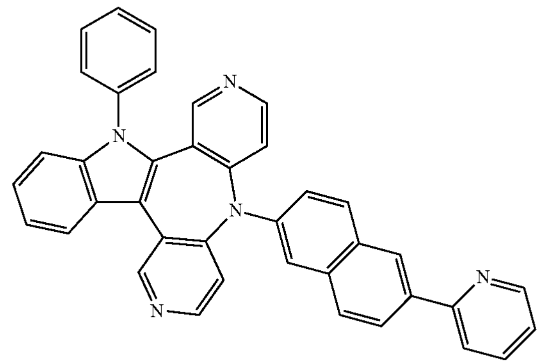
2-31
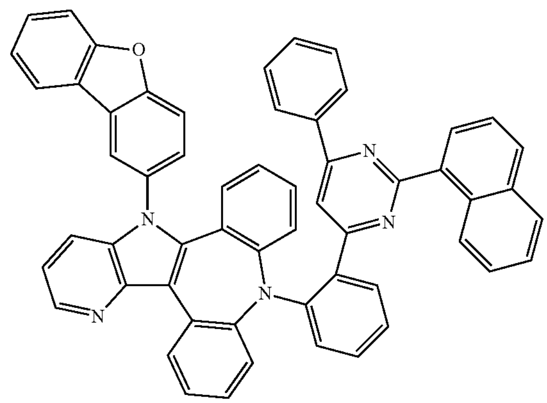
2-32
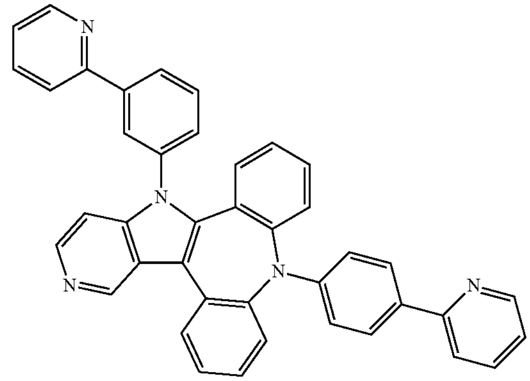
2-33
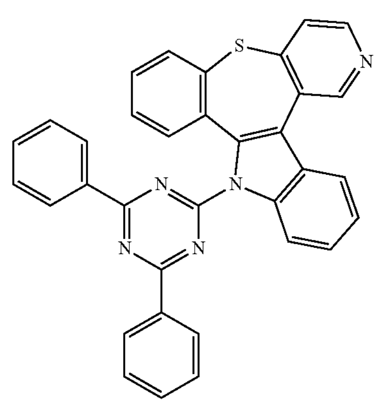

-continued
2-34
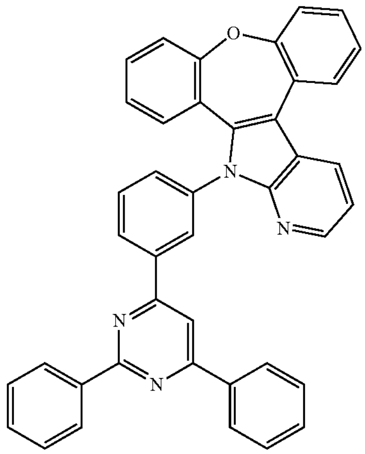
2-35
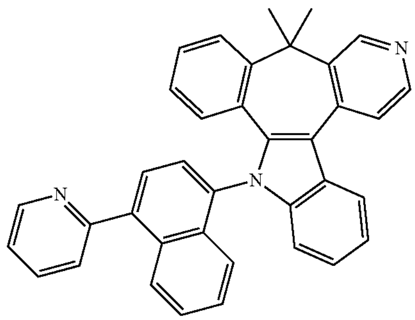
2-36
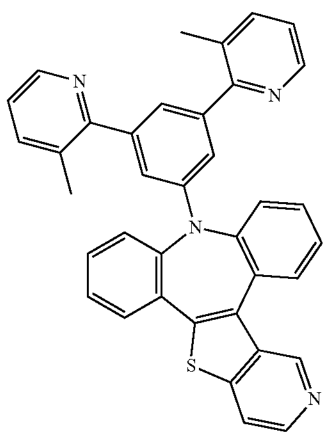
2-37
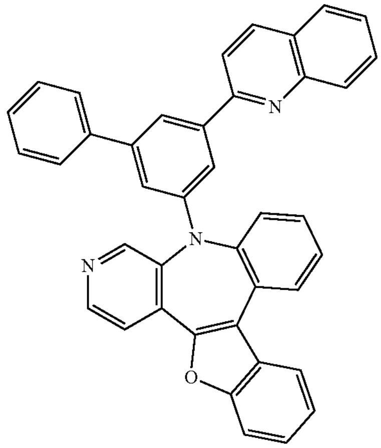
-continued
2-38
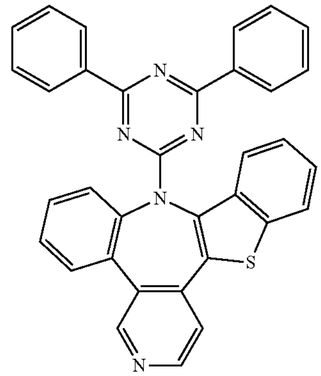
2-39
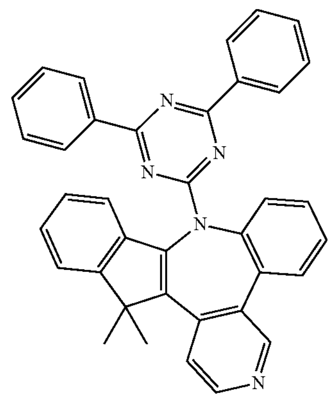
2-40
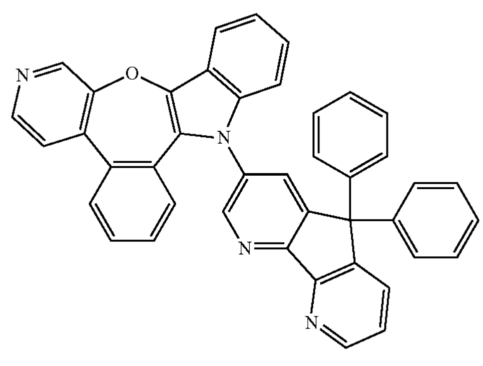
2-41
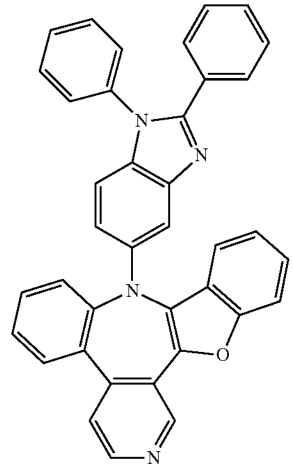

-continued
2-42
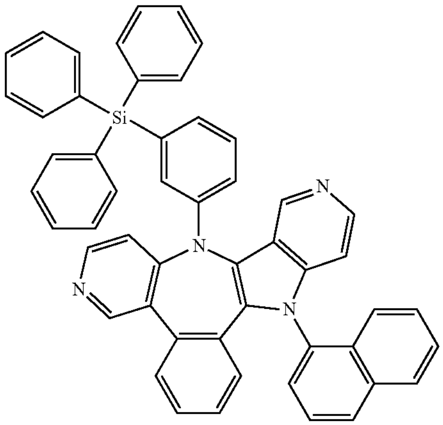
2-43
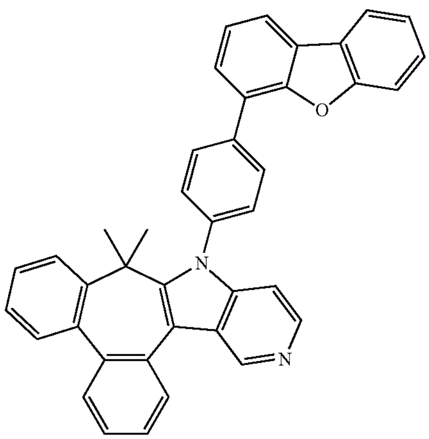
2-44
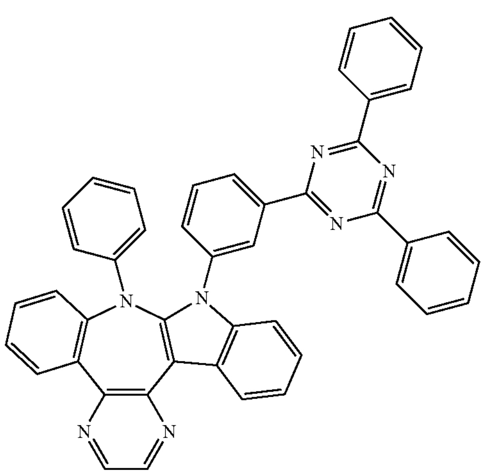
-continued
2-45
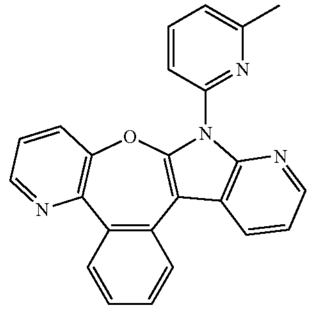
2-46
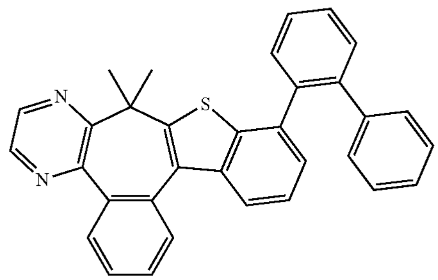
2-47
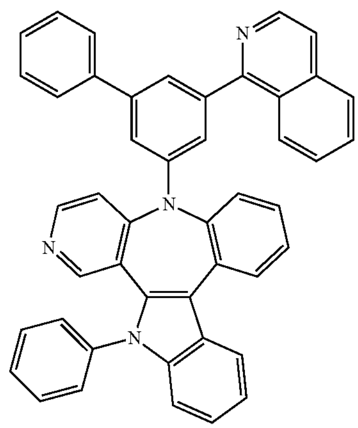
2-48
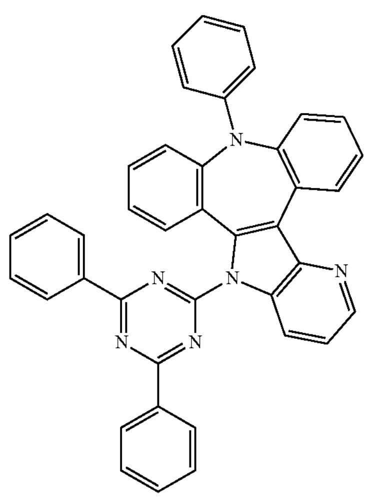

-continued
2-49
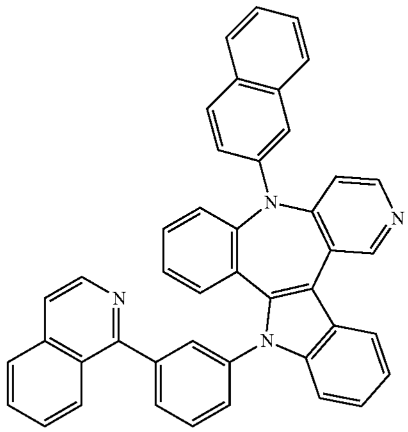
2-50
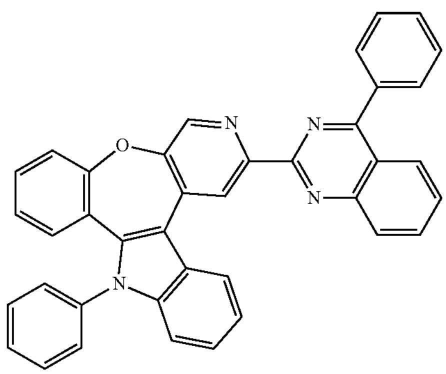
2-51
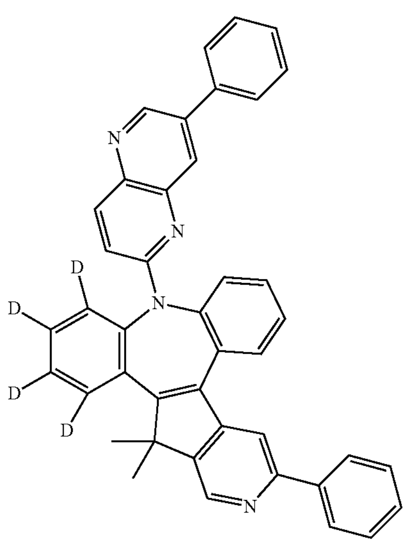
-continued
2-52
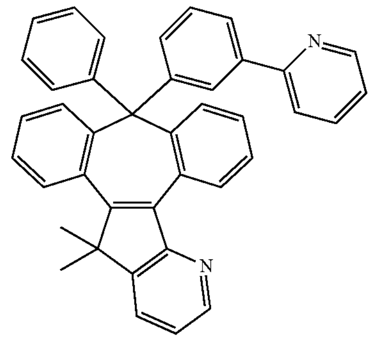
2-53
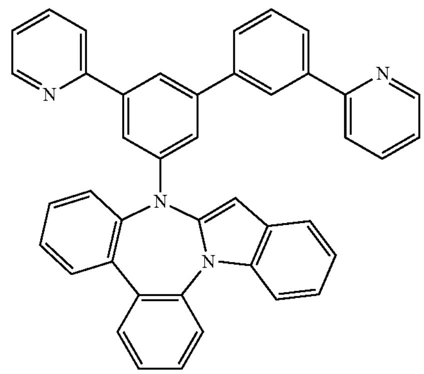
2-54
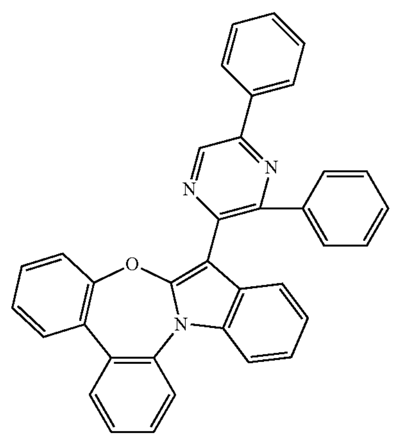
2-55
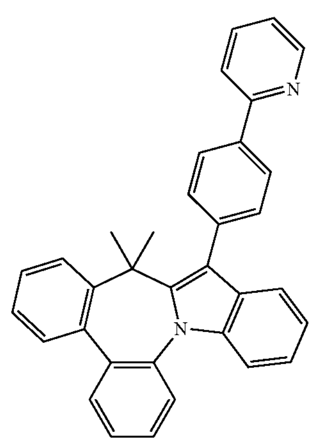

-continued
2-56
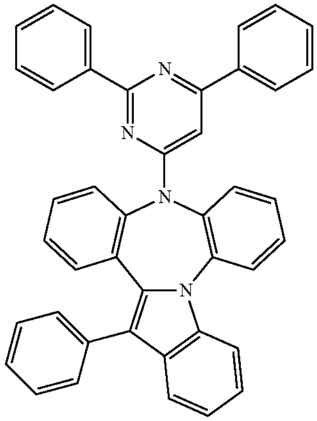
2-57
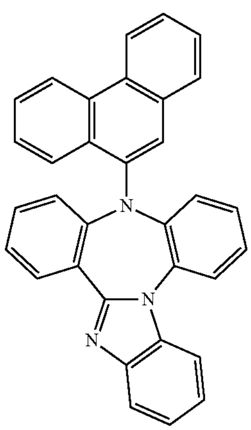
2-58
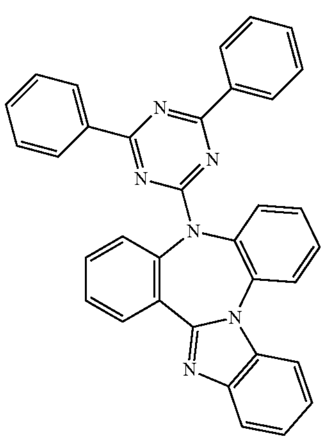
-continued
2-59
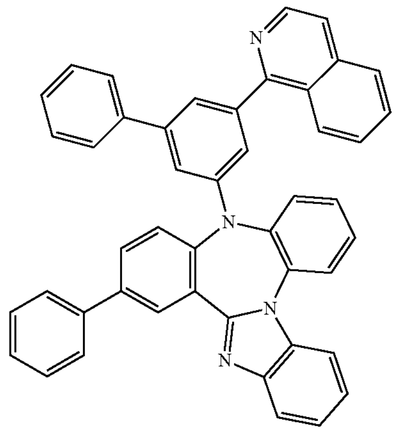
2-60
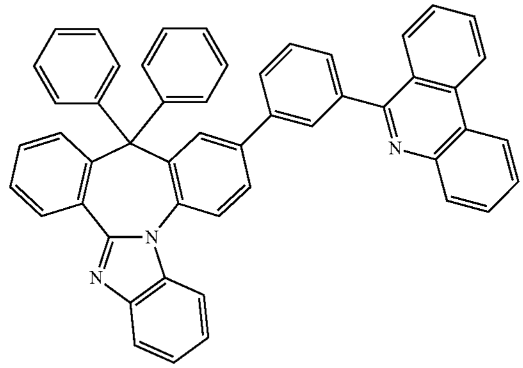
2-61
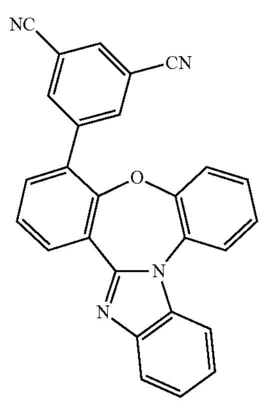
2-62
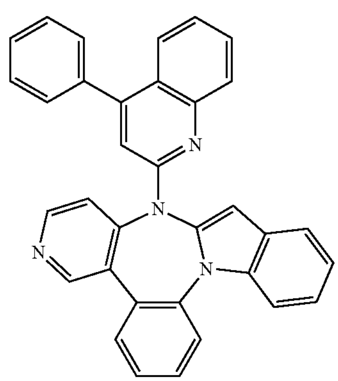

-continued
2-63
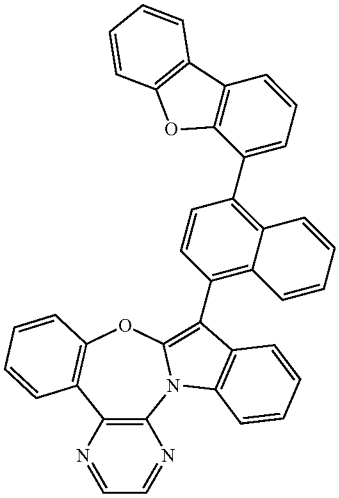
2-64
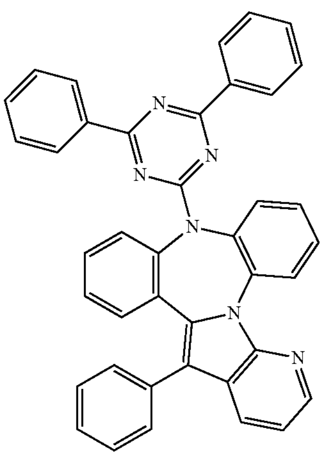
2-65
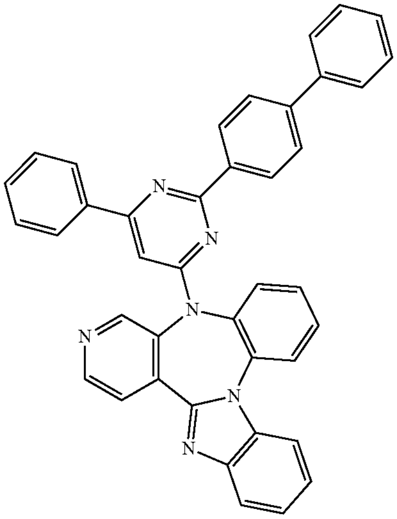
-continued
2-66
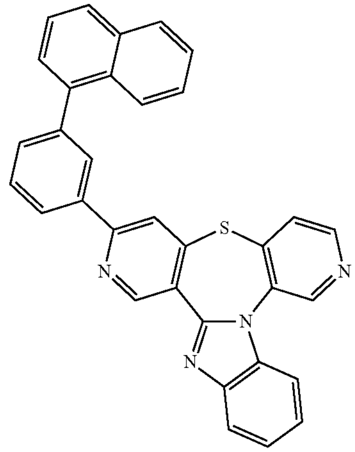
2-67
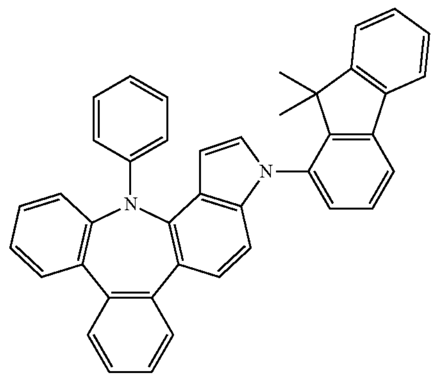
2-68
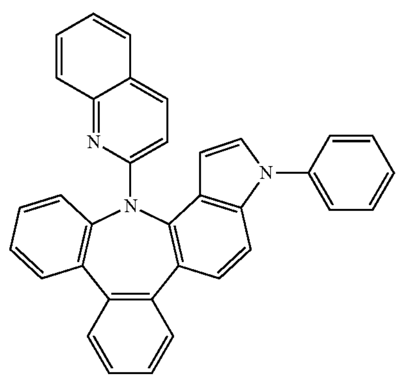
2-69
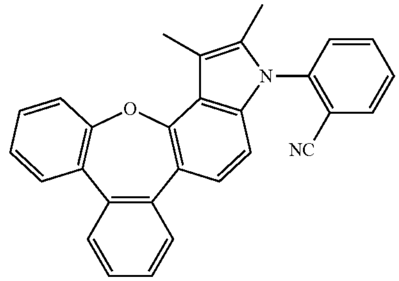

-continued
2-70
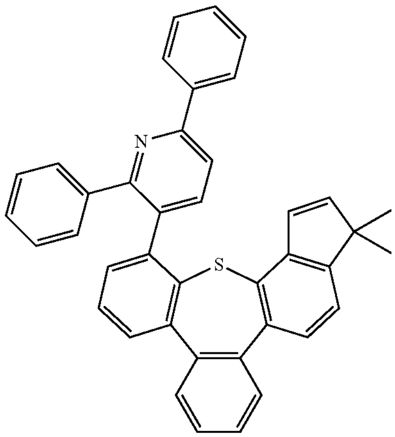
2-71
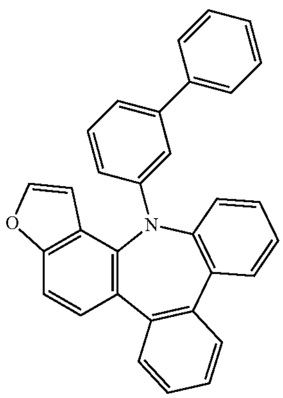
2-72
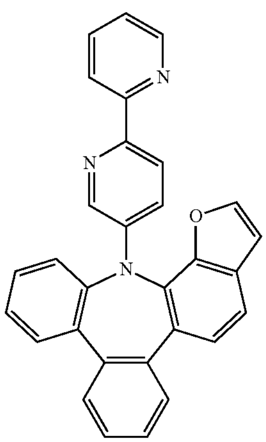
2-73
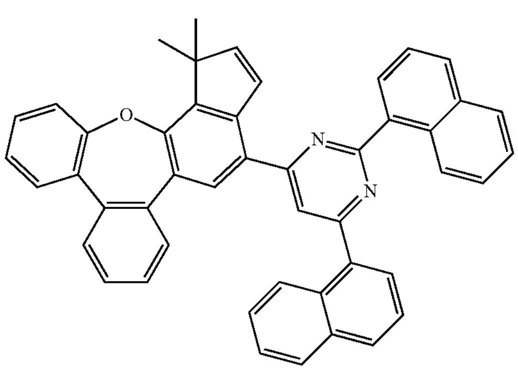
-continued
2-74
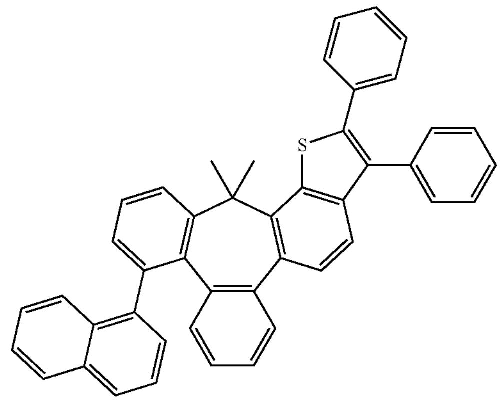
2-75
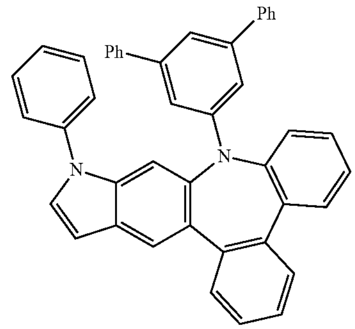
2-76
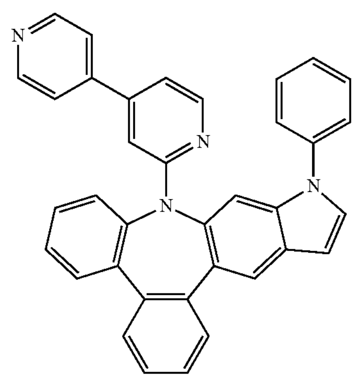
2-77
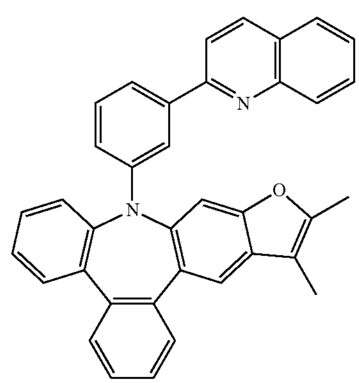

-continued
2-78
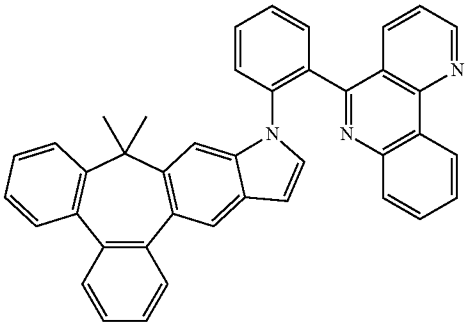
2-79
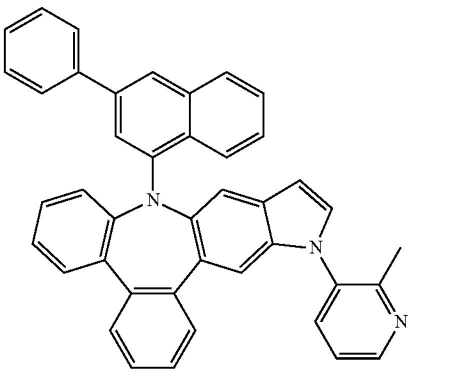
2-80
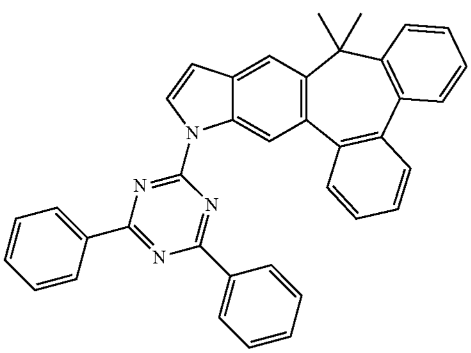
2-81
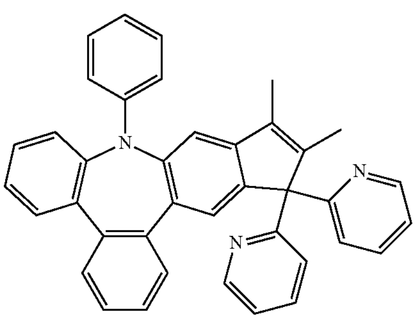
-continued
2-82
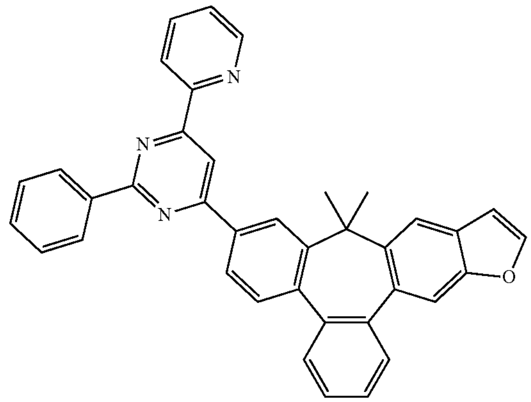
2-83
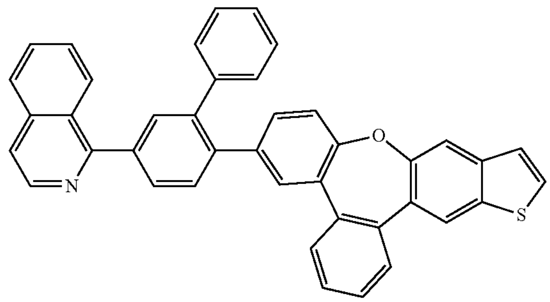
2-84
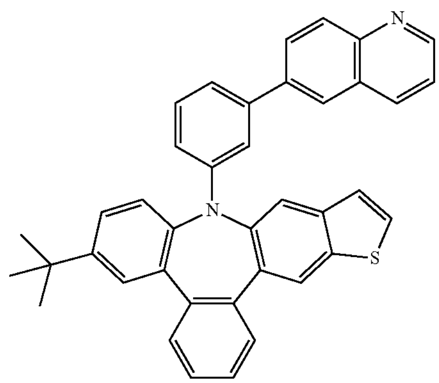
2-85
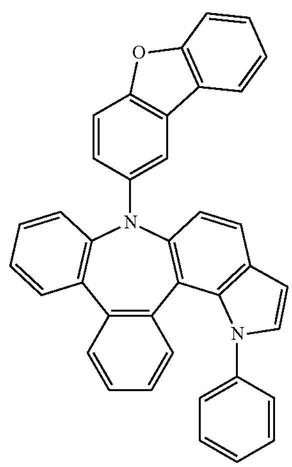

-continued
2-86
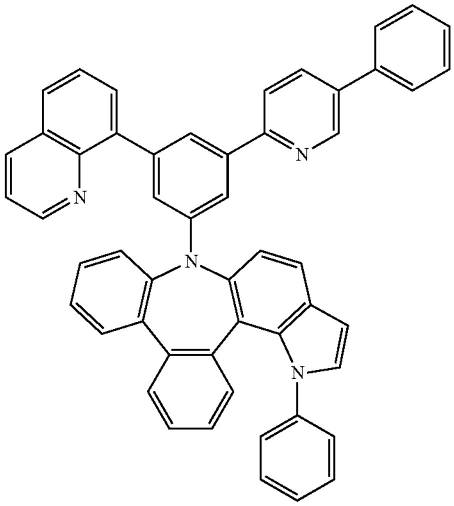
2-87
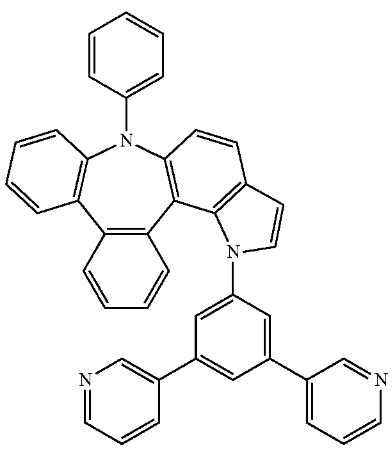
2-88
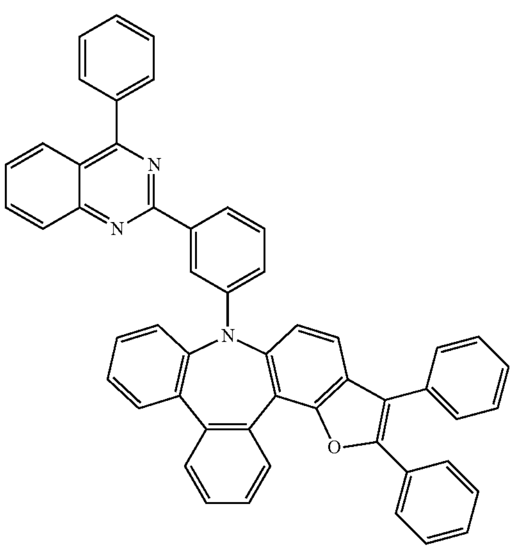
-continued
2-89
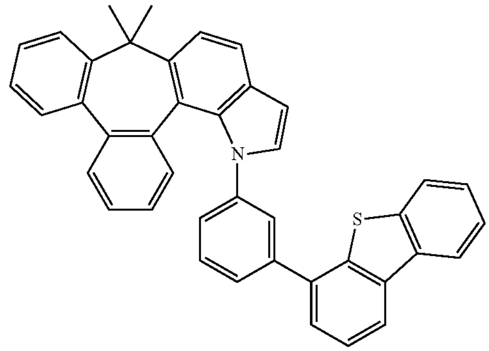
2-90
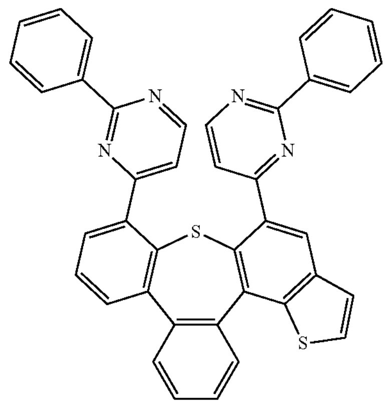
2-91
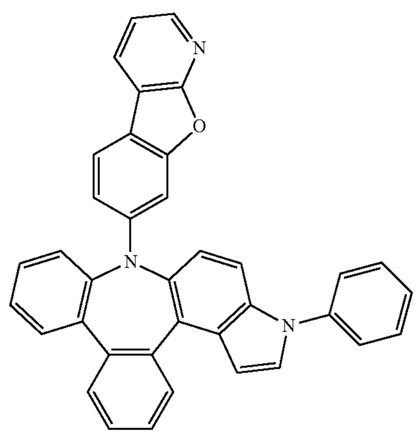
2-92
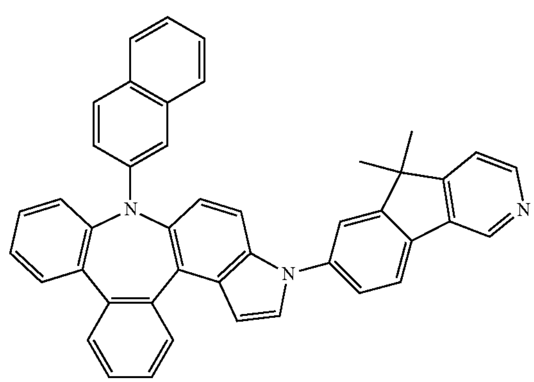

-continued
2-93
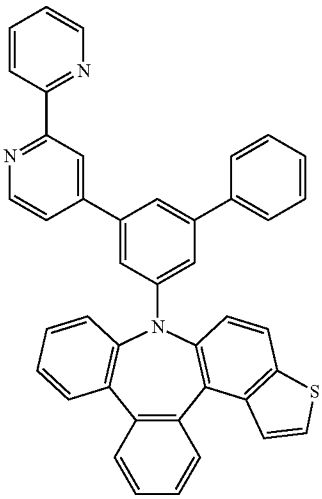
2-94
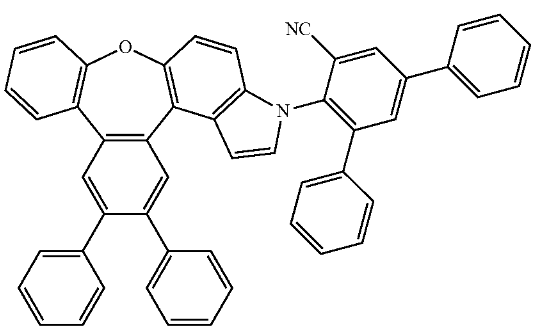
2-95
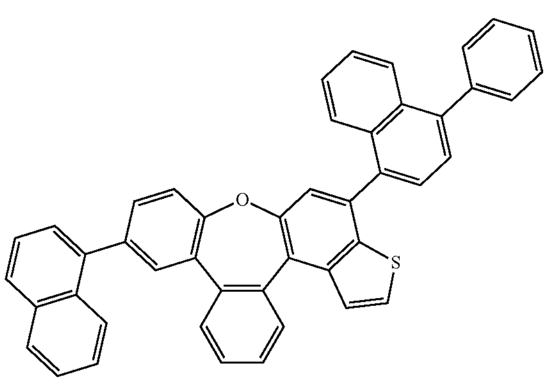
-continued
2-96
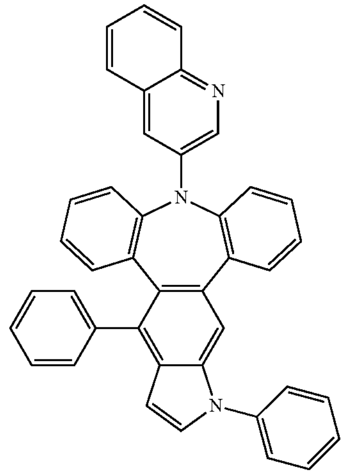
2-97
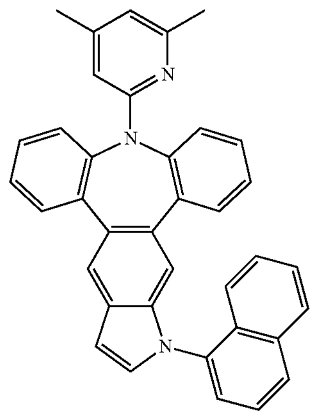
2-98
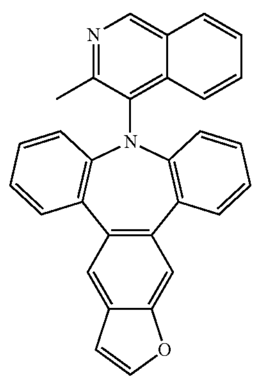
2-99
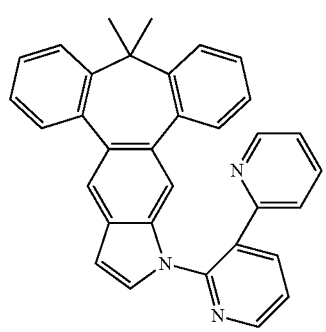

-continued
2-100
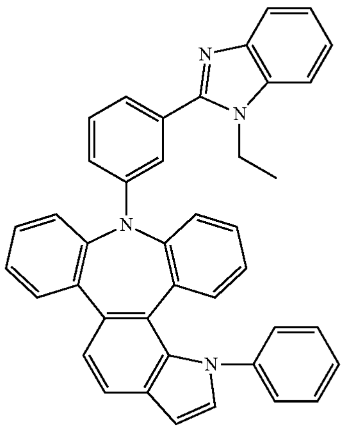
2-101
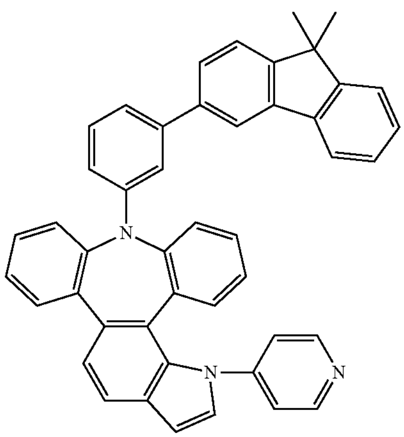
2-102
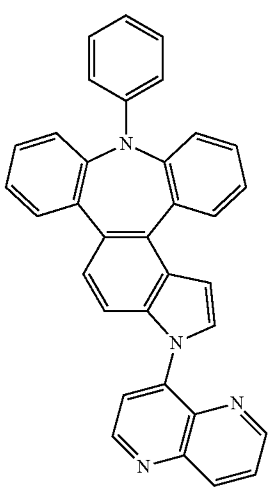
-continued
2-103
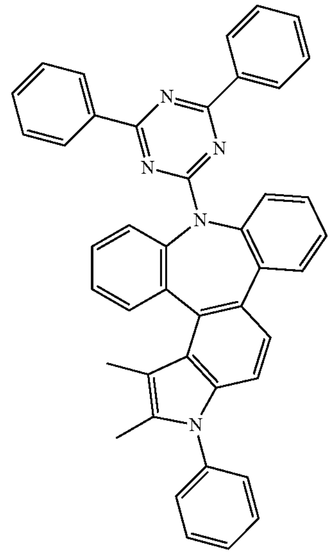
2-104
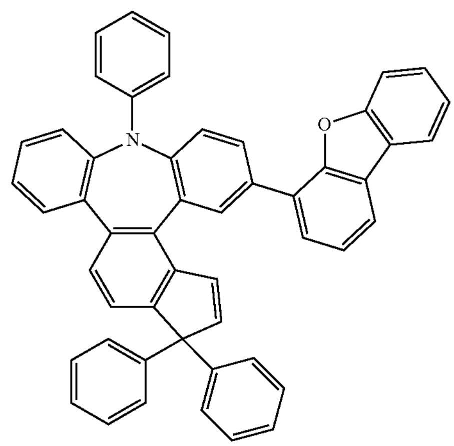
2-105
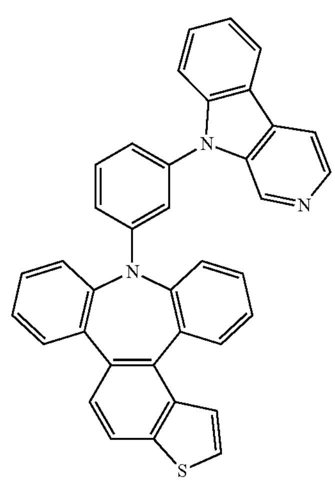

-continued
2-106
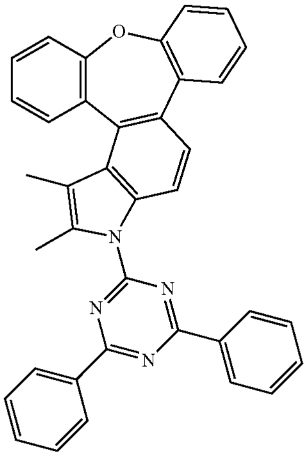
2-107
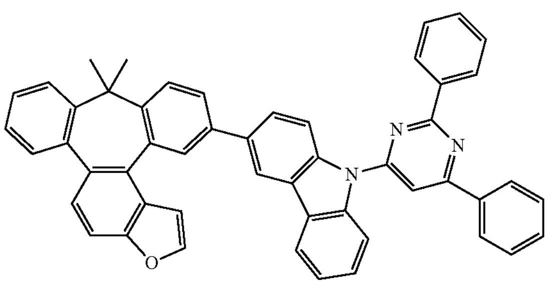
2-108
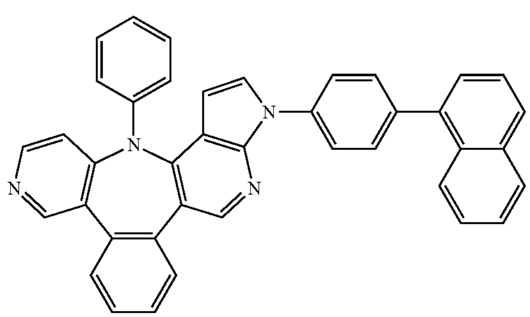
2-109
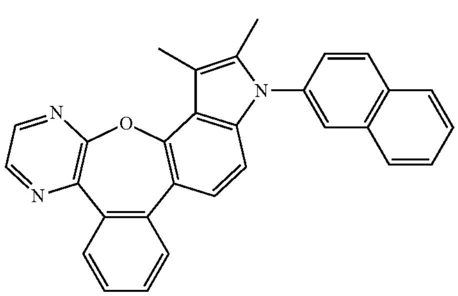
-continued
2-110
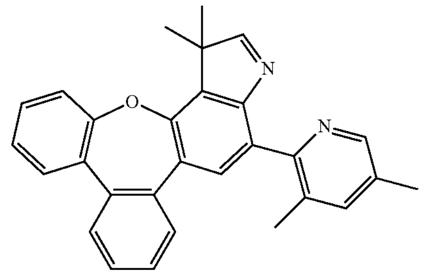
2-111
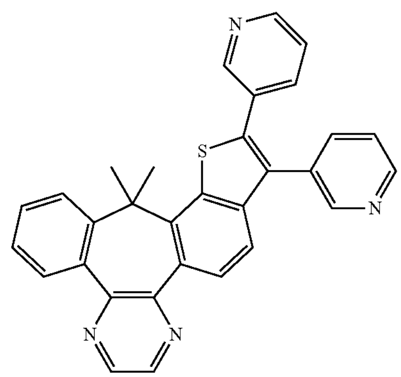
2-112
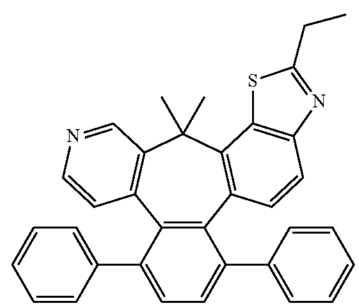
2-113
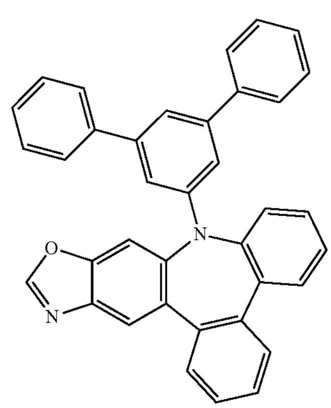

-continued
2-114
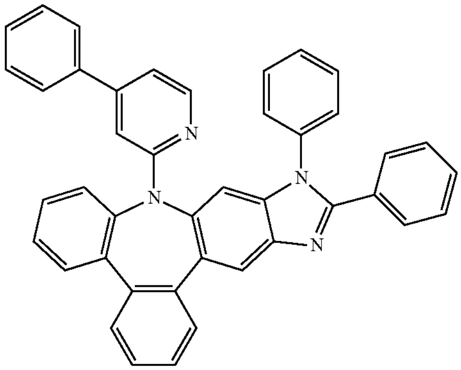
2-115
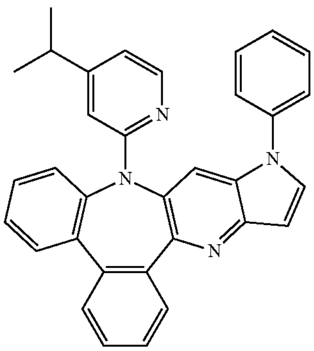
2-116
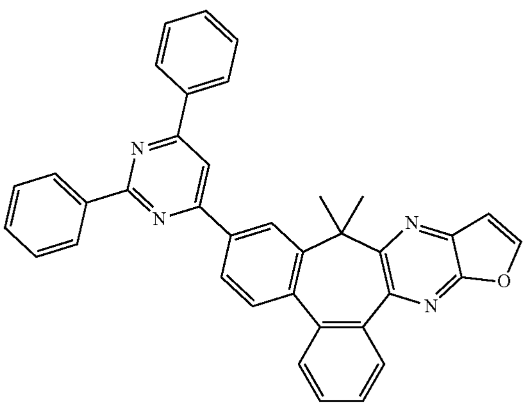
2-117
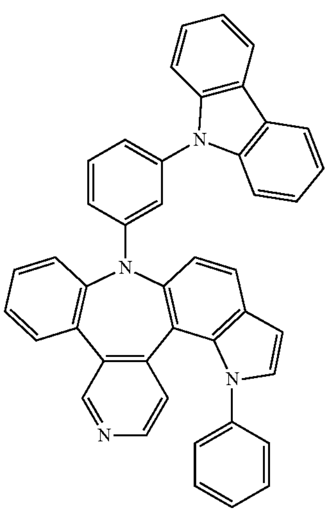
-continued
2-118
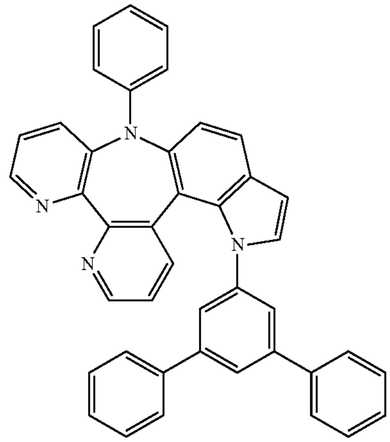
2-119
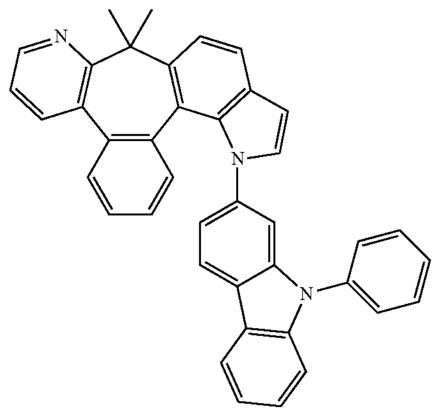
2-120
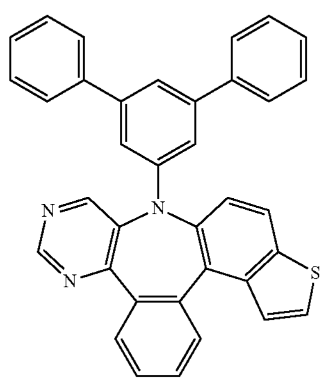

-continued
2-121
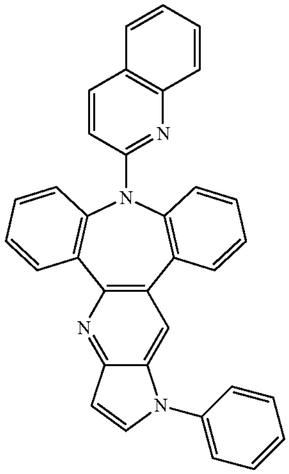
2-122
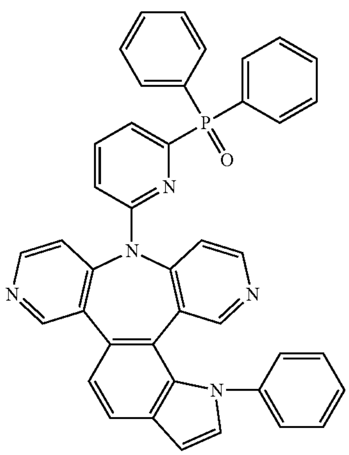
2-123
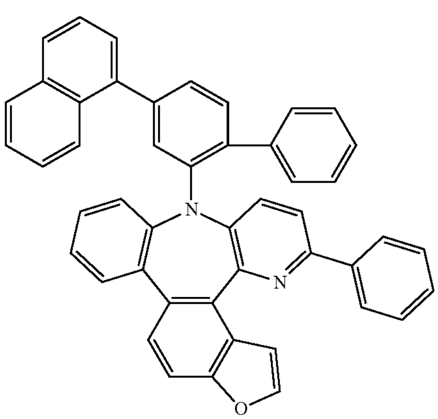
-continued
2-124
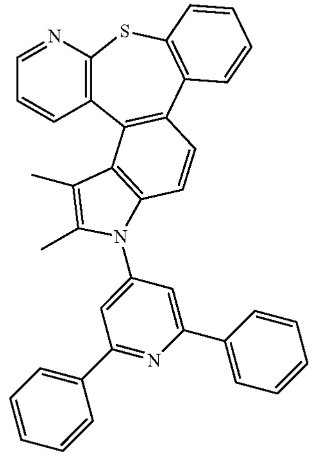
2-125
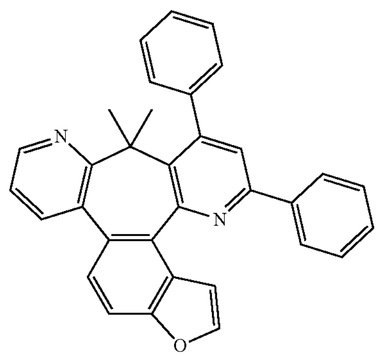
2-126
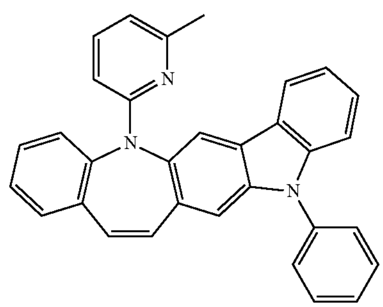
2-127
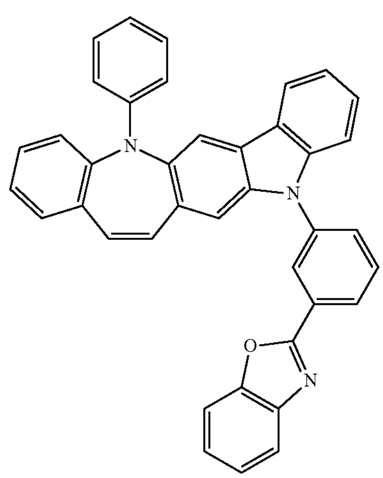

2-128
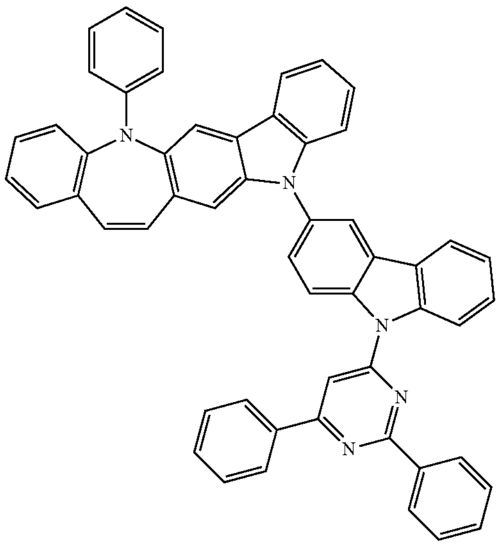
2-129
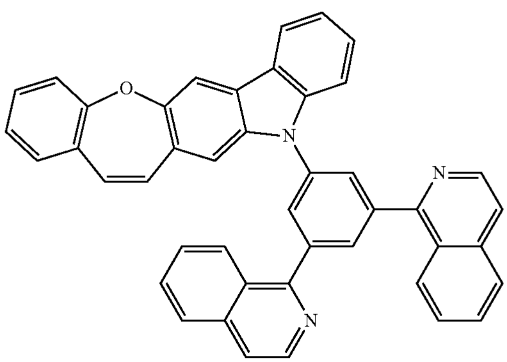
2-130
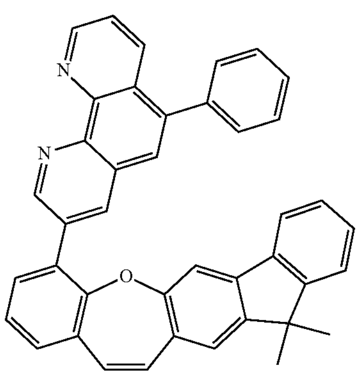
2-131
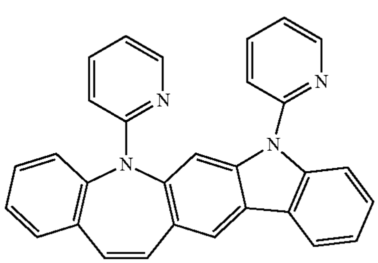
2-132
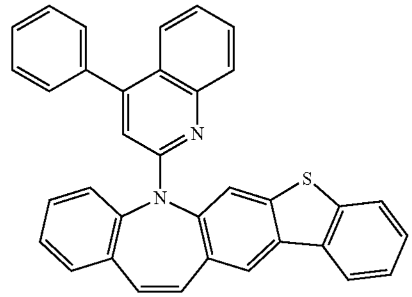
2-133
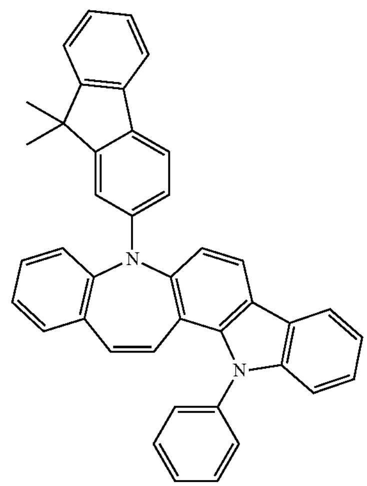
2-134
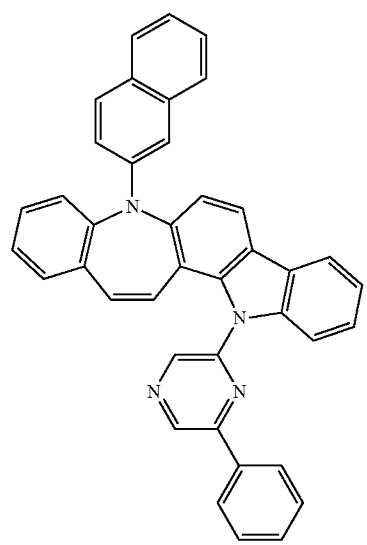
2-135
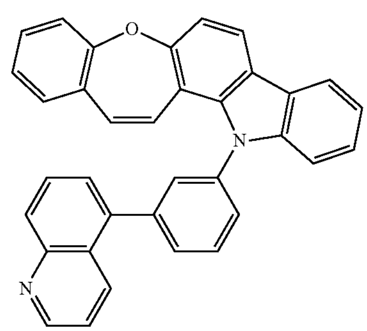

-continued
2-136
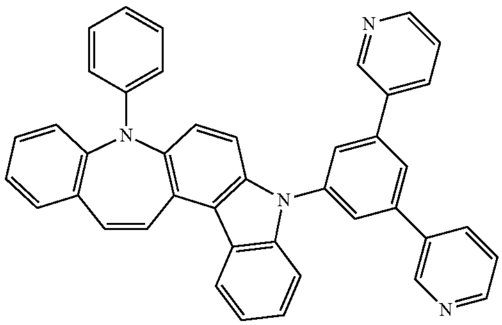
2-137
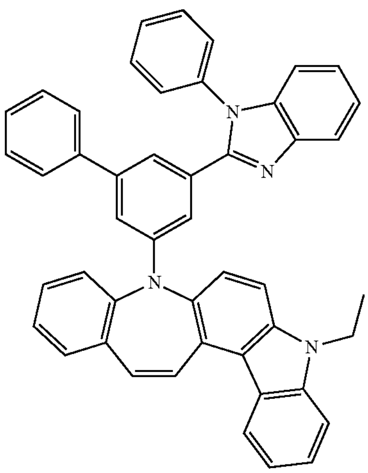
2-138
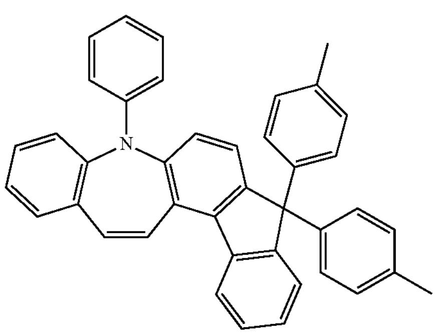
2-139
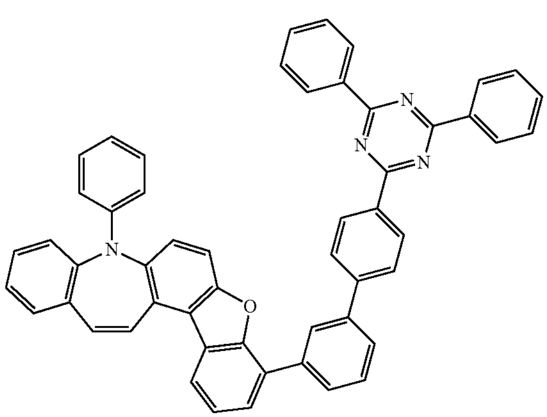
-continued
2-140
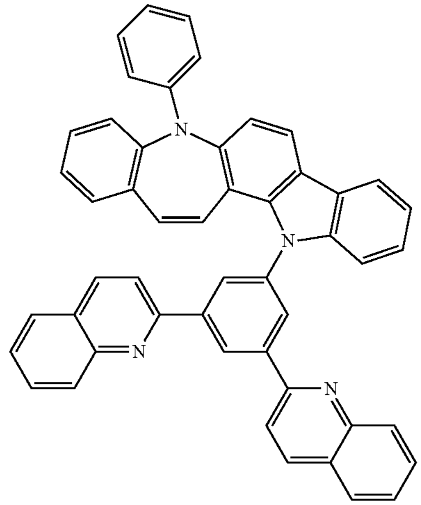
2-141
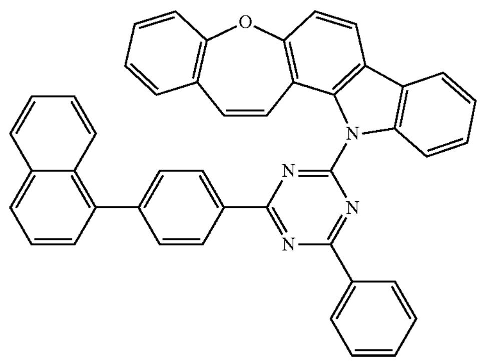
2-142
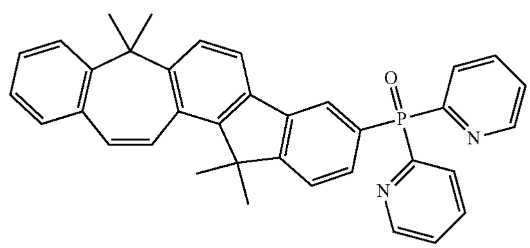
2-143
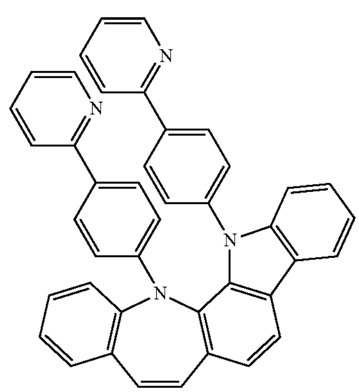

-continued
2-144
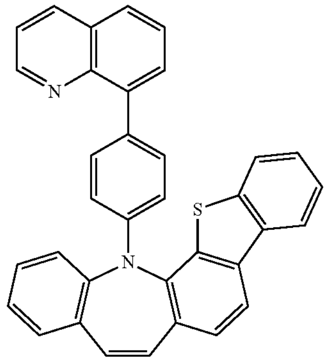
2-145
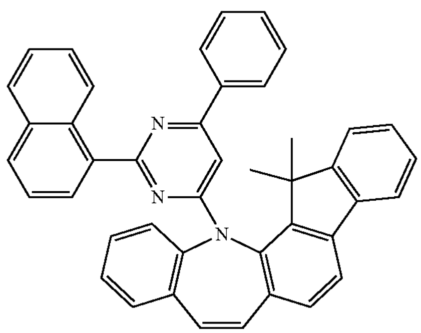
2-146
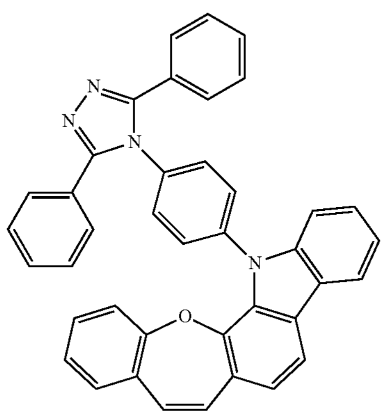
2-147
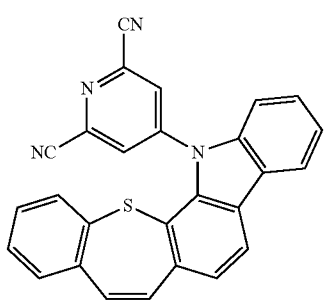
-continued
2-148
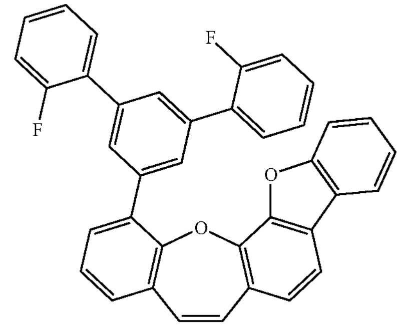
2-149
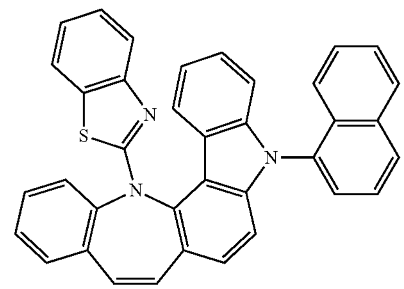
2-150
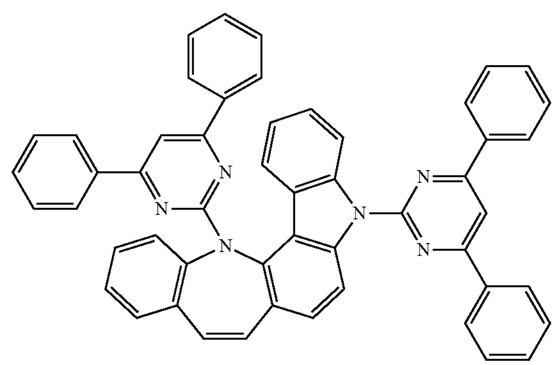
2-151
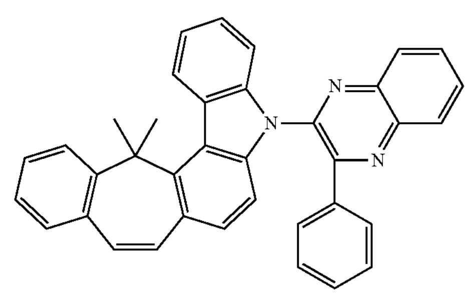

-continued
2-152
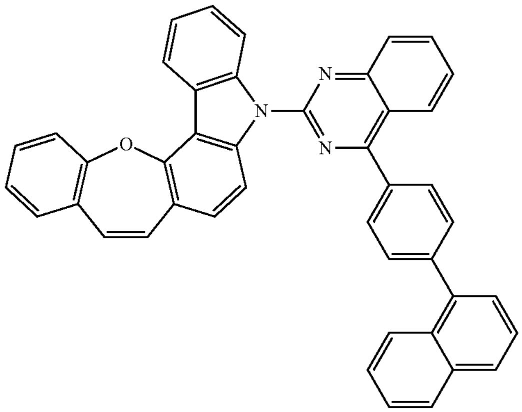
2-153
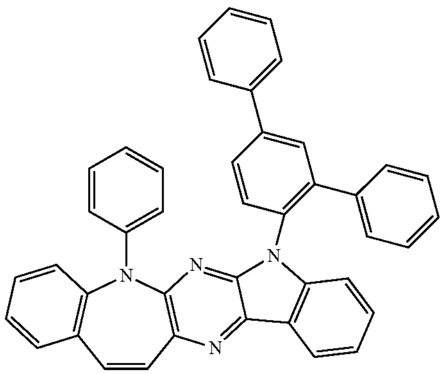
2-154
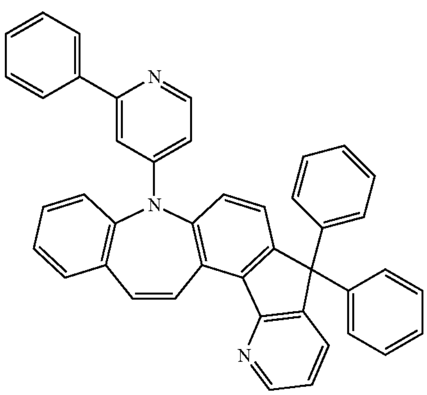
2-155
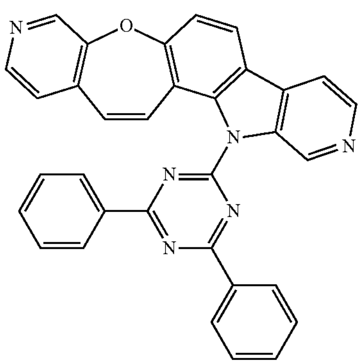
-continued
2-156
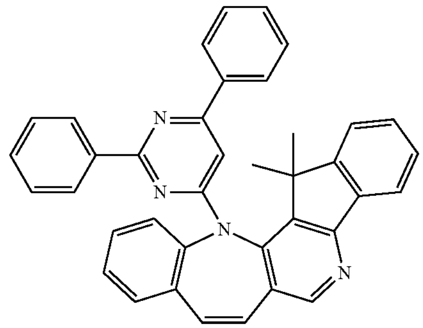
2-157
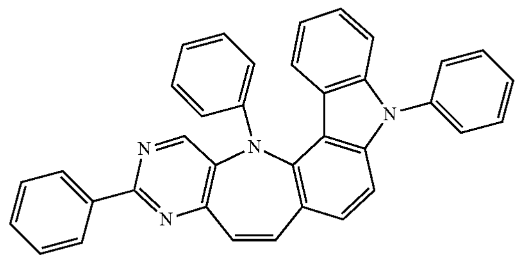
2-158
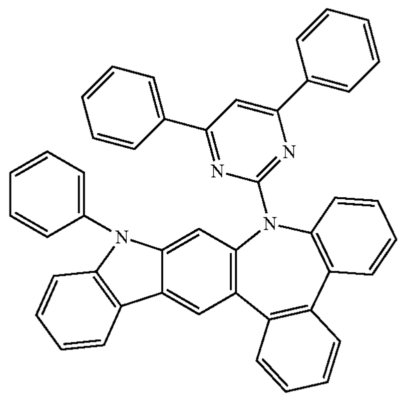
2-159
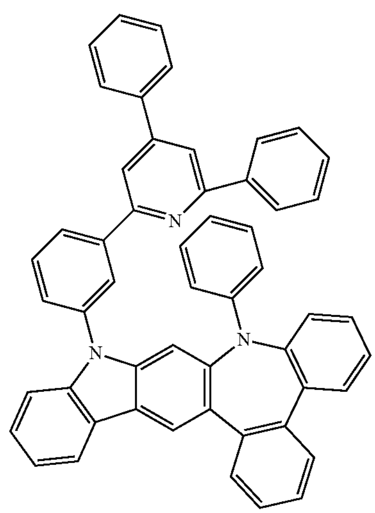

-continued
2-160
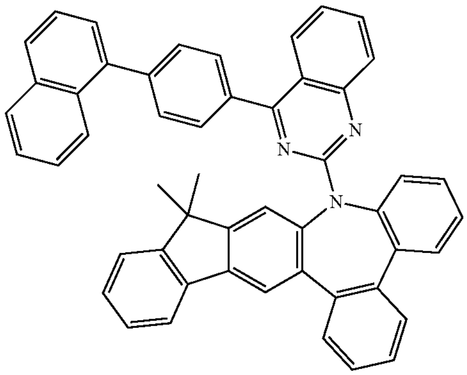
2-161
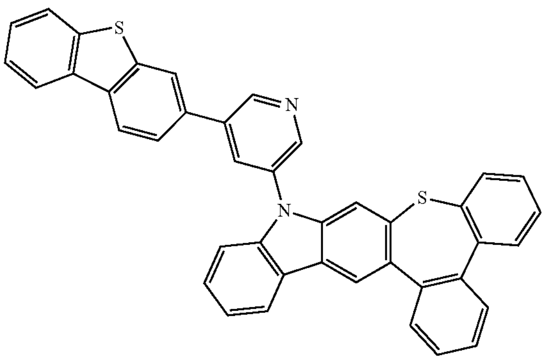
2-162
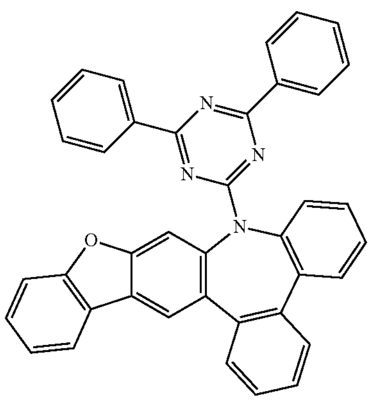
2-163
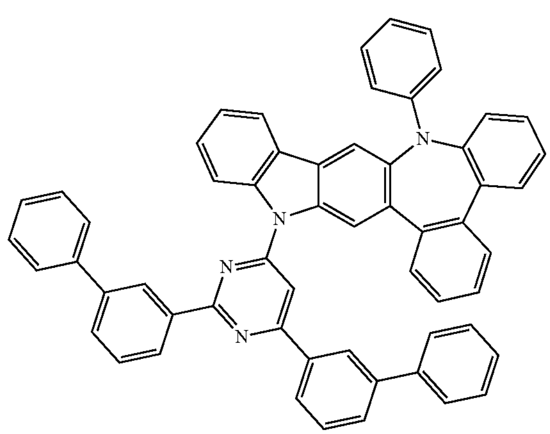
-continued
2-164
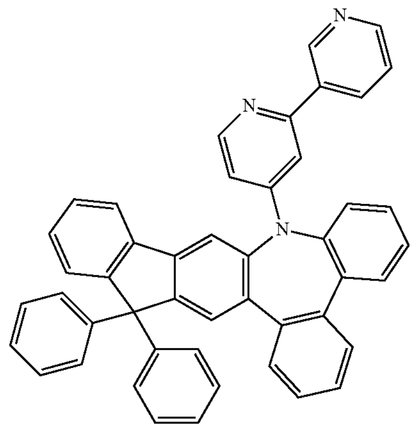
2-165
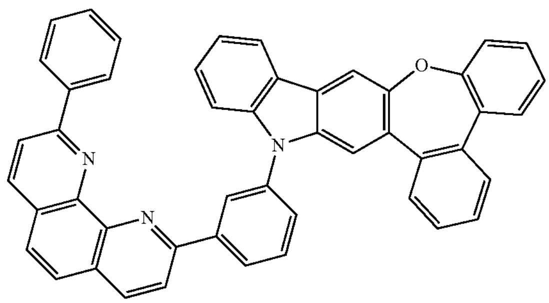
2-166
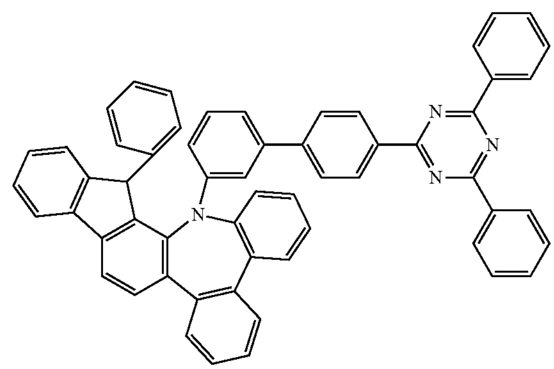
2-167
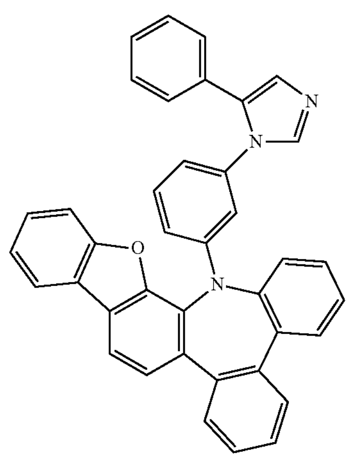

-continued
2-168
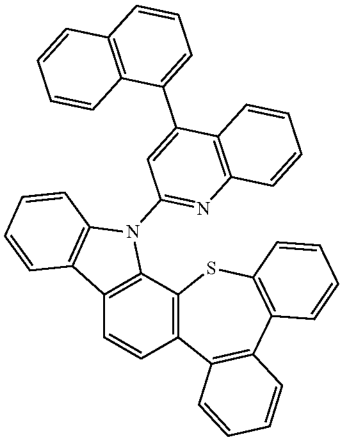
2-169
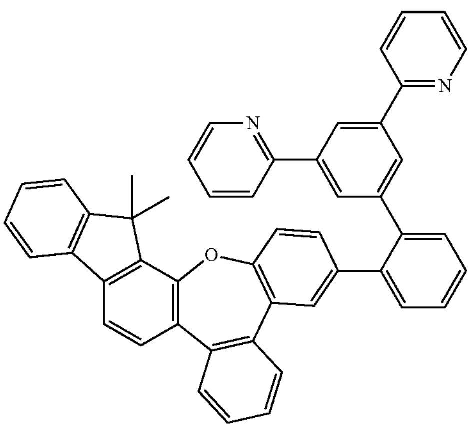
2-170
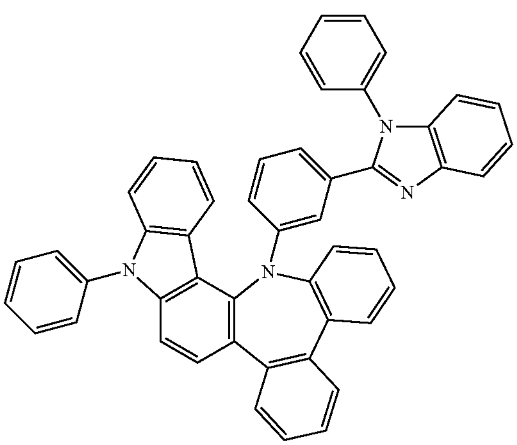
-continued
2-171
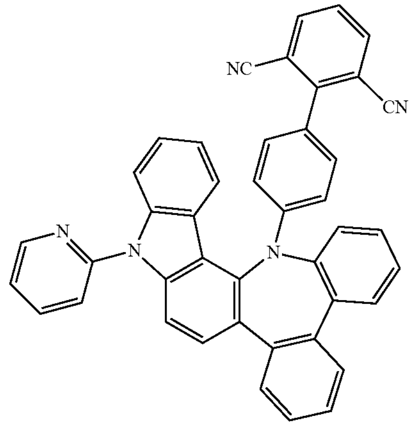
2-172
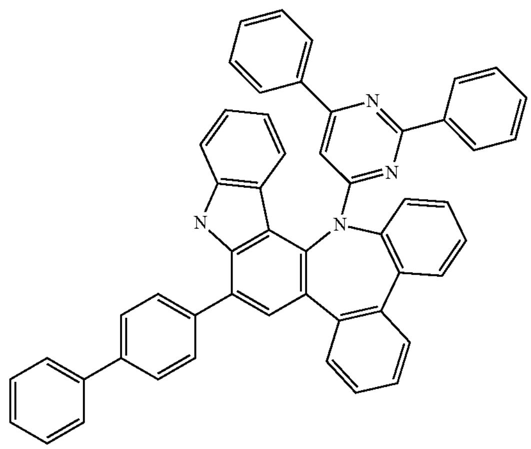
2-173
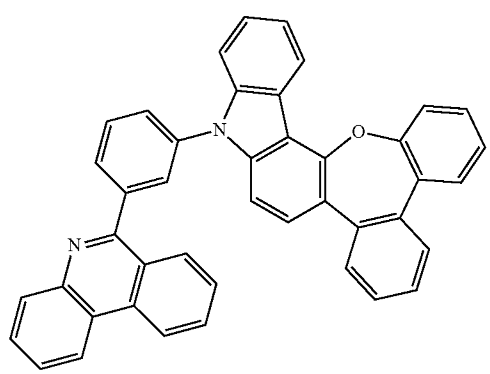

2-174
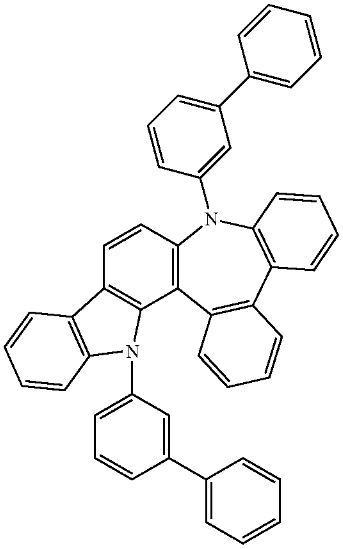
2-175
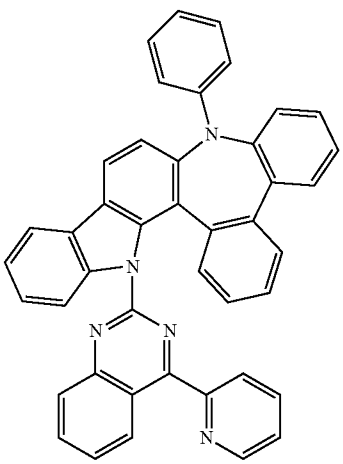
2-176
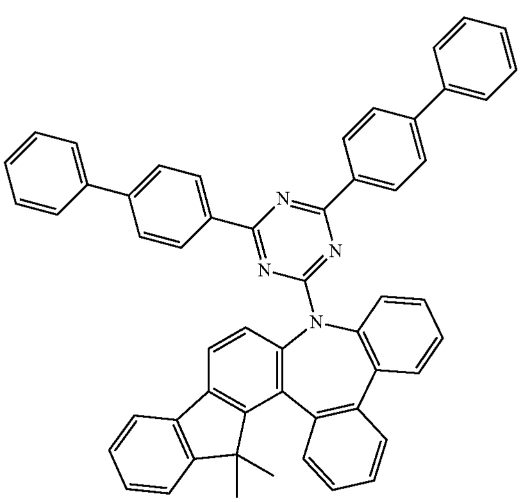
2-177
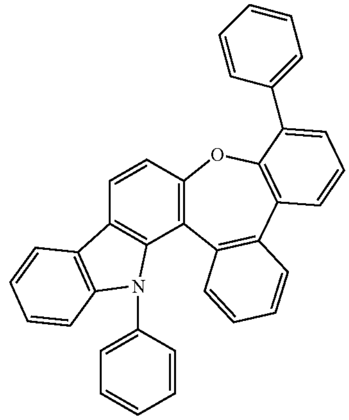
2-178
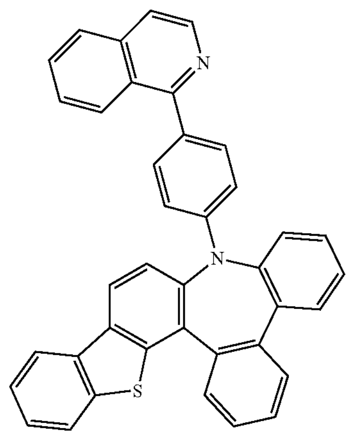
2-179
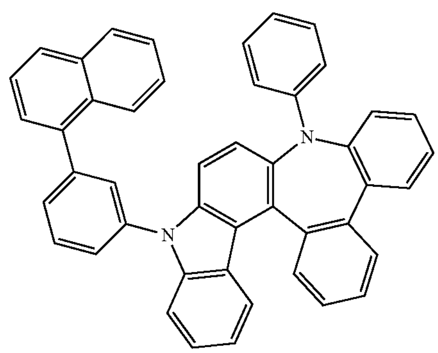
2-180
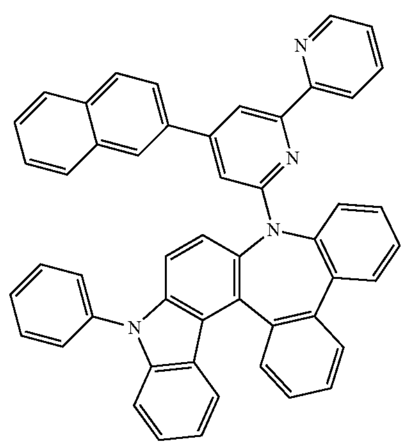

2-181
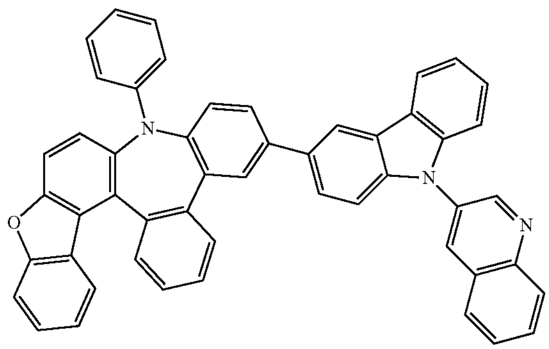
2-182
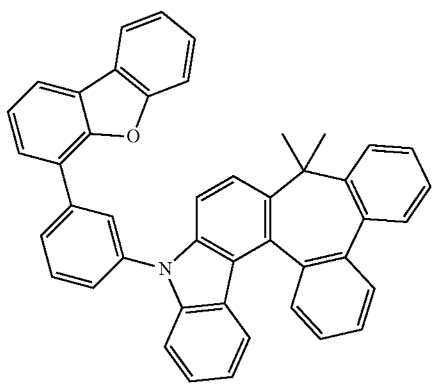
2-183
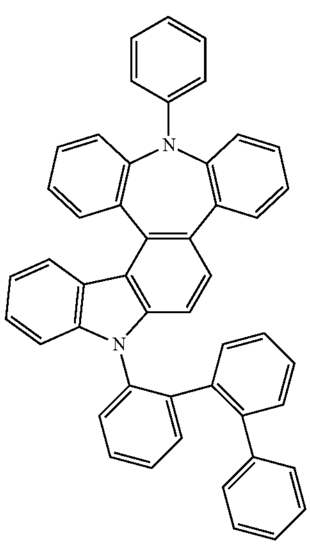
2-184
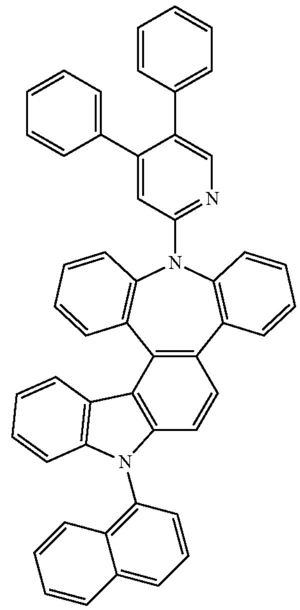
2-185
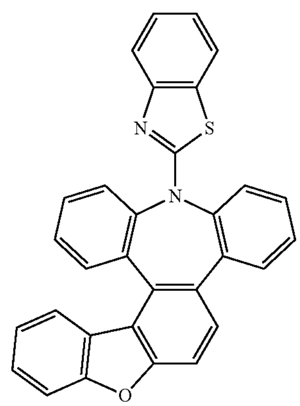
2-186
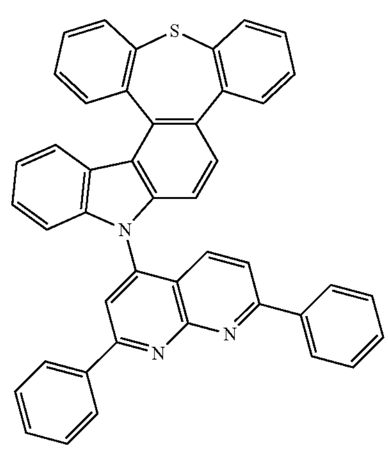

2-187
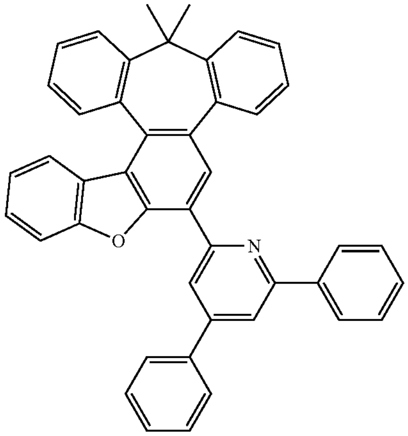
2-188
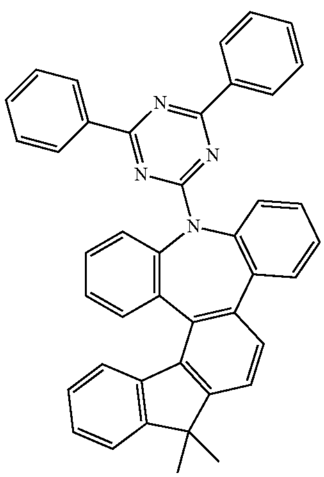
2-189
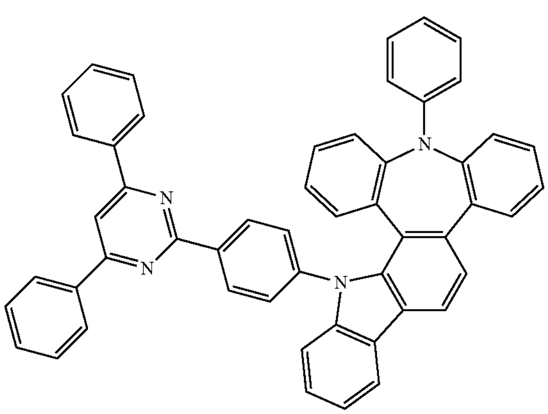
2-190
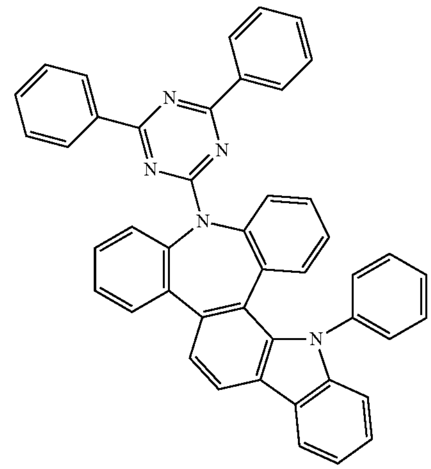
2-191
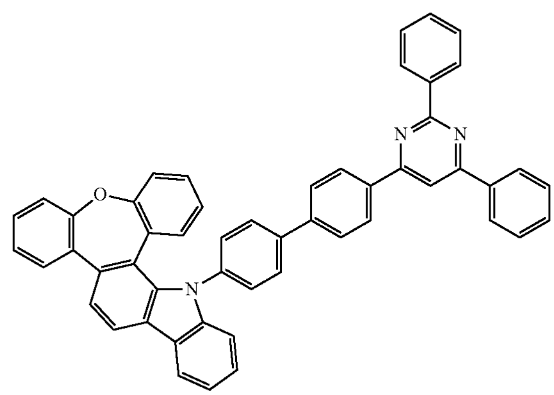
2-192
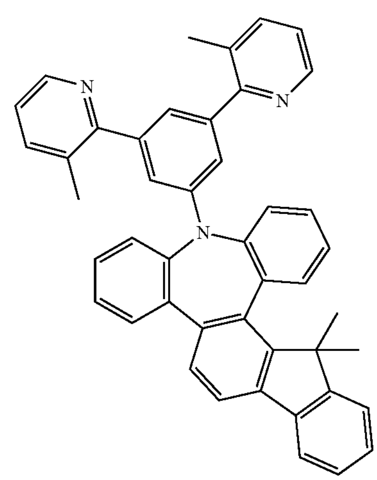

-continued
2-193
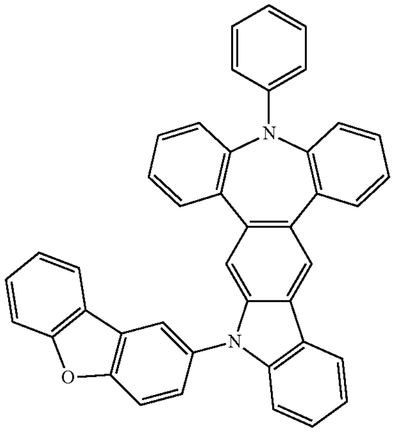
2-194
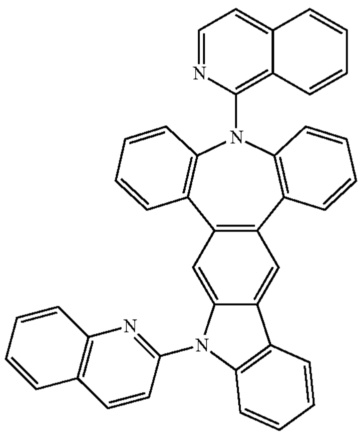
2-195
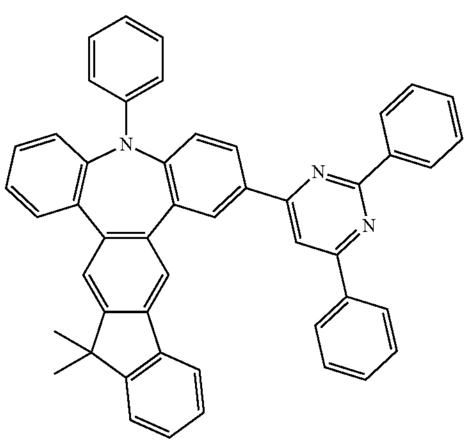
-continued
2-196
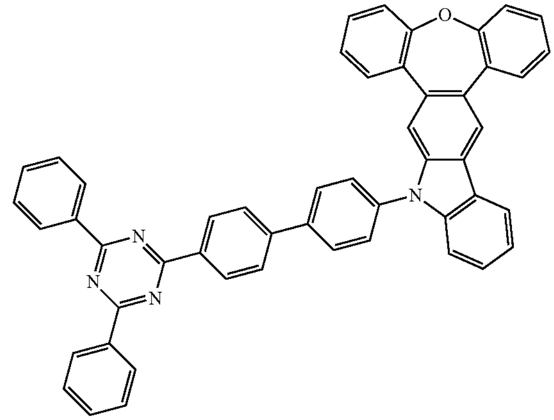
2-197
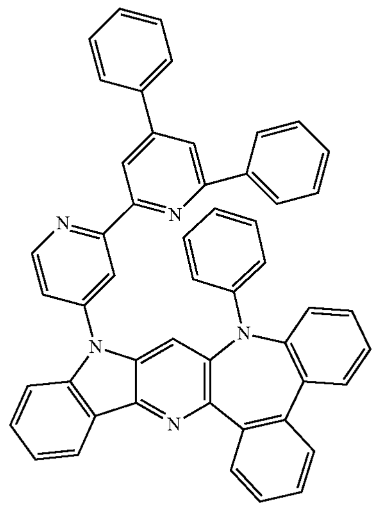
2-198
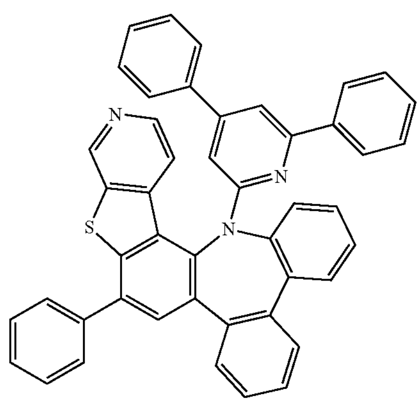

-continued
2-199
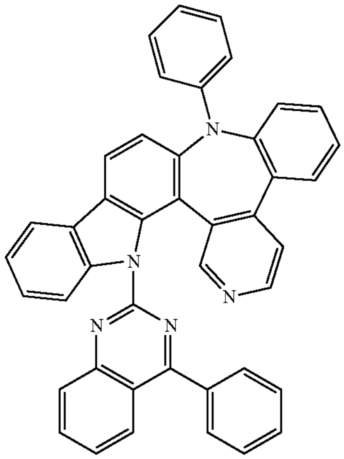
2-200
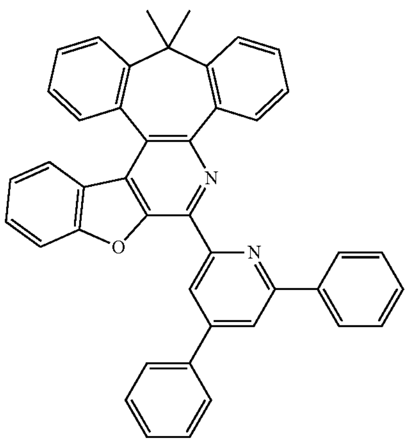
2-201
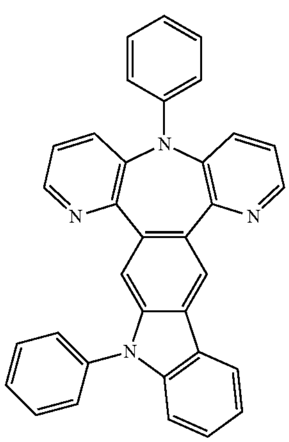
-continued
2-202
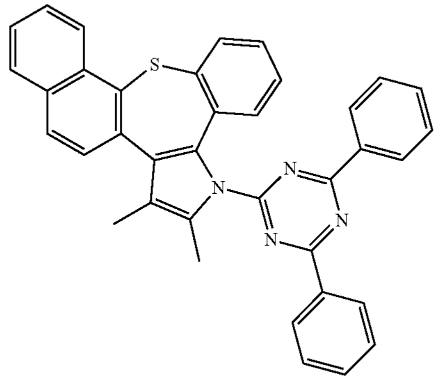
2-203
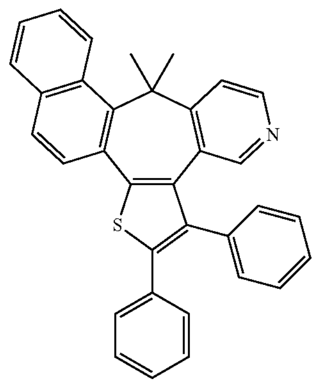
2-204
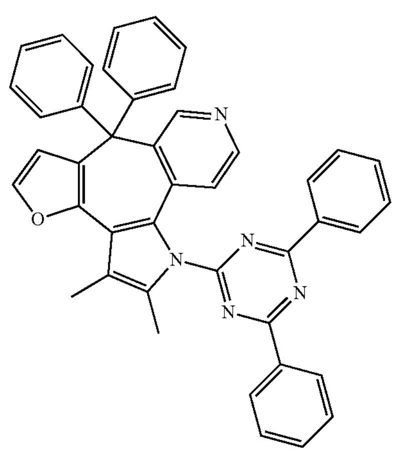

-continued
2-205
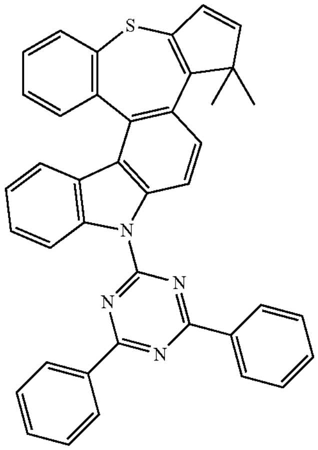
2-206
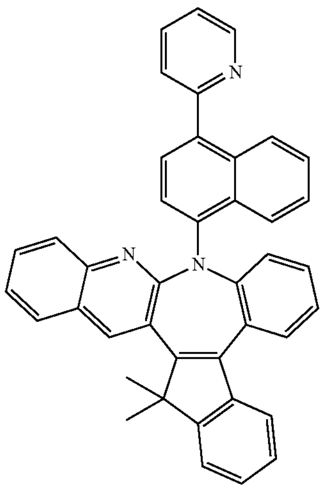
2-207
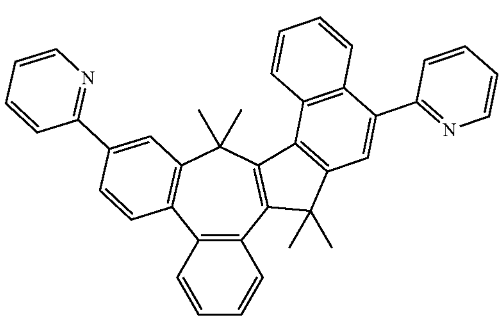
2-208
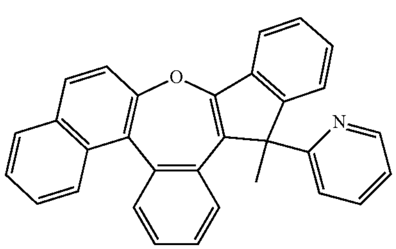
-continued
2-209
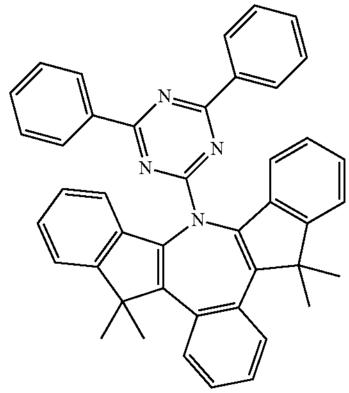
2-210
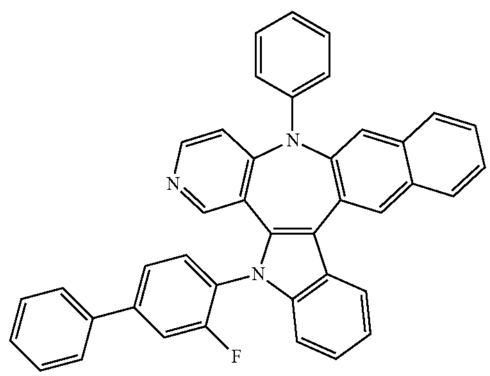
2-211
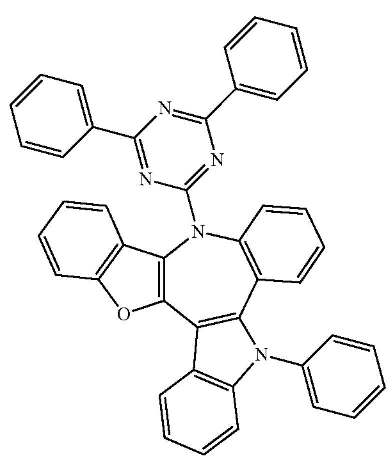

-continued
2-212
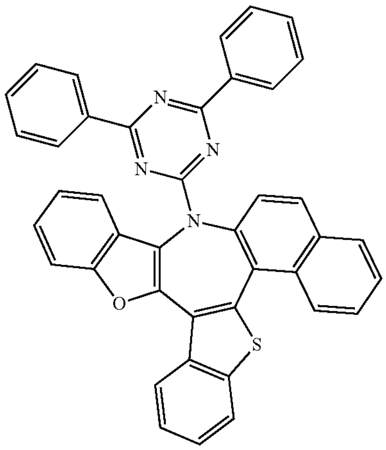
2-213
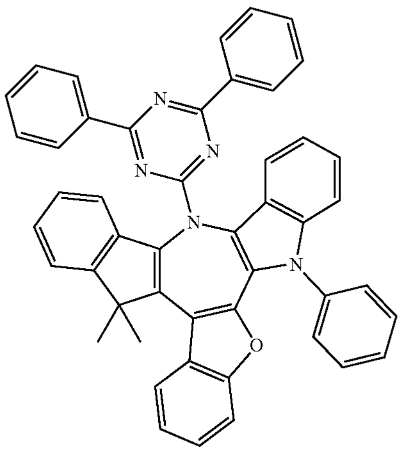
2-214
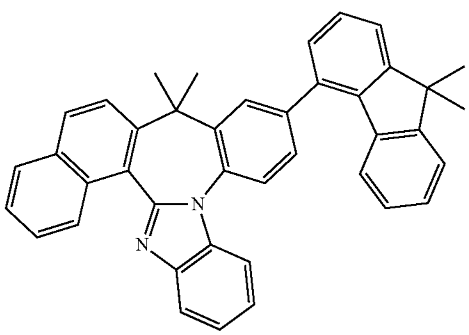
2-215
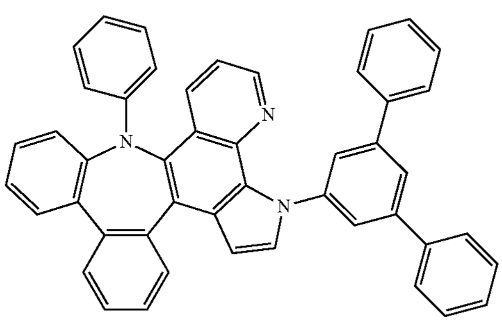
-continued
2-216
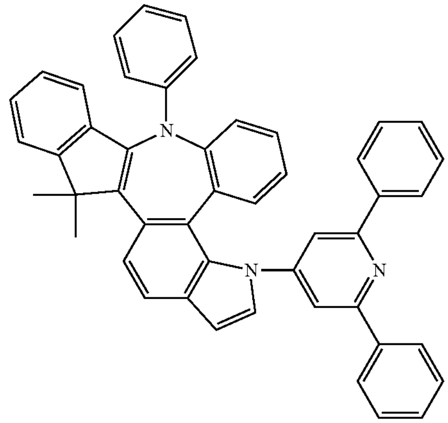
2-217
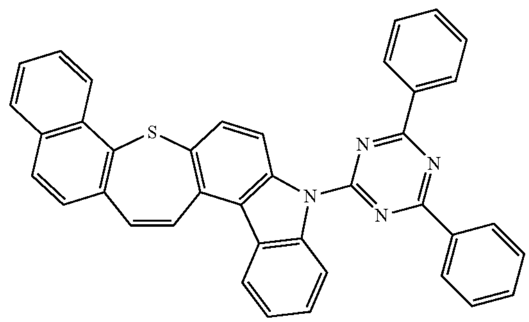
2-218
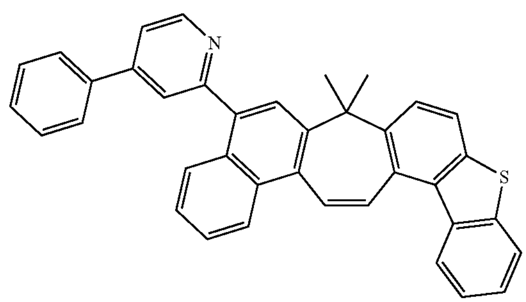
2-219
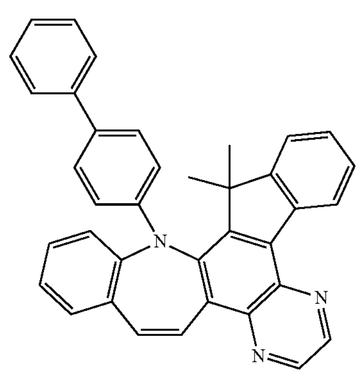

-continued
2-220
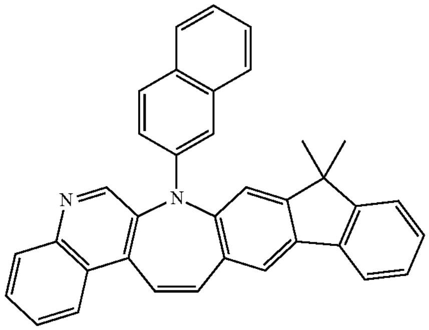
2-221
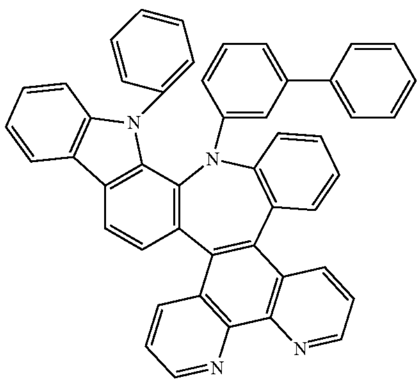
2-222
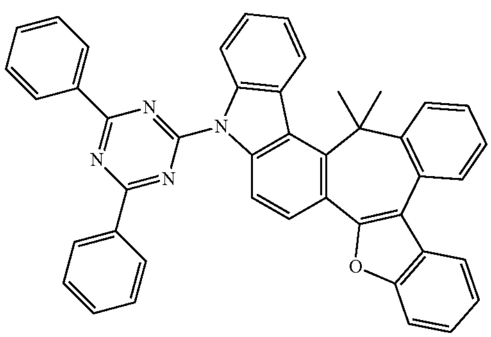
2-223
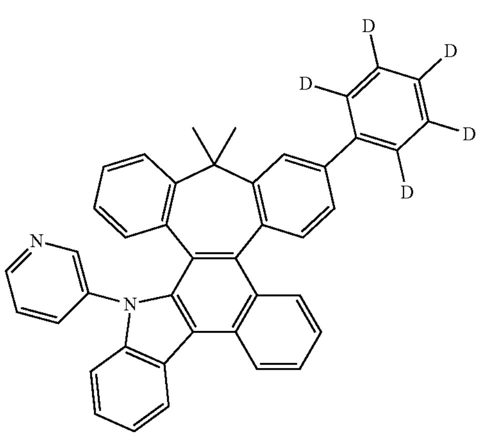
-continued
2-224
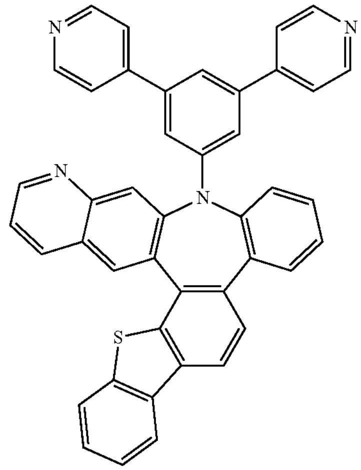
2-225
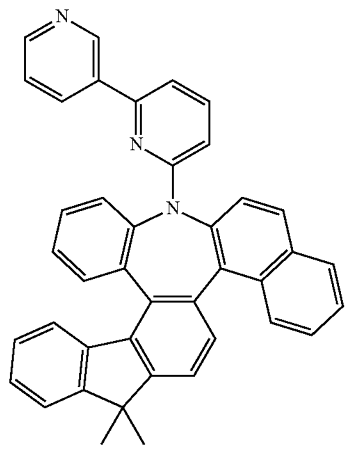
2-226
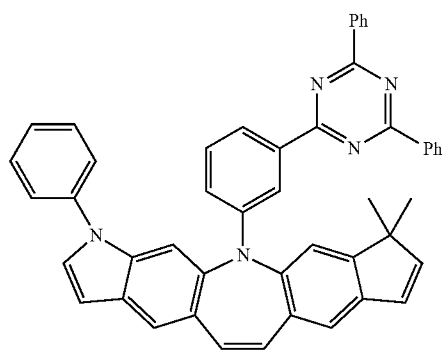
2-227
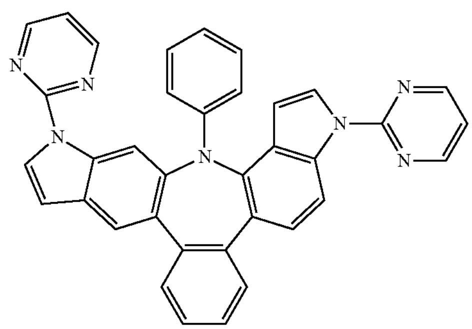

-continued
2-228
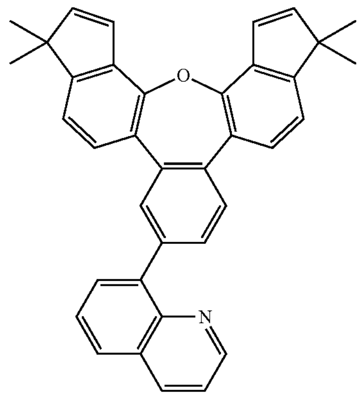
2-229
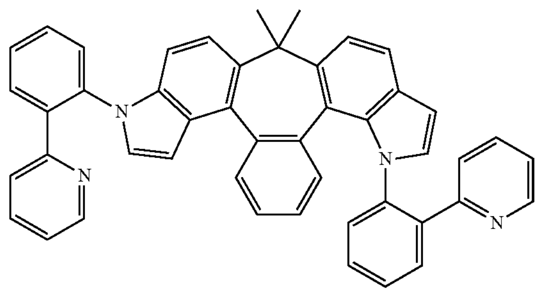
2-230
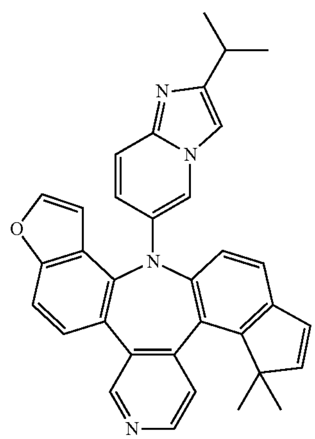
2-231
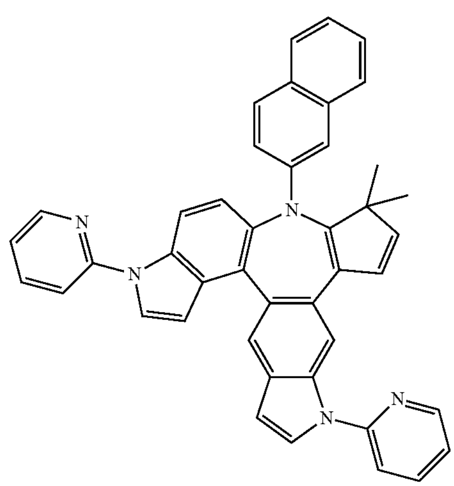
-continued
2-232
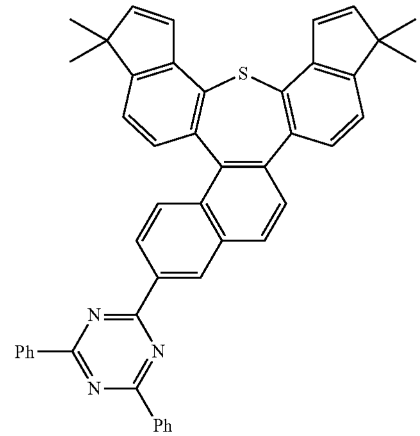
2-233
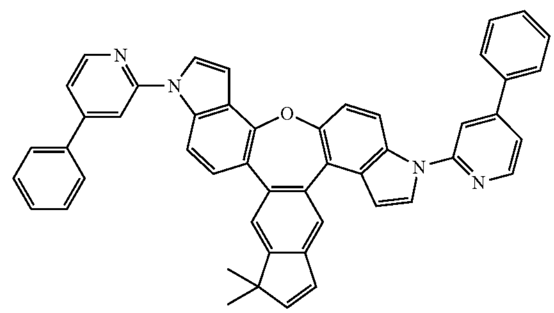
2-234
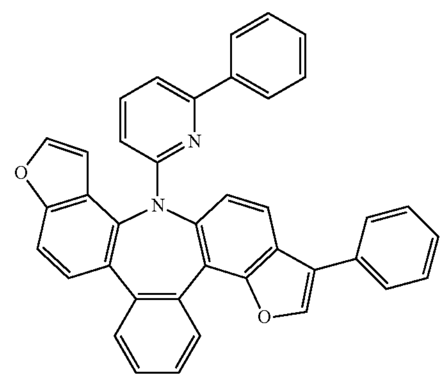
2-235
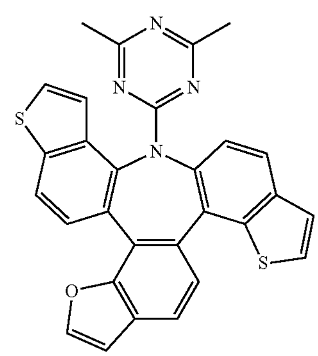

-continued
2-236
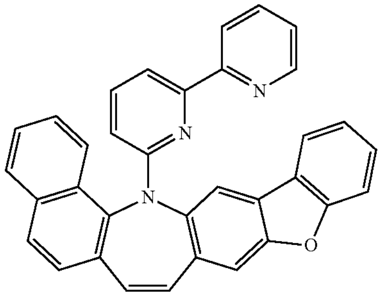
2-237
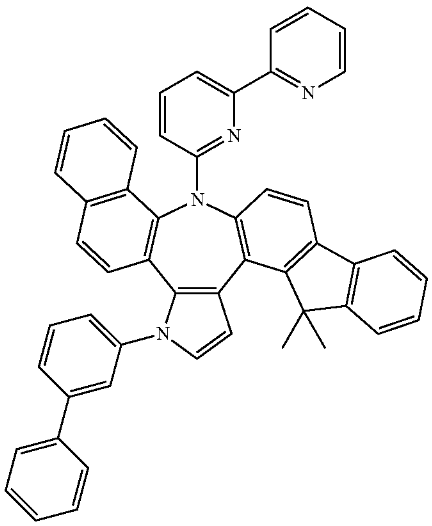
2-238
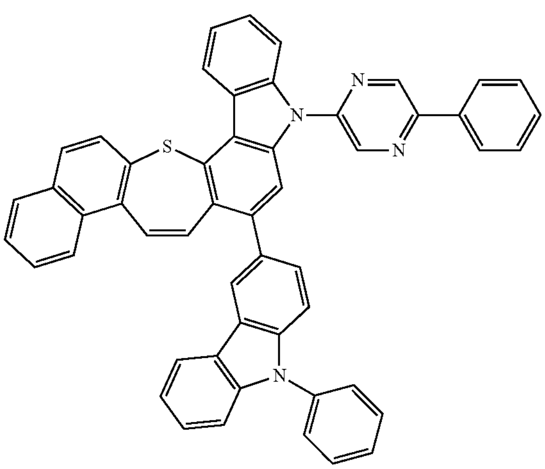
-continued
2-239
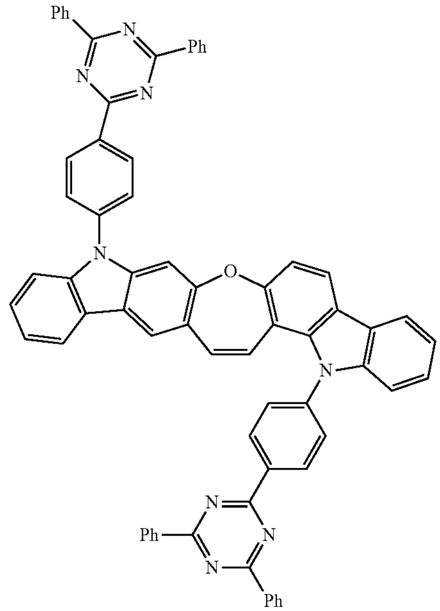
2-240
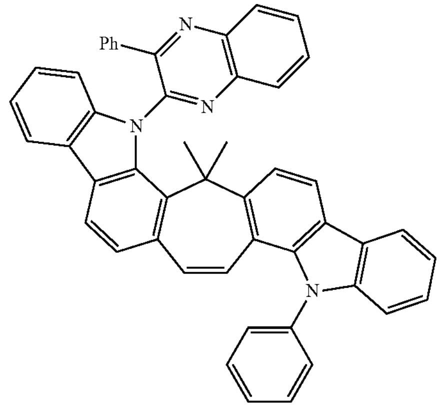
2-241
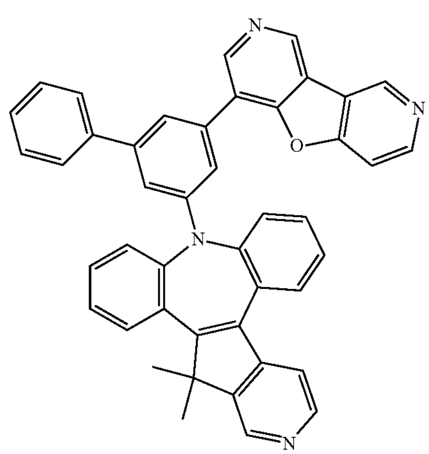

-continued
2-242
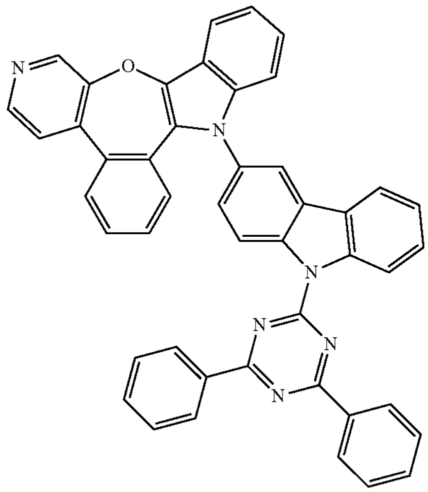
2-243
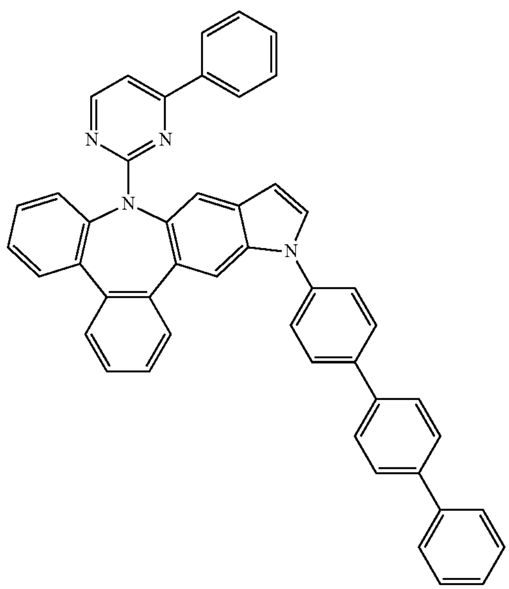
2-244
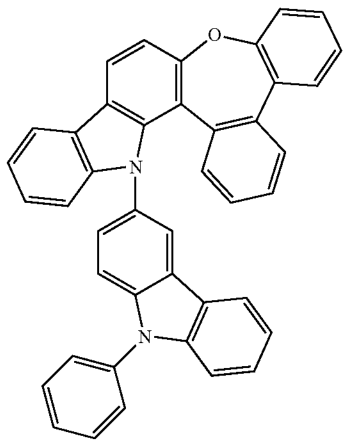
-continued
2-245
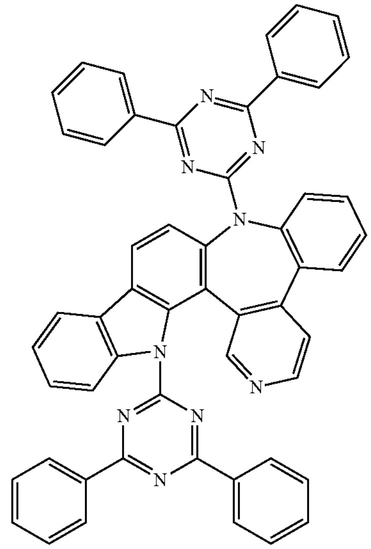
2-246
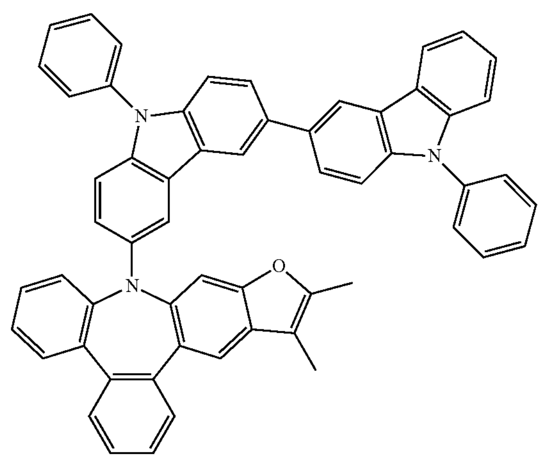
2-247
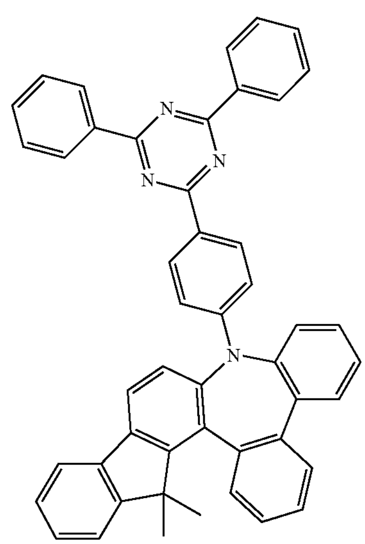

2-248
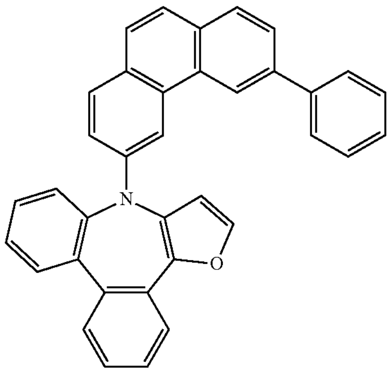
2-249
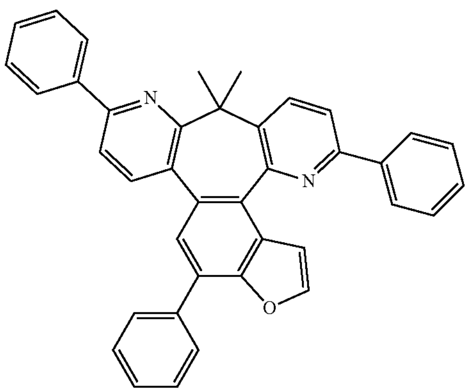
2-250
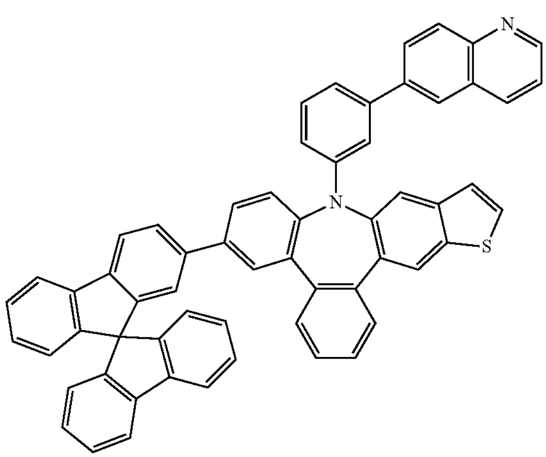
2-251
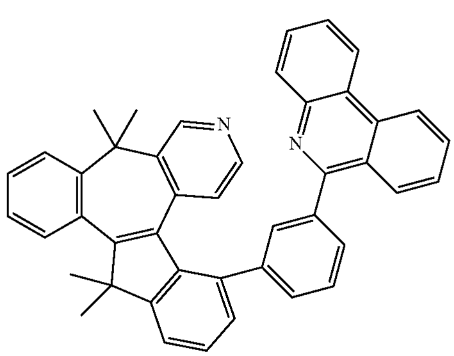
2-252
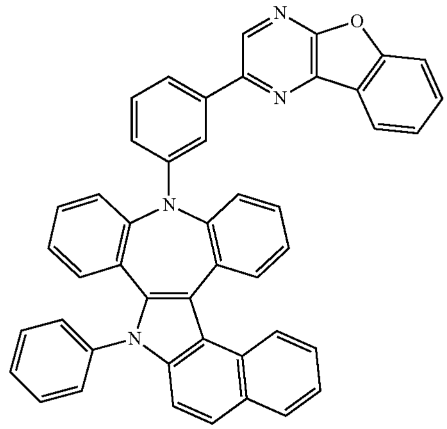
2-253
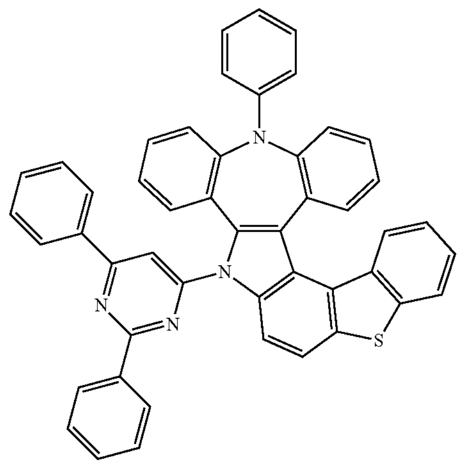
2-254
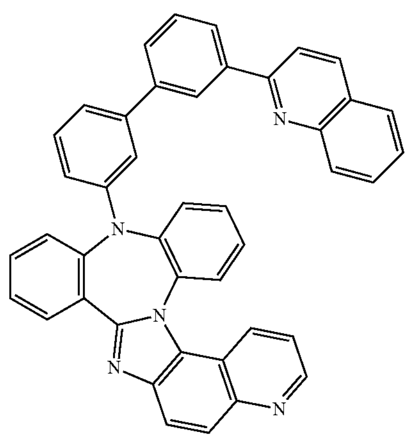

-continued
2-255
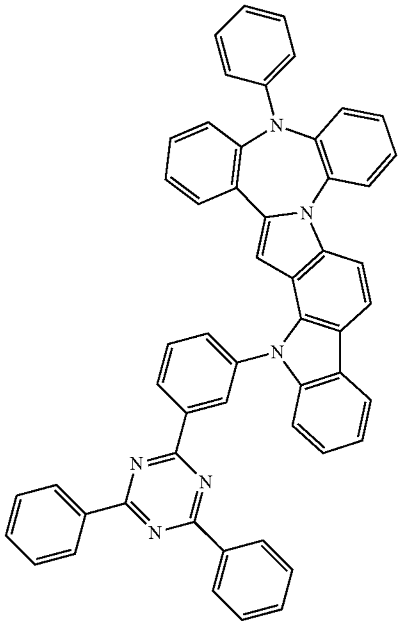
2-256
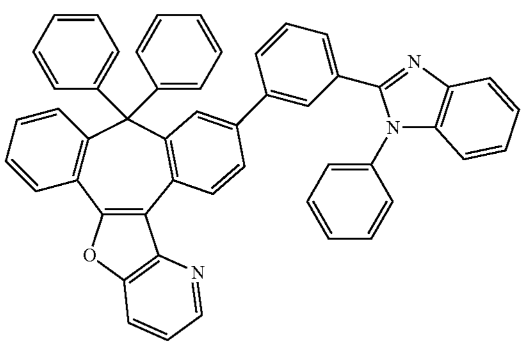
2-257
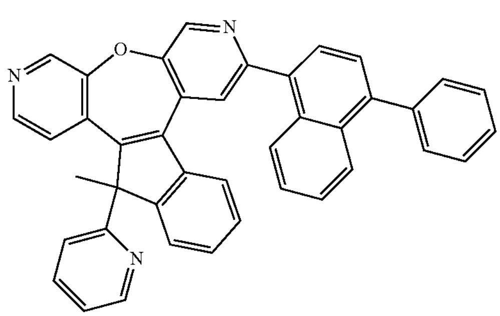
-continued
2-258
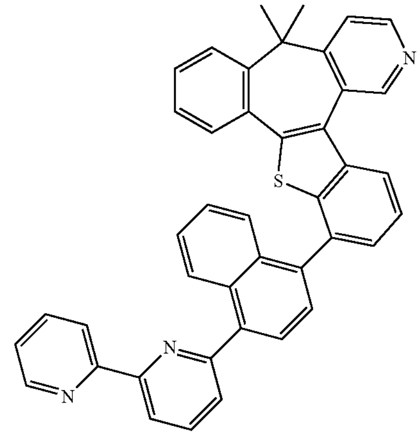
2-259
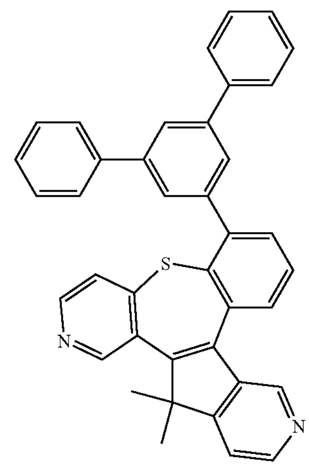
2-260
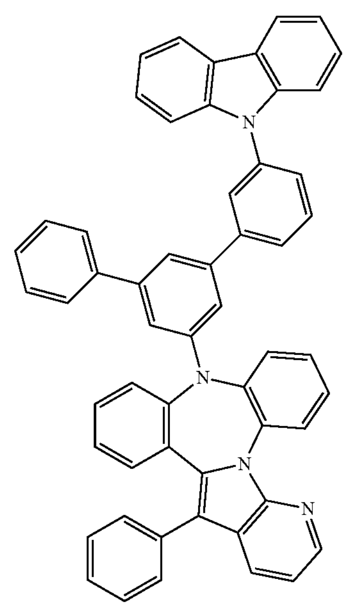

-continued 2-261

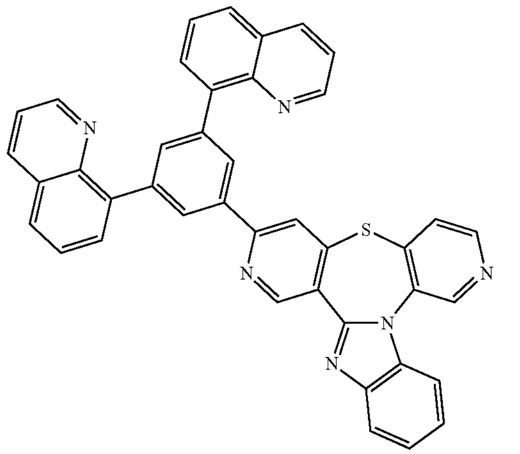

2-262

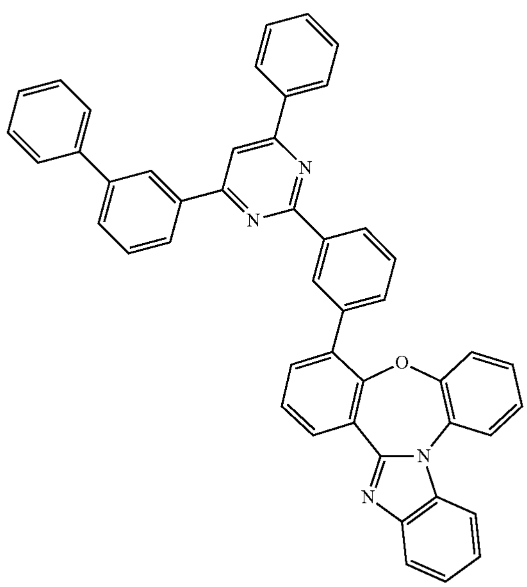

In Formulae 1A and 1B, any suitable combinations of ring $A_1$, ring $A_2$, $L_1$, $L_2$, a1, a2, $Ar_1$, $Ar_2$, b1, b2, $R_1$ to $R_4$, c1m and c2 may be used within the scopes described herein.

In Formulae 2A and 2B, any suitable combinations of ring $A_{21}$, ring $A_{22}$, ring $A_{23}$, $X_{21}$, and $T_{11}$ to $T_{14}$ may be used within the scopes described herein.

Regarding $*-[(L_{22})_{a22}-(R_{22})_{b22}]$, $C(R_{23})(R_{24})$, $Si(R_{23})(R_{24})$, and $N-[(L_{21})_{a21}-(R_{21})_{b21}]$, any suitable combinations of $L_{21}$, $L_{22}$, a21, a22, $R_{21}$ to $R_{24}$, b21, and b22 may be used within the scopes described herein.

In one embodiment, the hole transport region may include an emission auxiliary layer, wherein the emission auxiliary layer may directly contact the emission layer and include the second compound represented by Formula 2A or 2B.

In one or more embodiments, the electron transport region may include a buffer layer, wherein the buffer layer may directly contact the emission layer and include the second compound represented by Formula 2A or 2B, but embodiments of the present disclosure are not limited thereto.

When the hole transport region and the electron transport region of the organic light-emitting device both (e.g., simultaneously) include the above-described second compound, the second compound included in the hole transport region may be identical to or different from the second compound included in the electron transport region.

The first compound represented by Formula 1A or 1B included in the emission layer may be a host, and the emission layer may further include a dopant, wherein the dopant may include an arylamine compound or a styrylamine compound, but embodiments of the present disclosure are not limited thereto.

Description of FIG. 1

FIG. 1 is a schematic view of an organic light-emitting device 10 according to an embodiment of the present disclosure. The organic light-emitting device 10 includes a first electrode 110, an organic layer 150, and a second electrode 190.

Hereinafter, the structure of the organic light-emitting device 10 according to an embodiment of the present disclosure and a method of manufacturing the organic light-emitting device 10 will be described in connection with FIG. 1.

First Electrode 110

In FIG. 1, a substrate may be under the first electrode 110 or above the second electrode 190. The substrate may be a glass substrate or a plastic substrate, each having excellent mechanical strength, thermal stability, transparency, surface smoothness, ease of handling, and/or water-resistance.

The first electrode 110 may be formed by depositing and/or sputtering a material for forming the first electrode 110 on the substrate. When the first electrode 110 is an anode, the material for the first electrode 110 may be selected from materials with a high work function in order to facilitate hole injection.

The first electrode 110 may be a reflective electrode, a semi-transmissive electrode, or a transmissive electrode. When the first electrode 110 is a transmissive electrode, the material for forming the first electrode 110 may be selected from indium tin oxide (ITO), indium zinc oxide (IZO), tin oxide ($SnO_2$), zinc oxide (ZnO), and combinations thereof, but embodiments of the present disclosure are not limited thereto. In one or more embodiments, when the first electrode 110 is a semi-transmissive electrode or a reflective electrode, the material for forming the first electrode may be selected from magnesium (Mg), silver (Ag), aluminum (Al), aluminum-lithium (Al—Li), calcium (Ca), magnesium-indium (Mg—In), magnesium-silver (Mg—Ag), and combinations thereof, but embodiments of the present disclosure are not limited thereto.

The first electrode 110 may have a single-layer structure, or a multi-layer structure including two or more layers. In some embodiments, the first electrode 110 may have a three-layered structure of ITO/Ag/ITO, but embodiments of the structure of the first electrode 110 are not limited thereto.

Organic Layer 150

The organic layer 150 may be on the first electrode 110. The organic layer 150 may include an emission layer.

The organic layer 150 may include a hole transport region between the first electrode 110 and the emission layer, and/or an electron transport region between the emission layer and the second electrode 190.

Hole Transport Region in Organic Layer 150

The hole transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The hole transport region may include a hole injection layer, a hole transport layer, an emission auxiliary layer, an electron blocking layer, or a combination thereof.

In some embodiments, the hole transport region may have a single-layer structure including (e.g., consisting of) a single layer including a plurality of different materials, or a multi-layer structure having a structure of hole injection layer/hole transport layer, hole injection layer/hole transport layer/emission auxiliary layer, hole injection layer/emission auxiliary layer, hole transport layer/emission auxiliary layer, or hole injection layer/hole transport layer/electron blocking layer, wherein layers of each structure are sequentially stacked on the first electrode 110 in each stated order, but embodiments of the structure of the hole transport region are not limited thereto.

The hole transport region may include the second compound represented by Formula 2A or 2B as described above.

In one embodiment, the hole transport region may include an emission auxiliary layer. The emission auxiliary layer may directly contact the emission layer.

In one or more embodiments, the hole transport region may include a hole injection layer and a hole transport layer stacked in this stated order on the first electrode 110, a hole injection layer and an emission auxiliary layer stacked in this stated order on the first electrode 110, or a hole injection layer, a hole transport layer, and an emission auxiliary layer stacked in this stated order on the first electrode 110, but embodiments of the present disclosure are not limited thereto.

When the hole transport region includes an emission auxiliary layer, the emission auxiliary layer may further include the second compound represented by Formula 2A or 2B.

The hole transport region may include at least one selected from m-MTDATA, TDATA, 2-TNATA, NPB (NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

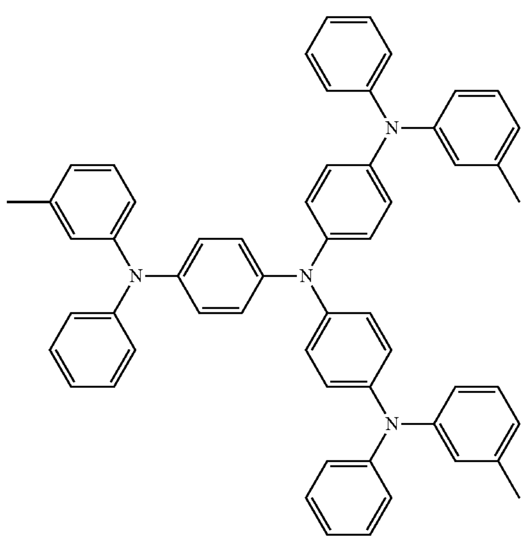

m-MTDATA

-continued

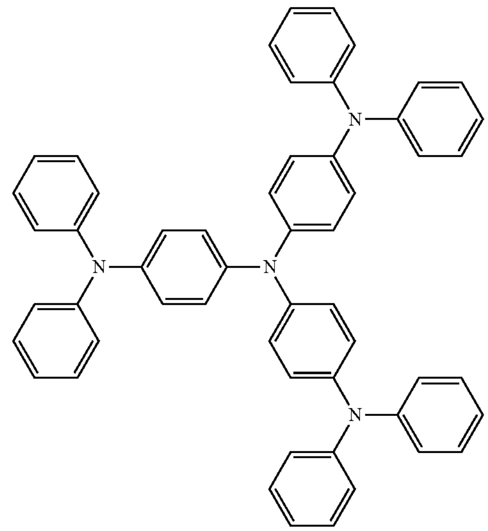

TDATA

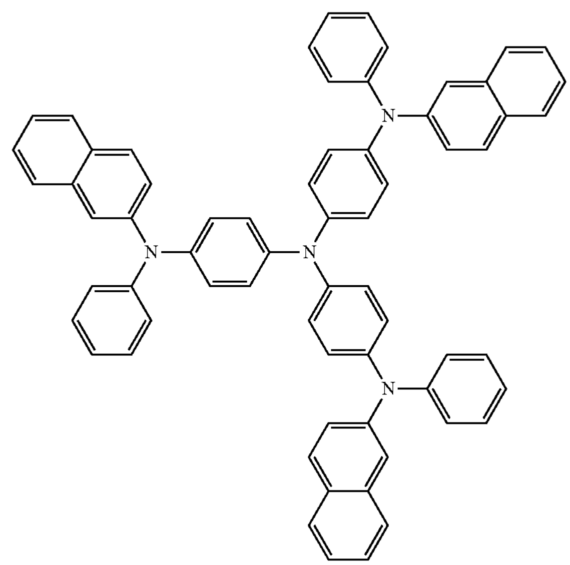

2-TNATA

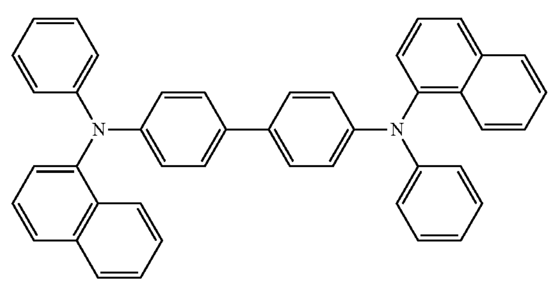

NPB

-continued

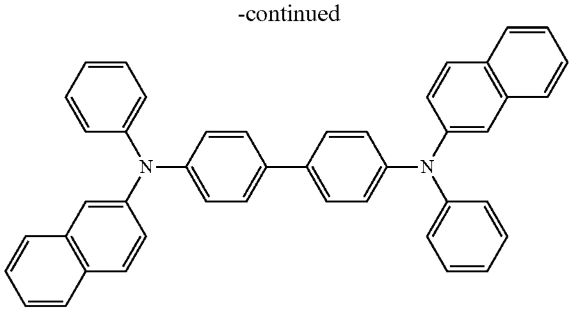

β-NPB

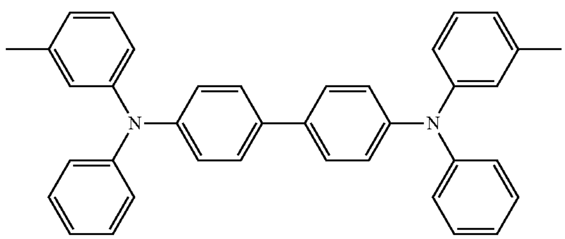

TPD

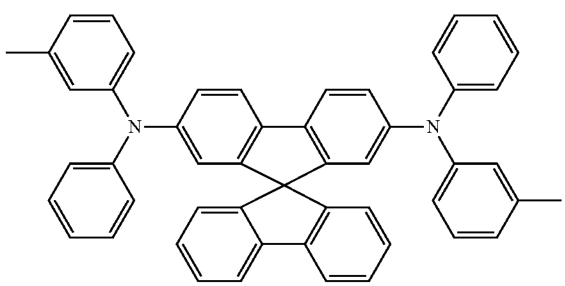

Spiro-TPD

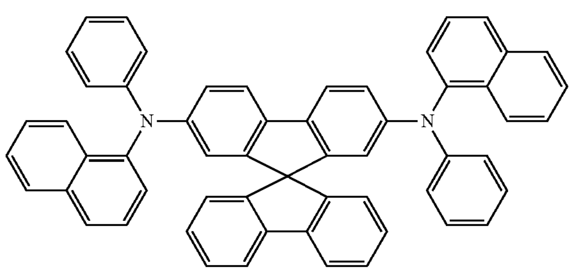

Spiro-NPB

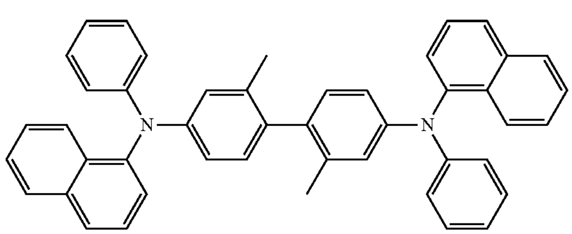

methylated NPB

-continued

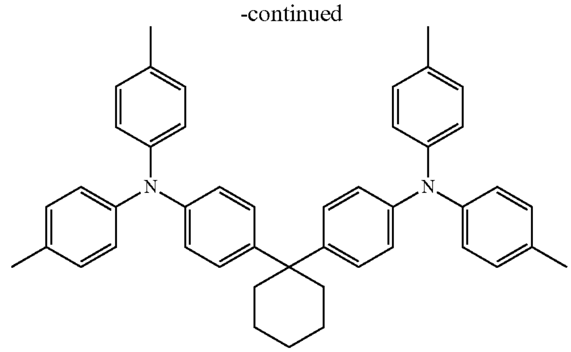

TAPC

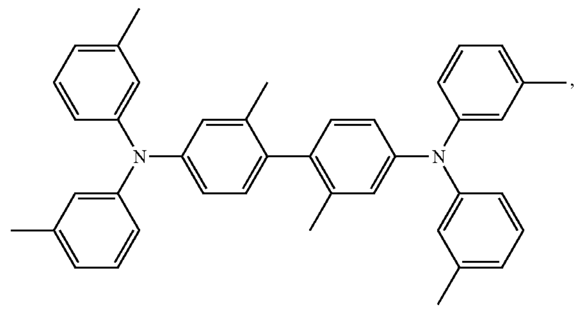

HMTPD

Formula 201

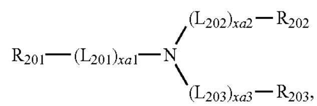

Formula 202

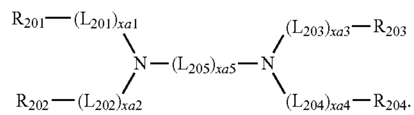

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 202, $R_{201}$ and $R_{202}$ may optionally be bound (e.g., coupled) via a single bond, a dimethyl-methylene group, or a diphenyl-methylene group, and $R_{203}$ and $R_{204}$ may optionally be bound (e.g., coupled) via a single bond, a dimethyl-methylene group, or a diphenyl-methylene group.

In one embodiment, in Formulae 201 and 202, $L_{201}$ to $L_{205}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one embodiment, xa5 may be 1, 2, 3, or 4.

In one or more embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be the same as described above.

In one or more embodiments, in Formula 201, at least one selected from $R_{201}$ to $R_{203}$ may be selected from the group consisting of:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one embodiment, in Formula 202, i) $R_{201}$ and $R_{202}$ may be bound (e.g., coupled) via a single bond, and/or ii) $R_{203}$ and $R_{204}$ may be bound (e.g., coupled) via a single bond.

In one or more embodiments, in Formula 202, at least one selected from $R_{201}$ to $R_{204}$ may be selected from the group consisting of:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201A:

Formula 201A

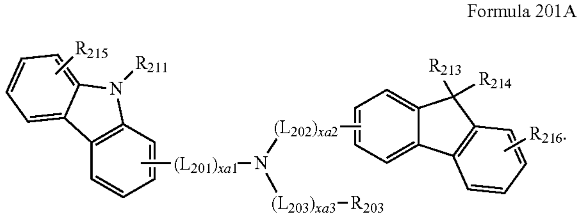

In some embodiments, the compound represented by Formula 201 may be represented by Formula 201A(1), but embodiments of the present disclosure are not limited thereto:

Formula 201A(1)

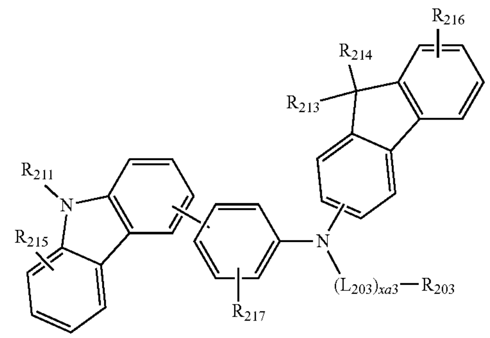

In some embodiments, the compound represented by Formula 201 may be represented by Formula 201A-1, but embodiments of the present disclosure are not limited thereto:

Formula 201A-1

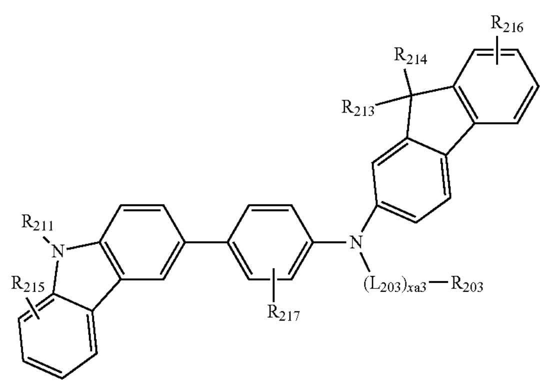

In some embodiments, the compound represented by Formula 202 may be represented by Formula 202A:

Formula 202A

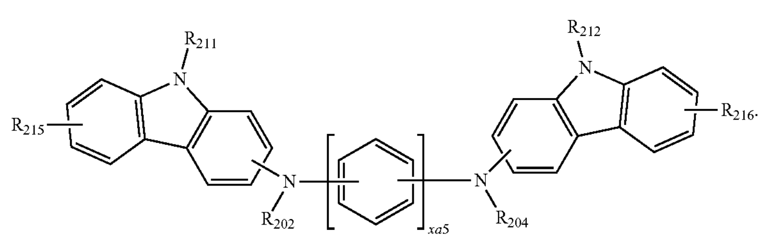

In some embodiments, the compound represented by Formula 202 may be represented by Formula 202A-1:

Formula 202A-1

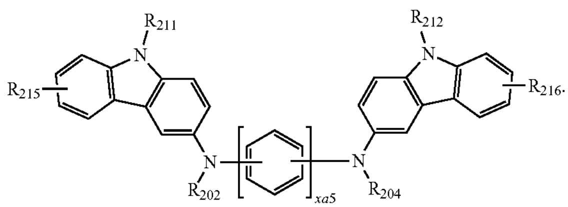

In Formulae 201A, 201A(1), 201A-1, 202A, and 202A-1, $L_{201}$ to $L_{203}$, xa1 to xa3, xa5, and $R_{202}$ to $R_{204}$ may each independently be the same as described herein in connection with Formulae 201 and 202, $R_{211}$ and $R_{212}$ may each independently be the same as described herein in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments of the present disclosure are not limited thereto:

HT1

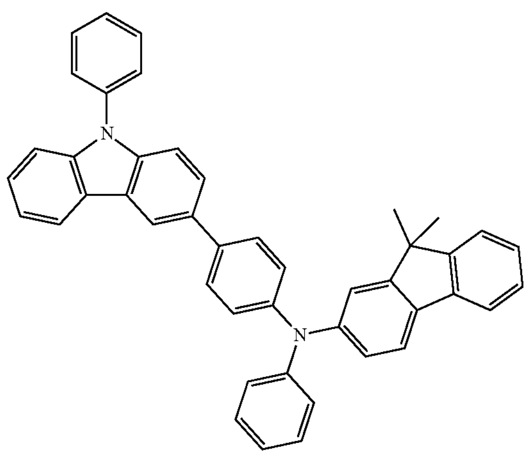

HT2

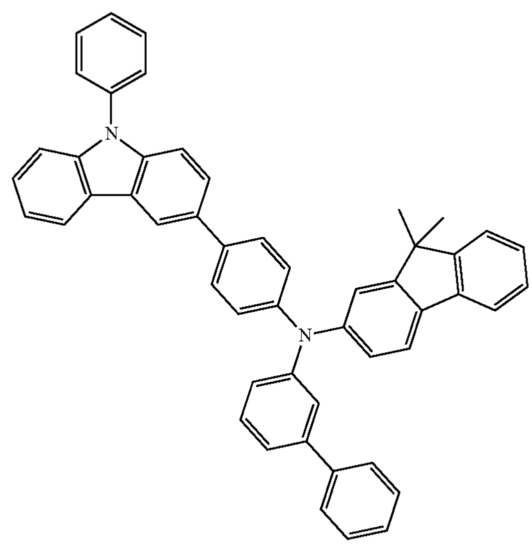

HT3

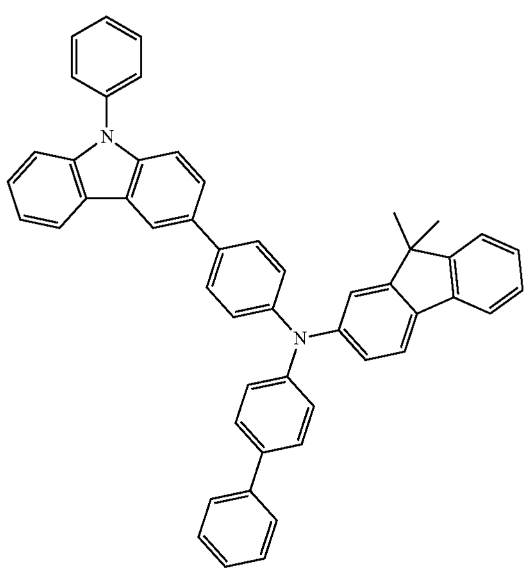

HT4

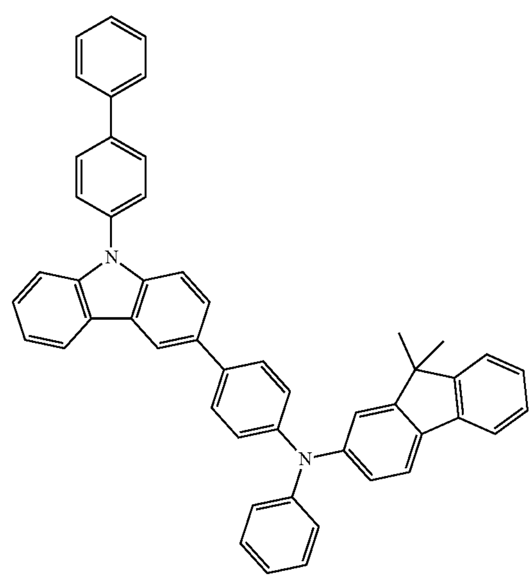

-continued
HT5
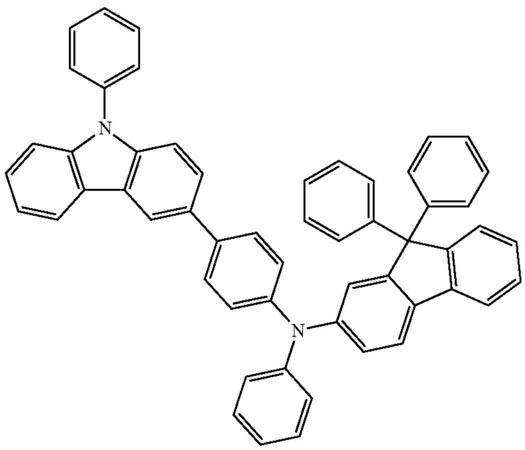
HT6
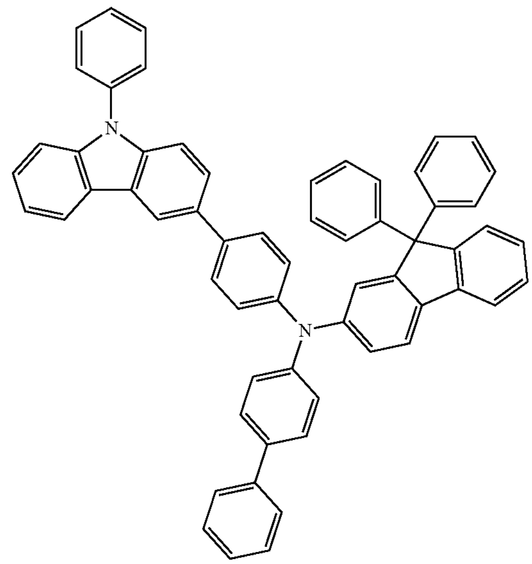
HT7
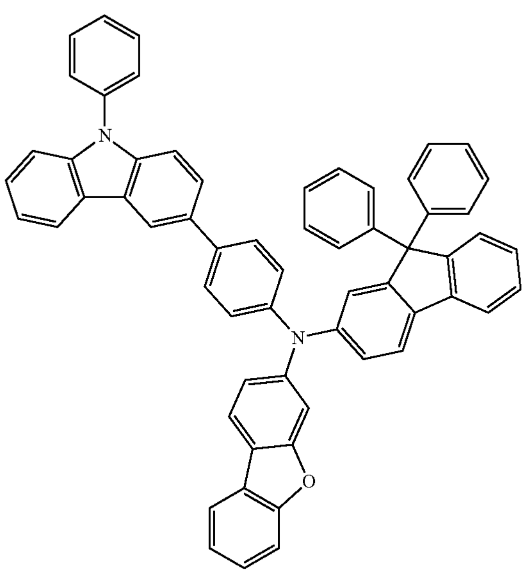
HT8
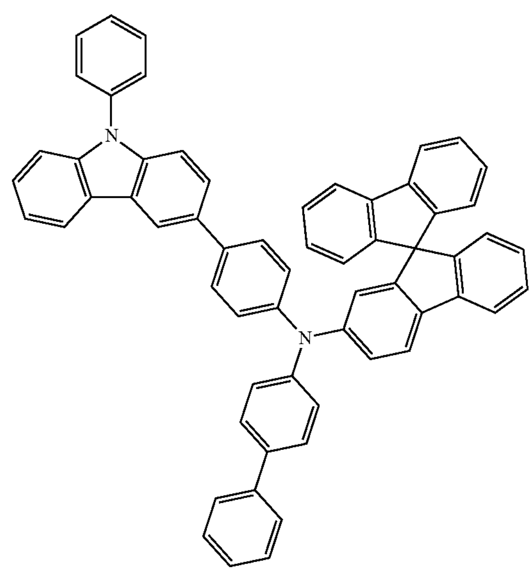

-continued
HT9
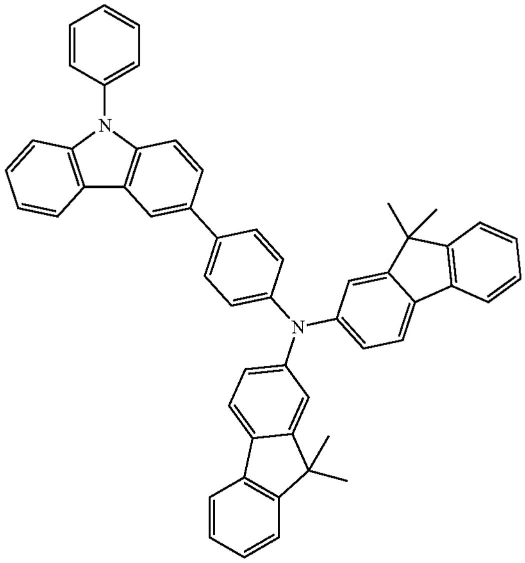
HT10
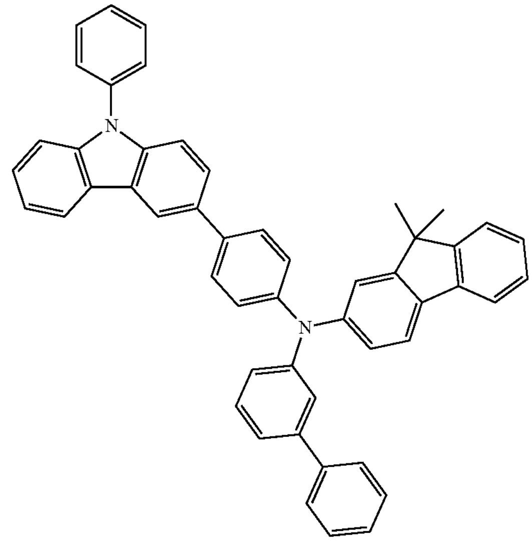
HT11
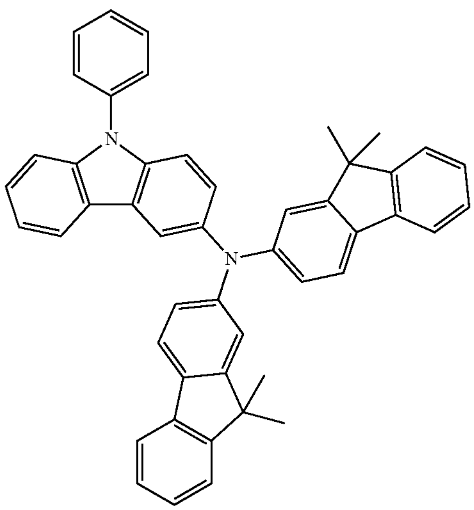
HT12
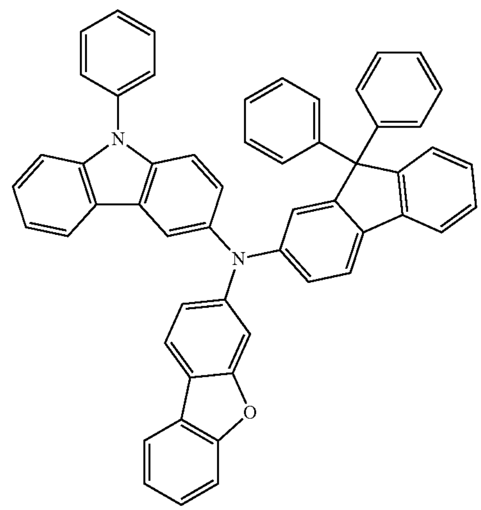
HT13
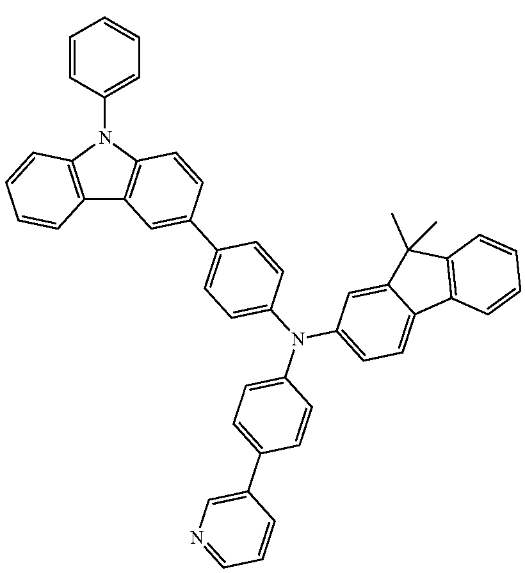
HT14
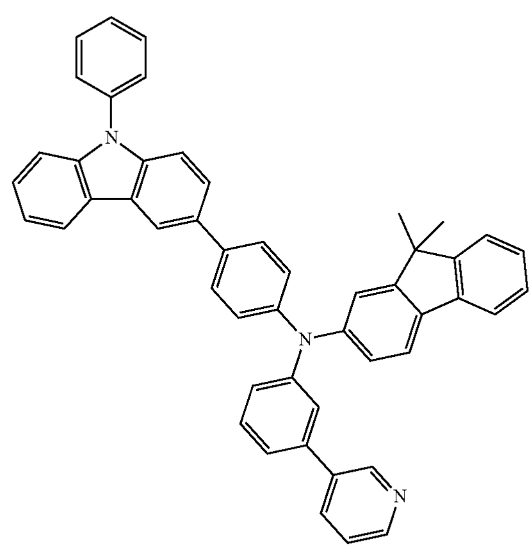

-continued
HT15
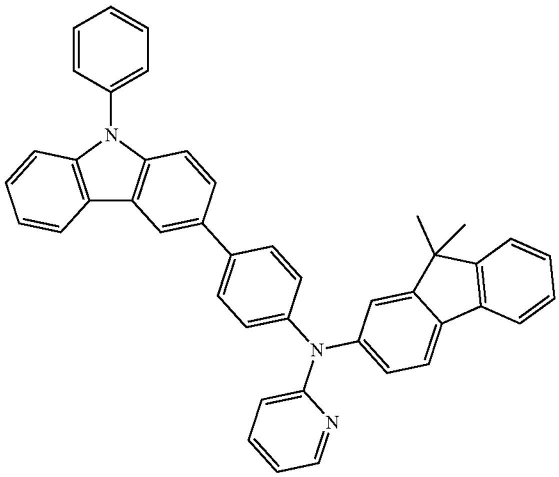
HT16
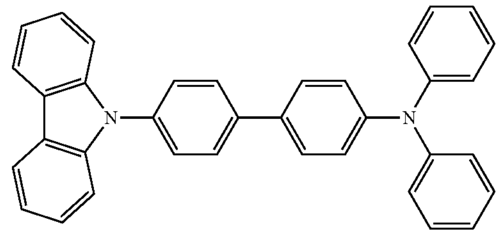
HT17
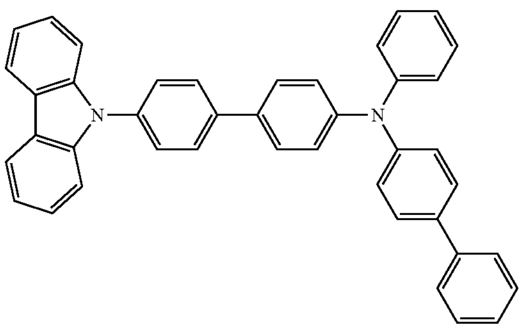
HT18
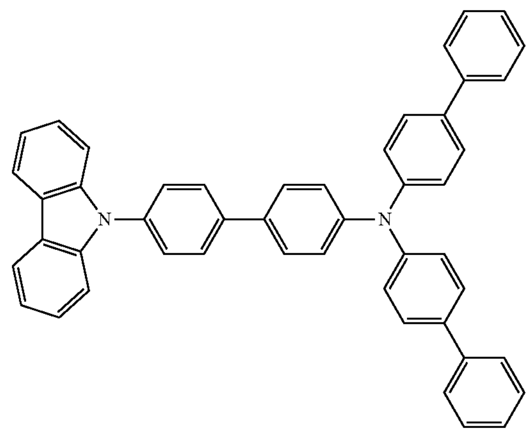
HT19
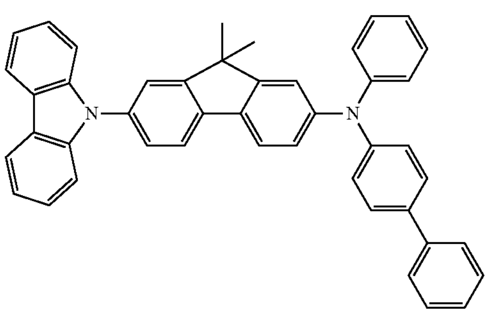
HT20
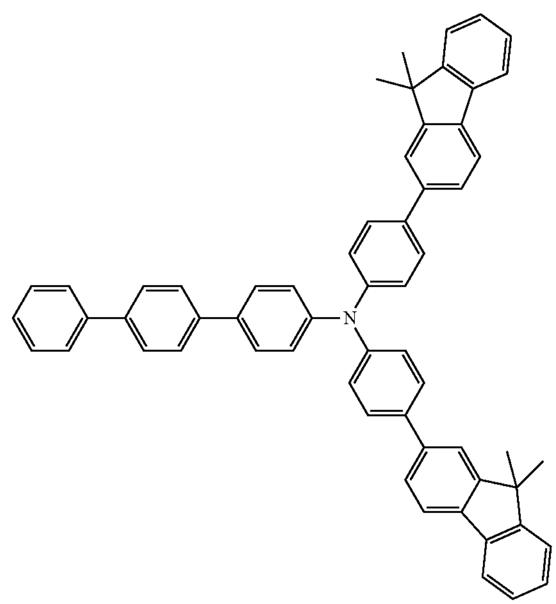

-continued
HT21
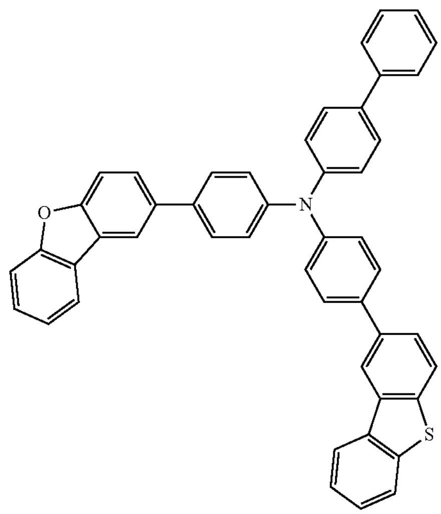
HT22
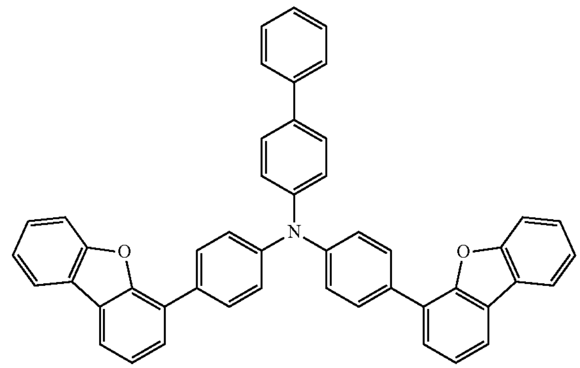
HT23
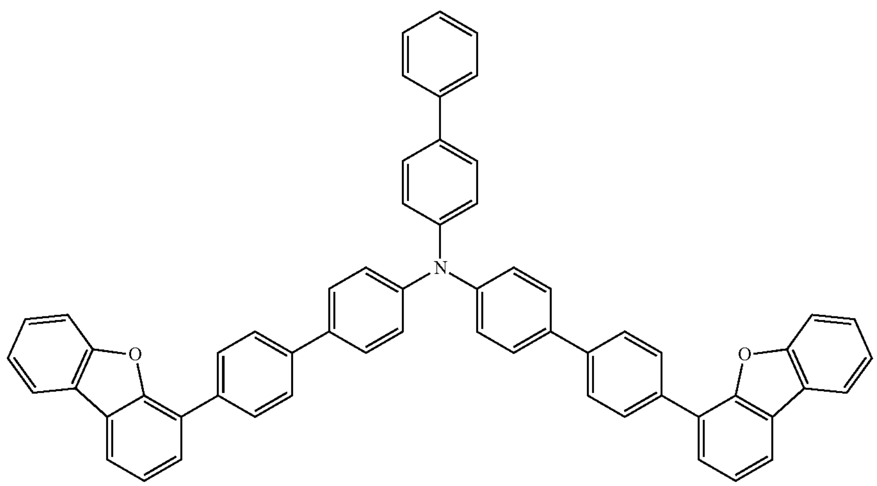
HT24
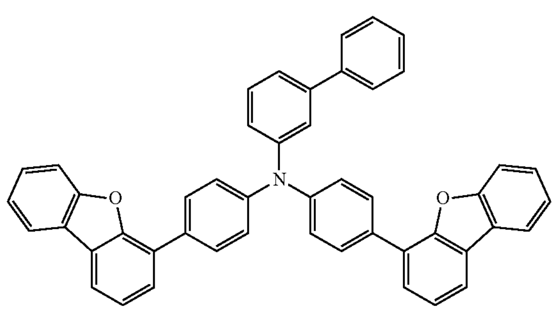
HT25
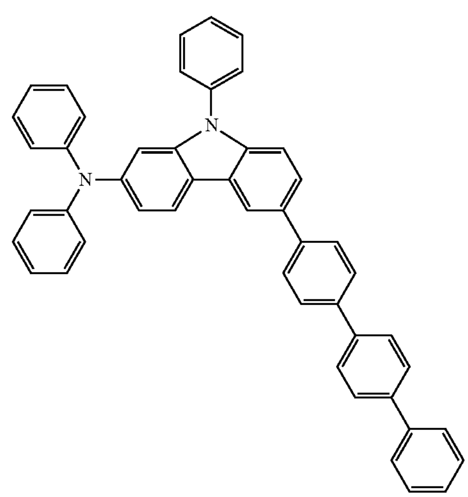

-continued
HT26
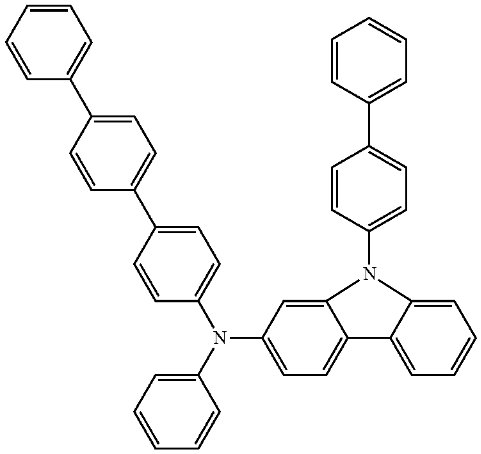
HT27
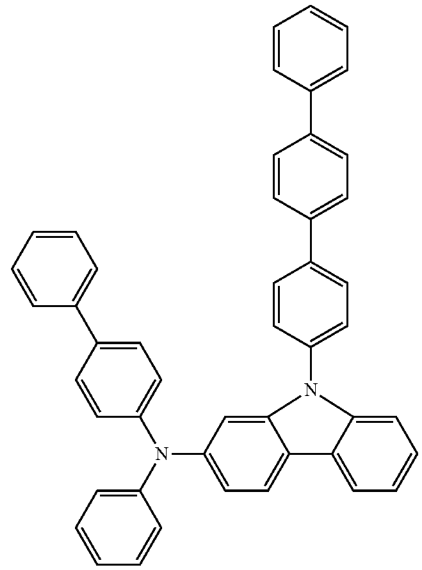
HT28
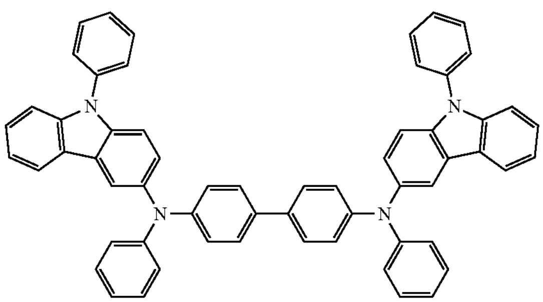
HT29
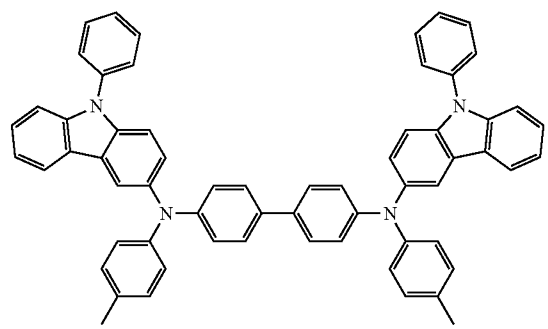
HT30
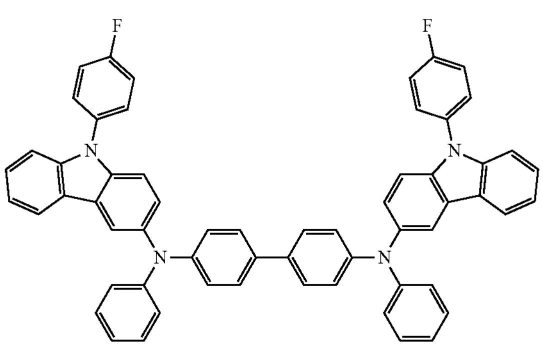
HT31
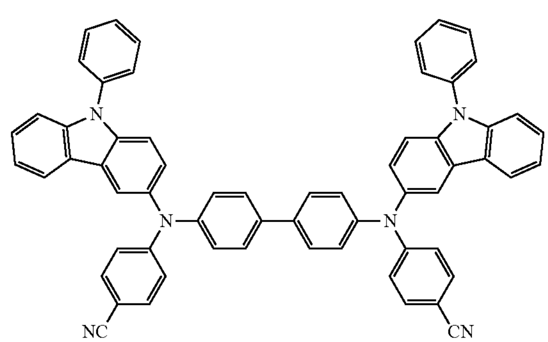

-continued
HT32
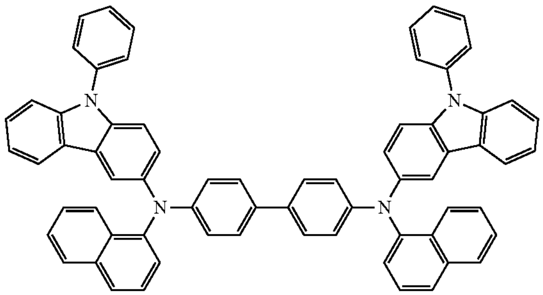
HT33
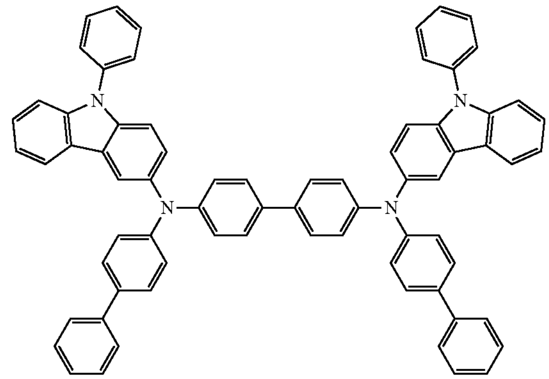
HT34
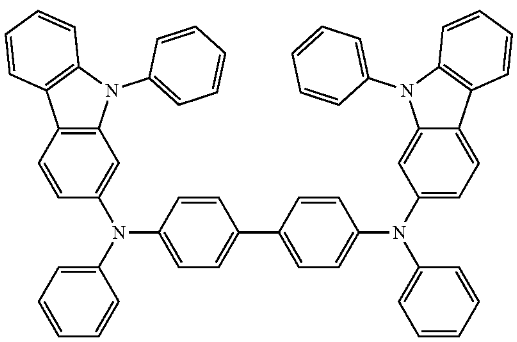
HT35
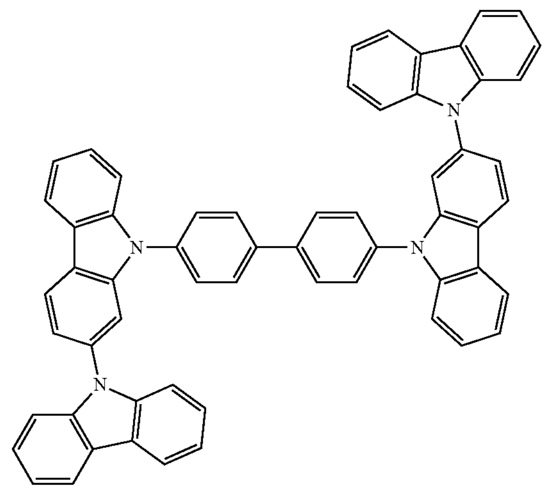
HT36
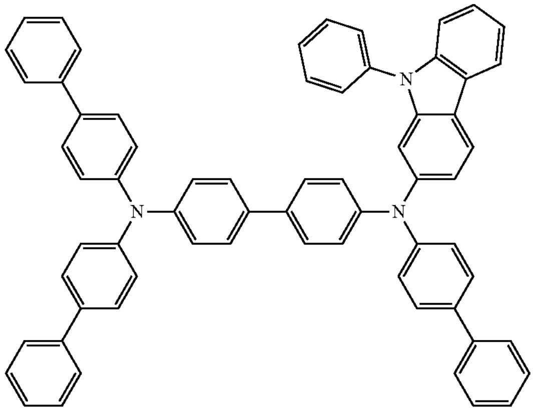
HT37
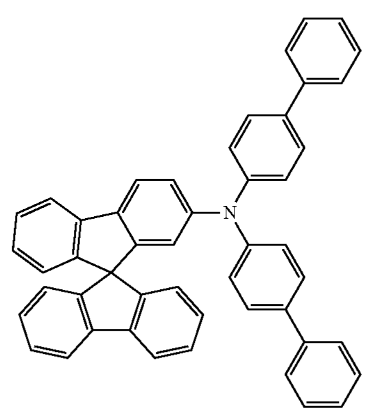

-continued

HT38

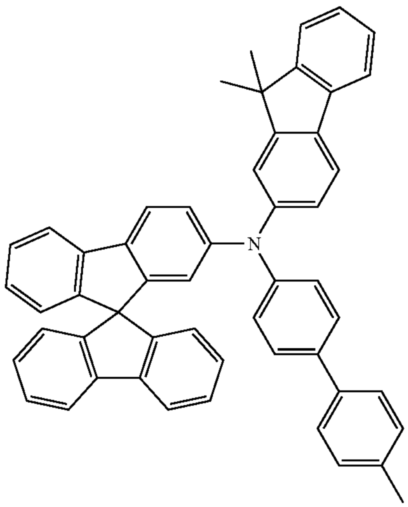

HT39

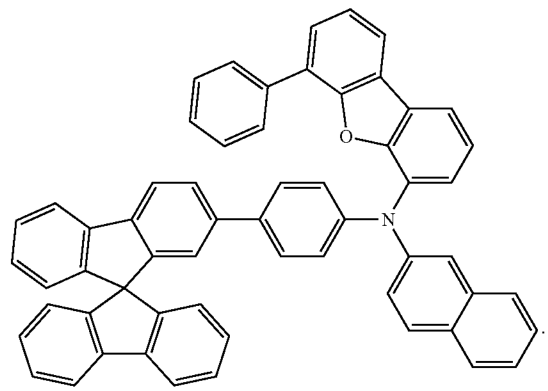

The thickness of the hole transport region may be about 100 Å to about 10,000 Å, and in some embodiments, about 100 Å to about 1,000 Å. When the hole transport region includes at least one selected from a hole injection layer and a hole transport layer, the thickness of the hole injection layer may be about 100 Å to about 9,000 Å, and in some embodiments, about 100 Å to about 1,000 Å; the thickness of the hole transport layer may be about 50 Å to about 2,000 Å, and in some embodiments, about 100 Å to about 1500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase the light-emission efficiency of the device by compensating for an optical resonance distance according to the wavelength of light emitted by an emission layer (e.g., by adjusting the optical resonance distance to match the wavelength of light emitted from the emission layer), and the electron blocking layer may block or reduce the flow of electrons from an electron transport region. The emission auxiliary layer and the electron blocking layer may include those materials as described above.

p-dopant

The hole transport region may further include, in addition to these materials, a charge-generation material for the improvement of conductive properties. The charge-generation material may be homogeneously or non-homogeneously dispersed in the hole transport region.

The charge-generation material may be, e.g., a p-dopant.

In one embodiment, the p-dopant may have a lowest unoccupied molecular orbital (LUMO) of −3.5 eV or less.

The p-dopant may include at least one selected from a quinone derivative, a metal oxide, and a cyano group-containing compound, but embodiments of the present disclosure are not limited thereto.

In some embodiments, the p-dopant may include at least one selected from the group consisting of:

a quinone derivative (such as tetracyanoquinodimethane (TCNQ) and/or 2,3,5,6-tetrafluoro-7,7,8,8-tetracyanoquinodimethane (F4-TCNQ));

a metal oxide (such as tungsten oxide and/or molybdenum oxide);

1,4,5,8,9,11-hexaazatriphenylene-hexacarbonitrile (HAT-CN); and a compound represented by Formula 221, but embodiments of the present disclosure are not limited thereto:

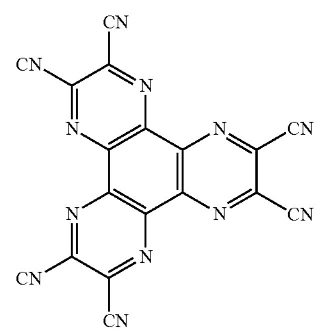

HAT-CN

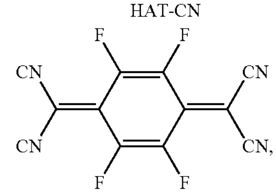

F4-TCNQ

Formula 221

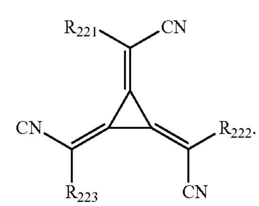

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ has at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full color organic light-emitting device, the emission layer may be patterned into a red emission layer, a green emission layer, and/or a blue emission layer, according to a sub-pixel. In one or more embodiments, the emission layer may have a stacked structure of two or more layers selected from a red emission layer, a green emission layer, and a blue emission layer, in which the two or more layers may contact each other or may be separated from each other. In one or more embodiments, the emission layer may include two or more materials selected from a red-light emission material, a green-light emission material, and a blue-light emission material, in which the two or more materials may be mixed together in a single layer to thereby emit white light.

In one embodiment, the emission layer of the organic light-emitting device 10 may be a first-color-light emission layer, the organic light-emitting device 10 may further include i) at least one second-color-light emission layer or ii) at least one second-color-light emission layer and at least one third-color-light emission layer, each between the first electrode 110 and the second electrode 190, a maximum emission wavelength of the first-color-light emission layer, a maximum emission wavelength of the second-color-light emission layer, and a maximum emission wavelength of the third-color-light emission layer may be identical to or different from each other, and the organic light-emitting device 10 may emit a mixed light including a first-color-light and a second-color-light, or a mixed light including the first-color-light, the second-color-light, and a third-color-light, but embodiments of the present disclosure are not limited thereto.

In some embodiments, the maximum emission wavelength of the first-color-light emission layer may be different from the maximum emission wavelength of the second-color-light emission layer, and the mixed light including the first-color-light and the second-color-light may be white light, but embodiments of the present disclosure are not limited thereto.

In one or more embodiments, the maximum emission wavelength of the first-color-light emission layer, the maximum emission wavelength of the second-color-light emission layer, and the maximum emission wavelength of the third-color-light emission layer may be different from one another, and the mixed light including the first-color-light, the second-color-light, and the third-color-light may be white light. However, embodiments of the present disclosure are not limited thereto.

The emission layer may include a host and a dopant. The dopant may include at least one selected from a phosphorescent dopant and a fluorescent dopant.

The amount of the dopant in the emission layer may be about 0.01 to about 15 parts by weight based on 100 parts by weight of the host, but embodiments of the present disclosure are not limited thereto.

The thickness of the emission layer may be about 100 Å to about 1,000 Å, and in some embodiments, about 200 Å to about 600 Å. When the thickness of the emission layer is within these ranges, excellent light-emission characteristics may be obtained without a substantial increase in driving voltage.

Host in Emission Layer

The host may include the above-described second compound represented by Formula 2A or 2B.

In one embodiment, the host may include (e.g., consist of) the above-described first compound represented by Formula 1A or 1B.

Phosphorescent Dopant Included in Emission Layer in Organic Layer 150

The phosphorescent dopant may include an organometallic complex represented by Formula 401:

Formula 401

$$M(L_{401})_{xc1}(L_{402})_{xc2},$$

Formula 402

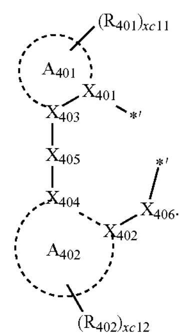

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, xc1 may be 1, 2, or 3, and when xc1 is 2 or greater, a plurality of $L_{401}$(s) may be identical to or different from each other, $L_{402}$ may be an organic ligand, xc2 may be an integer selected from 0 to 4, and when xc2 is 2 or greater, a plurality of $L_{402}$(s) may be identical to or different from each other, $X_{401}$ to $X_{404}$ may each independently be nitrogen or carbon, $X_{401}$ and $X_{403}$ may be bound (e.g., coupled) via a single bond or a double bond, and $X_{402}$ and $X_{404}$ may be bound (e.g., coupled) via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O—*', *—S—*', *—C(═O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', wherein $Q_{411}$ and $Q_{412}$ may each independently be selected from hydrogen, deuterium, a $C_1$-$C_{20}$ alkyl group, a $C_1$-$C_{20}$ alkoxy group, a phenyl group, a biphenyl group, a terphenyl group, and a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer selected from 0 to 10, and

* and *' in Formula 402 may each independently indicate a binding site to M in Formula 401.

In one embodiment, in Formula 402, $A_{401}$ and $A_{402}$ may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen, and $X_{402}$ may be carbon, or ii) $X_{401}$ and $X_{402}$ may both (e.g., simultaneously) be nitrogen.

In one or more embodiments, in Formula 402, $R_{401}$ and $R_{402}$ may each independently be selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantyl group, a norbornanyl group, and a norbornenyl group;

a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments of the present disclosure are not limited thereto.

In one or more embodiments, when xc1 in Formula 401 is 2 or greater, in a plurality of $L_{401}$(s), two $A_{401}$(s) may optionally be bound (e.g., coupled) via $X_{407}$ as a linking group, and two $A_{402}$(s) may optionally be bound (e.g., coupled) via $X_{408}$ as a linking group (see Compounds PD1 to PD4 and PD7). $X_{407}$ and $X_{408}$ may each independently be a single bond, *—O—*', *—S—*', *—C(═O)—*', *—N($Q_{413}$)-*', *—C($Q_{413}$)($Q_{414}$)-*', or *—C($Q_{413}$)=C($Q_{414}$)-*', wherein $Q_{413}$ and $Q_{414}$ may each independently be selected from hydrogen, deuterium, a $C_1$-$C_{20}$ alkyl group, a $C_1$-$C_{20}$ alkoxy group, a phenyl group, a biphenyl group, a terphenyl group, and a naphthyl group, but embodiments of the present disclosure are not limited thereto.

In Formula 401, $L_{402}$ may be any suitable monovalent, divalent, or trivalent organic ligand. In some embodiments, $L_{402}$ may be selected from a halogen, a diketone (e.g., acetylacetonate), a carboxylic acid (e.g., picolinate), —C(═O), an isonitrile, —CN, and a phosphorus-based ligand (e.g., phosphine and/or phosphite), but embodiments of the present disclosure are not limited thereto.

The phosphorescent dopant may include, for example, at least one selected from Compounds PD1 to PD25, but embodiments of the present disclosure are not limited thereto:

PD1

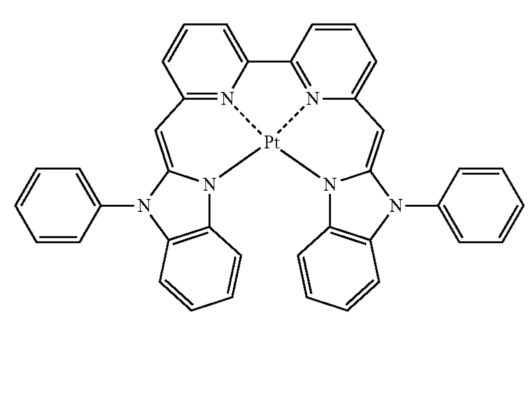

-continued
PD2
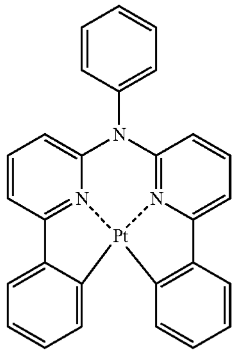
PD3
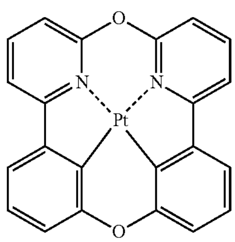
PD4
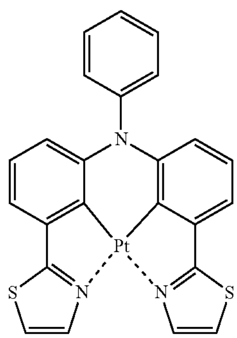
PD5
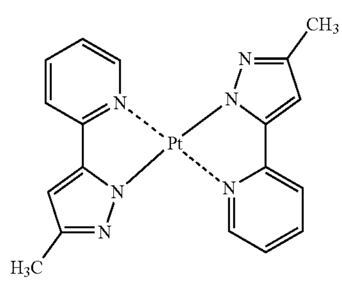
PD6
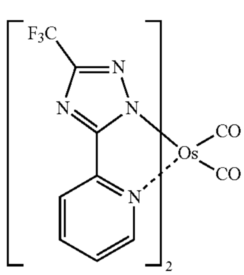
-continued
PD7
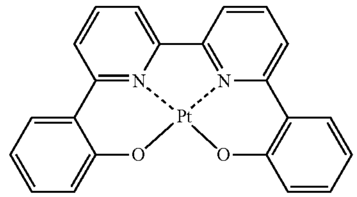
PD8
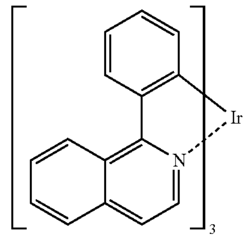
PD9
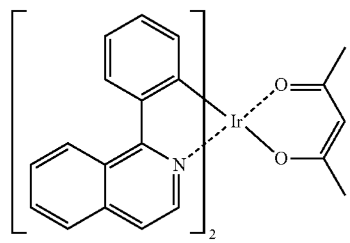
PD10
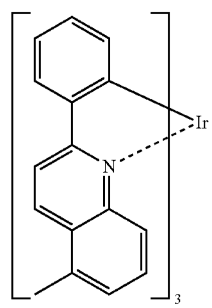
PD11
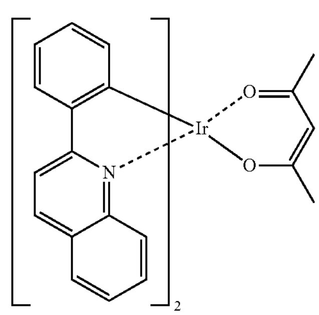

-continued
PD12
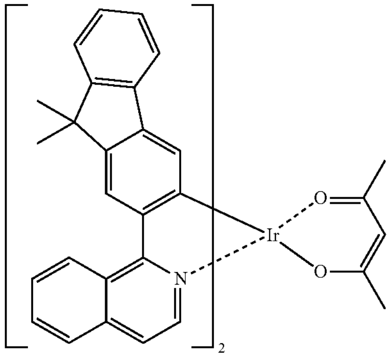
PD13
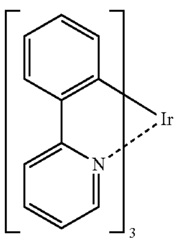
PD14
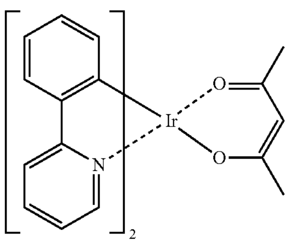
PD15
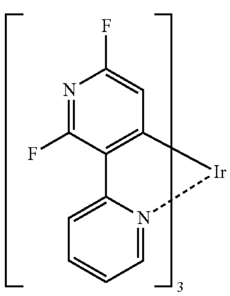
PD16
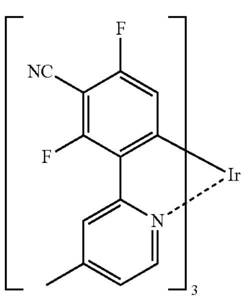
-continued
PD17
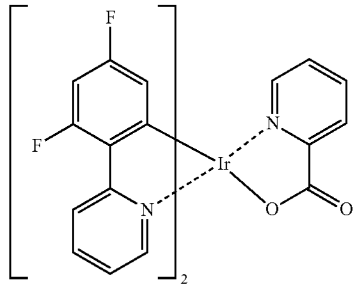
PD18
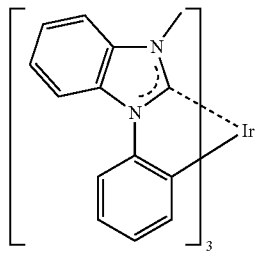
PD19
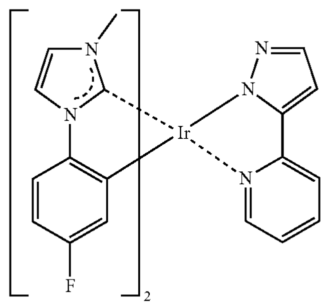
PD20
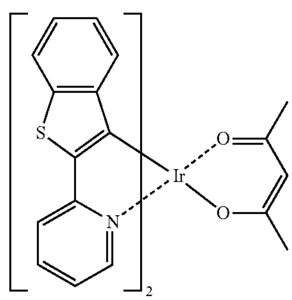
PD21
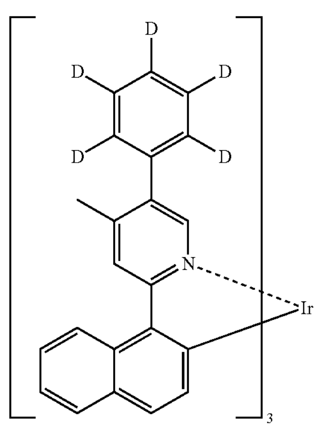

-continued

PD22

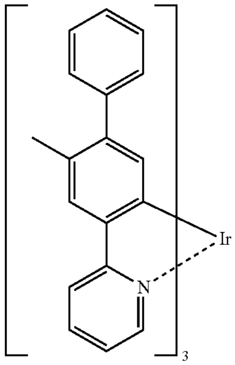

PD23

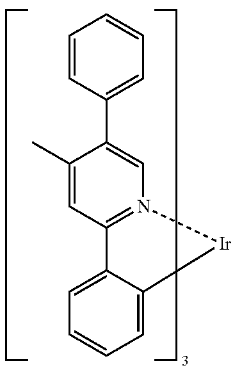

PD24

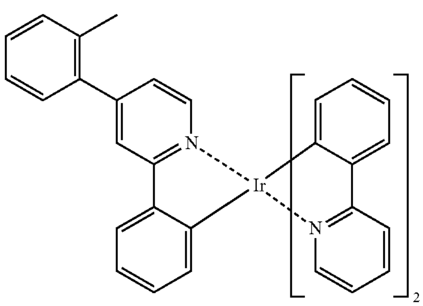

PD25

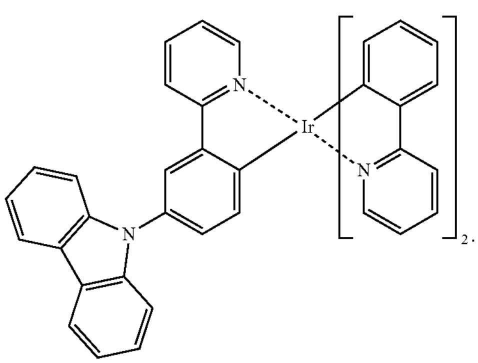

Fluorescent Dopant in Emission Layer

The fluorescent dopant may include an arylamine compound or a styrylamine compound.

In one or more embodiments, the fluorescent dopant may include a compound represented by Formula 501:

Formula 501

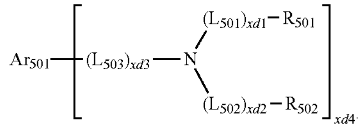

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer selected from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer selected from 1 to 6.

In some embodiments, in Formula 501, $Ar_{501}$ may be selected from the group consisting of:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, in Formula 501, $L_{501}$ to $L_{503}$ may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, in Formula 501, $R_{501}$ and $R_{502}$ may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —$Si(Q_{31})(Q_{32})(Q_{33})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, in Formula 501, xd4 may be 2, but embodiments of the present disclosure are not limited thereto.

In some embodiments, the fluorescent dopant may be selected from Compounds FD1 to FD22:

FD1

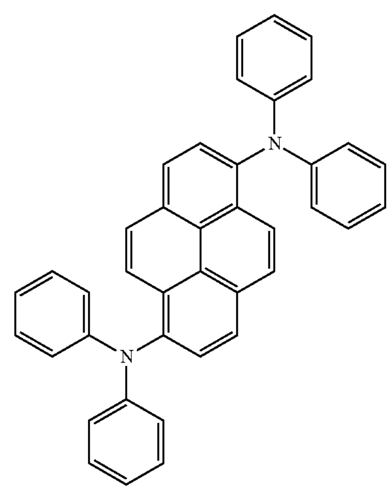

FD2

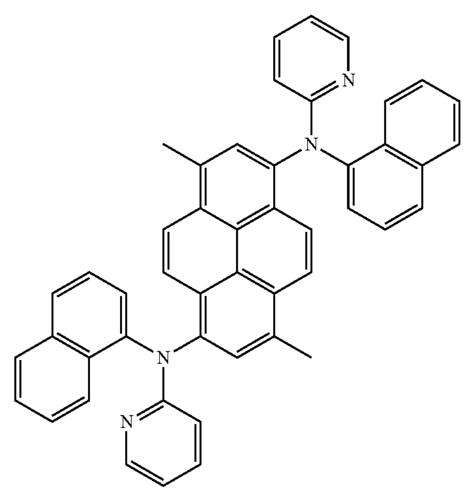

-continued
FD3
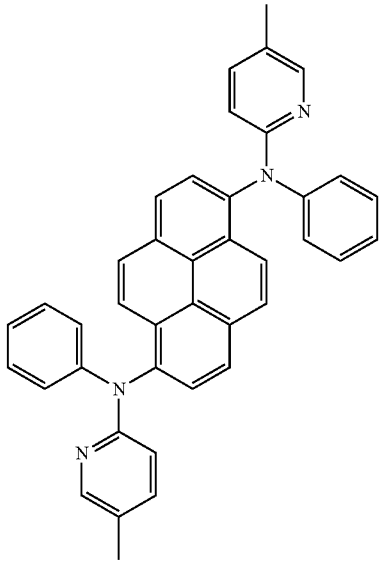
FD4
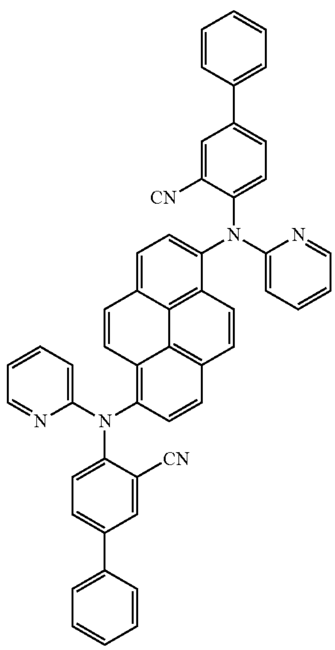
FD5
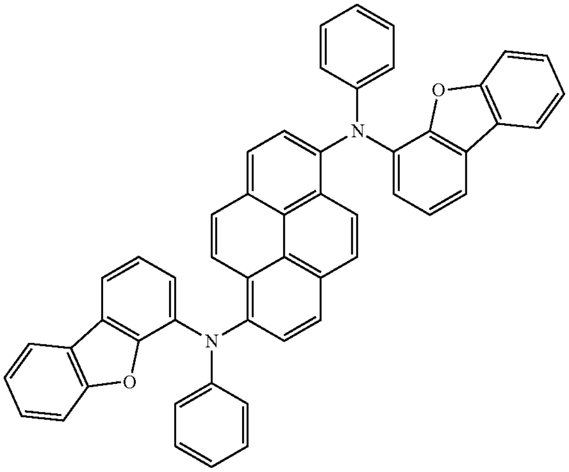
-continued
FD6
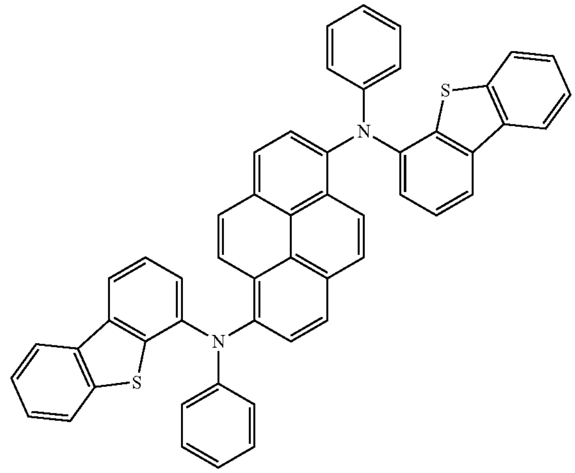
FD7
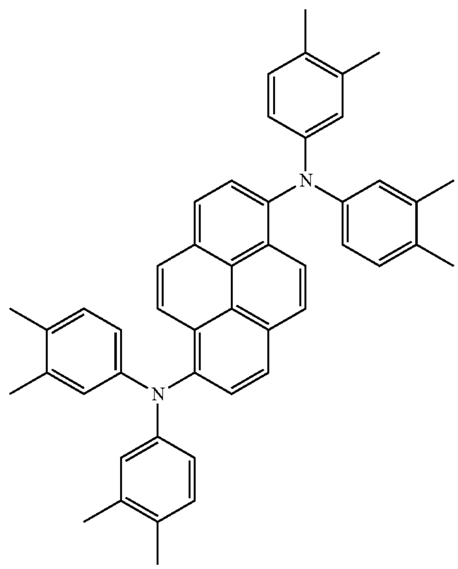
FD8
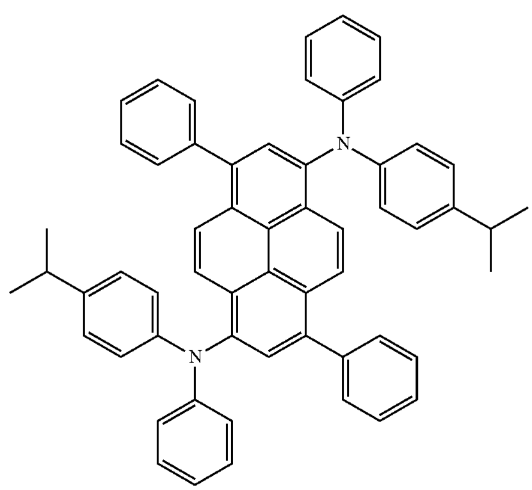

-continued
FD9
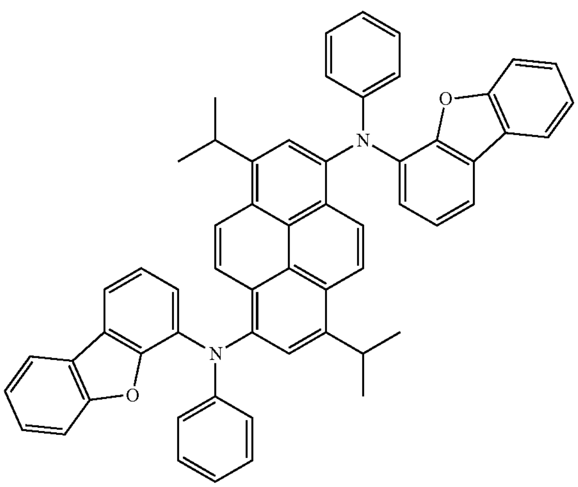
FD10
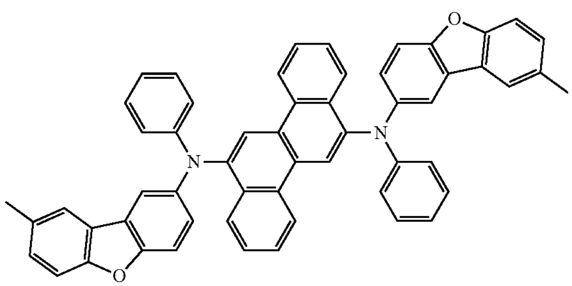
FD11
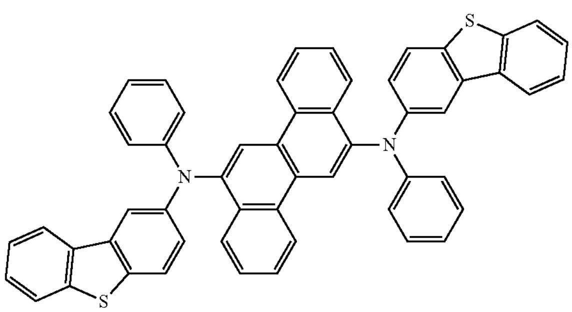
FD12
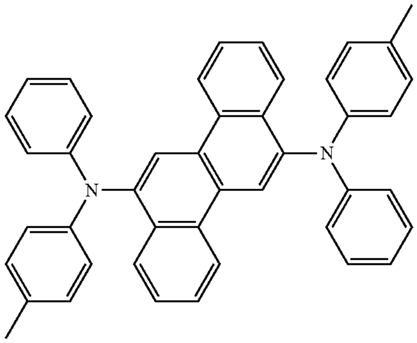
-continued
FD13
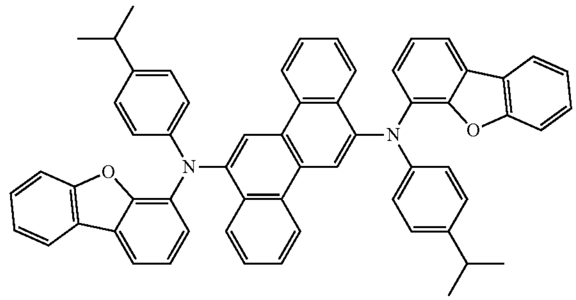
FD14
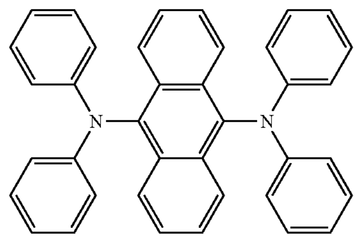
FD15
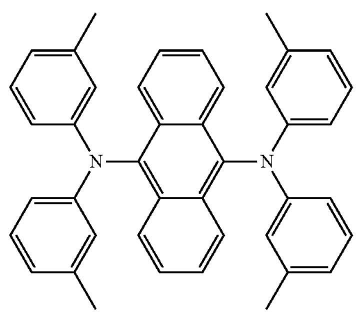
FD16
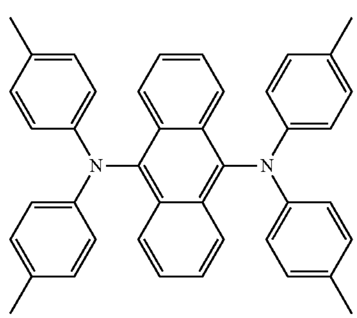

-continued
FD17
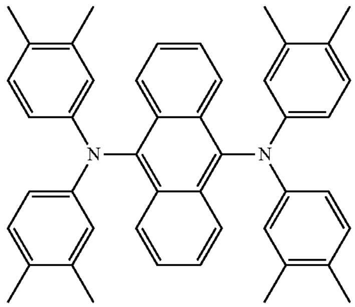
FD18
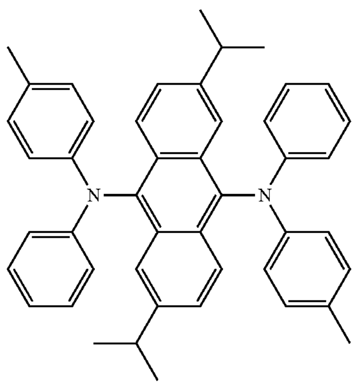
FD19
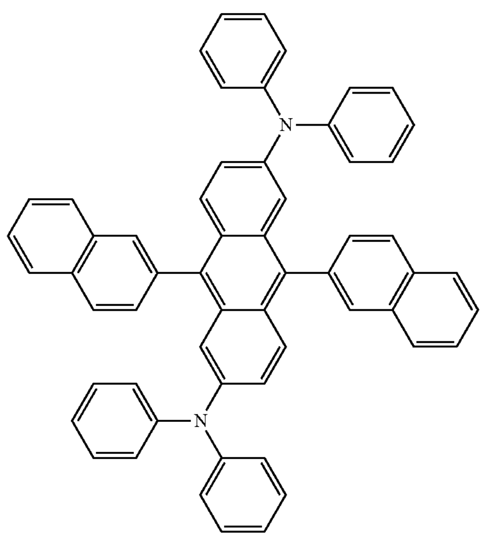
-continued
FD20
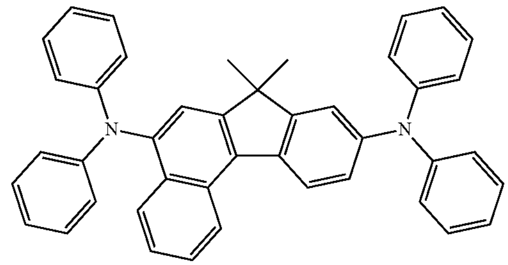
FD21
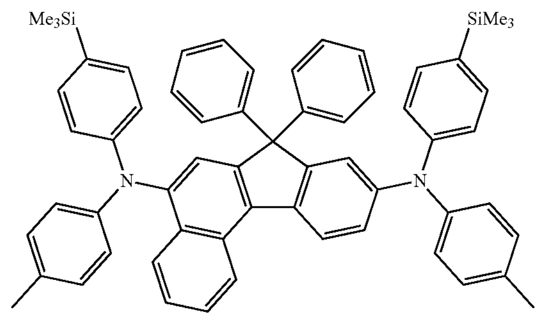
FD22
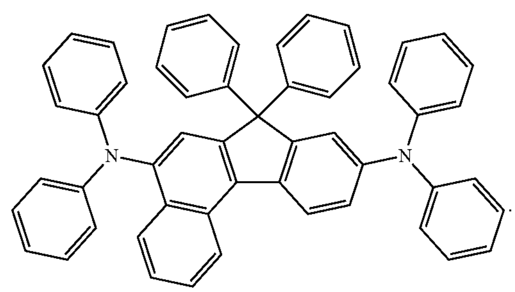
Alternatively, the fluorescent dopant may be selected from the compounds below, but embodiments of the present disclosure are not limited thereto:
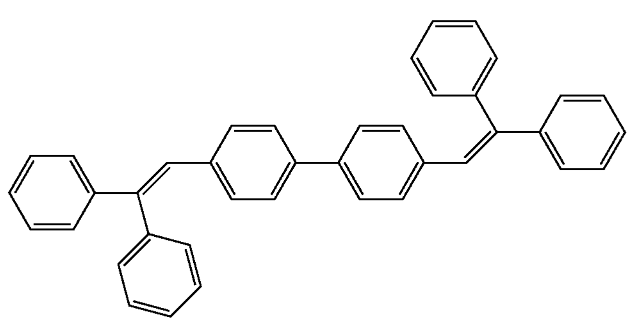
DPVBi -continued

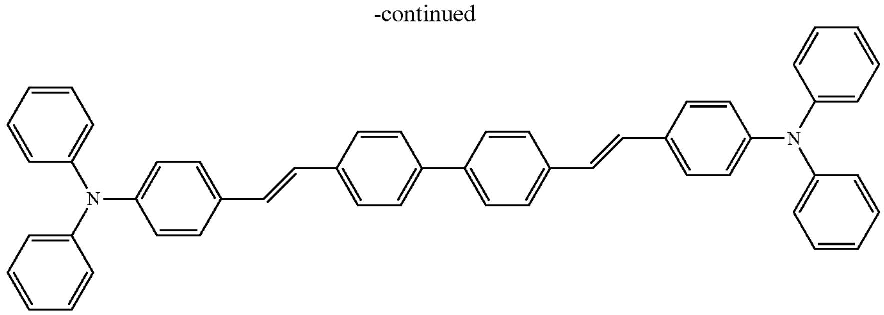

DPAVBi

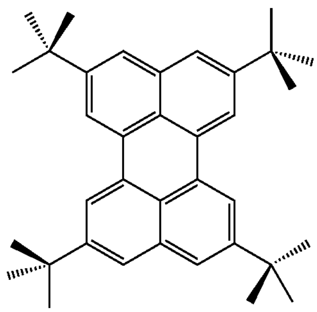

TBPe

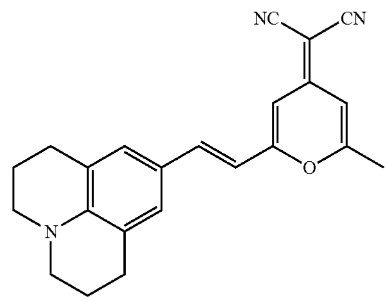

DCM

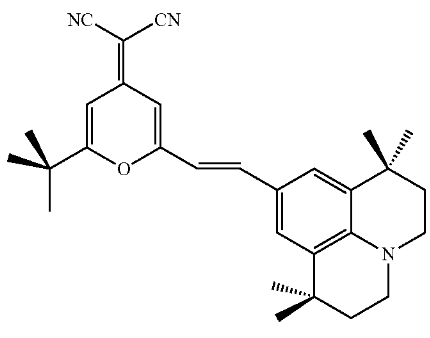

DCJTB

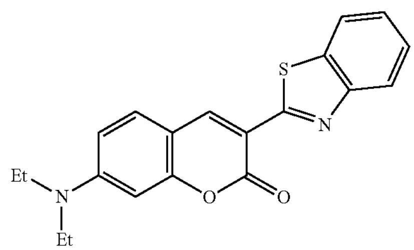

Coumarin 6

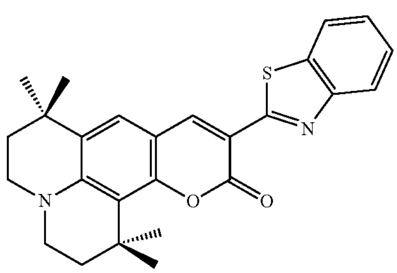

C545T

Electron Transport Region in Organic Layer 150

The electron transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron transport region may include a buffer layer, a hole blocking layer, an electron control layer, an electron transport layer, an electron injection layer, or a combination thereof, but embodiments of the present disclosure are not limited thereto.

In some embodiments, the electron transport region may have a structure of electron transport layer/electron injection layer, a structure of hole blocking layer/electron transport layer/electron injection layer, a structure of electron control layer/electron transport layer/electron injection layer, or a structure of buffer layer/electron transport layer/electron injection layer, wherein layers of each structure are sequentially stacked on an emission layer in each stated order. However, embodiments of the structure of the electron transport layer are not limited thereto.

The electron transport region may include the second compound represented by Formula 2A or 2B as described above.

In one embodiment, the electron transport region may include a buffer layer. The buffer layer may directly contact the emission layer and include the second compound represented by Formula 2A or 2B as described above.

In one or more embodiments, the electron transport region may include a buffer layer, an electron transport layer, and an electron injection layer stacked in this stated order on the emission layer, and the buffer layer may include the second compound represented by Formula 2A or 2B as described above.

The electron transport region (e.g., a hole blocking layer, an electron control layer, and/or an electron transport layer in the electron transport region) may include a metal-free compound containing at least one π electron-depleted nitrogen-containing ring.

As used herein, the term "π electron-depleted nitrogen-containing ring" indicates a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed (e.g., fused), or iii) a heteropolycyclic group in which at least one 5-membered to 7-membered heteromonocyclic group having at least one *—N=*' moiety is condensed (e.g., fused) with at least one $C_5$-$C_{60}$ carbocyclic group.

Non-limiting examples of the π electron-depleted nitrogen-containing ring may include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, thiadiazole, an imidazopyridine, an imidazopyrimidine, and an azacarbazole, but embodiments of the present disclosure are not limited thereto.

In some embodiments, the electron transport region may include a compound represented by Formula 601:

$$[Ar_{601}]_{xe11}\text{-}[(L_{601})_{xe1}\text{-}R_{601}]_{xe21}. \qquad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer selected from 0 to 5, and $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), wherein $Q_{601}$ to $Q_{603}$ may each independently be selected from a $C_1$-$C_{10}$ alkyl group, a $C_1$-$C_{10}$ alkoxy group, a phenyl group, a biphenyl group, a terphenyl group, and a naphthyl group, and xe21 may be an integer selected from 1 to 5.

In some embodiments, at least one selected from the xe11 $Ar_{601}$(s) and the xe21 $R_{601}$(s) may include a π electron-depleted nitrogen-containing ring.

In some embodiments, in Formula 601, ring $Ar_{601}$ may be selected from the group consisting of:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$S(=O)_2(Q_{31})$, and —$P(=O)(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or greater, a plurality of $Ar_{601}$(s) may be bound (e.g., coupled) via one or more single bonds.

In one embodiment, in Formula 601, $Ar_{601}$ may be an anthracene group.

In some embodiments, the compound represented by Formula 601 may be represented by Formula 601-1:

Formula 601-1

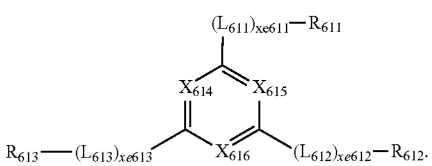

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each independently be the same as described herein in connection with $L_{601}$, xe611 to xe613 may each independently be the same as described herein in connection with xe1, $R_{611}$ to $R_{613}$ may each independently be the same as described herein in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, in Formulae 601 and 601-1, $L_{601}$ and $L_{611}$ to $L_{613}$ may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In some embodiments, $R_{601}$ to $R_{611}$ and $R_{613}$ in Formulae 601 to 601-1 may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and $$—S(=O)_2(Q_{601}) \text{ and } —P(=O)(Q_{601})(Q_{602}),$$

wherein $Q_{601}$ and $Q_{602}$ may each independently be the same as described herein.

The electron transport region may include at least one compound selected from Compounds ET1 to ET36, but embodiments of the present disclosure are not limited thereto:

ET1

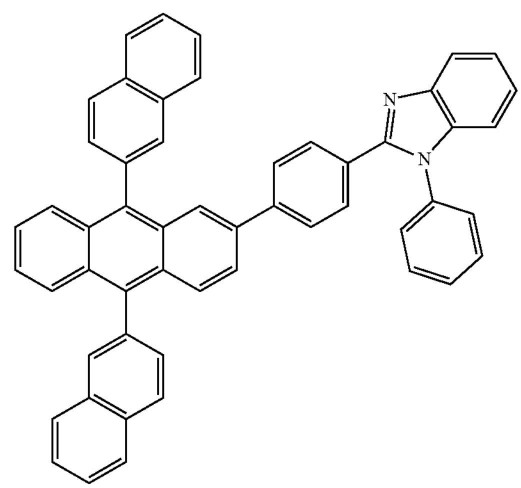

ET2

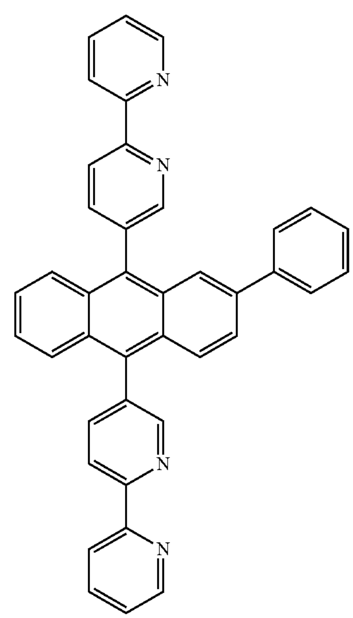

-continued
ET3
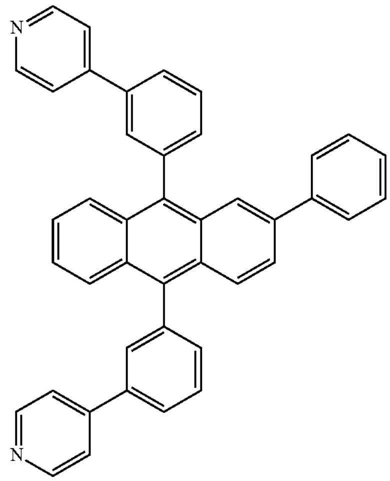
ET4
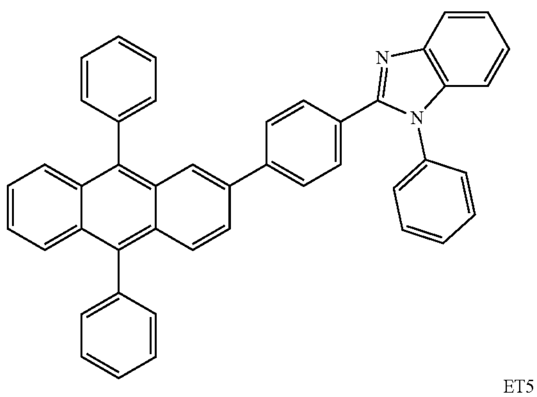
ET5
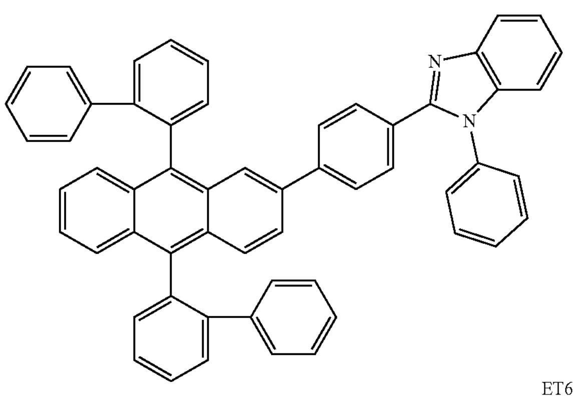
ET6
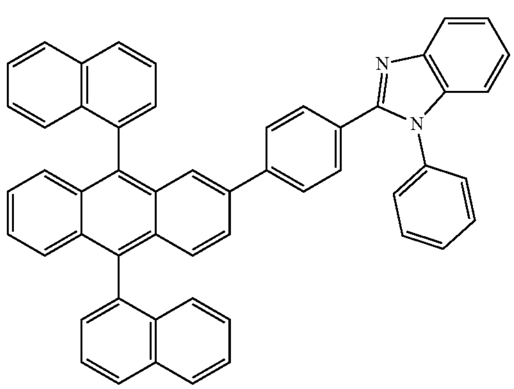
-continued
ET7
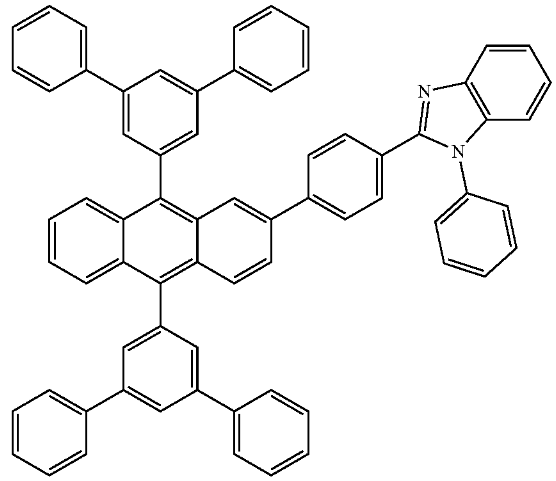
ET8
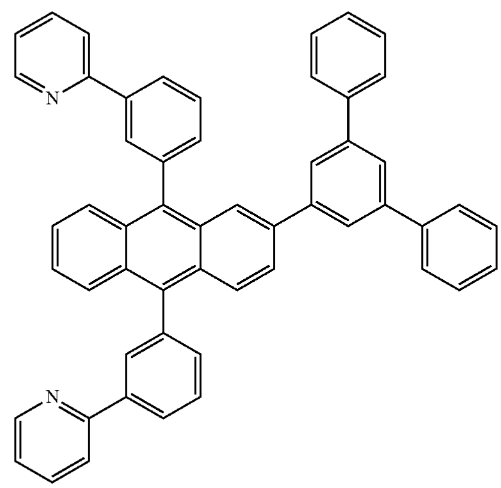
ET9
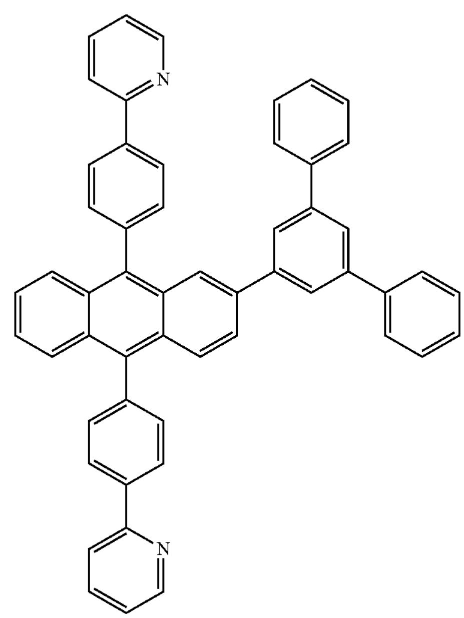

-continued
ET10
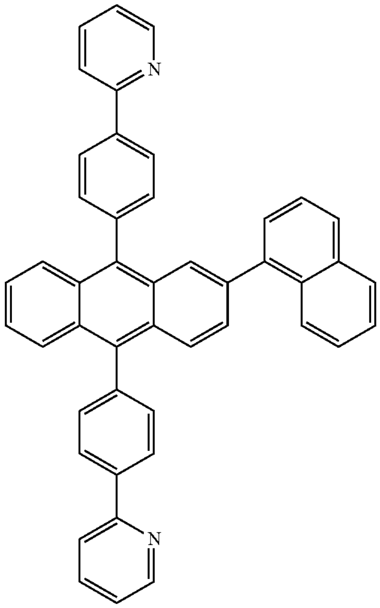
ET11
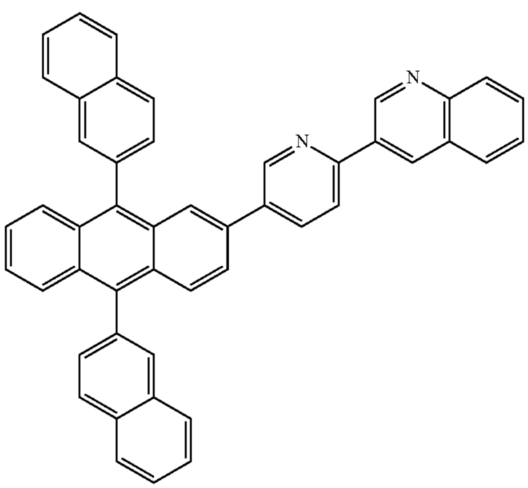
ET12
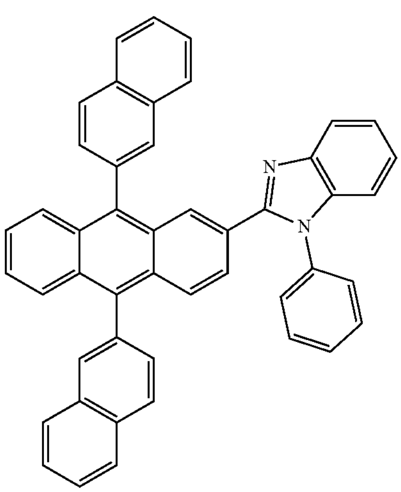
-continued
ET13
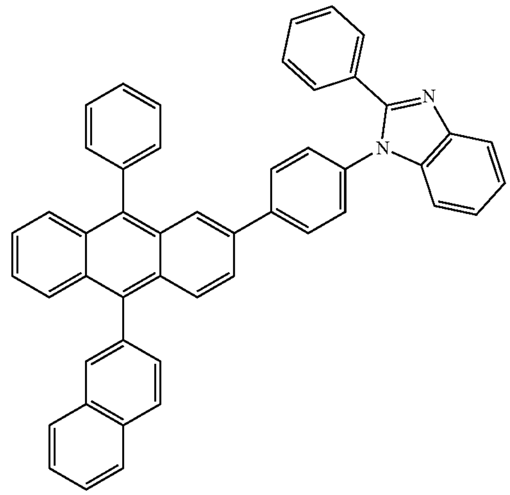
ET14
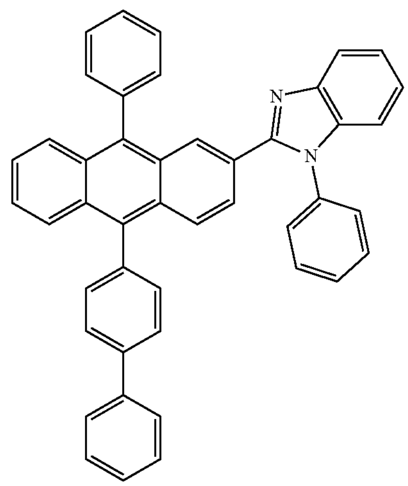
ET15
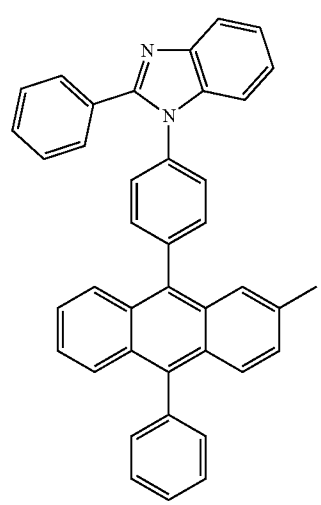

ET16
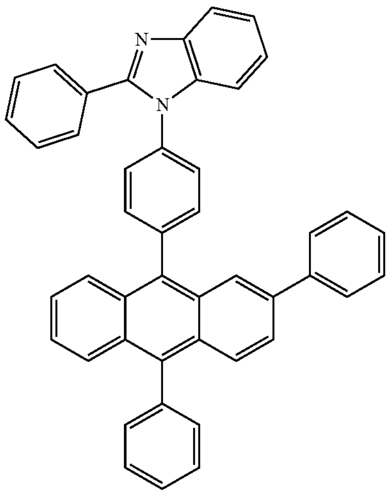
ET17
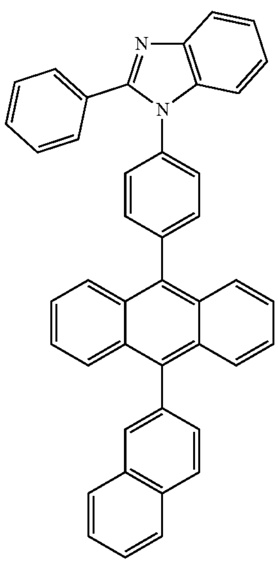
ET18
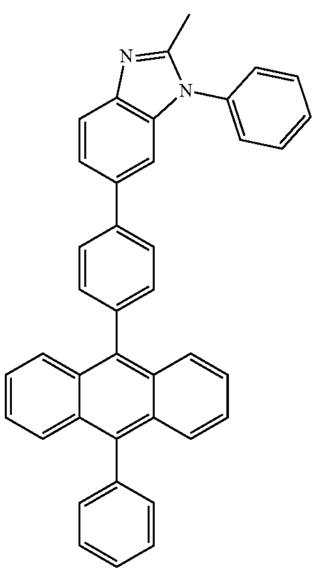
ET19
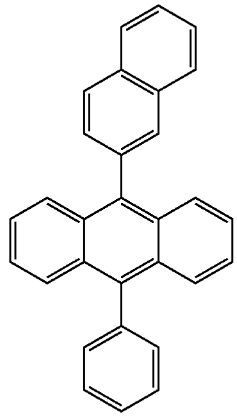
ET20
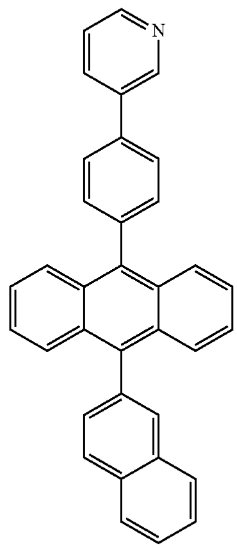
ET21
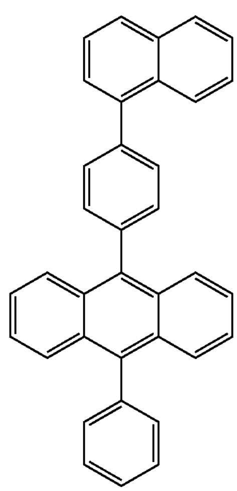

-continued
ET22
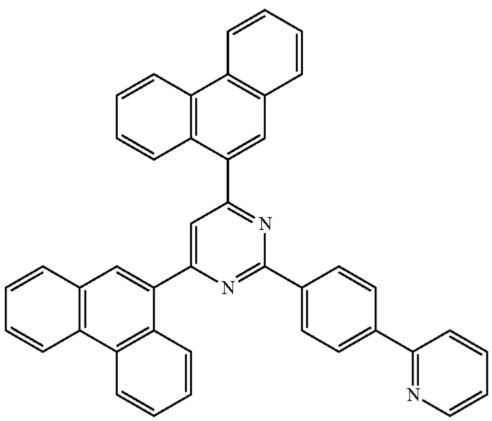
ET23
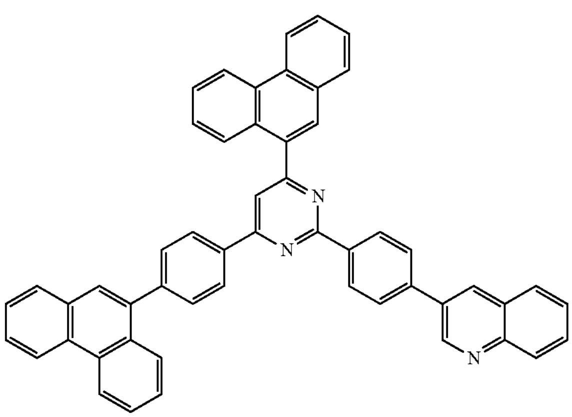
ET24
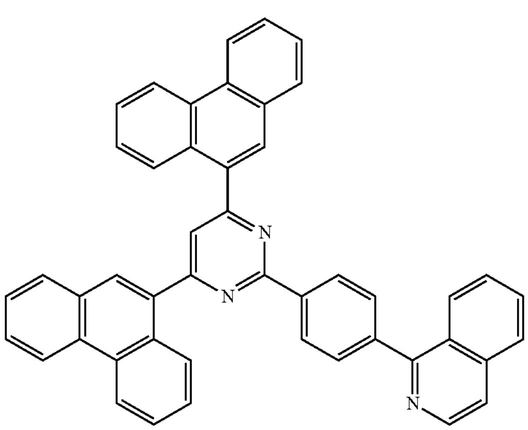
-continued
ET25
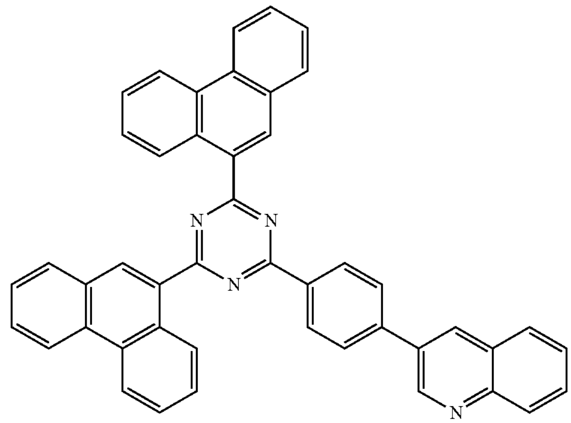
ET26
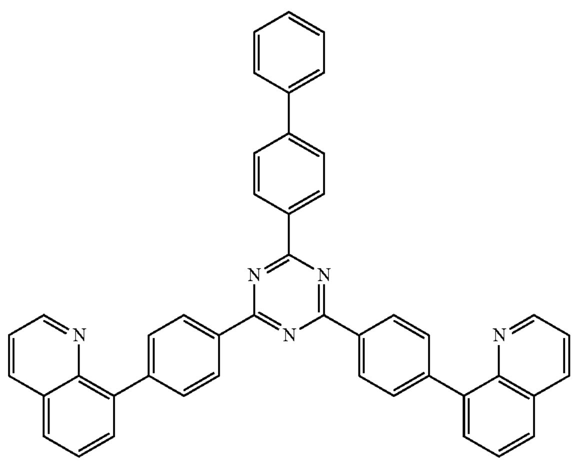
ET27
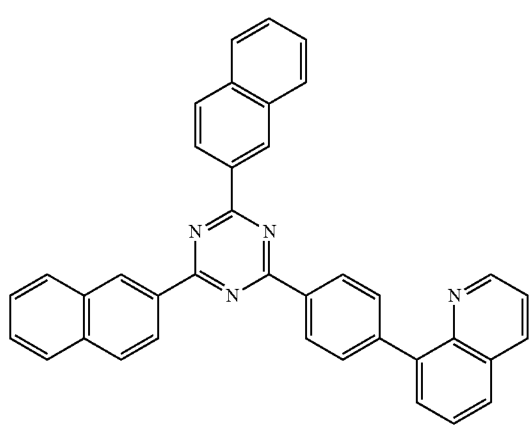

-continued
ET28
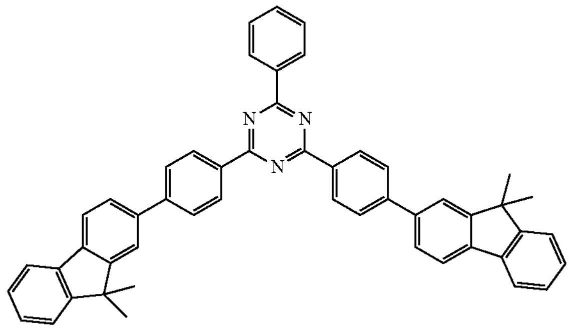
ET29
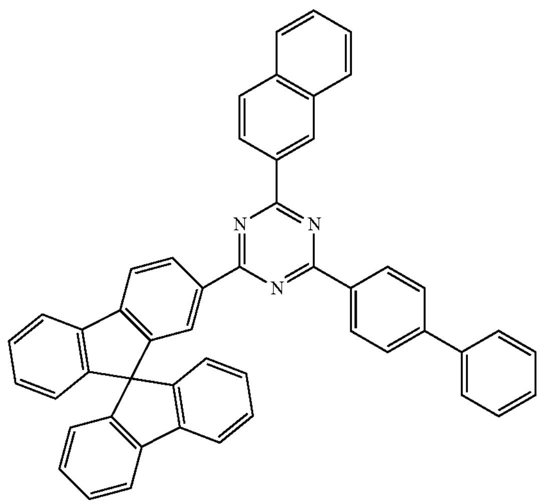
ET30
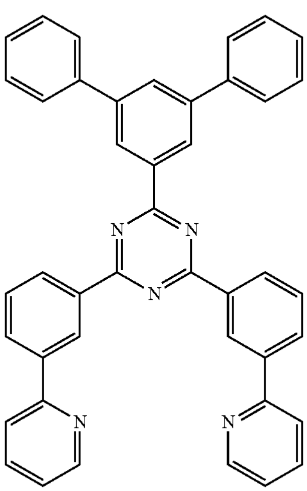
-continued
ET31
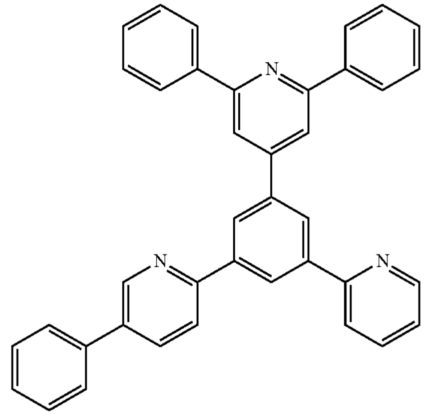
ET32
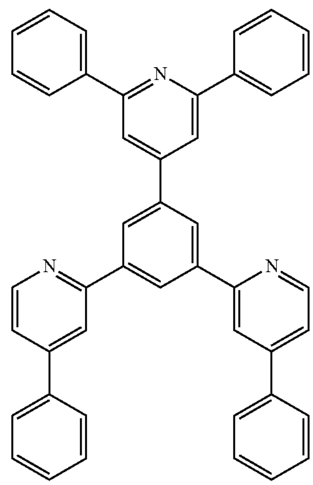
ET33
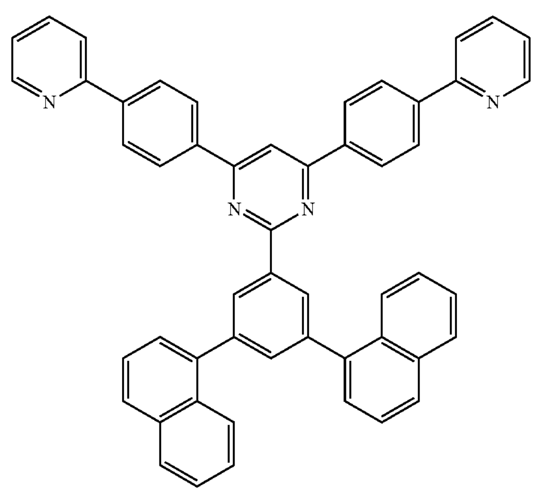

-continued

ET34

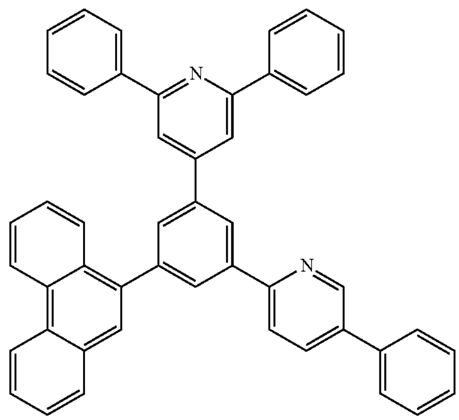

ET35

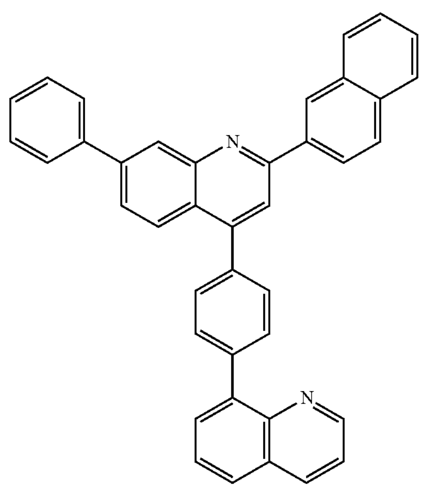

ET36

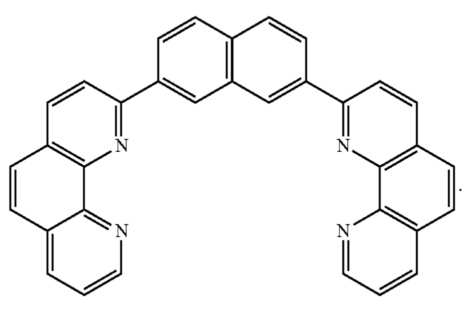

In one or more embodiments, the electron transport region may include at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ:

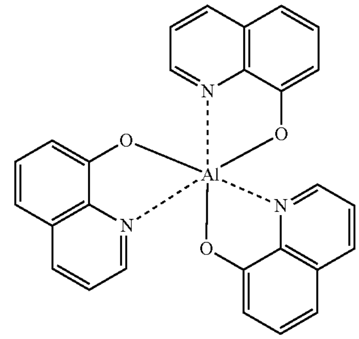

$Alq_3$

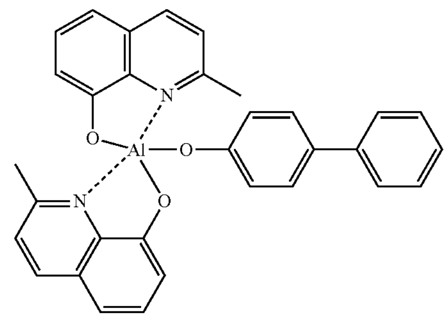

BAlq

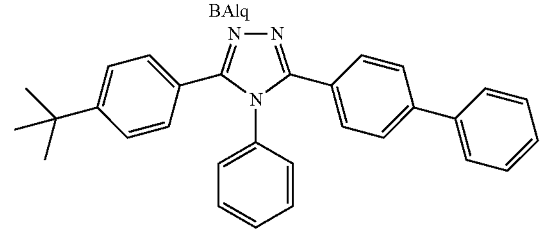

TAZ

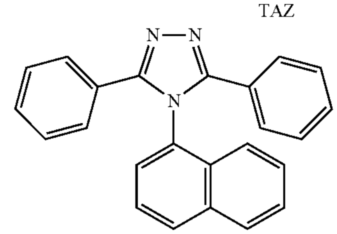

NTAZ

The thicknesses of the buffer layer, hole blocking layer, and electron control layer may each independently be about 20 Å to about 1,000 Å, and in some embodiments, about 30 Å to about 500 Å. When the thicknesses of the buffer layer, the hole blocking layer, and the electron control layer are each within these ranges, the electron blocking layer may have excellent electron blocking characteristics and/or electron control characteristics without a substantial increase in driving voltage.

The thickness of the electron transport layer may be about 100 Å to about 1,000 Å, and in some embodiments, about 150 Å to about 500 Å. When the thickness of the electron transport layer is within these ranges, the electron transport layer may have satisfactory electron transport characteristics without a substantial increase in driving voltage.

The electron transport region (e.g., the electron transport layer in the electron transport region) may further include, in addition to the materials described above, a metal-containing material.

The metal-containing material may include an alkali metal complex, an alkaline earth metal complex, or a combination thereof. The alkali metal complex may include a metal ion selected from a lithium (Li) ion, a sodium (Na) ion, a potassium (K) ion, a rubidium (Rb) ion, and a cesium (Cs) ion, and the alkaline earth metal complex may include a metal ion selected from a beryllium (Be) ion, a magnesium (Mg) ion, a calcium (Ca) ion, a strontium (Sr) ion, and a barium (Ba) ion. Each ligand coordinated with the metal ion of the alkali metal complex or the alkaline earth metal complex may be independently selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, but embodiments of the present disclosure are not limited thereto.

In some embodiments, the metal-containing material may include a Li complex. The Li complex may include, e.g., Compound ET-D1 (lithium quinolate, LiQ) and/or ET-D2:

ET-D1

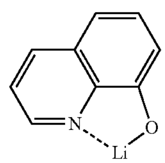

ET-D2

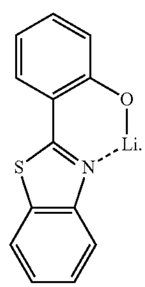

The electron transport region may include an electron injection layer that facilitates injection of electrons from the second electrode 190. The electron injection layer may directly contact the second electrode 190.

The electron injection layer may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron injection layer may include an alkali metal, alkaline earth metal, rare earth metal, alkali metal compound, alkaline earth metal compound, rare earth metal compound, alkali metal complex, alkaline earth metal complex, rare earth metal complex, or a combination thereof.

In one or more embodiments, the electron injection layer may include Li, Na, K, Rb, Cs, Mg, Ca, erbium (Er), thulium (Tm), ytterbium (Yb), or a combination thereof. However, embodiments of the material included in the electron injection layer are not limited thereto.

The alkali metal may be selected from Li, Na, K, Rb, and Cs. In one embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from scandium (Sc), yttrium (Y), cerium (Ce), ytterbium (Yb), gadolinium (Gd), and terbium (Tb).

The alkali metal compound, the alkaline earth metal compound, and the rare earth metal compound may be selected from oxides and halides (e.g., fluorides, chlorides, bromides, and/or iodides) of the alkali metal, the alkaline earth metal, and the rare earth metal, respectively.

The alkali metal compound may be selected from alkali metal oxides (such as $Li_2O$, $Cs_2O$, and/or $K_2O$) and alkali metal halides (such as LiF, NaF, CsF, KF, LiI, NaI, CsI, and/or KI). In one embodiment, the alkali metal compound may be selected from LiF, $Li_2O$, NaF, LiI, NaI, CsI, and KI, but embodiments of the present disclosure are not limited thereto.

The alkaline earth metal compound may be selected from alkaline earth metal compounds (such as BaO, SrO, CaO, $Ba_xSr_{1-x}O$ (wherein $0<x<1$), and/or $Ba_xCa_{1-x}O$ (wherein $0<x<1$)). In one embodiment, the alkaline earth metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth metal complex, and the rare earth metal complex may include an alkali metal ion, an alkaline earth metal ion, and a rare earth metal ion, respectively, as described above, and each ligand coordinated with the metal ion of the alkali metal complex, the alkaline earth metal complex, and the rare earth metal complex may independently be selected from hydroxyquinoline, hydroxyisoquinoline, hydroxybenzoquinoline, hydroxyacridine, hydroxyphenanthridine, hydroxyphenyl oxazole, hydroxyphenyl thiazole, hydroxydiphenyl oxadiazole, hydroxydiphenyl thiadiazole, hydroxyphenyl pyridine, hydroxyphenyl benzimidazole, hydroxyphenyl benzothiazole, bipyridine, phenanthroline, and cyclopentadiene, but embodiments of the present disclosure are not limited thereto.

The electron injection layer may include (e.g., consist of) an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof, as described above. In one or more embodiments, the electron injection layer may further include an organic material. When the electron injection layer further includes an organic material, the alkali metal, the alkaline earth metal, the rare earth metal, the alkali metal compound, the alkaline earth metal compound, the rare earth metal compound, the alkali metal complex, the alkaline earth metal complex, the rare earth metal complex, or the combination thereof may be homogeneously or non-homogeneously dispersed in a matrix including the organic material.

The thickness of the electron injection layer may be about 1 Å to about 100 Å, and in some embodiments, about 3 Å to about 90 Å. When the thickness of the electron injection layer is within these ranges, the electron injection layer may have satisfactory electron injection characteristics without a substantial increase in driving voltage.

In some embodiments, the electron transport region in the organic light-emitting device 10 may include a buffer layer, an electron transport layer, and an electron injection layer.

At least one layer selected from the electron transport layer and the electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

Second Electrode 190

The second electrode 190 may be on the organic layer 150. The second electrode 190 may be a cathode which is an electron injection electrode, and in this regard, the material for forming the second electrode 190 may be selected from a metal, an alloy, an electrically conductive compound, and mixtures thereof, each having a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layer structure, or a multi-layer structure including two or more layers.

Description of FIGS. 2 to 6

Figure 2:
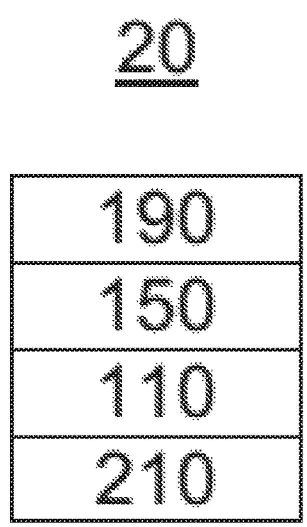

An organic light-emitting device 20 of FIG. 2 includes a first capping layer 210, a first electrode 110, an organic layer 150, and a second electrode 190 sequentially stacked in this stated order. An organic light-emitting device 30 of FIG. 3 includes a first electrode 110, an organic layer 150, a second electrode 190, and a second capping layer 220 sequentially stacked in this stated order. An organic light-emitting device 40 of FIG. 4 includes a first capping layer 210, a first electrode 110, an organic layer 150, a second electrode 190, and a second capping layer 220.

Figure 3:
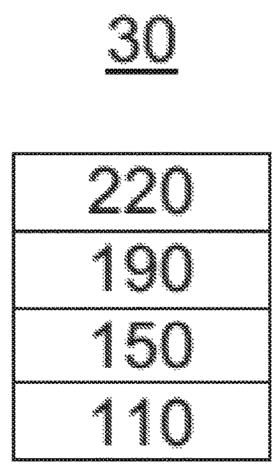
Figure 4:
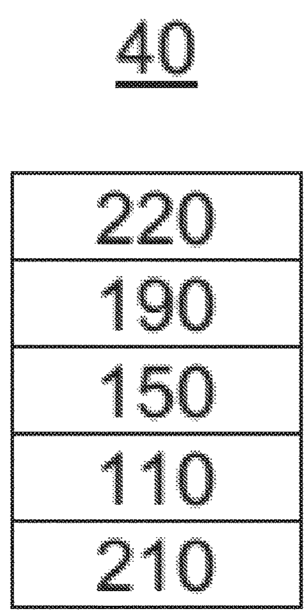

Regarding FIGS. 2 to 4, the first electrode 110, the organic layer 150, and the second electrode 190 may each independently be the same as described herein in connection with FIG. 1.

In the organic layer 150 of each of the organic light-emitting devices 20 and 40, light generated in an emission layer may pass through the first electrode 110 (which is a semi-transmissive electrode or a transmissive electrode) and the first capping layer 210 toward the outside, and in the organic layer 150 of each of the organic light-emitting devices 30 and 40, light generated in an emission layer may pass through the second electrode 190 (which is a semi-transmissive electrode or a transmissive electrode) and the second capping layer 220 toward the outside.

The first capping layer 210 and the second capping layer 220 may increase the external luminescent efficiency of the device, according to the principle of constructive interference.

The first capping layer 210 and the second capping layer 220 may each independently be a capping layer including an organic material, an inorganic capping layer including an inorganic material, or a composite capping layer including an organic material and an inorganic material.

At least one selected from the first capping layer 210 and the second capping layer 220 may include at least one material selected from carbocyclic compounds, heterocyclic compounds, amine-based compounds, porphyrin derivatives, phthalocyanine derivatives, naphthalocyanine derivatives, alkali metal-based complexes, and alkaline earth metal-based complexes. The carbocyclic compound, the heterocyclic compound, and the amine-based compound may each be optionally substituted with a substituent containing at least one element selected from O, N, S, selenium (Se), silicon (Si), fluorine (F), chlorine (Cl), bromine (Br), and iodine (I). In one embodiment, at least one selected from the first capping layer 210 and the second capping layer 220 may include an amine-based compound.

In one embodiment, at least one selected from the first capping layer 210 and the second capping layer 220 may include the compound represented by Formula 201 and/or the compound represented by Formula 202.

In one or more embodiments, at least one selected from the first capping layer 210 and the second capping layer 220 may include a compound selected from Compounds HT28 to HT33 and Compounds CP1 to CP5, but embodiments of the present disclosure are not limited thereto:

CP1

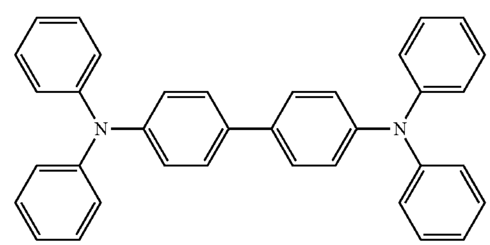

CP2

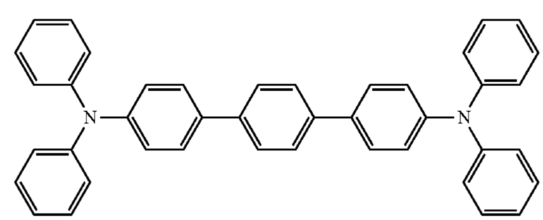

CP3

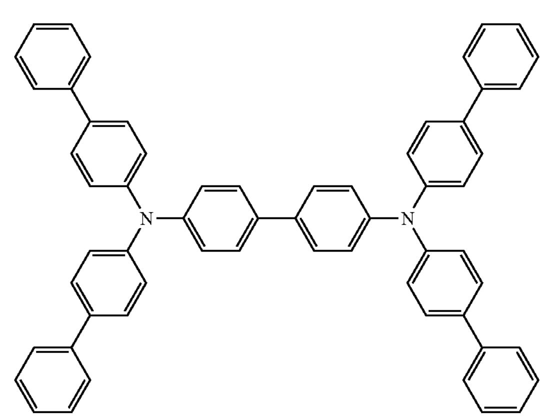

-continued

CP4

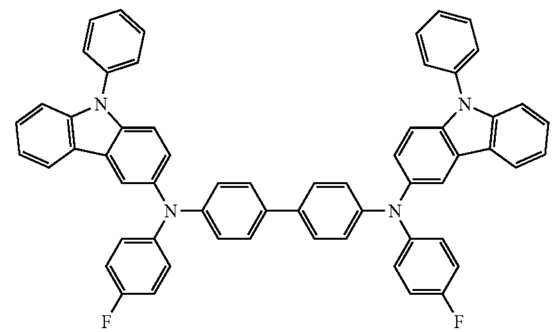

CP5

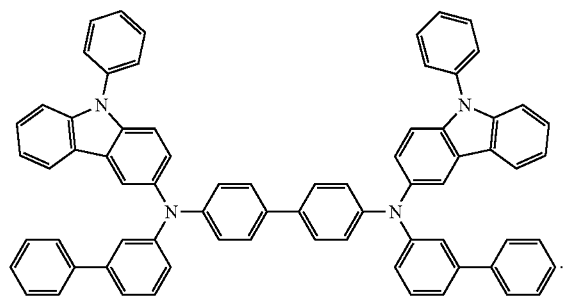

Figure 5:
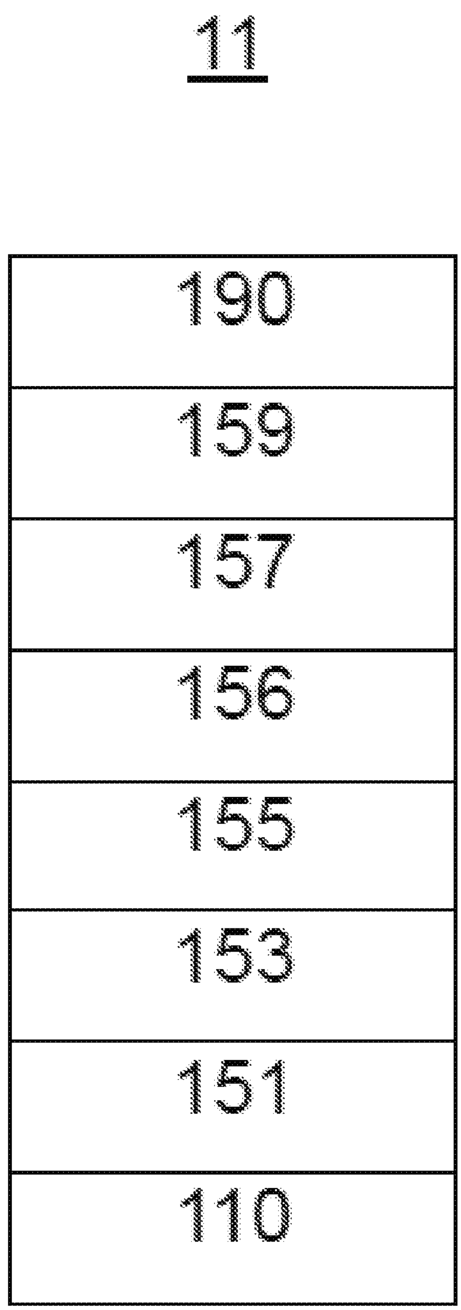

FIG. 5 is a schematic view of an organic light-emitting device 11 according to an embodiment of the present disclosure. The organic light-emitting device 11 may include a first electrode 110, a hole injection layer 151, a hole transport layer 153, an emission layer 155, a buffer layer 156, an electron transport layer 157, an electron injection layer 159, and a second electrode 190 sequentially stacked in this stated order.

Figure 6:
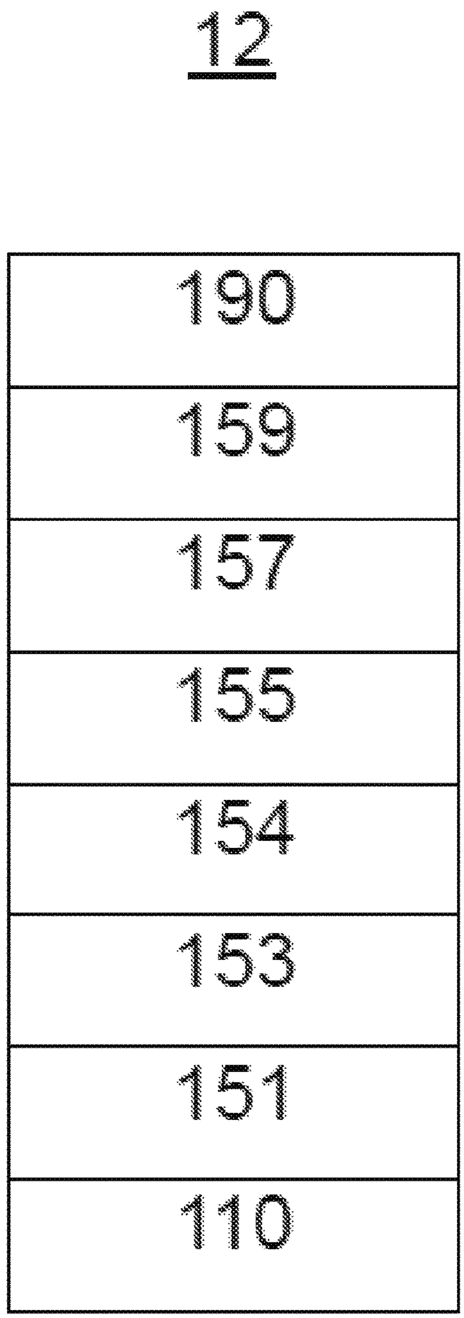

FIG. 6 is a schematic view of an organic light-emitting device 12 according to an embodiment of the present disclosure. The organic light-emitting device 12 may include a first electrode 110, a hole injection layer 151, a hole transport layer 153, an auxiliary layer 154, an emission layer 155, an electron transport layer 157, an electron injection layer 159, and a second electrode 190 sequentially stacked in this stated order.

Descriptions of the layers included in the organic light-emitting device 11 and 12 of FIGS. 5 and 6 may be the same as described above.

Hereinbefore, the organic light-emitting device according to an embodiment of the present disclosure has been described in connection with FIGS. 1 to 6. However, embodiments of the present disclosure are not limited thereto.

The layers constituting the hole transport region, the emission layer, and the layers constituting the electron transport region may be formed in a specific region using one or more suitable methods selected from vacuum deposition, spin coating, casting, Langmuir-Blodgett (LB) deposition, ink-jet printing, laser-printing, and laser-induced thermal imaging.

When the layers constituting the hole transport region, the emission layer, and the layers constituting the electron transport region are each formed by vacuum deposition, in some embodiments, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec, depending on the compound to be included in each layer, and the structure of each layer to be formed.

When the layers constituting the hole transport region, the emission layer, and the layers constituting the electron transport region are each formed by spin coating, the spin coating may be performed at a coating speed of about 2,000 rpm to about 5,000 rpm and at a heat treatment temperature of about 80° C. to 200° C., depending on the compound to be included in each layer, and the structure of each layer to be formed.

General Definitions of Substituents

The term "$C_1$-$C_{60}$ alkyl group", as used herein, refers to a linear or branched aliphatic saturated hydrocarbon monovalent group having 1 to 60 carbon atoms, and non-limiting examples thereof may include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group", as used herein, refers to a divalent group having substantially the same structure as the $C_1$-$C_{60}$ alkyl group.

The term "$C_2$-$C_{60}$ alkenyl group", as used herein, refers to a hydrocarbon group having at least one carbon-carbon double bond in the body (e.g., middle) or at the terminus of the $C_2$-$C_{60}$ alkyl group, and non-limiting examples thereof may include an ethenyl group, a propenyl group, and a butenyl group. The term "$C_2$-$C_{60}$ alkenylene group", as used herein, refers to a divalent group having substantially the same structure as the $C_2$-$C_{60}$ alkenyl group.

The term "$C_2$-$C_{60}$ alkynyl group", as used herein, refers to a hydrocarbon group having at least one carbon-carbon triple bond in the body (e.g., middle) or at the terminus of the $C_2$-$C_{60}$ alkyl group, and non-limiting examples thereof may include an ethynyl group and a propynyl group. The term "$C_2$-$C_{60}$ alkynylene group", as used herein, refers to a divalent group having substantially the same structure as the $C_2$-$C_{60}$ alkynyl group.

The term "$C_1$-$C_{60}$ alkoxy group", as used herein, refers to a monovalent group represented by —O-$A_{101}$ (wherein $A_{101}$ is a $C_1$-$C_{60}$ alkyl group), and non-limiting examples thereof may include a methoxy group, an ethoxy group, and an isopropyloxy group.

The term "$C_3$-$C_{10}$ cycloalkyl group", as used herein, refers to a monovalent saturated hydrocarbon monocyclic group having 3 to 10 carbon atoms, and non-limiting examples thereof may include a cyclopropyl group, a cyclobutyl group, a cyclopentyl group, a cyclohexyl group, and a cycloheptyl group. The term "$C_3$-$C_{10}$ cycloalkylene group", as used herein, refers to a divalent group having substantially the same structure as the $C_3$-$C_{10}$ cycloalkyl group.

The term "$C_1$-$C_{10}$ heterocycloalkyl group", as used herein, refers to a monovalent monocyclic group having at least one heteroatom selected from N, O, Si, P, and S as a ring-forming atom and 1 to 10 carbon atoms, and non-limiting examples thereof may include a 1,2,3,4-oxatriazolidinyl group, a tetrahydrofuranyl group, and a tetrahydrothiophenyl group. The term "$C_1$-$C_{10}$ heterocycloalkylene group", as used herein, refers to a divalent group having substantially the same structure as the $C_1$-$C_{10}$ heterocycloalkyl group.

The term "$C_3$-$C_{10}$ cycloalkenyl group", as used herein, refers to a monovalent monocyclic group that has 3 to 10 carbon atoms and at least one carbon-carbon double bond in the ring thereof and does not have aromaticity, and non-limiting examples thereof may include a cyclopentenyl group, a cyclohexenyl group, and a cycloheptenyl group. The term "$C_3$-$C_{10}$ cycloalkenylene group", as used herein, refers to a divalent group having substantially the same structure as the $C_3$-$C_{10}$ cycloalkenyl group.

The term "$C_1$-$C_{10}$ heterocycloalkenyl group", as used herein, refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group", as used herein, refers to a divalent group having substantially the same structure as the $C_1$-$C_{10}$ heterocycloalkenyl group.

The term "$C_6$-$C_{60}$ aryl group", as used herein, refers to a monovalent group having an aromatic system having 6 to 60 carbon atoms, and the term "$C_6$-$C_{60}$ arylene group", as used herein, refers to a divalent group having an aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused (e.g., condensed).

The term "$C_1$-$C_{60}$ heteroaryl group", as used herein, refers to a monovalent group having a heterocyclic aromatic system that has at least one heteroatom selected from N, O, Si, P, and S as a ring-forming atom, and 1 to 60 carbon atoms. The term "$C_1$-$C_{60}$ heteroarylene group", as used herein, refers to a divalent group having a heterocyclic aromatic system that has at least one heteroatom selected from N, O, Si, P, and S as a ring-forming atom, and 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused (e.g., condensed).

The term "$C_6$-$C_{60}$ aryloxy group", as used herein, refers to —O-$A_{102}$ (wherein $A_{102}$ is a $C_6$-$C_{60}$ aryl group), and the term "$C_6$-$C_{60}$ arylthio group", as used herein, indicates —S-$A_{103}$ (wherein $A_{103}$ is a $C_6$-$C_{60}$ aryl group).

The term "monovalent non-aromatic condensed polycyclic group", as used herein, refers to a monovalent group that has two or more rings condensed with each other, only carbon atoms as ring forming atoms (e.g., 8 to 60 carbon atoms), and non-aromaticity in the entire molecular structure. A non-limiting example of the monovalent non-aromatic condensed polycyclic group may be a fluorenyl group. The term "divalent non-aromatic condensed polycyclic group", as used herein, refers to a divalent group having substantially the same structure as the monovalent non-aromatic condensed polycyclic group.

The term "monovalent non-aromatic condensed heteropolycyclic group", as used herein, refers to a monovalent group that has two or more rings condensed to each other, and at least one heteroatom selected from N, O, Si, P, and S in addition to carbon atoms (for example, 2 to 60 carbon atoms) as ring-forming atoms, wherein the molecular structure as a whole is non-aromatic in the entire molecular structure (e.g., the entire structure is non-aromatic). A non-limiting example of the monovalent non-aromatic condensed heteropolycyclic group may be a carbazolyl group. The term "divalent non-aromatic condensed heteropolycyclic group", as used herein, refers to a divalent group having substantially the same structure as the monovalent non-aromatic condensed heteropolycyclic group.

The term "$C_5$-$C_{60}$ carbocyclic group", as used herein, refers to a monocyclic or polycyclic group having 5 to 60 carbon atoms as the only ring-forming atoms. The term "$C_5$-$C_{60}$ carbocyclic group", as used herein, refers to an aromatic carbocyclic group or a non-aromatic carbocyclic group. The term "$C_5$-$C_{60}$ carbocyclic group", as used herein, refers to a ring (such as a benzene group), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group", as used herein, refers to a group having substantially the same structure as the $C_1$-$C_{60}$ carbocyclic group, except that as a ring-forming atom, at least one heteroatom selected from N, O, Si, P, and S is used in addition to carbon (for example, 1 to 60 carbon atoms).

In the present specification, at least one substituent of the substituted $C_5$-$C_{60}$ carbocyclic group, substituted $C_1$-$C_{60}$ heterocyclic group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

The term "Ph" as used herein represents a phenyl group, the term "Me" as used herein represents a methyl group, the term "Et" as used herein represents an ethyl group, the term "ter-Bu" or "$Bu^t$" as used herein represents a tert-butyl group, and the term "OMe" as used herein represents a methoxy group.

The term "biphenyl group" as used herein represents "a phenyl group substituted with a phenyl group". In other words, a biphenyl group is a substituted phenyl group having a $C_6$-$C_{60}$ aryl group as a substituent.

The term "terphenyl group" as used herein refers to "a phenyl group substituted with a biphenyl group". In other words, a terphenyl group is a substituted phenyl group having a $C_6$-$C_{60}$ aryl group substituted with a $C_6$-$C_{60}$ aryl group as a substituent.

Symbols * and *' used herein, unless defined otherwise, refer to a binding site to a neighboring atom in a corresponding formula.

Hereinafter, compounds according to embodiments of the present disclosure and an organic light-emitting device according to an embodiment of the present disclosure will be described in more detail with reference to Synthesis Examples and Examples. The wording "B was used instead of A" used in describing Synthesis Examples refers to that an identical number of molar equivalents of B was used in place of A.

EXAMPLE

Example 1-1

As a substrate and an anode, a Corning 15 Ohms per square centimeter (Ω/cm$^2$) (120 nanometers (nm)) ITO glass substrate was cut to a size of 50 millimeters (mm)×50 mm×0.7 mm, sonicated using isopropyl alcohol and deionized water for 5 minutes each, and cleaned by exposure to ultraviolet irradiation and ozone. Then, the glass substrate was mounted on a vacuum deposition device.

m-MTDATA was vacuum-deposited on the ITO anode to form a hole injection layer having a thickness of about 70 nm. NPB was then vacuum-deposited on the hole injection layer to form a hole transport layer having a thickness of about 10 nm.

Compound 1-7 (as a host) and Compound FD1 (as a dopant) were next co-deposited on the hole transport layer (wherein the content of the dopant was about 5 wt %) to form an emission layer having a thickness of about 30 nm.

Compound 2-1 was vacuum-deposited on the emission layer to form a buffer layer having a thickness of 10 nm, $Alq_3$ was vacuum-deposited on the buffer layer to form an electron transport layer having a thickness of 20 nm, LiF was deposited on the electron transport layer to form an electron injection layer having a thickness of 1 nm, and Al was vacuum-deposited on the electron injection layer to form a second electrode (cathode) having a thickness of 200 nm, thereby completing the manufacture of an organic light-emitting device.

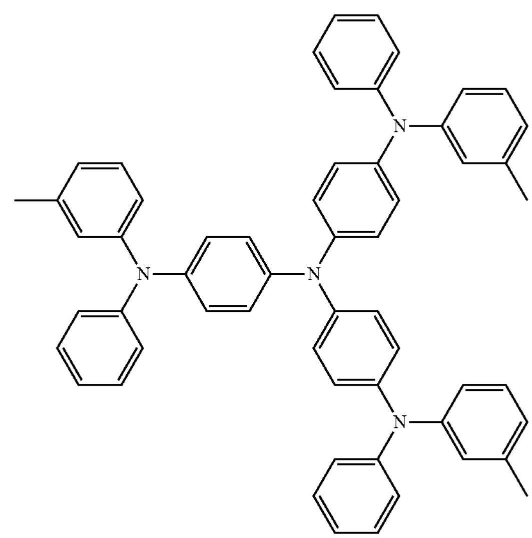

m-MTDATA

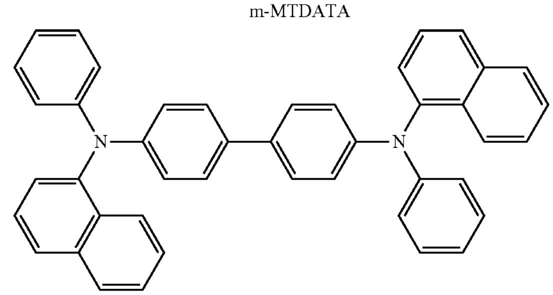

NPB

-continued

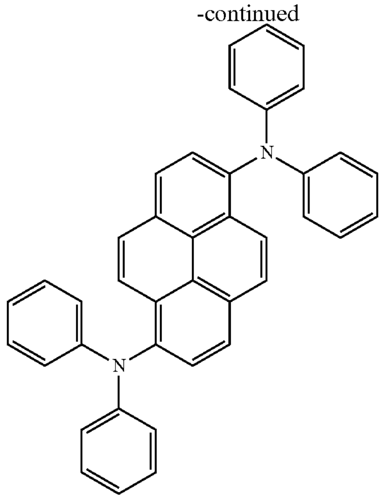

FD1

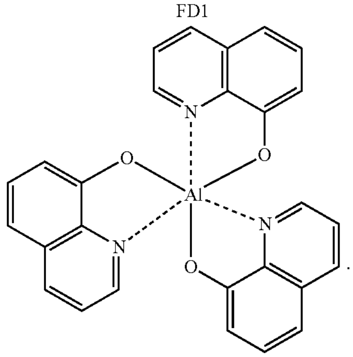

Alq3

Examples 1-2 to 1-27 and Comparative Examples 1, 2, 3, 11, and 12

Additional organic light-emitting devices of Examples 1-2 to 1-27 and Comparative Examples 1, 2, 3, 11, and 12 were manufactured in substantially the same manner as in Example 1-1, except that the materials shown in Table 3 were used as hosts and buffer layer materials.

Evaluation Example 1

The driving voltage (V) and efficiency (cd/A) at 10 mA/cm$^2$ of each of the organic light-emitting devices of Examples 1-2 to 1-27 and Comparative Examples 1, 2, 3, 11, and 12 were measured using a Keithley source-measure unit (SMU) 236 and a PR650 luminance meter. The results thereof are shown in Table 3.

TABLE 3

| | Host in emission layer | Buffer layer | Driving voltage (V) | Efficiency (cd/A) |
|---|---|---|---|---|
| Example 1-1 | Compound 1-7 | Compound 2-1 | 4.7 | 5.2 |
| Example 1-2 | Compound 1-7 | Compound 2-9 | 4.6 | 5.3 |
| Example 1-3 | Compound 1-7 | Compound 2-10 | 4.8 | 5.4 |
| Example 1-4 | Compound 1-7 | Compound 2-202 | 4.7 | 5.2 |
| Example 1-5 | Compound 1-7 | Compound 2-204 | 4.6 | 5.4 |
| Example 1-6 | Compound 1-7 | Compound 2-75 | 4.8 | 5.1 |
| Example 1-7 | Compound 1-7 | Compound 2-71 | 4.7 | 5.2 |
| Example 1-8 | Compound 1-7 | Compound 2-80 | 4.8 | 5.4 |
| Example 1-9 | Compound 1-7 | Compound 2-13 | 4.9 | 5.3 |
| Example 1-10 | Compound 1-7 | Compound 2-38 | 4.6 | 5.2 |
| Example 1-11 | Compound 1-7 | Compound 2-48 | 4.6 | 5.4 |
| Example 1-12 | Compound 1-7 | Compound 2-136a | 4.7 | 5.3 |
| Example 1-13 | Compound 1-7 | Compound 2-147a | 4.8 | 5.3 |
| Example 1-14 | Compound 1-7 | Compound 2-143a | 4.6 | 5.3 |
| Example 1-15 | Compound 1-7 | Compound 2-103 | 4.8 | 5.2 |
| Example 1-16 | Compound 1-7 | Compound 2-106 | 4.7 | 5.2 |
| Example 1-17 | Compound 1-7 | Compound 2-209 | 5.0 | 5.4 |
| Example 1-18 | Compound 1-7 | Compound 2-211 | 4.7 | 5.4 |
| Example 1-19 | Compound 1-7 | Compound 2-212 | 4.8 | 5.3 |
| Example 1-20 | Compound 1-7 | Compound 2-213 | 4.8 | 5.3 |
| Example 1-21 | Compound 1-7 | Compound 2-58 | 4.6 | 5.3 |
| Example 1-22 | Compound 1-7 | Compound 2-64 | 4.7 | 5.3 |
| Example 1-23 | Compound 1-7 | Compound 2-162 | 4.7 | 5.2 |
| Example 1-24 | Compound 1-7 | Compound 2-222 | 4.8 | 5.3 |
| Example 1-25 | Compound 1-7 | Compound 2-188 | 4.8 | 5.4 |
| Example 1-26 | Compound 1-7 | Compound 2-190 | 4.8 | 5.4 |
| Example 1-27 | Compound 1-7 | Compound 2-205 | 4.9 | 5.4 |
| Comparative Example 1 | Compound 1 | Compound 2-1 | 4.9 | 4.6 |
| Comparative Example 2 | Compound 2 | Compound 2-1 | 5.0 | 4.7 |
| Comparative Example 3 | Compound 1-7 | BAlq | 5.3 | 4.8 |
| Comparative Example 11 | Compound 1-7 | Compound BF-A | 4.9 | 5.0 |
| Comparative Example 12 | Compound 1-7 | Compound BF-B | 4.8 | 4.9 |

Referring to Table 3, the organic light-emitting devices of Examples 1-1 to 1-27 were each found to have low driving voltage and high efficiency, as compared with the organic light-emitting devices of Comparative Examples 1, 2, 3, 11, and 12.

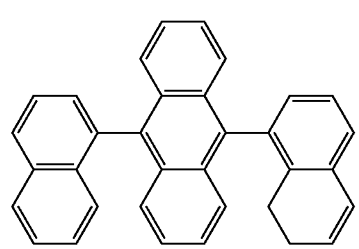

1

-continued

2

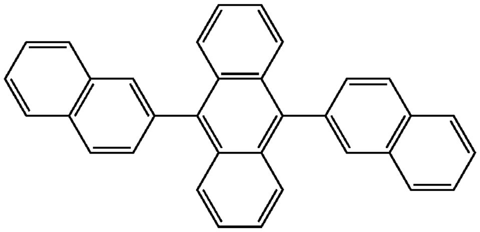

BF-A

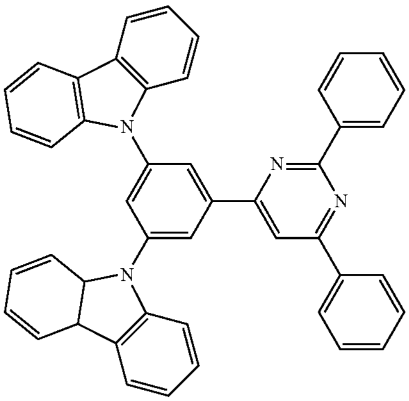

BF-B

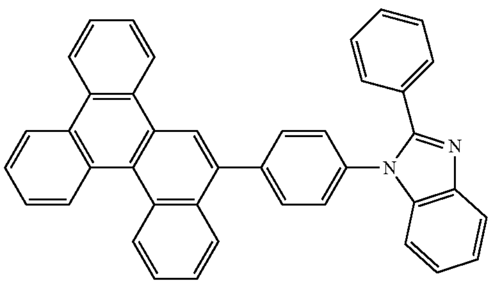

Examples 2-1 to 2-32

Additional organic light-emitting devices of Examples 2-1 to 2-32 were manufactured in substantially the same manner as in Example 1-1, except that the materials shown in Table 4 were used as host and buffer layer materials.

Evaluation Example 2

The driving voltage (V) and efficiency (cd/A) at 10 mA/cm$^2$ of each of the organic light-emitting devices of Examples 2-1 to 2-32 were measured using a Keithley SMU 236 and a PR650 luminance meter. The results thereof are shown in Table 4.

TABLE 4

| | Host in emission layer | Buffer layer | Driving voltage (V) | Efficiency (cd/A) |
|---|---|---|---|---|
| Example 2-1 | Compound 1-13 | Compound 2-1 | 4.8 | 5.1 |
| Example 2-2 | Compound 1-2 | Compound 2-1 | 4.8 | 5.1 |
| Example 2-3 | Compound 1-4 | Compound 2-1 | 4.9 | 5.2 |
| Example 2-4 | Compound 1-6 | Compound 2-1 | 5.0 | 5.2 |
| Example 2-5 | Compound 1-17 | Compound 2-1 | 4.8 | 5.3 |
| Example 2-6 | Compound 1-24 | Compound 2-1 | 4.9 | 5.2 |
| Example 2-7 | Compound 1-32 | Compound 2-1 | 4.9 | 5.1 |
| Example 2-8 | Compound 1-28 | Compound 2-1 | 4.8 | 5.1 |
| Example 2-9 | Compound 1-41 | Compound 2-1 | 4.9 | 5.0 |
| Example 2-10 | Compound 1-52 | Compound 2-1 | 4.8 | 5.2 |
| Example 2-11 | Compound 1-57 | Compound 2-1 | 4.9 | 5.1 |
| Example 2-12 | Compound 1-2 | Compound 2-13 | 4.9 | 5.2 |
| Example 2-13 | Compound 1-2 | Compound 2-48 | 4.7 | 5.3 |
| Example 2-14 | Compound 1-2 | Compound 2-58 | 4.7 | 5.3 |
| Example 2-15 | Compound 1-2 | Compound 2-222 | 4.8 | 5.3 |
| Example 2-16 | Compound 1-6 | Compound 2-13 | 5.0 | 5.4 |
| Example 2-17 | Compound 1-6 | Compound 2-48 | 4.7 | 5.5 |
| Example 2-18 | Compound 1-6 | Compound 2-58 | 4.8 | 5.3 |
| Example 2-19 | Compound 1-6 | Compound 2-222 | 4.9 | 5.4 |
| Example 2-20 | Compound 1-24 | Compound 2-13 | 4.8 | 5.2 |
| Example 2-21 | Compound 1-24 | Compound 2-48 | 4.6 | 5.3 |
| Example 2-22 | Compound 1-24 | Compound 2-58 | 4.6 | 5.2 |
| Example 2-23 | Compound 1-24 | Compound 2-222 | 4.7 | 5.2 |
| Example 2-24 | Compound 1-28 | Compound 2-13 | 4.9 | 5.2 |
| Example 2-25 | Compound 1-28 | Compound 2-48 | 4.6 | 5.2 |
| Example 2-26 | Compound 1-28 | Compound 2-58 | 4.7 | 5.3 |
| Example 2-27 | Compound 1-28 | Compound 2-222 | 4.7 | 5.2 |
| Example 2-28 | Compound 1-52 | Compound 2-13 | 4.8 | 5.2 |
| Example 2-29 | Compound 1-52 | Compound 2-48 | 4.7 | 5.3 |
| Example 2-30 | Compound 1-52 | Compound 2-58 | 4.6 | 5.3 |
| Example 2-32 | Compound 1-52 | Compound 2-222 | 4.7 | 5.3 |
| Comparative Example 1 | Compound 1 | Compound 2-1 | 4.9 | 4.6 |
| Comparative Example 2 | Compound 2 | Compound 2-1 | 5.0 | 4.7 |
| Comparative Example 3 | Compound 1-7 | BAlq | 5.3 | 4.8 |

Referring to Table 4, the organic light-emitting devices of each of Examples 2-1 to 2-32 were found to have low driving voltage and high efficiency, as compared with each of the organic light-emitting devices of Comparative Examples 1 to 3.

Examples 3-1 to 3-20 and Comparative Examples 14 to 16

Additional organic light-emitting devices of Examples 3-1 to 3-20 and Comparative Examples 4 to 6 were manufactured in substantially the same manner as in Example 1-1, except that the materials shown in Table 5 were used as host and buffer layer materials, and Compound FD19 was used as a dopant instead of Compound FD1:

FD19

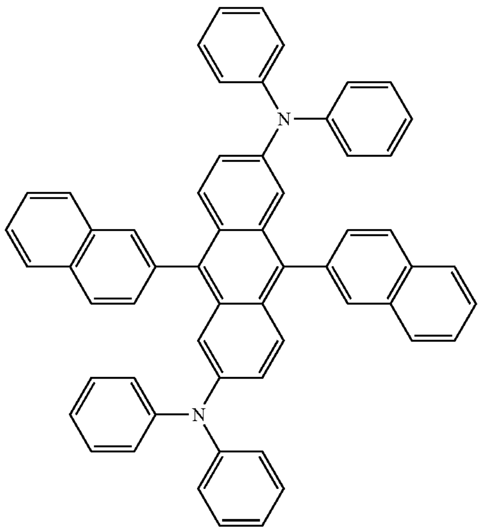

.

Evaluation Example 3

The driving voltage (V) and efficiency (cd/A) at 10 mA/cm$^2$ of each of the organic light-emitting devices of Examples 3-1 to 3-20 and Comparative Examples 4 to 6 were measured using a Keithley SMU 236 and a PR650 luminance meter. The results thereof are shown in Table 5.

TABLE 5

| | Host in emission layer | Buffer layer | Driving voltage (V) | Efficiency (cd/A) |
|---|---|---|---|---|
| Example 3-1 | Compound 1-69 | Compound 2-1 | 4.9 | 20.4 |
| Example 3-2 | Compound 1-77 | Compound 2-1 | 5.0 | 20.8 |
| Example 3-3 | Compound 1-91 | Compound 2-1 | 4.9 | 21.2 |
| Example 3-4 | Compound 1-107 | Compound 2-1 | 5.1 | 21.6 |
| Example 3-5 | Compound 1-69 | Compound 2-13 | 4.9 | 20.6 |
| Example 3-6 | Compound 1-69 | Compound 2-48 | 4.8 | 20.4 |
| Example 3-7 | Compound 1-69 | Compound 2-58 | 4.7 | 21.1 |
| Example 3-8 | Compound 1-69 | Compound 2-222 | 4.9 | 20.3 |
| Example 3-9 | Compound 1-77 | Compound 2-13 | 5.1 | 20.6 |
| Example 3-10 | Compound 1-77 | Compound 2-48 | 4.8 | 21.4 |
| Example 3-11 | Compound 1-77 | Compound 2-58 | 4.9 | 21.0 |
| Example 3-12 | Compound 1-77 | Compound 2-222 | 4.9 | 21.2 |
| Example 3-13 | Compound 1-91 | Compound 2-13 | 4.9 | 21.3 |
| Example 3-14 | Compound 1-91 | Compound 2-48 | 4.8 | 21.5 |
| Example 3-15 | Compound 1-91 | Compound 2-58 | 4.7 | 22.2 |
| Example 3-16 | Compound 1-91 | Compound 2-222 | 4.8 | 21.8 |
| Example 3-17 | Compound 1-107 | Compound 2-13 | 5.0 | 21.9 |
| Example 3-18 | Compound 1-107 | Compound 2-48 | 4.8 | 22.4 |
| Example 3-19 | Compound 1-107 | Compound 2-58 | 4.8 | 22.8 |
| Example 3-20 | Compound 1-107 | Compound 2-222 | 4.9 | 22.6 |
| Comparative Example 4 | Compound 1 | Compound 2-1 | 5.1 | 18.1 |
| Comparative Example 5 | Compound 2 | Compound 2-1 | 5.2 | 17.8 |
| Comparative Example 6 | Compound 1-69 | BAlq | 5.4 | 19.2 |

Referring to Table 5, the organic light-emitting devices of Examples 3-1 to 3-20 were each found to have low driving voltage and high efficiency, as compared with the organic light-emitting devices of Comparative Examples 4 to 6.

Example 4-1

As a substrate and an anode, a Corning 15 Ω/cm$^2$ (120 nm) ITO glass substrate was cut to a size of 50 mm×50 mm×0.7 mm, sonicated using isopropyl alcohol and deionized water for 5 minutes each, and cleaned by exposure to ultraviolet irradiation and ozone. Then, the glass substrate was mounted on a vacuum deposition device.

m-MTDATA was vacuum-deposited on the ITO anode to form a hole injection layer having a thickness of about 70 nm. Compound 2-1 was vacuum-deposited on the hole injection layer to form an emission auxiliary layer having a thickness of about 10 nm.

Compound 1-7 (as a host) and Compound FD1 (as a dopant) were co-deposited on the emission auxiliary layer (wherein the content of the dopant was about 5 wt %) to form an emission layer having a thickness of about 30 nm.

$Alq_3$ was vacuum-deposited on the emission layer to form an electron transport layer having a thickness of 30 nm, LiF was deposited on the electron transport layer to form an electron injection layer having a thickness of 1 nm, and Al was vacuum-deposited on the electron injection layer to form a second electrode (cathode) having a thickness of 200 nm, thereby completing the manufacture of an organic light-emitting device.

Examples 4-2 to 4-22 and Comparative Examples 7 to 9

Additional organic light-emitting devices of Examples 4-2 to 4-22 and Comparative Examples 7 to 9 were manufactured in substantially the same manner as in Example 4-1, except that the materials shown in Table 6 were used as emission auxiliary layer and host materials.

Evaluation Example 4

The driving voltage (V) and efficiency (cd/A) at 10 mA/cm$^2$ of each of the organic light-emitting devices of Examples 4-1 to 4-22 and Comparative Examples 7 to 9 were measured using a Keithley SMU 236 and a PR650 luminance meter. The results thereof are shown in Table 6.

TABLE 6

| | Emission auxiliary layer | Host in emission layer | Driving voltage (V) | Efficiency (cd/A) |
|---|---|---|---|---|
| Example 4-1 | Compound 2-1 | Compound 1-7 | 4.8 | 5.2 |
| Example 4-2 | Compound 2-1 | Compound 1-13 | 4.8 | 5.0 |
| Example 4-3 | Compound 2-1 | Compound 1-2 | 4.9 | 5.1 |
| Example 4-4 | Compound 2-1 | Compound 1-4 | 4.9 | 5.2 |
| Example 4-5 | Compound 2-1 | Compound 1-6 | 5.1 | 5.4 |
| Example 4-6 | Compound 2-1 | Compound 1-17 | 4.8 | 5.2 |
| Example 4-7 | Compound 2-1 | Compound 1-24 | 4.8 | 5.1 |
| Example 4-8 | Compound 2-1 | Compound 1-32 | 4.9 | 5.2 |
| Example 4-9 | Compound 2-1 | Compound 1-28 | 4.9 | 5.2 |
| Example 4-10 | Compound 2-1 | Compound 1-41 | 4.9 | 5.0 |
| Example 4-11 | Compound 2-1 | Compound 1-52 | 4.8 | 5.1 |
| Example 4-12 | Compound 2-1 | Compound 1-57 | 5.0 | 5.4 |
| Example 4-13 | Compound 2-75 | Compound 1-2 | 4.9 | 5.1 |
| Example 4-14 | Compound 2-75 | Compound 1-6 | 5.0 | 5.3 |
| Example 4-15 | Compound 2-75 | Compound 1-24 | 4.8 | 5.1 |
| Example 4-16 | Compound 2-75 | Compound 1-28 | 4.8 | 5.1 |
| Example 4-17 | Compound 2-75 | Compound 1-52 | 4.9 | 5.0 |
| Example 4-18 | Compound 2-71 | Compound 1-2 | 4.8 | 5.2 |
| Example 4-19 | Compound 2-71 | Compound 1-6 | 4.9 | 5.5 |
| Example 4-20 | Compound 2-71 | Compound 1-24 | 4.7 | 5.3 |
| Example 4-21 | Compound 2-71 | Compound 1-28 | 4.8 | 5.2 |
| Example 4-22 | Compound 2-71 | Compound 1-52 | 4.7 | 5.2 |

TABLE 6-continued

| | Emission auxiliary layer | Host in emission layer | Driving voltage (V) | Efficiency (cd/A) |
|---|---|---|---|---|
| Comparative Example 7 | Compound 2-1 | Compound 1 | 4.9 | 4.5 |
| Comparative Example 8 | Compound 2-1 | Compound 2 | 5.0 | 4.6 |
| Comparative Example 9 | Compound 4 | Compound 1-7 | 5.0 | 4.8 |

4

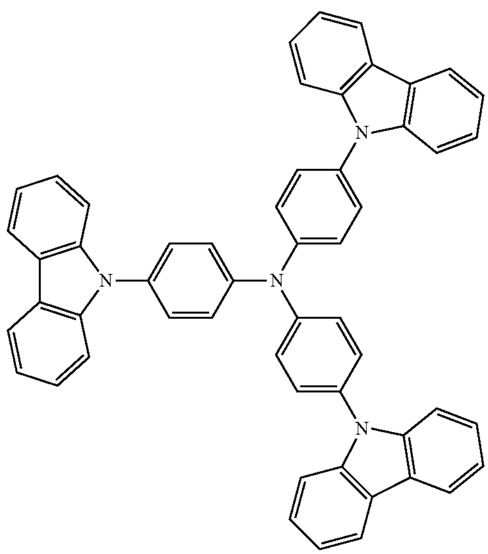

1

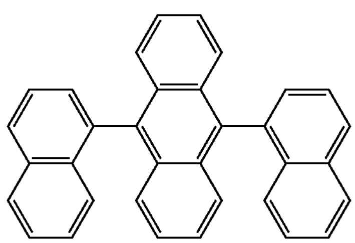

2

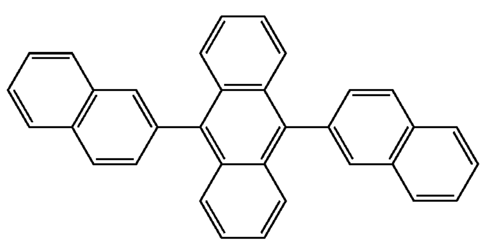

Referring to Table 6, the organic light-emitting devices of each of Examples 4-1 to 4-22 were found to have low driving voltage and high efficiency, as compared with each of the organic light-emitting devices of Comparative Examples 7 to 9.

As described above, an organic light-emitting device according to an embodiment of the present disclosure may have a low-driving voltage, improved efficiency, and long lifespan.

It should be understood that the embodiments described herein should be considered in a descriptive sense only and not for purposes of limitation. Descriptions of features or aspects within each embodiment should typically be considered as being available for other similar features or aspects in other embodiments.

As used herein, the terms "use", "using", and "used" may be considered synonymous with the terms "utilize", "utilizing", and "utilized", respectively. Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the drawings, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:

a first electrode;

a second electrode facing the first electrode;

an emission layer between the first electrode and the second electrode;

a hole transport region between the first electrode and the emission layer; and an electron transport region between the emission layer and the second electrode, wherein the emission layer comprises a first compound, at least one selected from the hole transport region and the electron transport region comprises a second compound, the first compound is represented by Formula 1A or 1B, and the second compound is represented by Formula 2A or 2B:

Formula 1A

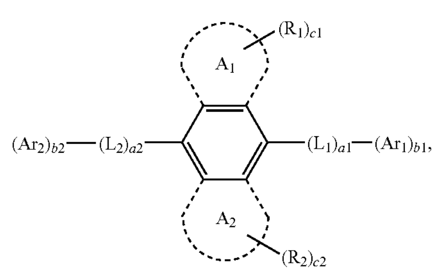

-continued

Formula 1B

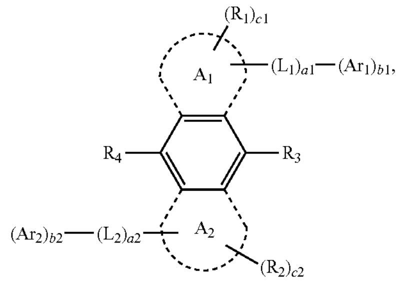

Formula 2A

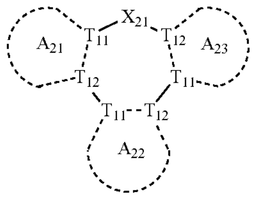

Formula 2B

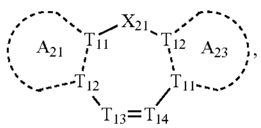

wherein, in Formulae 1A, 1B, 2A, and 2B, rings $A_1$ and $A_2$ are each independently a $C_5$-$C_{60}$ carbocyclic group, rings $A_{21}$, $A_{22}$, and $A_{23}$ are each independently a $C_5$-$C_{30}$ carbocyclic group or a $C_1$-$C_{30}$ heterocyclic group, each substituted with at least one *-[$(L_{22})_{a22}$-$(R_{22})_{b22}$], each $T_{11}$ and each $T_{12}$ is independently carbon or nitrogen, any two or more of the three $T_{11}$(s) Formula 2A are identical to or different from each other, $T_{13}$ is N or C($R_{27}$), $T_{14}$ is N or C($R_{28}$), any two or more of the three $T_{12}$(s) Formula 2A are identical to or different from each other, the two $T_{11}$(s) in Formula 2B are identical to or different from each other, the two $T_{12}$(s) in Formula 2B are identical to or different from each other, and each bond between $T_{11}$ and $T_{12}$ is a single bond or a double bond; wherein the three $T_{11}$(s) and the three $T_{12}$(s) Formula 2A are not all nitrogen, and the two $T_{11}$(s), the two $T_{12}$(S), $T_{13}$, and $T_{14}$ in Formula 2B are not all nitrogen, rings $A_{21}$, $A_{22}$, and $A_{23}$ are each condensed to a central 7-membered ring in Formulae 2A and 2B, such that they each share a $T_{11}$ and a $T_{12}$ with the central 7-membered ring, and i) the case that rings $A_{21}$ $A_{22}$, and $A_{23}$ in Formula 2A are all a benzene group substituted with at least one *-[$(L_{22})_{a22}$-$(R_{22})_{b22}$] and ii) the case that rings $A_{21}$ and $A_{22}$ in Formula 2B are all a benzene group substituted with at least one *-[$(L_{22})_{a22}$-$(R_{22})_{b22}$] are excluded;

$X_{21}$ is selected from O, S, Se, C($R_{23}$)($R_{24}$), Si($R_{23}$)($R_{24}$), and N-[$(L_{21})_{a21}$-$(R_{21})_{b21}$], $L_1$, $L_2$, $L_{21}$, and $L_{22}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1, a2, a21, and a22 are each independently an integer selected from 0 to 5, $Ar_1$ and $Ar_2$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, b1 and b2 are each independently an integer selected from 1 to 5, $R_1$ to $R_4$, $R_{21}$ to $R_{24}$, $R_{27}$, and $R_{28}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), and c1, c2, b21, and b22 are each independently an integer selected from 0 to 4, wherein a compound represented by Formula 1A, in which i) rings $A_1$ and $A_2$ are each a benzene group, ii) a1, a2, c1, and c2 are 0, iii) b1 and b2 are 1, and iv) $Ar_1$ and $Ar_2$ are each a naphthyl group, is excluded from being the first compound, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(—O)($Q_{31}$), —S(═O)$_2$($Q_{31}$), and —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

2. The organic light-emitting device of claim 1, wherein:

rings $A_1$ and $A_2$ in Formulae 1A and 1B are each independently selected from a benzene group, a naphthalene group, an anthracene group, a phenanthrene group, an indene group, a fluorene group, and a benzofluorene group, and a group represented by *—$(L_1)_{a1}$-$(Ar_1)_{b1}$ and a group represented by *—$(L_2)_{a2}$-$(Ar_2)_{b2}$ in Formulae 1A and 1B are different from each other.

3. The organic light-emitting device of claim 1, wherein rings $A_{21}$, $A_{22}$, and $A_{23}$ in Formulae 2A and 2B are each independently selected from a benzene group, a naphthalene group, an anthracene group, an indene group, a fluorene group, a pyridine group, a pyrimidine group, a pyrazine group, a pyridazine group, a quinoline group, an isoquinoline group, a pyrrole group, a pyrazole group, an imidazole group, an oxazole group, a thiazole group, a cyclopentadiene group, a silole group, a selenophene group, a furan group, a thiophene group, an indole group, a benzimidazole group, a benzoxazole group, a benzothiazole group, an indene group, a benzosilole group, a benzoselenophene group, a benzofuran group, a benzothiophene group, a carbazole group, a fluorene group, a dibenzosilole group, a dibenzoselenophene group, a dibenzofuran group, a dibenzothiophene group, a pyrrolopyridine group, a cyclopentapyridine group, a silolopyridine group, a selenophenopyridine group, a furopyridine group, a thienopyridine group, a pyrrolopyrimidine group, a cyclopentapyrimidine group, a silolopyrimidine group, a selenophenopyrimidine group, a furopyrimidine group, a thienopyrimidine group, a pyrrolopyrazine group, a cyclopentapyrazine group, a silolopyrazine group, a selenophenopyrazine group, a furopyrazine group, a thienopyrazine group, a naphthopyrrole group, a cyclopentanaphthalene group, a naphthosilole group, a naphthoselenothiophene group, a naphthofuran group, a naphthothiophene group, a pyrroloquinoline group, a cyclopentaquinoline group, a siloloquinoline group, a selenophenoquinoline group, a furoquinoline group, a thienoquinoline group, an pyrroloisoquinoline group, an cyclopentaisoquinoline group, an siloloisoquinoline group, an selenophenoisoquinoline group, an furoisoquinoline group, an thienoisoquinoline group, an azacarbazole group, an azafluorene group, an azadibenzosilole group, an azadibenzoselenophene group, an azadibenzofuran group, an azadibenzothiophene group, an indenoquinoline group, an indenoisoquinoline group, an indenoquinoxaline group, a phenanthroline group, and a naphthoindole group, each substituted with at least one *-[$(L_{22})_{a22}$-$(R_{22})_{b22}$], and selection of $A_{21}$, $A_{22}$, and $A_{23}$ is subject to the limitations of claim 1.

4. The organic light-emitting device of claim 1, wherein rings $A_{21}$, $A_{22}$, and $A_{23}$ in Formulae 2A and 2B are each independently selected from groups represented by Formulae 2-1 to 2-36, each substituted with at least one *-[$(L_{22})_{a22}$-$(R_{22})_{b22}$], and selection of $A_{21}$, $A_{22}$, and $A_{23}$ is subject to the limitations of claim 1:

Formula 2-1

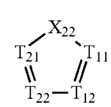

-continued
Formula 2-2
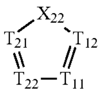
Formula 2-3
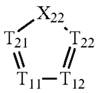
Formula 2-4
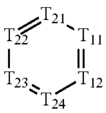
Formula 2-5
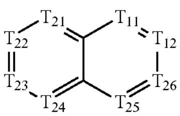
Formula 2-6
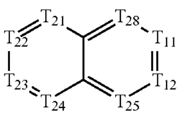
Formula 2-7
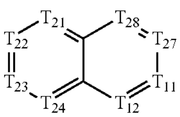
Formula 2-8
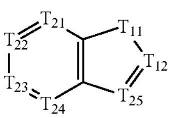
Formula 2-9
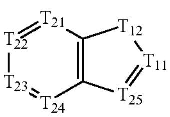
Formula 2-10
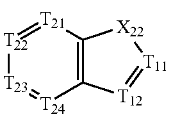
Formula 2-11
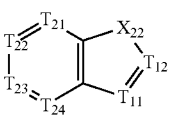
Formula 2-12
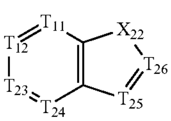
Formula 2-13
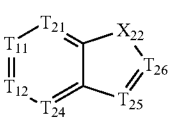
Formula 2-14
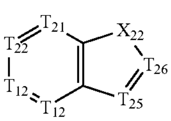
-continued
Formula 2-15
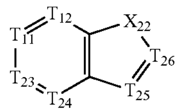
Formula 2-16
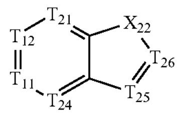
Formula 2-17
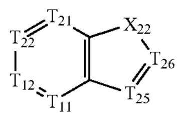
Formula 2-18
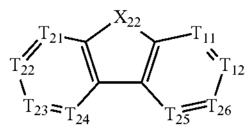
Formula 2-19
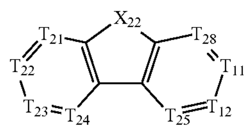
Formula 2-20
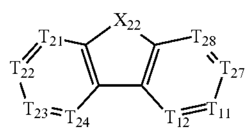
Formula 2-21
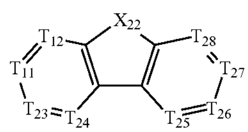
Formula 2-22
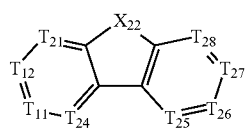
Formula 2-23
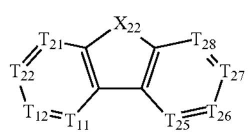
Formula 2-24
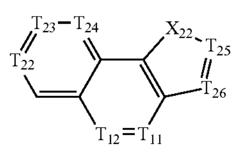
Formula 2-25
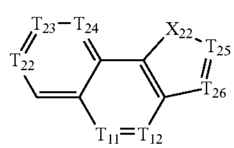

-continued

Formula 2-26

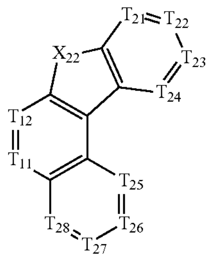

Formula 2-27

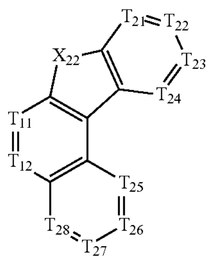

Formula 2-28

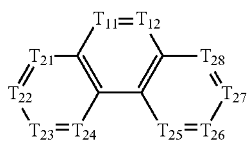

Formula 2-29

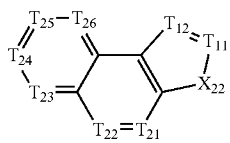

Formula 2-30

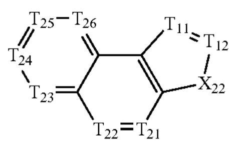

Formula 2-31

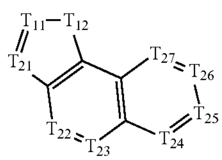

Formula 2-32

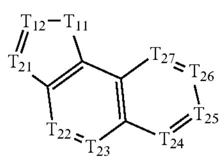

Formula 2-33

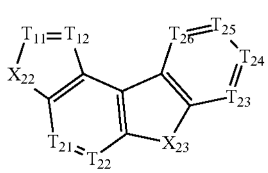

Formula 2-34

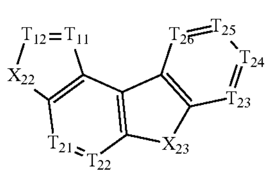

-continued

Formula 2-35

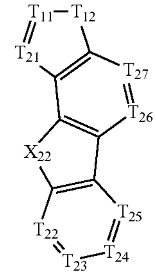

Formula 2-36

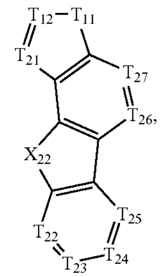

wherein, in Formulae 2-1 to 2-36, $T_{11}$ and $T_{12}$ are each independently the same as described herein in connection with Formulae 2A and 2B, $X_{22}$ and $X_{23}$ are each independently O, S, Se, or a moiety comprising C, N, and/or Si, and $T_{21}$ to $T_{28}$ are each independently N or a moiety comprising C.

5. The organic light-emitting device of claim 1, wherein $X_{21}$ in Formulae 2A and 2B is $N[(L_{21})_{a21}\text{-}(R_{21})_{b21}]$.

6. The organic light-emitting device of claim 4, wherein $X_{21}$ in Formulae 2A and 2B is O, S, Se, $C(R_{23})(R_{24})$, or $Si(R_{23})(R_{24})$, at least one selected from rings $A_{21}$, $A_{22}$, and $A_{23}$ Formula 2A and at least one selected from rings $A_{21}$ and $A_{23}$ in Formula 2B are each independently selected from groups represented by Formulae 2-1 to 2-3, 2-10 to 2-27, and 2-33 to 2-36, and $X_{22}$ or $X_{23}$, in Formulae 2-1 to 2-3, 2-10 to 2-27, and 2-33 to 2-36, is $N\text{-}[(L_{22})_{a22}\text{-}(R_{22})_{b22}]$.

7. The organic light-emitting device of claim 1, wherein $L_1$, $L_2$, $L_{21}$, and $L_{22}$ are each independently selected from the group consisting of:

a phenylene group, a pentalenylene group, an indenylene group, a naphthylene group, an azulenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a phenylene group, a pentalenylene group, an indenylene group, a naphthylene group, an azulenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene-group, an azacarbazolylene group, an azadibenzofuranylene group, an azadibenzothiophenylene group, and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkyl group, a $C_6$-$C_{20}$ aryl group, a $C_3$-$C_{20}$ heteroaryl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $L_1$ and $L_2$ are each not a substituted or unsubstituted carbazolylene group, a substituted or unsubstituted dibenzofuranylene group, and a substituted or unsubstituted dibenzothiophenylene group, and $Q_1$ to $Q_3$ and $Q_{31}$ to $Q_{33}$ are each independently selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

8. The organic light-emitting device of claim 1, wherein:

$R_1$ to $R_4$ are each independently selected from hydrogen, deuterium, —F, —Cl, —Br, —I, a hydroxyl group, a cyano group, a nitro group, an am idino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a phenanthrenyl group, an anthracenyl group, a fluorenyl group, a dimethylfluorenyl group, a diphenylfluorenyl group, and —Si($Q_1$)($Q_2$)($Q_3$), wherein $Q_1$ to $Q_3$ are each independently selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

9. The organic light-emitting device of claim 1, wherein $Ar_1$, $Ar_2$, $R_{21}$, and $R_{22}$ are each independently selected from the group consisting of:

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanathrolinyl group, a phenazinyl group, a benzimidazolyl group, a bemzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacoebazolyl group, an azadibenzofuranyl group, an azadibenzothiophenyl group, and an azadibenzosilolyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkyl group, a $C_6$-$C_{20}$ aryl group, a $C_3$-$C_{20}$ heteroaryl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), or $R_{22}$ is selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, —Si($Q_1$)($Q_2$)($Q_3$), —S(═O)$_2$($Q_1$), and —P(═O)($Q_1$)($Q_2$), wherein $Ar_1$ and $Ar_2$ are each not a substituted or unsubstituted carbazolyl group, a substituted or unsubstituted dibenzofuranyl group, or a substituted or unsubstituted dibenzothiophenyl group, wherein $Q_1$ to $Q_3$ and $Q_{31}$ to $Q_{33}$ are each independently selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

10. The organic light-emitting device of claim 1, wherein $Ar_1$ and $Ar_2$ are each independently selected from the group consisting of:

a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a spiro-benzofluorene-fluorenyl group, an indenofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a tetraphenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a triazinyl group, an imidazopyridinyl group, an imidazopyrimidinyl group, a benzofuranyl group, and a benzothiophenyl group; and a phenyl group, a bipheyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a spiro-benzofluorene-fluorenyl group, an indenofluorenyl group, a phenalenyl group, a phenanthrenyl group, an anthracenyl group, a fluoranthenyl group, a triphenylenyl group, a pyrenyl group, a chrysenyl group, a perylenyl group, a perntaphenyl group, a tetraphenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a triazinyl group, an imidazopyridinyl group, an imidazopyrimidinyl group, a benzofuranyl group, and a benzothiophenyl group, each substituted with at least one selected from deuterium, —F, —Cl, —Br, —I, a hydroxyl group, a cyano group, a nitro group, an amidino group, a hydrazine group, a hydrazono group, a $C_1$-$C_{20}$ alkyl group, a $C_1$-$C_{20}$ alkoxy group, a $C_3$-$C_{20}$ cycloalkyl group, a $C_6$-$C_{20}$ aryl group, a $C_3$-$C_{20}$ heteroaryl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_{31}$ to $Q_{33}$ are each independently selected from the group consisting of:

a $C_1$-$C_{10}$ alkyl group, a $C_1$-$C_{10}$ alkoxy group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

11. The organic light-emitting device of claim 1, wherein the first compound is represented by one selected from Formulae 1(1) to 1(7):

Formula 1(1)

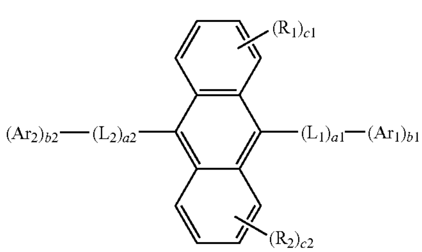

Formula 1(2)

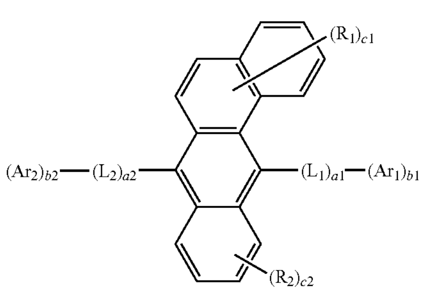

-continued

Formula 1(3)

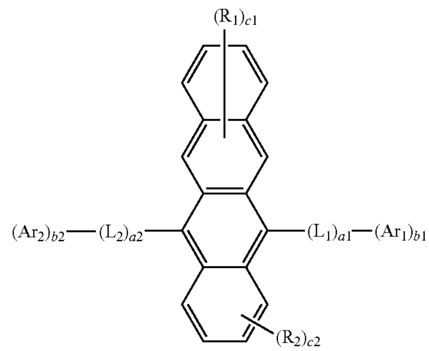

Formula 1(4)

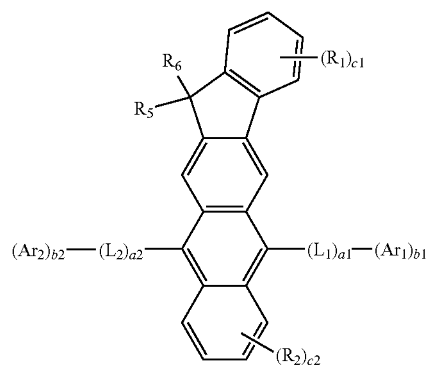

Formula 1(5)

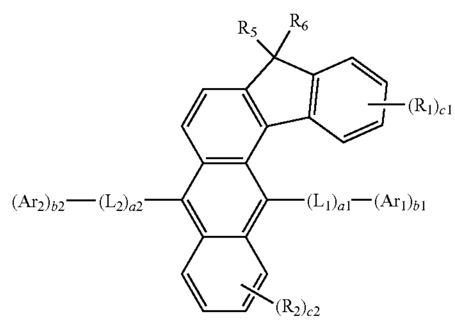

Formula 1(6)

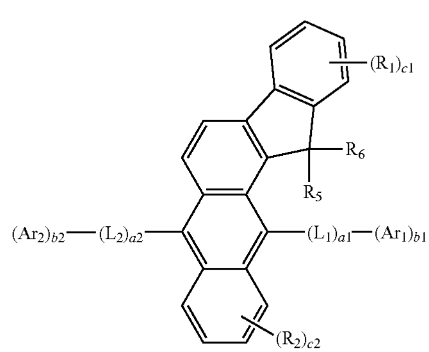

-continued

Formula 1(7)

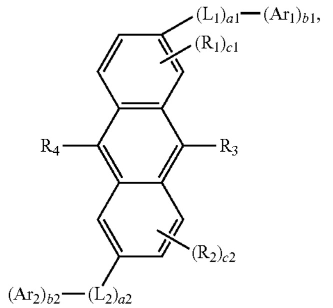

wherein, in Formulae 1(1) to 1(7), $L_1$, $L_2$, a1, a2, $Ar_1$ $Ar_2$, b1, b2, $R_1$ to $R_4$, C1, and c2 are each independently the same as described herein in connection with Formulae 1A and 1B, and $R_5$ and $R_6$ are each independently the same as described herein in connection with $R_1$.

12. An organic light-emitting device comprising:

a first electrode;

a second electrode facing the first electrode;

an emission layer between the first electrode and the second electrode;

a hole transport region between the first electrode and the emission layer; and an electron transport region between the emission layer and the second electrode, wherein the emission layer comprises a first compound, the hole transport region comprises an emission auxiliary layer, the emission auxiliary layer directly contacts the emission layer, and the emission auxiliary layer comprises a second compound represented by Formula 2A or 2B, the first compound is represented by Formula 1A or 1B, and the second compound is represented by Formula 2A or 2B:

Formula 1A

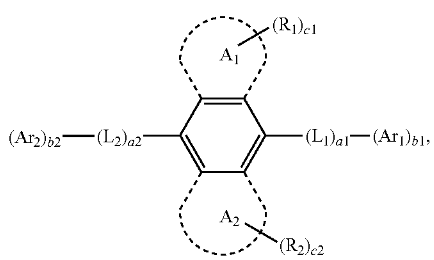

Formula 1B

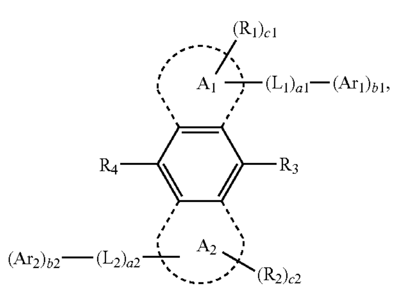

-continued

Formula 2A

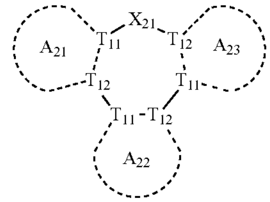

Formula 2B

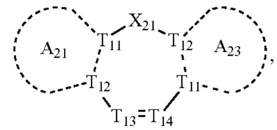

wherein, in Formulae 1A, 1B, 2A, and 2B, rings $A_1$ and $A_2$ are each independently a $C_5$-$C_{60}$ carbocyclic group, rings $A_{21}$, $A_{22}$, and $A_{23}$ are each independently a $C_5$-$C_{30}$ carbocyclic group or a $C_1$-$C_{30}$ heterocyclic group, each substituted with at least one *-[$(L_{22})_{a22}$-$(R_{22})_{b22}$], each $T_{11}$ and each $T_{12}$ is independently carbon or nitrogen, any two or more of the three $T_{11}$(s) Formula 2A are identical to or different from each other, $T_{13}$ is N or C($R_{27}$), $T_{14}$ is N or C($R_{28}$), any two or more of the three $T_{12}$(s) Formula 2A are identical to or different from each other, the two $T_{11}$(s) in Formula 2B are identical to or different from each other, the two $T_{12}$(s) in Formula 2B are identical to or different from each other, and each bond between $T_{11}$ and $T_{12}$ is a single bond or a double bond; wherein the three $T_{11}$(s)and the three $T_{12}$(s) Formula 2A are not all nitrogen, and the two $T_{11}$(s), the two $T_{12}$(s), $T_{13}$ and $T_{14}$ in Formula 2B are not all nitrogen, rings $A_{21}$, $A_{22}$, and $A_{23}$ are each condensed to a central 7-membered ring in Formulae 2A and 2B, such that they each share a $T_{11}$ and a $T_{12}$ with the central 7-membered ring, $X_{21}$ is selected from O, S, Se, C($R_{23}$)($R_{24}$), Si($R_{23}$)($R_{24}$), and N-[$(L_{21})_{a21}$-$(R_{21})_{b21}$], $L_1$, $L_2$, $L_{21}$, and $L_{22}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1, a2, a21, and a22 are each independently an integer selected from 0to 5, $Ar_1$ and $Ar_2$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, b1 and b2 are each independently an integer selected from 1 to 5, $R_1$ to $R_4$, $R_{21}$ to $R_{24}$, $R_{27}$, and $R_{28}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$), and c1, c2, b21, and b22 are each independently an integer selected from 0 to 4, wherein a compound represented by Formula 1A, in which i) rings $A_1$ and $A_2$ are each a benzene group, ii) a1, a2, c1, and c2 are 0, iii) b1 and b2 are 1, and iv) $Ar_1$ and $Ar_2$ are each a naphthyl group, is excluded from being the first compound, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituded $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkeny group, a $C_2$-$C_{60}$alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, $_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenylaryl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

13. An organic light-emitting device comprising:

a first electrode;

a second electrode facing the first electrode;

an emission layer between the first electrode and the second electrode;

a hole transport region between the first electrode and the emission layer; and an electron transport region between the emission layer and the second electrode, wherein the emission layer comprises a first compound, the electron transport region comprises a buffer layer, the buffer layer directly contacts the emission layer, and the buffer layer comprises a second compound, the first compound is represented by Formula 1A or 1B, and the second compound is represented by Formula 2A or 2B:

Formula 1A

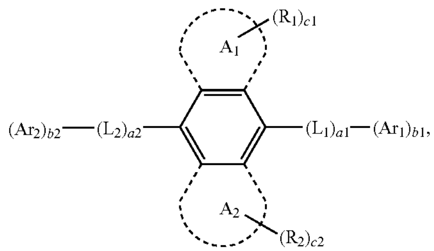

Formula 1B

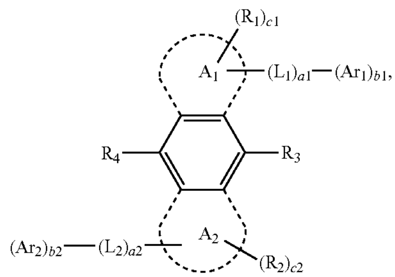

Formula 2A

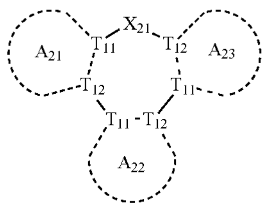

Formula 2B

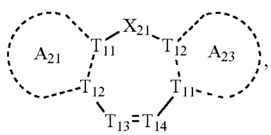

wherein, in Formulae 1A, 1B, 2A, and 2B, rings $A_1$ and $A_2$ are each independently a $C_5$-$C_{60}$ carbocyclic group, rings $A_{21}$, $A_{22}$, and $A_{23}$ are each independently a $C_5$-$C_{30}$ carbocyclic group or a $C_1$-$C_{30}$ heterocyclic group, each substituted with at least one *-[$(L_{22})_{a22}$-$(R_{22})_{b22}$], each $T_{11}$ and each $T_{12}$ is independently carbon or nitrogen, any two or more of the three $T_{11}$(s) Formula 2A are identical to or different from each other, $T_{13}$ is N or C($R_{27}$), $T_{14}$ is N or C($R_{28}$), any two or more of the three $T_{12}$(s) Formula 2A are identical to or different from each other, the two $T_{11}$(s) in Formula 2B are identical to or different from each other, the two $T_{12}$(s) in Formula 2B are identical to or different from each other, and each bond between $T_{11}$ and $T_{12}$ is a single bond or a double bond; wherein the three $T_{11}$(s) and the three $T_{12}$(s) Formula 2A are not all nitrogen, and the two $T_{11}$(s), the two $T_{12}$(S), $T_{13}$ and $T_{14}$ in Formula 2B are not all nitrogen, rings $A_{21}$, $A_{22}$, and $A_{23}$ are each condensed to a central 7-membered ring in Formulae 2A and 2B, such that they each share a $T_{11}$ and a $T_{12}$ with the central 7-membered ring, $X_{21}$ is selected from O, S, Se, C($R_{23}$)($R_{24}$), Si($R_{23}$)($R_{24}$), and N-[$(L_{21})_{a21}$-$(R_{21})_{b21}$], $L_1$, $L_2$, $L_{21}$, and $L_{22}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1, a2, a21, and a22 are each independently an integer selected from 0 to 5, $Ar_1$ and $Ar_2$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{10}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, b1 and b2 are each independently an integer selected from 1 to 5, $R_1$ to $R_4$, $R_{21}$ to $R_{24}$, $R_{27}$, and $R_{28}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$), and c1, c2, b21, and b22 are each independently an integer selected from 0 to 4, wherein a compound represented by Formula 1A, in which i) rings $A_1$ and $A_2$ are each a benzene group, ii) a1, a2, c1, and c2 are 0, iii) b1 and b2 are 1, and iv) $Ar_1$ and $Ar_2$ are each a naphthyl group, is excluded from being the first compound, and at least one substituent of the substituted $C_3$-$C_{10}$ cycloalkylene group, substituted $C_1$-$C_{10}$ heterocycloalkylene group, substituted $C_{310}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_{260}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkynyl group, a $C_2$-$C_{60}$ alkoxy group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O )($Q_{31}$), —S(═O)$_2$($Q_{31}$), and —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

14. The organic light-emitting device of claim 1, wherein the first compound comprised in the emission layer is a host, and the emission layer further comprises a dopant, wherein the dopant comprises an arylamine compound or a styrylamine compound.

15. The organic light-emitting device of claim 14, wherein the dopant comprises a compound represented by Formula 501:

Formula 501

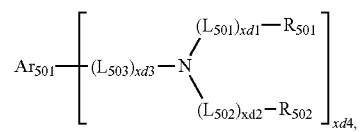

wherein, in Formula 501, $Ar_{501}$ is a substituted or unsubstituted $C_5$-$C_{60}$ carbocyclic group or a substituted or unsubstituted $C_1$-$C_{60}$ heterocyclic group, $L_{501}$ to $L_{503}$ are each independently selected from a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 are each independently an integer selected from 0 to 3, $R_{501}$ and $R_{502}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 is an integer selected from 1 to 4.

16. The organic light-emitting device of claim 1, wherein:

the electron transport region comprises a buffer layer, an electron transport layer, and an electron injection layer, wherein at least one selected from the electron transport layer and the electron injection layer comprises an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

17. The organic light-emitting device of claim 16, wherein the electron injection layer comprises lithium (Li), sodium (Na), potassium (K), rubidium (Rb), cesium (Cs), magnesium (Mg), calcium (Ca), erbium (Er), thulium (Tm), ytterbium (Yb), or a combination thereof.

18. The organic light-emitting device of claim 1, wherein the hole transport region comprises a p-dopant, wherein the p-dopant has a lowest unoccupied molecular orbital (LUMO) energy level of −3.5 eV or less.

19. The organic light-emitting device of claim 18, wherein the p-dopant comprises a cyano group-containing compound.

20. The organic light-emitting device of claim 1, wherein:

the emission layer is a first-color-light emission layer, the organic light-emitting device further comprises i) at least one second-color-light emission layer or ii) at least one second-color-light emission layer and at least one third-color-light emission layer, each between the first electrode and the second electrode, a maximum emission wavelength of the first-color-light emission layer, a maximum emission wavelength of the second-color-light emission layer, and a maximum emission wavelength of the third-color-light emission layer are identical to or different from each other, and the organic light-emitting device emits a mixed light including a first-color-light and a second-color-light, or a mixed light including the first-color-light, the second-color-light, and a third-color-light.

* * * * *